United States Patent
Rayner

(10) Patent No.: US 9,089,056 B2
(45) Date of Patent: *Jul. 21, 2015

(54) HOUSING FOR ENCASING AN OBJECT

(71) Applicant: TreeFrog Developments, Inc., San Diego, CA (US)

(72) Inventor: Gary Rayner, San Diego, CA (US)

(73) Assignee: TreeFrog Developments, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/029,739

(22) Filed: Sep. 17, 2013

(65) Prior Publication Data

US 2014/0016217 A1 Jan. 16, 2014

Related U.S. Application Data

(63) Continuation of application No. 13/656,658, filed on Oct. 19, 2012, now Pat. No. 8,708,142, which is a (Continued)

(51) Int. Cl.
*H05K 5/02* (2006.01)
*G06F 1/16* (2006.01)
(Continued)

(52) U.S. Cl.
CPC ............ *H05K 5/0217* (2013.01); *A45C 13/002* (2013.01); *B65D 85/00* (2013.01);
(Continued)

(58) Field of Classification Search
CPC ....... B65D 85/38; H04B 1/3888; H04M 1/04; H05K 5/02; H05K 5/06; H05K 7/16; G06F 1/1613; G06F 1/1626; G06F 1/1656; G06F 1/181; A45C 2013/025
USPC .............. 206/305, 320; 361/679.02, 679.03, 361/679.26, 679.55–679.59, 724, 727; 455/90.3, 575.1, 575.8
See application file for complete search history.

(56) References Cited

U.S. PATENT DOCUMENTS 3,023,885 A 3/1962 Kindseth
3,482,895 A 12/1969 Becklin
(Continued)

FOREIGN PATENT DOCUMENTS

DE 29612454 U1 9/1996
EP 1018680 A2 7/2000
(Continued)

OTHER PUBLICATIONS

BodyGloveMobile—Apple iPhone 4 & 4S Zero 360 Case-Clear-Flat Back (no clip) [Retrieved from http://bodyglovemobile.com/product/apple-iphone-4-amp-4s-zero-360deg-case-clear-flat-back-no-clip,338,63.htm. Dated Apr. 9, 2012].

(Continued)

*Primary Examiner* — Bryon Gehman
(74) *Attorney, Agent, or Firm* — Mintz Levin Cohn Ferris Glovsky and Popeo, P.C.

(57) ABSTRACT

An apparatus and system for housing a device include a housing that is configured such that a device may be fitted within the housing and thereby be protected, such as from shocks and/or liquid. The housing may include top and bottom members that may be removably coupled together so as to form the housing. Each top and bottom member optionally includes front and back surfaces surrounded by a perimeter. The perimeter is defined by proximal and distal ends as well as opposing sides. The top and bottom members may include respective clasping mechanisms that extend along the perimeter of the top and bottom members. The clasping mechanisms are configured for coupling the top and bottom members with one another thereby sealing the housing, for instance, in a shock-proof and/or water tight seal.

30 Claims, 142 Drawing Sheets

Related U.S. Application Data continuation of application No. 13/355,447, filed on Jan. 20, 2012, now Pat. No. 8,393,466, which is a continuation of application No. 13/272,156, filed on Oct. 12, 2011, now Pat. No. 8,342,325.

(60) Provisional application No. 61/392,361, filed on Oct. 12, 2010, provisional application No. 61/444,085, filed on Feb. 17, 2011, provisional application No. 61/471,058, filed on Apr. 1, 2011.

(51) Int. Cl.
*H05K 5/06* (2006.01)
*B65D 85/00* (2006.01)
*A45C 13/00* (2006.01)

(52) U.S. Cl.
CPC ............ *G06F 1/1601* (2013.01); *G06F 1/1613* (2013.01); *G06F 1/1626* (2013.01); *G06F 1/1637* (2013.01); *G06F 1/1656* (2013.01); *H05K 5/0221* (2013.01); *H05K 5/061* (2013.01); *G06F 2200/1633* (2013.01)
USPC ........................................................ 206/320

(56) References Cited

U.S. PATENT DOCUMENTS

| | | | |
|---|---|---|---|
| 3,665,991 A | 5/1972 | Gillemot et al. | |
| 4,097,878 A | 6/1978 | Cramer | |
| 4,298,204 A | 11/1981 | Jinkins | |
| 4,312,580 A | 1/1982 | Schwomma et al. | |
| 4,375,323 A | 3/1983 | Inagaki et al. | |
| 4,383,743 A | 5/1983 | Nozawa et al. | |
| 4,418,830 A | 12/1983 | Dzung et al. | |
| 4,420,078 A | 12/1983 | Belt et al. | |
| 4,546,874 A | 10/1985 | Kirchhan | |
| 4,584,718 A | 4/1986 | Fuller | |
| 4,658,956 A | 4/1987 | Takeda et al. | |
| 4,686,332 A | 8/1987 | Greanias et al. | |
| 4,712,657 A | 12/1987 | Myers et al. | |
| 4,733,776 A | 3/1988 | Ward | |
| 4,762,227 A | 8/1988 | Patterson | |
| 4,803,504 A | 2/1989 | Maeno et al. | |
| 4,836,256 A | 6/1989 | Meliconi | |
| 4,942,514 A | 7/1990 | Miyagaki et al. | |
| 4,963,902 A | 10/1990 | Fukahori | |
| 4,977,483 A | 12/1990 | Perretta | |
| 4,994,829 A | 2/1991 | Tsukamoto | |
| 5,002,184 A | 3/1991 | Lloyd | |
| D316,932 S | 5/1991 | Escher, Jr. | |
| 5,025,921 A | 6/1991 | Gasparaitis et al. | |
| D322,165 S | 12/1991 | Lloyd | |
| 5,087,934 A | 2/1992 | Johnson | |
| 5,092,458 A | 3/1992 | Yokoyama | |
| 5,092,459 A | 3/1992 | Uljanic et al. | |
| 5,177,515 A | 1/1993 | Tsukamoto | |
| 5,231,381 A | 7/1993 | Duwaer | |
| 5,233,502 A | 8/1993 | Beatty et al. | |
| 5,239,323 A | 8/1993 | Johnson | |
| 5,239,324 A | 8/1993 | Ohmura et al. | |
| 5,285,894 A | 2/1994 | Kamata et al. | |
| 5,294,988 A | 3/1994 | Wakabayashi et al. | |
| 5,305,032 A | 4/1994 | Arai | |
| 5,360,108 A | 11/1994 | Alagia | |
| 5,368,159 A | 11/1994 | Doria | |
| 5,383,091 A | 1/1995 | Snell | |
| 5,388,691 A | 2/1995 | White | |
| 5,388,692 A | 2/1995 | Withrow et al. | |
| D365,927 S | 1/1996 | Cho | |
| 5,541,813 A | 7/1996 | Satoh et al. | |
| RE35,318 E | 8/1996 | Warman | |
| 5,548,306 A | 8/1996 | Yates | |
| 5,583,742 A | 12/1996 | Noda | |
| 5,584,054 A | 12/1996 | Tyneski et al. | |
| 5,590,760 A | 1/1997 | Astarb | |
| 5,610,655 A | 3/1997 | Wakabayashi et al. | |
| D378,634 S | 4/1997 | LaPere | |
| 5,636,101 A | 6/1997 | Bonsall et al. | |
| 5,669,004 A | 9/1997 | Sellers | |
| 5,707,757 A | 1/1998 | Lee | |
| 5,713,048 A | 1/1998 | Hayakawa | |
| 5,713,466 A | 2/1998 | Tajima | |
| 5,845,803 A | 12/1998 | Saito et al. | |
| 5,850,915 A | 12/1998 | Tajima | |
| 5,907,721 A | 5/1999 | Schelling et al. | |
| 5,946,501 A | 8/1999 | Hayakawa | |
| 5,956,291 A | 9/1999 | Nehemiah et al. | |
| 5,982,520 A | 11/1999 | Weiser et al. | |
| 5,990,874 A | 11/1999 | Tsumura et al. | |
| D419,297 S | 1/2000 | Richardson et al. | |
| D419,768 S | 2/2000 | Richardson et al. | |
| 6,041,924 A | 3/2000 | Tajima | |
| D424,035 S | 5/2000 | Steiner et al. | |
| 6,068,119 A | 5/2000 | Derr et al. | |
| 6,092,707 A | 7/2000 | Bowes, Jr. | |
| 6,094,785 A | 8/2000 | Montgomery et al. | |
| 6,128,441 A | 10/2000 | Kamata et al. | |
| 6,132,367 A | 10/2000 | Adair | |
| 6,201,867 B1 | 3/2001 | Koike | |
| D447,634 S | 9/2001 | Snider | |
| 6,311,017 B1 | 10/2001 | Mori | |
| 6,313,982 B1 | 11/2001 | Hino | |
| 6,317,313 B1 | 11/2001 | Mosgrove et al. | |
| 6,349,824 B1 | 2/2002 | Yamada | |
| 6,396,769 B1 | 5/2002 | Polany | |
| 6,415,138 B2 | 7/2002 | Sirola et al. | |
| 6,456,487 B1 | 9/2002 | Hetterick | |
| D464,196 S | 10/2002 | Parker | |
| 6,471,056 B1 | 10/2002 | Tzeng | |
| 6,519,141 B2 | 2/2003 | Tseng et al. | |
| 6,525,928 B1 | 2/2003 | Madsen et al. | |
| 6,532,152 B1 | 3/2003 | White et al. | |
| 6,536,589 B2 | 3/2003 | Chang | |
| 6,574,434 B2 | 6/2003 | Matsuoto et al. | |
| 6,594,472 B1 | 7/2003 | Curtis et al. | |
| 6,595,608 B1 | 7/2003 | Minelli et al. | |
| 6,597,865 B1 | 7/2003 | Negishi et al. | |
| 6,614,423 B1 | 9/2003 | Wong et al. | |
| 6,614,722 B2 | 9/2003 | Polany et al. | |
| 6,616,111 B1 | 9/2003 | White | |
| 6,625,394 B2 | 9/2003 | Smith et al. | |
| 6,634,494 B1 | 10/2003 | Derr et al. | |
| 6,636,697 B2 | 10/2003 | Smith et al. | |
| 6,646,864 B2 * | 11/2003 | Richardson | 206/305 |
| 6,659,274 B2 | 12/2003 | Enners | |
| 6,665,174 B1 | 12/2003 | Derr et al. | |
| 6,698,608 B2 | 3/2004 | Parker et al. | |
| 6,721,651 B1 | 4/2004 | Minelli | |
| 6,751,552 B1 | 6/2004 | Minelli | |
| 6,760,570 B1 | 7/2004 | Higdon, Jr. | |
| 6,778,388 B1 | 8/2004 | Minelli | |
| 6,785,566 B1 | 8/2004 | Irizarry | |
| 6,822,640 B2 | 11/2004 | Derocher | |
| 6,844,845 B1 | 1/2005 | Whiteside et al. | |
| 6,913,201 B1 | 7/2005 | Wagner et al. | |
| 6,914,774 B1 | 7/2005 | Albertini et al. | |
| D507,871 S | 8/2005 | DiMarchi et al. | |
| 6,954,405 B2 | 10/2005 | Polany et al. | |
| 6,955,293 B1 | 10/2005 | Katsanevas | |
| 6,975,888 B2 | 12/2005 | Buesseler et al. | |
| 6,980,777 B2 | 12/2005 | Shepherd et al. | |
| 6,995,976 B2 * | 2/2006 | Richardson | 206/320 |
| 7,046,230 B2 | 5/2006 | Zadesky et al. | |
| 7,050,712 B2 | 5/2006 | Shimamura | |
| 7,050,841 B1 | 5/2006 | Onda | |
| 7,069,063 B2 | 6/2006 | Halkosaari et al. | |
| 7,082,264 B2 | 7/2006 | Watanabe et al. | |
| 7,106,959 B2 | 9/2006 | Sato | |
| 7,158,376 B2 * | 1/2007 | Richardson et al. | 361/679.56 |
| 7,180,735 B2 | 2/2007 | Thomas et al. | |
| 7,194,202 B2 | 3/2007 | Funahashi et al. | |
| 7,194,291 B2 | 3/2007 | Peng | |
| 7,230,823 B2 * | 6/2007 | Richardson et al. | 361/679.56 |

(56) References Cited

U.S. PATENT DOCUMENTS

| | | | |
|---|---|---|---|
| 7,255,228 B2 | 8/2007 | Kim | |
| 7,263,032 B2 | 8/2007 | Polany et al. | |
| 7,312,984 B2 | 12/2007 | Richardson et al. | |
| 7,341,144 B2 | 3/2008 | Tajiri et al. | |
| 7,352,961 B2 | 4/2008 | Watanabe et al. | |
| 7,362,570 B2 | 4/2008 | Su | |
| 7,365,281 B2 | 4/2008 | Yamaguchi et al. | |
| 7,369,881 B2 | 5/2008 | Tsujimoto | |
| 7,409,148 B2 | 8/2008 | Takahashi et al. | |
| 7,436,653 B2 | 10/2008 | Yang | |
| 7,464,813 B2 * | 12/2008 | Carnevali | 206/320 |
| 7,464,814 B2 * | 12/2008 | Carnevali | 206/320 |
| 7,495,895 B2 | 2/2009 | Carnevali | |
| 7,511,956 B2 | 3/2009 | Tomioka et al. | |
| 7,525,792 B2 | 4/2009 | Yokote | |
| 7,535,799 B2 | 5/2009 | Polany et al. | |
| 7,594,576 B2 | 9/2009 | Chen et al. | |
| 7,609,512 B2 | 10/2009 | Richardson et al. | |
| 7,613,386 B2 | 11/2009 | Shimamura | |
| D605,850 S | 12/2009 | Richardson et al. | |
| 7,697,269 B2 | 4/2010 | Yang et al. | |
| 7,733,642 B2 | 6/2010 | Liou et al. | |
| 7,755,975 B2 | 7/2010 | Pettersen et al. | |
| 7,772,507 B2 | 8/2010 | Orr et al. | |
| 7,775,354 B2 | 8/2010 | Latchford et al. | |
| 7,789,228 B2 | 9/2010 | Zenzai | |
| 7,789,696 B2 | 9/2010 | Umei et al. | |
| 7,801,425 B2 | 9/2010 | Fantone et al. | |
| 7,850,032 B2 | 12/2010 | Carnevali et al. | |
| 7,854,434 B2 | 12/2010 | Heiman et al. | |
| 7,889,489 B2 | 2/2011 | Richardson et al. | |
| 7,907,394 B2 | 3/2011 | Richardson et al. | |
| 7,926,818 B2 | 4/2011 | Isono | |
| 7,933,122 B2 | 4/2011 | Richardson et al. | |
| 7,941,196 B2 | 5/2011 | Kawasaki et al. | |
| 7,975,870 B2 | 7/2011 | Laule et al. | |
| 7,993,071 B2 | 8/2011 | Clawson | |
| 8,004,835 B2 * | 8/2011 | Conti et al. | 361/679.56 |
| D644,636 S | 9/2011 | Richardson et al. | |
| 8,031,472 B2 | 10/2011 | Bicket et al. | |
| 8,068,331 B2 | 11/2011 | Sauers et al. | |
| 8,164,899 B2 | 4/2012 | Yamaguchi et al. | |
| 8,167,126 B2 | 5/2012 | Stiehl | |
| 8,191,706 B1 | 6/2012 | Liu | |
| 8,204,561 B2 | 6/2012 | Mongan et al. | |
| 8,245,842 B2 | 8/2012 | Bau | |
| 8,269,104 B2 | 9/2012 | Choraku et al. | |
| 8,286,789 B2 | 10/2012 | Wilson et al. | |
| 8,342,325 B2 | 1/2013 | Rayner | |
| 8,520,373 B2 * | 8/2013 | Liu | 361/679.03 |
| 2001/0040109 A1 | 11/2001 | Yaski et al. | |
| 2002/0003584 A1 | 1/2002 | Kossin | |
| 2002/0071550 A1 | 6/2002 | Pletikosa | |
| 2002/0079244 A1 | 6/2002 | Kwong | |
| 2002/0085709 A1 | 7/2002 | Hsu | |
| 2002/0090212 A1 | 7/2002 | Shimamura et al. | |
| 2002/0122353 A1 | 9/2002 | Polany et al. | |
| 2002/0136557 A1 | 9/2002 | Shimamura | |
| 2002/0137475 A1 | 9/2002 | Shou et al. | |
| 2002/0175096 A1 | 11/2002 | Linihan | |
| 2002/0175901 A1 | 11/2002 | Gettemy | |
| 2002/0193136 A1 | 12/2002 | Halkosaari et al. | |
| 2002/0195910 A1 | 12/2002 | Hus et al. | |
| 2003/0080947 A1 | 5/2003 | Genest et al. | |
| 2003/0095374 A1 | 5/2003 | Richardson | |
| 2003/0111366 A1 | 6/2003 | Enners | |
| 2003/0118332 A1 | 6/2003 | Smith et al. | |
| 2003/0118334 A1 | 6/2003 | Smith et al. | |
| 2003/0128397 A1 | 7/2003 | Smith et al. | |
| 2003/0223577 A1 | 12/2003 | Ono | |
| 2004/0014506 A1 | 1/2004 | Kemppinen | |
| 2004/0076415 A1 | 4/2004 | Da Silva | |
| 2004/0089570 A1 | 5/2004 | Chien et al. | |
| 2004/0120219 A1 | 6/2004 | Polany et al. | |
| 2004/0188120 A1 | 9/2004 | Komatsu et al. | |
| 2004/0203502 A1 | 10/2004 | Dietrich et al. | |
| 2004/0226836 A1 | 11/2004 | Schreiber et al. | |
| 2005/0052425 A1 | 3/2005 | Zadesky et al. | |
| 2005/0094024 A1 | 5/2005 | Sato | |
| 2005/0110768 A1 | 5/2005 | Marriott et al. | |
| 2005/0115852 A1 | 6/2005 | Funahashi et al. | |
| 2005/0123161 A1 | 6/2005 | Polany et al. | |
| 2005/0167304 A1 | 8/2005 | Shimamura | |
| 2005/0174727 A1 | 8/2005 | Thomas et al. | |
| 2005/0181843 A1 | 8/2005 | Tsujimoto | |
| 2005/0224508 A1 | 10/2005 | Tajiri et al. | |
| 2005/0247584 A1 | 11/2005 | Lu | |
| 2005/0279661 A1 | 12/2005 | Hodges | |
| 2006/0008261 A1 | 1/2006 | Watanabe et al. | |
| 2006/0110146 A1 | 5/2006 | Ariga | |
| 2007/0040931 A1 | 2/2007 | Nishizawa | |
| 2007/0071423 A1 | 3/2007 | Fantone et al. | |
| 2007/0074473 A1 | 4/2007 | Yamaguchi et al. | |
| 2007/0086273 A1 | 4/2007 | Polany et al. | |
| 2007/0109730 A1 | 5/2007 | Shigyo et al. | |
| 2007/0110416 A1 | 5/2007 | Yamaguchi et al. | |
| 2007/0115387 A1 | 5/2007 | Ho | |
| 2007/0138920 A1 | 6/2007 | Austin et al. | |
| 2007/0158220 A1 | 7/2007 | Cleereman et al. | |
| 2007/0215663 A1 | 9/2007 | Chongson et al. | |
| 2007/0241012 A1 | 10/2007 | Latchford et al. | |
| 2007/0261978 A1 | 11/2007 | Sanderson | |
| 2007/0280053 A1 | 12/2007 | Polany et al. | |
| 2007/0297149 A1 | 12/2007 | Richardson et al. | |
| 2008/0081679 A1 | 4/2008 | Kawasaki et al. | |
| 2008/0157485 A1 | 7/2008 | Isono | |
| 2008/0164267 A1 | 7/2008 | Huber | |
| 2009/0009945 A1 | 1/2009 | Johnson et al. | |
| 2009/0017884 A1 | 1/2009 | Rotschild | |
| 2009/0028535 A1 | 1/2009 | Funahashi et al. | |
| 2009/0032420 A1 | 2/2009 | Zenzai | |
| 2009/0087655 A1 | 4/2009 | Yamada et al. | |
| 2009/0090532 A1 | 4/2009 | Lai et al. | |
| 2009/0109635 A1 | 4/2009 | Chen et al. | |
| 2009/0117957 A1 | 5/2009 | Araki et al. | |
| 2009/0167545 A1 | 7/2009 | Osaka | |
| 2009/0211775 A1 | 8/2009 | Yamaguchi et al. | |
| 2009/0215412 A1 | 8/2009 | Liu et al. | |
| 2009/0260844 A1 | 10/2009 | Tseng | |
| 2010/0006314 A1 | 1/2010 | Wilson, II et al. | |
| 2010/0044198 A1 | 2/2010 | Tang et al. | |
| 2010/0085691 A1 | 4/2010 | Yeh et al. | |
| 2010/0144194 A1 | 6/2010 | Umei et al. | |
| 2010/0181108 A1 | 7/2010 | Hata et al. | |
| 2010/0203931 A1 * | 8/2010 | Hynecek et al. | 455/575.8 |
| 2010/0206601 A1 | 8/2010 | Choraku et al. | |
| 2010/0311475 A1 | 12/2010 | Takatsuka et al. | |
| 2010/0313485 A1 | 12/2010 | Kuo | |
| 2011/0002106 A1 | 1/2011 | Bentley et al. | |
| 2011/0017620 A1 | 1/2011 | Latchford et al. | |
| 2011/0024315 A1 | 2/2011 | Kim | |
| 2011/0228460 A1 | 9/2011 | Kim et al. | |
| 2012/0018325 A1 | 1/2012 | Kim | |
| 2012/0031914 A1 | 2/2012 | Liu | |
| 2012/0043235 A1 | 2/2012 | Klement | |
| 2012/0099261 A1 | 4/2012 | Reber | |
| 2012/0099262 A1 | 4/2012 | Reber et al. | |
| 2012/0099265 A1 | 4/2012 | Reber | |
| 2012/0099266 A1 | 4/2012 | Reber et al. | |
| 2012/0103844 A1 | 5/2012 | Piedra et al. | |
| 2012/0118773 A1 | 5/2012 | Rayner | |
| 2012/0168336 A1 | 7/2012 | Schmidt et al. | |
| 2012/0314354 A1 | 12/2012 | Rayner | |

FOREIGN PATENT DOCUMENTS

| | | |
|---|---|---|
| JP | 05-061069 U | 8/1993 |
| JP | 08-288990 A | 11/1996 |
| JP | 3060175 U | 7/1999 |
| JP | 3066786 U | 3/2000 |
| JP | 2000-341383 A | 12/2000 |
| JP | 2001-046132 A | 2/2001 |
| JP | 2003-164316 A | 6/2003 |
| WO | WO-94/00037 A1 | 1/1994 |

(56) References Cited

FOREIGN PATENT DOCUMENTS

| WO | WO-99/41958 A1 | 8/1999 |
|---|---|---|
| WO | WO-00/51315 A1 | 8/2000 |
| WO | WO-02/11161 A2 | 2/2002 |
| WO | WO-2012/051358 A2 | 4/2012 |
| WO | WO-2012/074151 A1 | 6/2012 |

OTHER PUBLICATIONS

Casemate Chrome with Mirror Screen Protector for iPhone 4/4S Case-Mate [Retrieved from http://www.case-mate.com/iPhone-4-Cases/Case-Mate-iPhone-4-4S-Chrome-with-Mirror-Screen-Protector.asp. Dated Apr. 9, 2012].

Hard Candy Cases—Bubble 360 Case for the new iPAD [Retrieved from http://www.hardcandycases.com/bubble-360-case--for-new-ipad.html. Dated Apr. 9, 2012].

Eaglecell, Inc.—Eaglecell Phone Accessories—iPhone 4(AT&T/Verizon)/4S(AT&T/Verizon/Sprint) [Retrieved from http://www.eaglecell.com/Ecommerce/general/BrowsrCategory.aspx?C . . . Dated Apr. 9, 2012].

Gadgetmac-CaseMate Phantom Case for iPhone 4/S Review [Retrieved from http://www.gadgetmac.com/reviews/case-mate-phantom-case-for-iphon . . . Dated Apr. 9, 2012].

Griffin cases & covers for iPhone 4 and iPhone 4s [Retrieved from http://www.griffintechnology.com/iphone/cases Dated Apr. 9, 2012].

OtterBox Commuter Series Cases OtterBox.com [Retrieved from http://www.otterbox.com/commuter-series,default,pg.html. Dated Apr. 9, 2012].

PCT International Search Report and Written Opinion for corresponding PCT application No. PCT/US2011/056040. Dated Jul. 12, 2012.

PCT International Search Report and Written Opinion issued in International Application No. PCT/US2013/043799. Mailed Sep. 5, 2013. (Submitted in two parts).

Results for Invalidity Search for Patent 6,995,976. Printed Jun. 27, 2012.

TakTik—iPhone Case [Retrieved from http://articlesdownload.com/2012/08/16taktik-premiumprotection-system . . . Dated Apr. 9, 2012].

\* cited by examiner

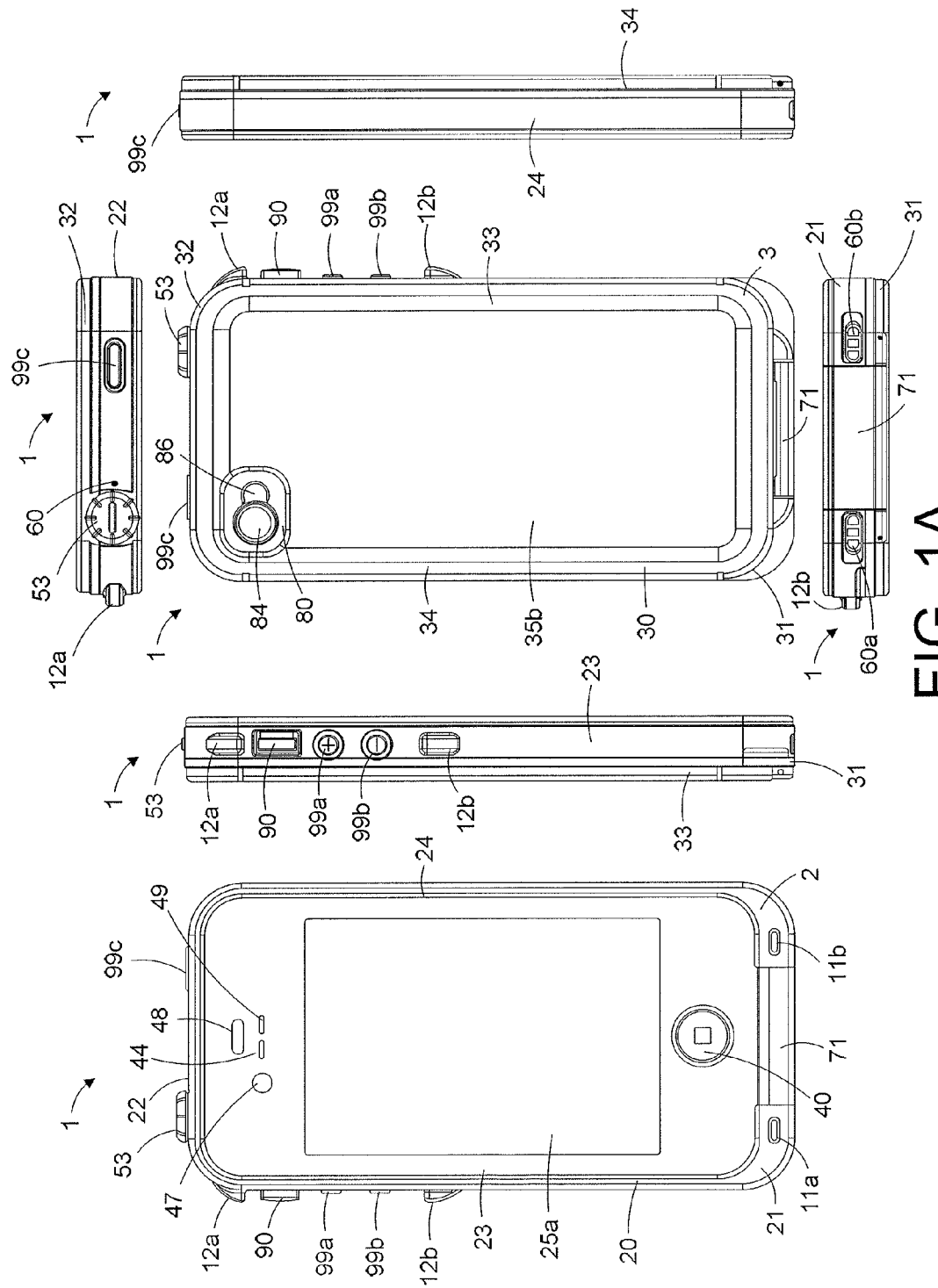

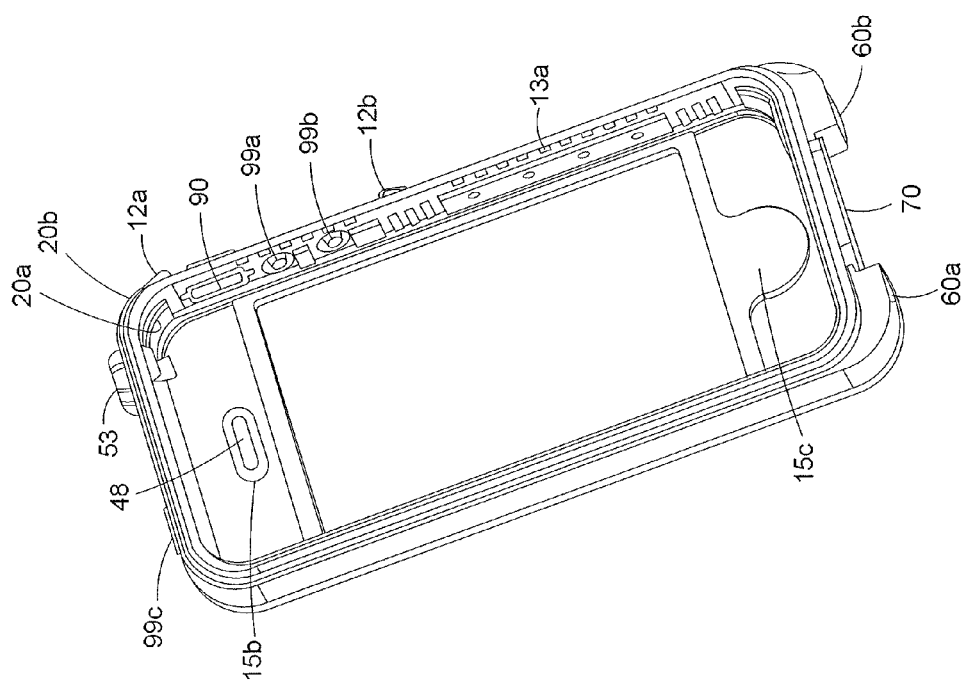

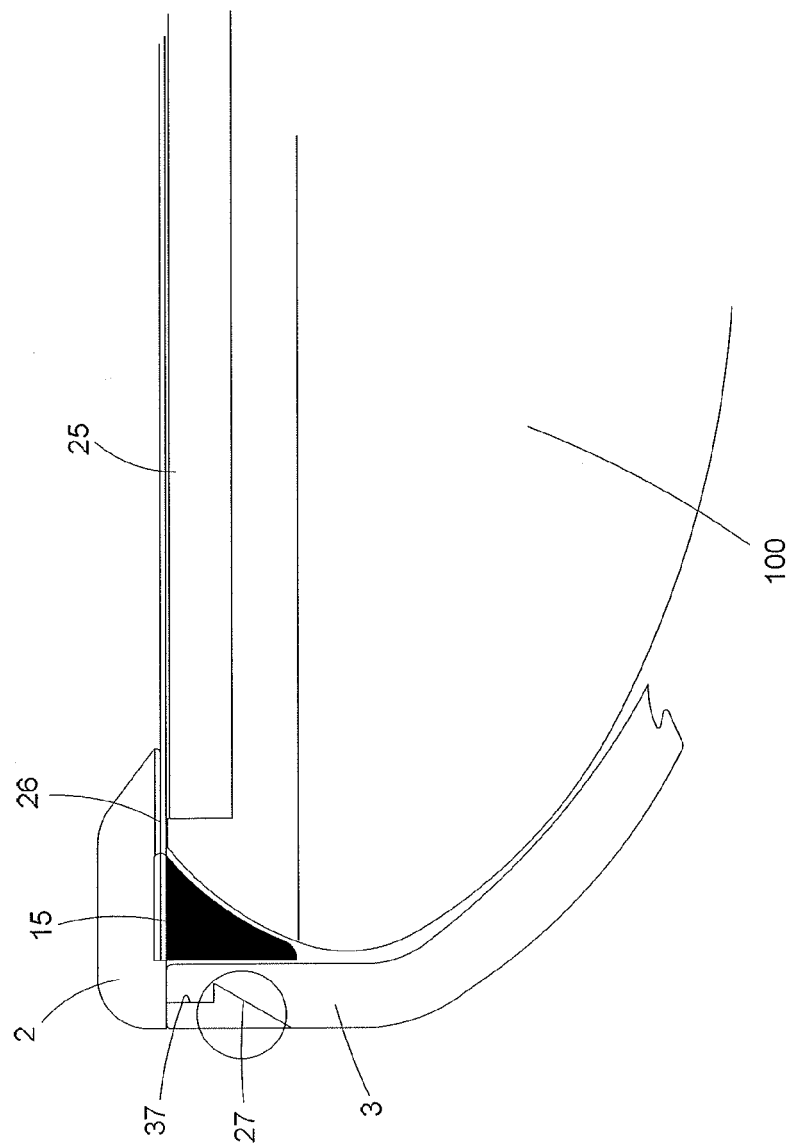

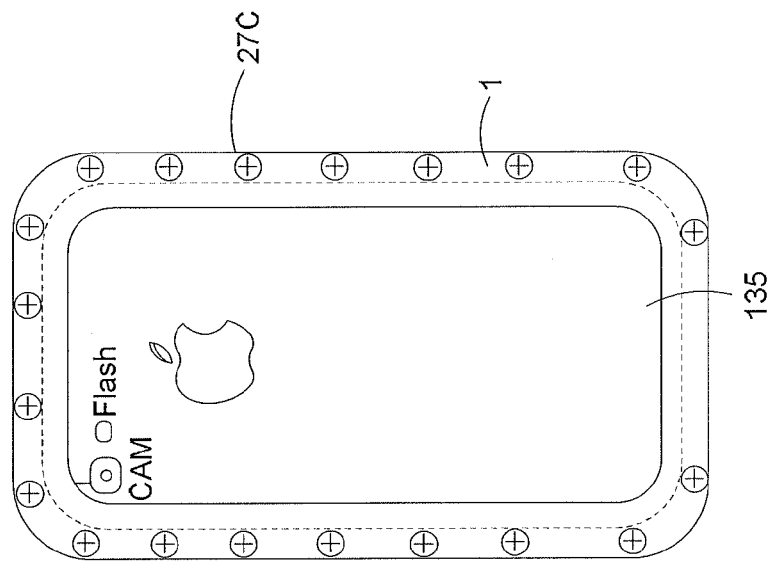
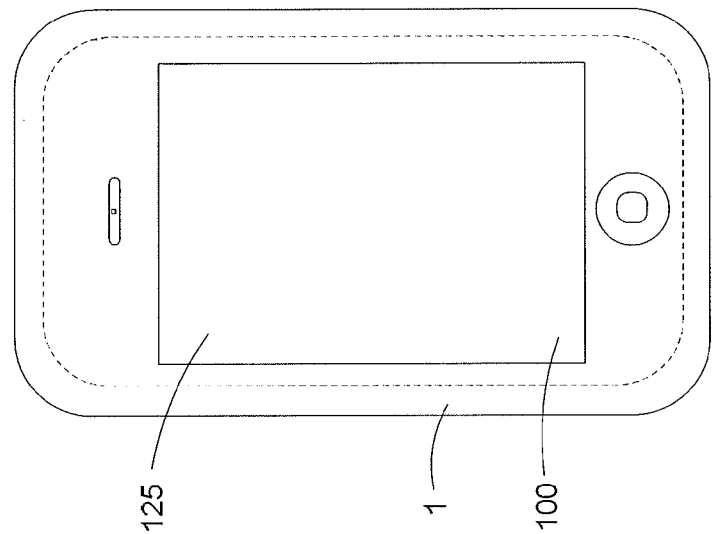
FIG. 4N

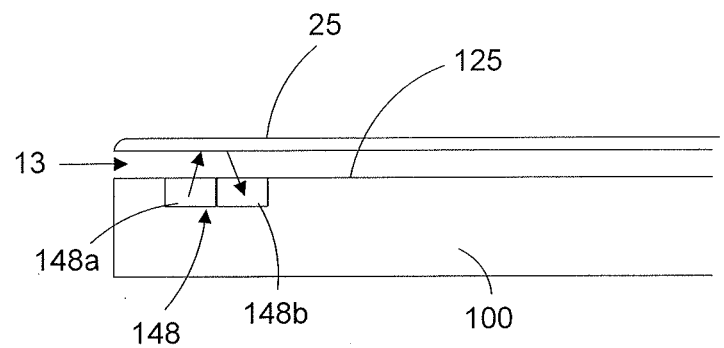
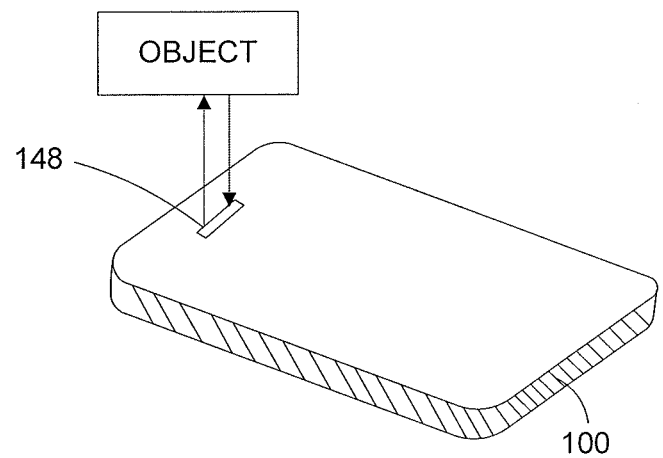
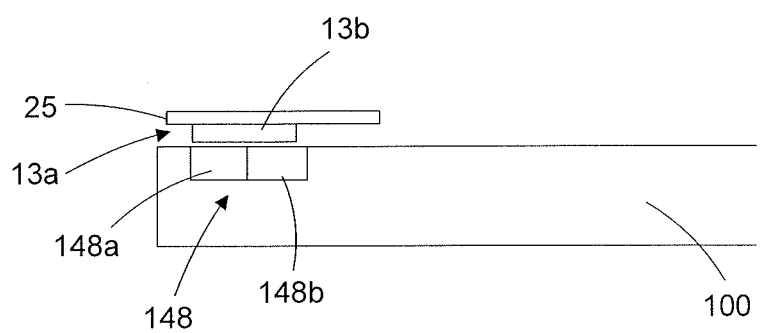
FIG. 5C

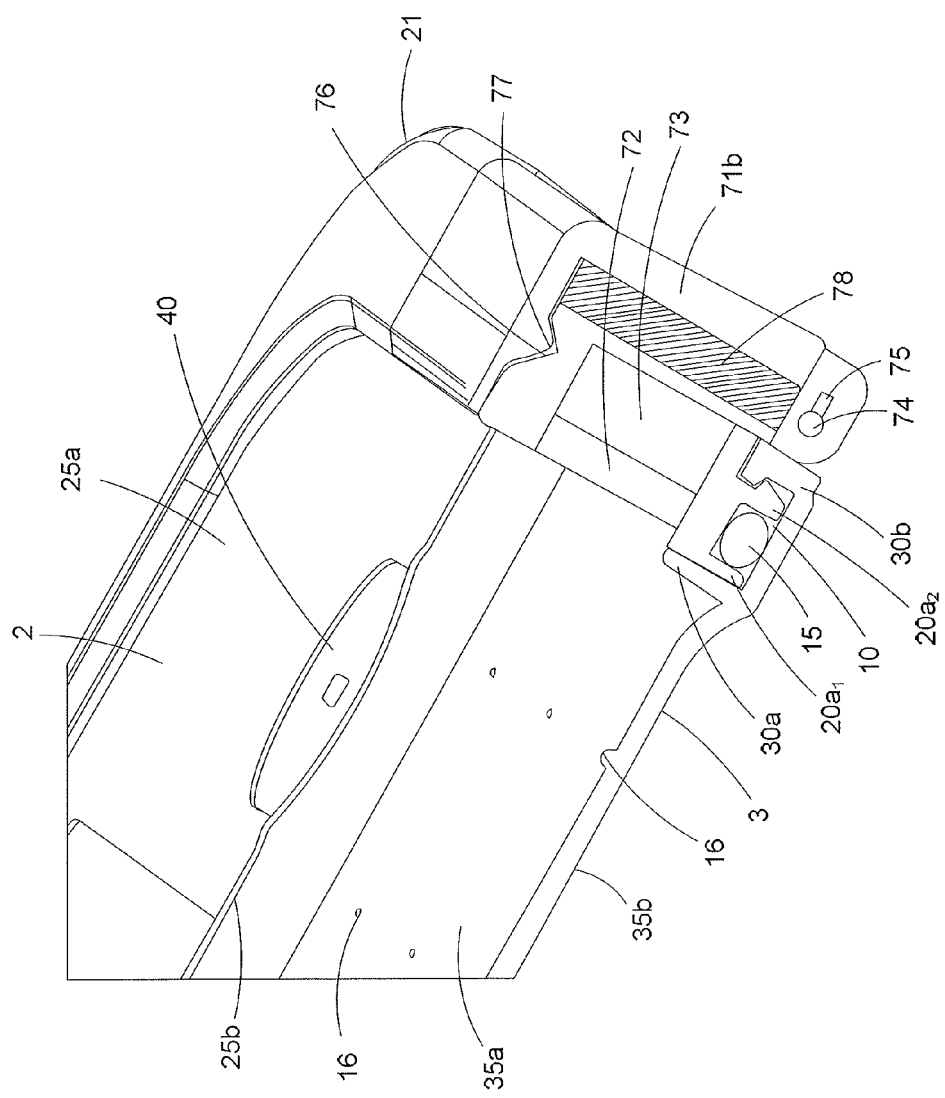

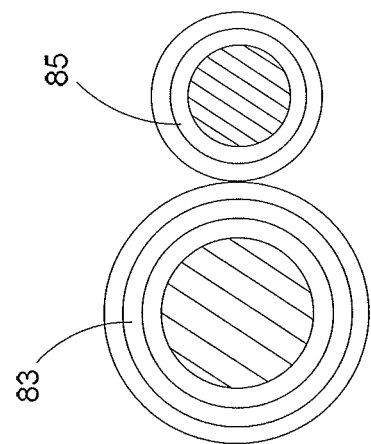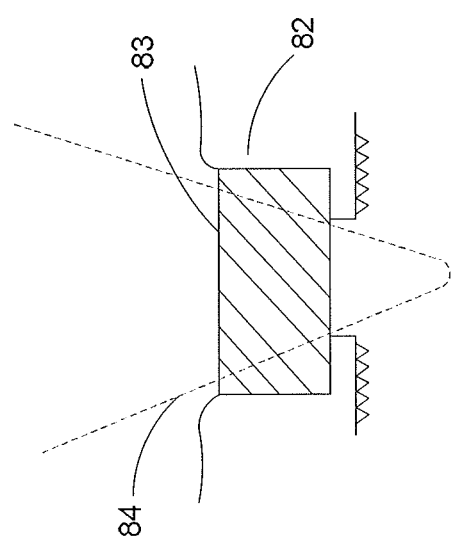
FIG. 8H

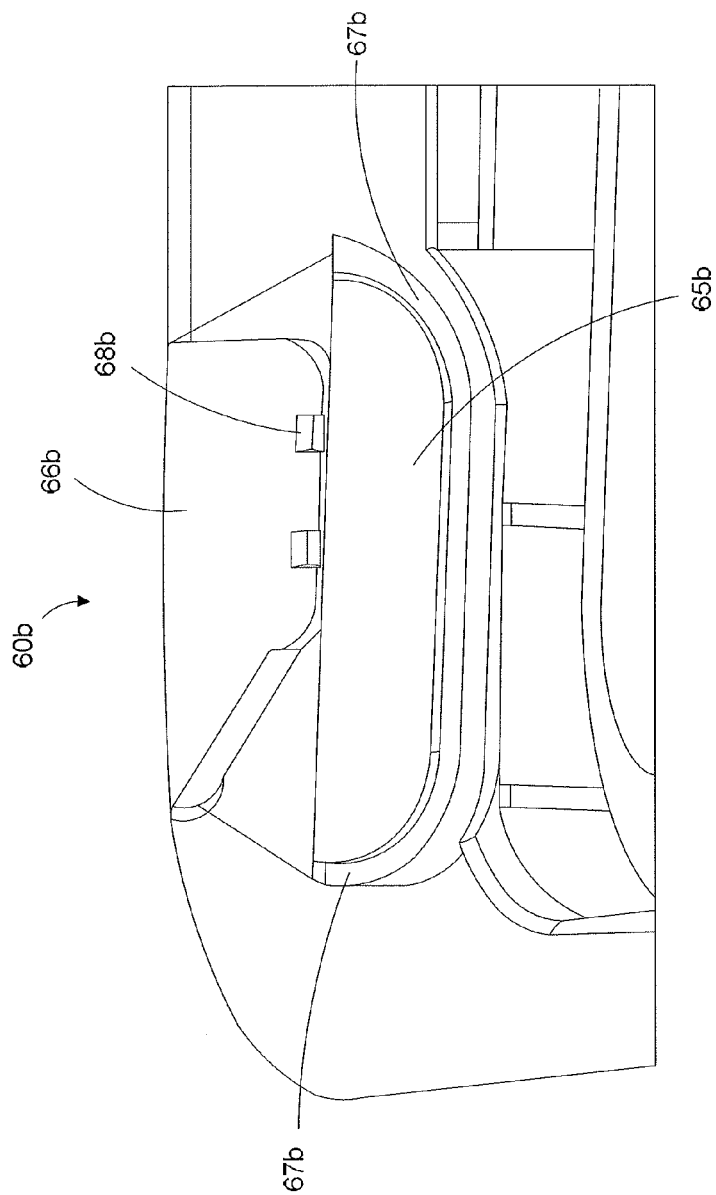

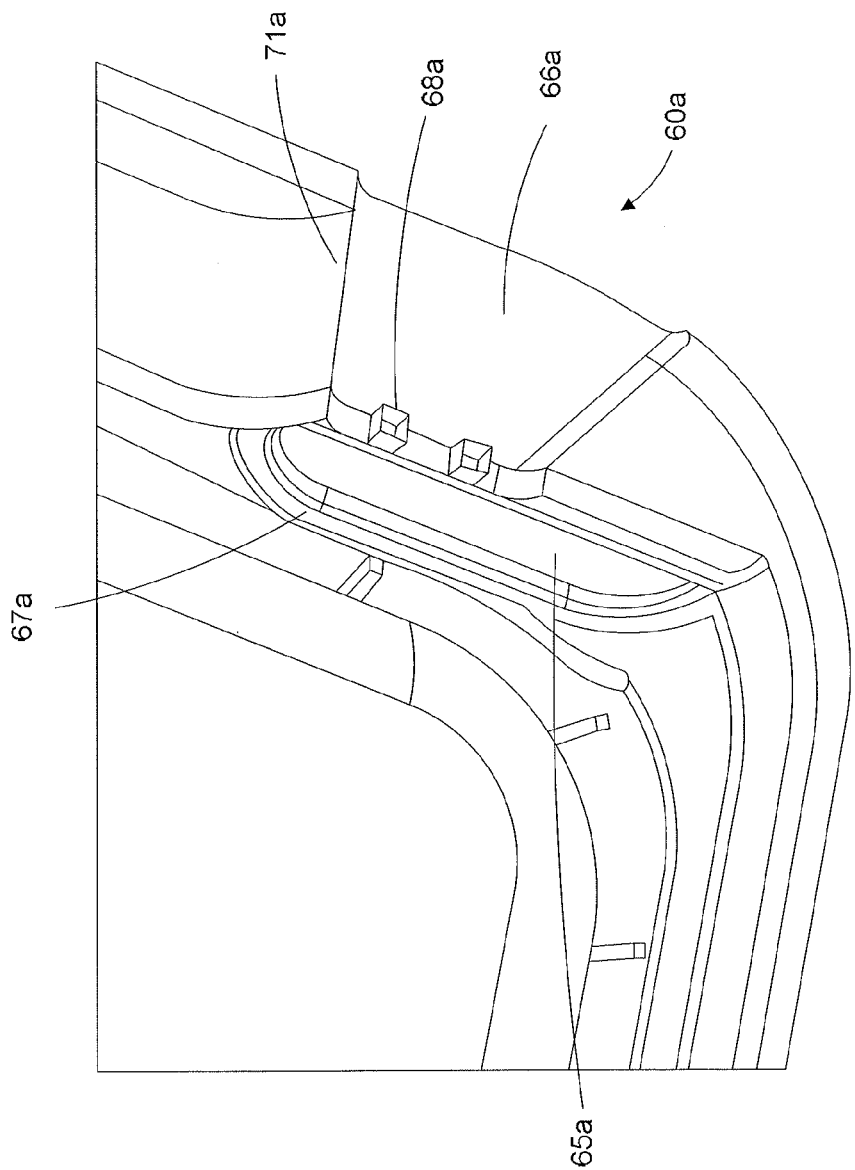

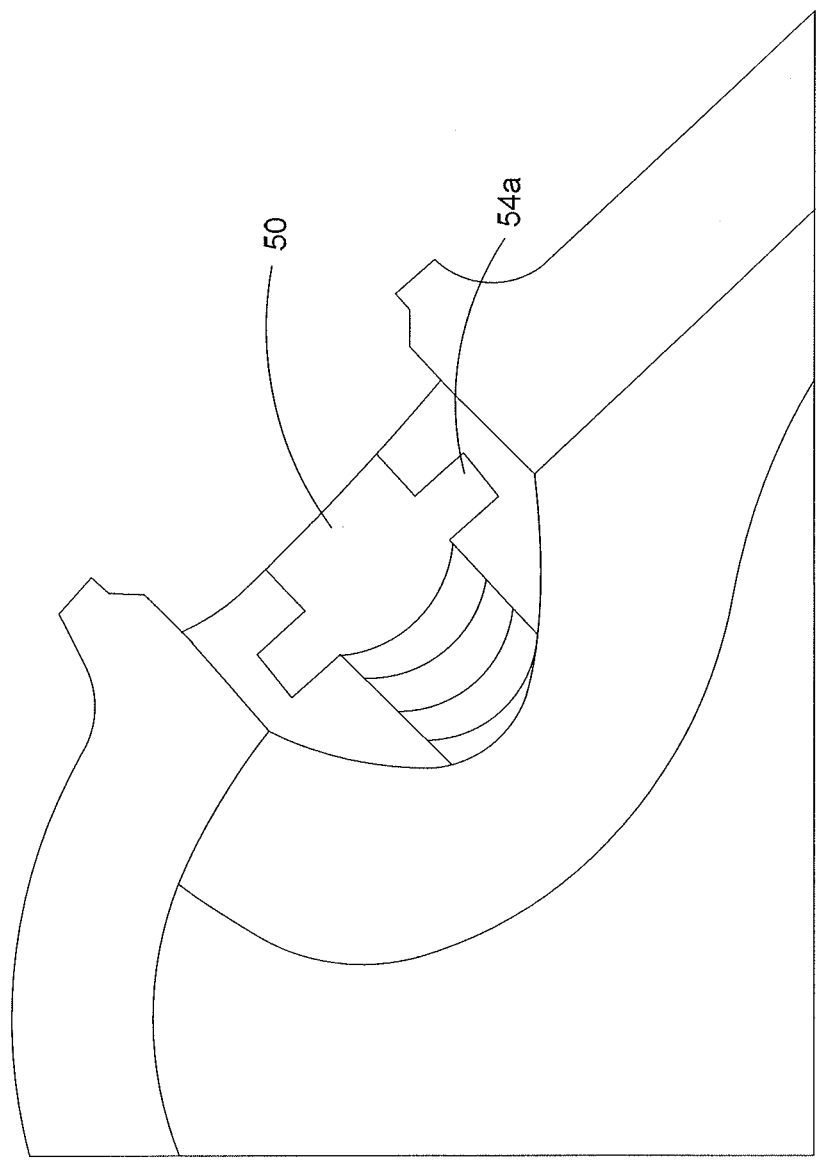

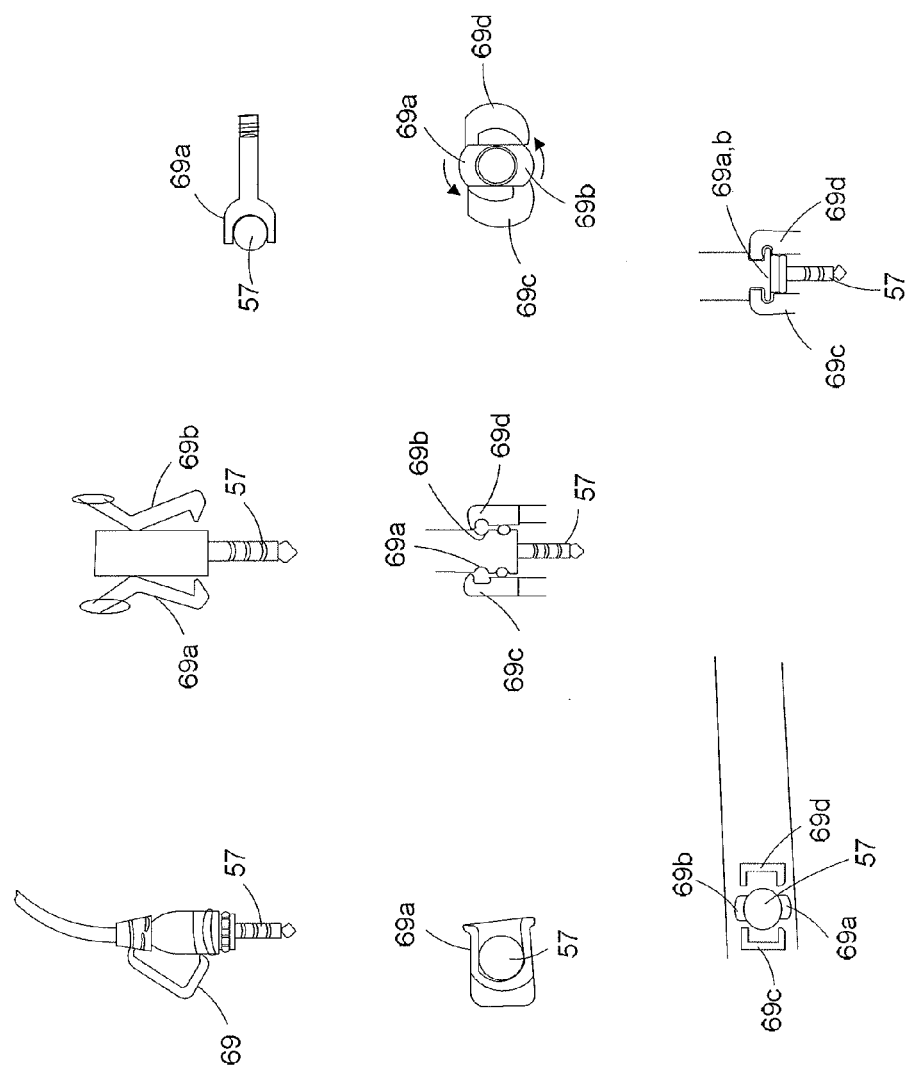

HOUSING FOR ENCASING AN OBJECT

CROSS-REFERENCE TO RELATED APPLICATIONS

This application is a continuation of co-pending U.S. patent application Ser. No. 13/656,658 filed on Oct. 19, 2012, titled "Housing for Encasing an Object;" which is a continuation of U.S. patent application Ser. No. 13/355,447 filed on Jan. 20, 2012, titled "Housing For Encasing An Object," now U.S. Pat. No. 8,393,466; which is a continuation of Ser. No. 13/272,156 filed on Oct. 12, 2011, titled "Housing For Encasing An Object," now U.S. Pat. No. 8,342,325; which claims priority from U.S. Provisional Application No. 61/392,361, with a filing date of Oct. 12, 2010; U.S. Provisional Application No. 61/444,085, with a filing date of Feb. 17, 2011; and U.S. Provisional Application No. 61/471,058, with a filing date of Apr. 1, 2011. This application is related to U.S. patent application Ser. No. 13/681,342 filed on Nov. 19, 2012, titled "Housing Encasing a Device Having a Switch." The disclosures of each of the applications cited in this paragraph are hereby incorporated herein by reference in their entireties.

FIELD

This disclosure relates generally to a housing for protecting one or more objects, such as an object in need of protection from the elements, mishandling, and/or other mistreatment. For instance, in one aspect, the disclosure relates to a housing for protecting one or more components of a device or a device itself, such as an electronic device, for example, an electronic device with a touch screen interface, including but not limited to: a computer, a digital tablet computer, a mobile telephone, a personal digital assistant, video recorder, camera, and the like, or as indicated, one or more of the components thereof. In a further aspect, the disclosure relates to a housing for protecting a non-electronic object.

BACKGROUND

Rain, dirt, dust, mud, snow, and water in all of its forms can be damaging to various objects. Additionally, objects that are fragile or otherwise breakable can be damaged by mistreatment and/or other inappropriate handling, such as by dropping. It is, therefore, useful to have a housing within which an object in need of protection may be housed so as to protect it from inclement conditions, mistreatment, and/or inappropriate handling. Types of objects in need of such protection are electronic devices and/or the components thereof, precious items, perishable entities, and the like.

With respect to electronic devices, such devices are well known and widely used. For instance, a mobile telephone or tablet computer are electronic devices that are convenient tools that allow people to communicate with one another while on the go and away from traditional telephone landlines or internet connections. For instance, mobile devices allow people to communicate via voice, text message, short message service (SMS), instant messaging (IM), and the like. Other such portable devices include computers, personal digital assistants, electronic digital readers, electronic game devices, video recorders, cameras, and the like. While these devices may be portable and handy to use, they suffer from some drawbacks. For example, they are often expensive and contain fragile electronic components that make them prone to damage due to inclement weather and/or mishandling.

Accordingly, there is a need in the art for a mechanism whereby an object, such as a portable device, for instance, an electronic device and/or the components thereof, may be protected from inclement weather and/or errant handling and/or other damage that may result from contacting a fluid, such as water, dirt, dust, mud, snow, and the like. The present disclosure is directed to an apparatus and system for housing or encasing an object, such as a device and/or the components thereof, as well as methods for using the same, in a manner that offers protection for the device from adverse environmental conditions, inclement weather, mishandling and/or damage, such as from contacting a fluid, such as water. Systems for the same are also provided.

SUMMARY

In one aspect, a housing for encasing an object is provided. The object may be any object that is in need of protecting from one or more adverse environmental conditions, inclement weather, mishandling and/or damage, such as from contacting a fluid, such as water, and/or from droppage. The object may be a device, e.g., an electronic device, and the housing a casing within which the electronic device is housed; or the object may be a single component or several components of which the device, e.g., the electronic device, is comprised. For instance, the housing may be a housing within which an electronic device, such as a mobile phone or tablet computer, is to be fitted; or the housing may be the actual housing that encases the components of the mobile phone or tablet computer. The housing may be of any appropriate size and dimension so long as it is capable of housing the object and protecting it, for instance, from adverse environmental conditions and/or rough treatment.

In other instances, the object may not be an electronic device, but rather may be a fabricated material, such as a textile material; a manufactured material, such as a mechanical tool or instrument; a naturally occurring material; a synthesized material; a chemical or biological material; a processed material; a perishable material; a precious material; and the like. The housing may be in the form of any typical container known and used in the art for containing the particular object. For instance, the container may be a cargo or transport container configured for opening and closing, a suitcase, a briefcase, a messenger container, a food or drink container, a medicine container, first aid kit, a cooler container, a heating container, or any other form of container meant to contain an object or objects and prevent it or them from being damaged due to environmental factors and/or mishandling.

As indicated, in certain embodiments, the object to be contained is an electronic device, such as a mobile telephone, digital assistant, a computer, tablet computer, music player, GPS device, or the like; and the housing is configured for protecting the electronic device. In certain embodiments, the object to be contained is one or more, e.g., a plurality, of electronic components, such as electronic components that are configured for functioning together so as to perform a particular function, such as telephonic, computing, and/or photographic functions, and the housing is configured for containing the electronic component(s) of the object and protecting them as well as for assisting in the performance of the function of the electronic device. For example, where the electronic device is a mobile telephone, digital assistant, computer, etc. the components may be the components contained within the device that allow it to function in an appropriate manner. The housing, therefore, could be the actual housing of the mobile telephone, digital assistant, computer, etc. that typically houses the components, however, modified in the manner described herein below so as to be liquid proof and/or shock proof as described herein.

In one aspect the container is configured for containing a device, such as an electronic device, e.g., a mobile telephone, music player, GPS device, and the like. In such an instance, the container includes a housing wherein the housing is adapted for housing the device, e.g., the mobile telephone, music player, GPS device, etc. It is to be understood that although the following description is set forth with respect to describing the shape and size of a particular container for housing a particular device, i.e., a mobile telephone device, the shape and size of the container and/or the object, e.g., device, to be contained can vary, for instance, as described above. Therefore, in one instance, a housing for housing a device, such as an electronic device, is provided.

The housing is configured such that the device may be fitted within the housing and be protected thereby, e.g., protected from rain, dirt, dust, mud, snow, water, shock, and the like. In certain instances, the housing may include a top member and a bottom member that may be removably coupled together so as to form the housing. In certain instances, the top and bottom members are separate components capable of being separably coupled together, such as, in various embodiments, by being snapped together. In other instances, the top and bottom members are formed of a single member made to be folded on itself in such a manner as to fit the device within a cavity formed thereby, such as without the inclusion of a hinge member. In other instances, the top and bottom members may be formed of a single or a plurality of members that are configured for being coupled together via a hinge component.

Each of the top and bottom members of the housing includes a front and a back surface surrounded by a perimeter portion. The perimeter portion is defined by a proximal and a distal end portion as well as opposing side portions. The perimeter portion may include a plurality of perimeter portions, such as an interior and an exterior perimeter portion, as described herein below.

In various embodiments, the top and/or bottom members of the housing may include a clasping mechanism. For instance, the top and bottom members may include respective clasping mechanisms that extend along at least a portion of the perimeter of the top and/or bottom member, which clasping mechanisms are configured for interfacing with one another in such a manner so as to couple the top and bottom members of the housing with one another thereby sealing the housing. In certain embodiments, the clasping mechanism circumscribes the entire perimeter portion of the housing. In other embodiments, the clasping mechanism is positioned along a perimeter portion of the housing but does not circumscribe the entire perimeter portion. In certain embodiments, the clasping mechanism includes a plurality of clasping mechanisms, one or more of which may or may not circumscribe the entire perimeter of the top and bottom members.

In certain embodiments, the clasping mechanism is an entirely internal clasping mechanism. By "entirely internal clasping mechanism" is meant that the clasping mechanism is entirely contained within the bounds that form the interior or cavity of the housing when the top and bottom members are coupled together so as to form the housing.

In certain embodiments, the clasping mechanism is an entirely external clasping mechanism. By "entirely external clasping mechanism" is meant that the clasping mechanism is positioned entirely on an exterior portion of the top and/or bottom member such that when the top and bottom members are coupled together so as to form the cavity of the housing the clasping mechanism is positioned exteriorly to the bounds that form the cavity of the housing.

In certain embodiments, the clasping mechanism is a hybrid clasping mechanism that is partially internal and partially external to the bounds that form the cavity of the housing. Accordingly, in certain instances, the perimeter portion may include one or more clasping mechanisms, such as internal, external, and/or hybrid clasping mechanisms that are configured so as to secure the sealing of the top and bottom members together. The clasping mechanisms may be separate elements added on to the perimeter portion of the housing, e.g., where the clasping mechanism is an external clasping mechanism, or may be an integral member therewith, e.g., where the clasping mechanism is an internal or hybrid clasping mechanism.

In certain embodiments, the clasping mechanism may include a plurality of clasping mechanisms such as one or more internal and/or one or more external and/or one or more hybrid clasping mechanisms. For instance, in various embodiments, the housing may include a plurality of internal clasping mechanisms and/or may include one or more external and/or hybrid clasping mechanisms. For example, the housing may include a first entirely internal clasping mechanism, e.g., one that circumscribes a portion or an entire perimeter of the housing; and may include a second entirely internal clasping mechanism, e.g., a second internal clasping mechanism that circumscribes an additional portion or entire perimeter of the housing. A further, external or hybrid clasping mechanism may also be provided.

Accordingly, in various embodiments, a single internal, external, or hybrid clasping mechanism may be provided; and in other various embodiments, a plurality of clasping mechanism, e.g., internal, external, and/or hybrid clasping mechanisms, may be provided. For instance, in certain embodiments, a plurality of internal clasping mechanisms are provided. The clasping mechanisms are configured such that when the top and bottom members are coupled together a liquid-proof seal is provided thereby which seal protects an encased device or components thereof from liquid, such as water.

In one embodiment, one or both of the top and bottom members may include a channel, such as a channel that extends along the perimeter portion of the top and/or bottom member. The channel along the perimeter portion may include an interior bounding member and an exterior bounding member, which bounding members at least partially define the bounds of the channel. Hence, in such an embodiment, the perimeter portion includes an interior perimeter portion, e.g., an interior bounding member; and an exterior perimeter portion, e.g., exterior bounding member. A bottom bounding member may also be provided. Accordingly, the perimeter portion may include an interior and an exterior perimeter portion, and in certain instances, the interior and exterior bounding members of the channel are the same as the interior and exterior perimeter portions of the top and/or bottom member. A portion of the bottom member may also provide a bottom bounding for the channel. The at least one channel may additionally include a gasket, such as a compressible O-ring, positioned within the channel.

In certain embodiments, where one top or bottom member includes a perimeter portion containing a channel, e.g., bounded by interior and exterior bounding members, the opposing member may additionally include a perimeter portion that includes an interior perimeter portion, such as a perimeter portion that interacts with the channel, e.g., so as to compress a gasket contained therein, and an exterior perimeter portion, which exterior perimeter portion may or may not interact with the channel. For instance, where the bottom member includes a perimeter portion having a channel bounded by interior, exterior, and/or bottom bounding members, the top member may include a perimeter portion that also includes interior and exterior perimeter portions, albeit without an intervening channel there between, which perimeter portions may be configured for interacting with one or more of the perimeter portions of the bottom member. For example, the interior and/or exterior bounding member(s) of the channel of the perimeter portion of the bottom member may include a clasping mechanism, and a corresponding interior or exterior perimeter portion of the top member may include a corresponding clasping mechanism, such that when the top and bottom members are coupled together and the clasping mechanism clasped, e.g., snapped, together a liquid-proof seal is provided thereby. Accordingly, in various embodiments, the interior and/or exterior perimeter portions as well as the interior and/or exterior bounding members of the top and bottom members may include clasping mechanisms, e.g., corresponding clasping mechanisms, that are configured for interacting with one another so as to couple the top and bottom members together, e.g., in a liquid-proof seal.

In another embodiment, for instance, where the housing is intended to house a device with a screen, such as an interactive screen, the front and/or back surfaces of the top and/or bottom member of the housing may each include at least one or more membranes. For instance, the top or bottom member may include a membrane, such as a membrane that is configured for interfacing with an interactive screen, e.g., a touch screen, of an encased device in such a manner that when a user touches the membrane one or more characteristics of that touch are transferred to the touch screen of the underlying device, and in this manner a user is able to manipulate the screen of the encased device.

In certain embodiments, a front and/or bottom surface membrane is not provided or is provided as a separate element from the housing. For instance, in certain embodiments, a top and/or bottom member of the housing may include a perimeter portion only, which perimeter portion circumscribes the device to be encased but does not otherwise include a top and/or bottom surface element that spans from one perimeter portion to the other. In such an embodiment, the top and/or bottom member may be configured for interfacing with the perimeter of the top and/or bottom surface of a device to be encased in such a manner so as to provide a liquid and/or shockproof seal therewith. In certain embodiments, the top and bottom member of the housing may be formed of a single element or may be composed of separate elements. In certain instances, the top and bottom member may be adapted to interact with a separate top and/or bottom surface element, such as a top and/or bottom surface membrane member.

For instance, the top and/or bottom member may be configured for interacting with a surface membrane member in such a way that when the top and bottom member are coupled together, said coupling together secures the surface membrane across the surface of the top and/or bottom members. In other embodiments, the top and/or bottom member may be a single member that circumscribes the perimeter of the device to be contained, and further configured for interfacing with a separate surface membrane so as to provide a liquid proof seal therewith. For example, the surface membrane may span from one perimeter of a device to be encased to another and may include an adhesive that allows the surface membrane to securely attach to the surface of the device, while the perimeter portion fits over the perimeter of the device and may or may not interact with the surface membrane attachment, but together they function to make the device both liquid proof and shockproof. In certain embodiments, only a perimeter portion or only a front or back surface membrane portion may be provided.

As described herein below, one or more membranes or portions thereof may be included herein as part of the front and/or back surface of the top or bottom member or may be provided as the entire top and/or bottom member. The membrane may include a perimeter portion and/or may interact with a perimeter portion of the housing. Accordingly, the perimeter portion of the membrane may be configured so as to interface with a perimeter portion, such as an inner and/or outer perimeter portion, of the top and/or bottom member. For instance, the perimeter portion of a top and/or bottom member, such as the perimeter portion of a top member, may include a plurality of sub-portions, such as a first sub-portion, e.g., an interior perimeter portion, that includes an interior membrane interfacing member, and a second sub-portion, e.g., an exterior perimeter portion, that includes an exterior membrane interfacing member, which interfacing members are configured for interfacing with a front and back surface of a perimeter portion of the membrane, such as in an overmould fashion.

Accordingly, in certain embodiments, the membrane may be configured such that it spans from one side of the perimeter, e.g., of a top or bottom member, to another side of the perimeter in such a manner that the back surface of the membrane associates with at least the interior membrane interfacing member of the interior perimeter portion, and the front surface of the membrane associates with the exterior membrane interfacing member of the outer perimeter portion.

Hence, in some embodiments, such as where a front surface membrane is provided, e.g., on a top member, the membrane may completely cover the front surface of an electronic device when the device is encased within the housing, and in some embodiments, the membrane may cover less than the entire front surface, such as covering only a perimeter portion of the front surface thereby leaving the interactive touch portion of the front screen of the electronic device uncovered. In such an instance, the perimeter portion of the membrane may include a gasket so as to maintain the housing's overall waterproofness, such as a gasket that circumscribes the entire perimeter portion of the top member front surface membrane.

In other embodiments, a front and/or bottom surface membrane need not be provided. Rather, the perimeter portion of the top and/or bottom member may be configured for interfacing with an encased device in such a manner so as to make the perimeter portion of an encased device waterproof and shockproof. For instance, the perimeter portion may include a gasket that compresses against one or more of the surfaces of an encased device thereby preventing liquid from penetrating there between. One or more other gaskets may also be provided and configured as stickers that may be placed on or around an encased device so as to cover various different sound transmission ports of the encased device thereby rendering the encased device entirely waterproof. Such gasket covering stickers may be provided entirely on their own or in combination with a perimeter portion.

The membrane, e.g., a first membrane, may have one or more features, such as additional membrane features, for instance, an acoustic membrane feature and/or a button feature. For example, the first membrane may include an acoustic membrane feature, which acoustic membrane feature may include an aperture spanning from the front to the back surface of the first membrane. The aperture may be covered by a second membrane, such as an acoustically transmissive membrane that is offset from the first membrane. The acoustic membrane may be offset from the first membrane by any suitable element, such as by the addition of a spacer member. Accordingly, the two or more membranes may be attached to one another via a suitable adhesive.

The first membrane may additionally include a button feature. The button feature may include an indented region. The indented region may simply be an indented region in the first membrane or it may be a cut-out region that has been overlaid with an additional membrane. In various instances, the indented region is at least partially circumscribed by a ridge region. For instance, in one embodiment, the perimeter portion of the button feature may include a raised deformable perimeter portion that surrounds the indented region. The raised deformable perimeter portion may be configured so as to allow a measure of travel for the indented region of the button feature such that when the indented region is depressed the raised portion is deformed thereby allowing the indented region to travel without causing significant stretching of the first membrane.

The first membrane may also include optically opaque regions and/or optically transmissive regions, such as an optically transmissive region coincident with a proximity sensor or video camera portion of an underlying device meant to be housed by the housing. In various embodiments, a front surface membrane may be configured so as to include an optical lens, which optical lens is configured for aligning with a camera or video lens of an encased device.

In an additional embodiment, along with a perimeter portion and/or a front surface membrane, a bottom member may be provided. The bottom member may be comprised simply of a perimeter portion or may include a bottom surface member that spans from one perimeter portion to the other. The bottom member may include one or more features. For instance, the bottom member may include a lens feature, such as a feature that includes one or more lenses, for instance, a camera and/or video lens and/or a flash lens. The lens feature may additionally include an optical skirt, such as a skirt that surrounds the one or more lenses and prevents the transmission of light there through from one lens region to the other lens region.

In a further instance, a perimeter portion, such as a distal end portion, may include a latch feature, for instance, a latch feature for enclosing an opening, such as a port opening. The latch feature may include a lower latch interface, a latch, and an upper latch interface, such that the latch is configured for moving from a closed position, where the latch is in contact with both the lower and upper latch interfaces, to an open position, where the latch is in contact with only one of the lower or upper latch interfaces. In certain instances, that latch feature may be positioned entirely on a top or bottom member, and in other instances, portions of the latch feature are included on both top and bottom members. In various embodiments, the latch feature is liquid-proof and/or dust-proof and may include a gasket so as to provide a liquid and/or dust proof seal when the latch is in the closed position.

In another instance, the perimeter portion, such as a distal or proximal perimeter end portion, may include one or more acoustic vent features for transmitting and/or channeling sound. For instance, an acoustic vent feature may include a sound channel having an acoustic vent material positioned therein. The acoustic vent material may span the sound channel at an angle from 0 to 180 degrees in a forward or reverse direction. The sound channel may extend from an exterior portion of the perimeter to an interior portion of the perimeter so as to permit the ingress and egress of sound there through, and the acoustic vent material may transect the sound channel, e.g., at an angle with respect to a centerline there through, so as to prevent the ingress (or egress) of water there through.

In one instance, the perimeter portion, such as one of the opposing side portions, may include a switch feature for engaging a switch mechanism of an encased device. The switch feature may include a switch housing and an actuator having a switch interface. The switch feature may additionally include an axle configured for being coupled to the switch housing and/or the switch interface. The switch feature may be configured such that as the actuator moves, such as rotates about the axle (if included), from a first position to a second position within the switch housing, the switch interface causes the switch to move from a first to a second position, such as from an "on" to an "off" position. In certain embodiments, one or more protective bumper portions may be positioned around the one or more switches or buttons so as to protect them from impact.

In another embodiment, an outer perimeter portion may include a slot feature, such as a coin slot feature, for assisting in separating the top member of the housing from the bottom member of the housing. The slot feature may include an indented or cut out portion of the perimeter. The cut out portion may be positioned in one or both of the top and bottom members. Accordingly, the cut out portion may be positioned on a top and/or bottom portion and is further bounded by one or a plurality of overhang regions, which overhang region or regions may be positioned in one or both of the top and bottom members thereby bounding the cut out portion. For instance, in one embodiment, the top member includes the cutout portion, and both the top and bottom member include corresponding overhang portions. A coin may be placed within the slot and twisted thereby causing the top member to move away from the bottom member.

In a further embodiment, the outer perimeter portion may include a noise cancelling feature for assisting in the cancelling of noise, such as ambient noise. The noise cancelling feature may include one or more of an aperture, e.g., positioned in one or both of the top and bottom member, an acoustic membrane, and a sound guide channel. The sound guide channel may traverse from the exterior of the housing to the interior of the housing and may be configured for directing sound from the aperture toward a noise cancelling feature, such as a microphone, present on an encased electronic device. The sound channel may be intersected by an acoustic membrane feature, which acoustic membrane may be positioned so as to intersect the sound guide channel at an angle with respect to a centerline there through. In certain embodiments, the acoustic membrane is transmissive for gas, e.g., sound waves, but not for liquid. Further, in certain embodiments, the interior portion of the noise cancelling feature may include a configuration that is adapted for preventing the transmission, e.g., refraction, of sound from within the case from entering the noise cancelling microphone of an encased device and thereby causing an echo. Such a feature may include a raised portion that circumscribes the noise cancelling microphone, when the device is encased within the housing, and may further include a gasket that circumscribes the same.

In an additional embodiment, the outer perimeter portion may include a port feature such as a headphone port feature, for instance, for receiving either a jack (such as a jack of a headphone or speaker assembly) or a closure device or the like. The port feature may include an aperture positioned in one or both of the top and/or bottom members. The aperture extends from the exterior of the assembly to the interior of the assembly. The aperture may be bounded by one or both of a gasket, such as an O-ring, and a threaded or cammed region, which threaded or cammed region may be configured for receiving a corresponding threaded or cammed region present on either the jack or the closure device to be inserted therein. The threaded region may be configured as a typical thread feature or may be configured as a cam feature.

The details of one or more variations of the subject matter described herein are set forth in the accompanying drawings and the following description.

BRIEF DESCRIPTION OF THE DRAWINGS

These and other aspects will now be described in detail with reference to the appended drawings. Like reference symbols in the various drawings indicate like elements.

FIGS. 1A-1D provide various perspective views of the front, back, and side surfaces of a housing of the disclosure.

FIGS. 3I-3J provide a perspective view of another embodiment of a housing of the disclosure wherein the housing does not include a front surface membrane.

FIGS. 5A-5D provide various views of a top member surface membrane of a housing of the disclosure.

FIGS. 7A-7C provide a perspective view of a button feature and proximal portion of a housing of the disclosure.

FIGS. 8A-8J provide various views of a lens feature of a housing of the disclosure.

FIGS. 10A-10K provide various views of a sound transmission portion positioned at a proximal end of a housing of the disclosure.

FIGS. 16A-16F provide various views of a waterproof jack and a correspondingly configured port opening of a housing of the disclosure.

FIGS. 17A-17I provide various views of an adapter for use with a housing of the disclosure.

DETAILED DESCRIPTION

Figure 1B:
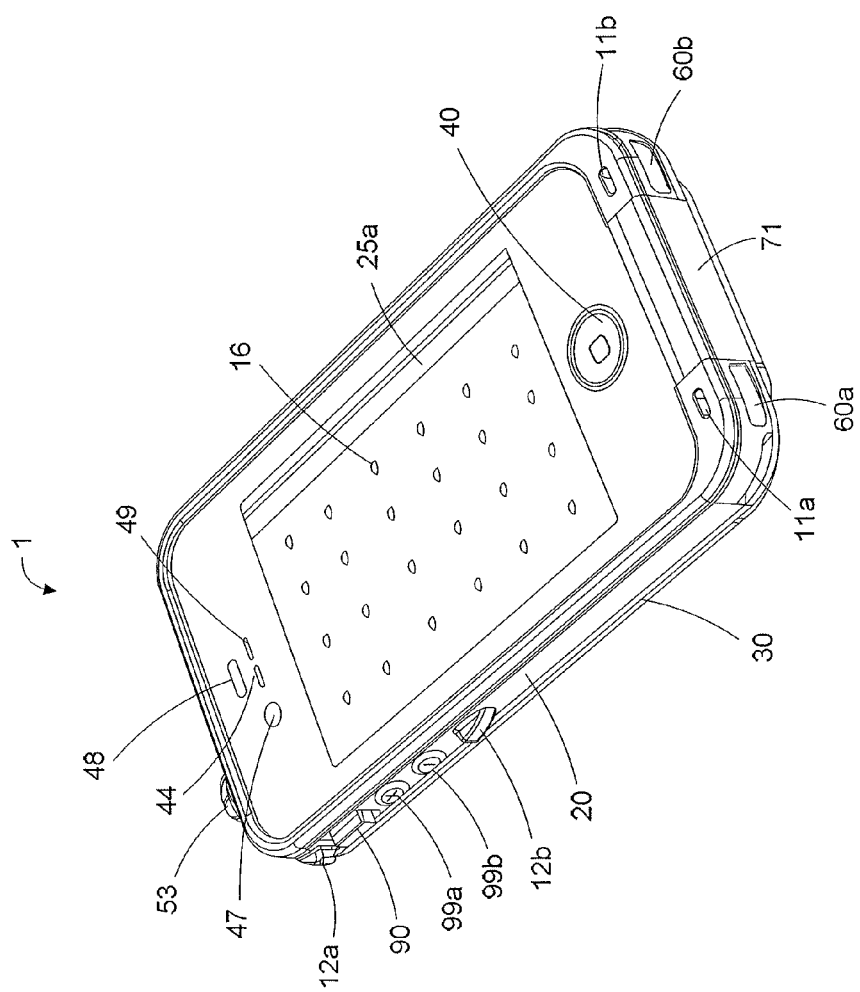

The subject matter described herein relates generally to a housing for encasing an object. It is to be understood that although the singular "object" is used herein, the term encompasses one or more objects. The object or objects may be any object that is capable of being fit within the housing and/or in need of protecting from one or more adverse environmental conditions, inclement weather, mishandling and/or damage, such as damage from contacting a liquid, such as water, or damage from dropping. The housing may be of any appropriate size and dimension so long as it is capable of housing the object and protecting it, for instance, from adverse environmental conditions and/or rough treatment. The object may be fabricated, e.g., a textile; manufactured; e.g., an electronic or mechanical device; synthesized; naturally occurring; processed; perishable, e.g., a food product; a precious item; and the like. The object may be a single object, like an electronic device, or may be a plurality of objects, such as components that make up an electronic device.

The housing may be in the form of any typical container known and used in the art for containing the particular object. For example, the container can be a cargo or transport container configured for opening and closing, a suitcase, a briefcase, a messenger container, a meal container, a medicine container, first aid kit, a cooler container, a heating container, a food or drink container, or any other form of container meant to contain an object and prevent it from being damaged due to environmental factors and/or mishandling.

In certain embodiments, the housing may be a case configured for encasing a device, such as an electronic device, for example, a mobile telephone device. In other instances, the housing is part of a device, such as an electronic device, which housing encases various components of the electronic device. For example, the housing may be the housing of a mobile device, or other electronic device, that encases the electronic components of the mobile device (or other electronic device).

Accordingly, in various aspects, a housing for encasing an object, such as device, methods of using the object, e.g., device, and/or systems for the same are provided. For instance, in one particular embodiment, a housing for encasing a device, such as an electronic device, is provided. The housing may be configured such that the device may be fitted within the housing and be protected thereby, such as from liquid or shock. The housing may include a plurality of separate members, such as a top member and a bottom member that are designed to be coupled together, or may include two members that are joined by a common member, e.g., a hinge member, which members are designed to come together around an object to be encased so as to form a liquid-tight seal. In certain embodiments, the housing may be comprised of a single member that is configured to be folded upon itself around the device to be encased, in such an instance, a portion of the member may comprise a top member and another portion of the member may comprise a bottom member.

There are several advantages achieved by the housings provided herein. For instance, in certain instances, a housing of the disclosure may provide a measure of shock absorbance for the protection of an encased device or components thereof. In certain instances, the housing may be configured to provide a measure of liquid-resistance for the protection of the encased device and/or components thereof. For example, in various instances, the housing may be shockproof and/or liquid proof. A housing as disclosed herein can also provide protection against the scratching, marring, chipping, breaking, fracturing, and the like of the underlying device or components thereof. In certain instances, the shock and/or liquid, e.g., water, resistance is provided while at the same time as maintaining the unique technical or design features of the encased device. In various instances, the housing is designed to increase the sound transmission qualities of the underlying device, e.g., for amplifying sound and/or sound quality. In some instances, these advantages are provided by the housing without substantially increasing the size and/or the weight of the underlying device.

For instance, in some embodiments, the dimensions of the housing fall within the following ranges. The thickness of the various members, e.g., a top or bottom member, which members may be separate individual members capable of being coupled together, e.g., by snapping, joined by a common hinge, or a single member, and may have a thickness of about 25.4 mm or less, such as 20 mm or less, for instance, about 15 mm or less, including about 10 mm or less, such as about 8 mm, or about 5 mm, for instance, about 4 mm or less, including about 3 mm or about 2 mm or less, for example, about 1.5 mm or 1.0 mm or less, even about 0.1 mm.

For example, in various instances, such as where the device to be contained is a mobile telephone or PDA device, the thickness of a top and/or bottom member may be less than about 2.5 mm, such as less than about 2.0 mm, less than about 1.5 mm, for example, less than 1 mm thick, such as about 0.1 mm thick. Where the device to be contained is a mobile computer, such as a mobile tablet computer, electronic reader, or video display, the thickness of a top and/or bottom member may be less than about 5 mm, less than about 4.5 mm or about 4 mm, such as less than 3.5 mm or less than about 3 mm or less than 2.5 mm, such as less than about 2.0 mm, less than about 1.5 mm, for example, less than 1 mm thick, such as about 0.1 mm thick.

In certain instances, such as where the object to be contained is a mobile electronic device, the weight of a top and/or bottom member of the housing may be less than about 5 or about 4 ounces, such as less than about 4 or about 3 ounces, for instance, less than about 2 ounces or about 1 ounce, including less than about 28 or about 27 grams. Accordingly, in one embodiment, due to the design features described herein, a housing of the disclosure is capable of providing shock and liquid resistance to a housed device, while only having a thickness and/or weight in the range recited above.

Further, in certain instances, the length and/or width of the top or bottom member may be such that it is no longer or wider than about 10 mm of the underlying device it is designed to encase, no longer or wider than about 8 mm or about 5 mm, for instance, no longer or wider than about 4 mm, including no longer or wider than about 3 mm or about 2 mm than the device the housing is designed to encase. For example, in various instances, the length and/or width of a top and/or bottom member may be less than 2.5 mm, such as less than 2.0 mm, less than 1.5 mm, for example, less than 1 mm more than the length and/or width of the device the housing is designed to house. Accordingly, in certain instances, a housing of the disclosure is configured so as to be substantially form fitting with the device it is meant to contain.

In one embodiment, due to the design features described herein, a housing of the disclosure is capable of providing shock and liquid resistance to a housed device, while only having a relative length and/or width in the ranges recited above. Several formulas may be employed for determining an adequate width and/or length of a particular housing, and thus, may be easily ascertained by determining the width and/or length of the underlying device, x, and providing a housing that has a dimension, y, such as one of the dimensions recited above, that is in addition to the dimension of the underlying device. Specifically, if the dimension of the device is x, then the dimension of the housing will be (x+y), where y is one of the dimensions set forth above, such as about 0.5 mm, about 1 mm, about 1.5 mm, about 2 mm, about 2.5 mm, about 3 mm, about 3.5 mm, etc. thicker, wider, and/or longer than the housed device. An alternative formula for determining an adequate length, width, or thickness of a housing may be to measure the distance y from the interior of the housing, which contacts the encased device, to the exterior of the housing, wherein y is within one of the ranges recited above.

To ensure the appropriate thickness, length, and/or width and/or weight of the housing have been provided, the device may be fitted within the housing, then the housing closed, and the housing and/or seal thereof may be tested for its ability to provide shock and/or liquid resistance, such as by experimentally dropping the housed device and/or exposing it to wet conditions. See, for instance, the examples section below. The thickness, length, and/or width and/or weight of the housing should be provided in such dimensions so that the encased device is not broken, cracked, or otherwise damaged by the dropping and/or exposure to liquid, e.g., water in all its forms.

It is to be noted that in certain instances, the housing may be larger, e.g., substantially larger, than the object the housing is configured to house, such as where there is little or no utility for having the size of the housing tied to the object it is configured to house. For instance, where it is determined that it would be beneficial to have a housing that is substantially thicker, wider, and longer than an underlying device, than the dimensions of the housing may be thicker, wider, and longer than those dimensions recited herein, such as greater than about 10 mm or more or greater than about 5 or about 10 ounces or more. In other instances, the housing is not substantially larger and/or heavier than the device it is designed to encase. Accordingly, in certain instances, the housing protects the device from one or more of a shock, such as that caused by dropping the device, and/or from liquid, such as that caused from contact with a liquid, such as water, without being much thicker, wider, longer, or heavier than the device it is configured to encase.

In certain embodiments the top member and the bottom member of the housing are configured for being coupled together so as to from a waterproof and/or shockproof seal. By water-resistant or waterproof seal is meant that a seal is formed by the coupling of the top member with the bottom member which seal does not substantially allow the passage of liquid, e.g., water, from one side of the housing (e.g., outside of the housing) to the other side of the housing (e.g., inside of the housing).

As can be seen with respect to FIG. 1A, the housing may include a plurality of members, such as a top member and a bottom member that are configured for being removably coupled together so as to form the housing 1. It is to be understood that although a particular embodiment is presented herein, such as a housing 1 for encasing an electronic device, such as a mobile phone, therein, the object to be housed may be any of a number of different objects, as described above, and the housing may, therefore, have a number of different shapes, sizes, and configurations without departing from the nature of the disclosure. For instance, as herein depicted below, the housing may include two separate members, e.g., separate individual top and bottom members, that are configured for being removably coupled together so as to surround an electronic device and thereby encase the device. In certain instances, (not shown) the top and bottom members may not be separate members, but rather may be members that are joined, for instance, by a common hinge element, or a single member configured for being folded upon itself and thereby forming the housing. Hence, the scope of the housings and systems described herein with respect to the particular embodiments set forth in reference to the figures is not intended to be unduly limiting.

Accordingly, with respect to FIG. 1B, in particular embodiments, the housing 1 may include a top member 2 and a bottom member 3 that when removably coupled together form the housing 1. The top and bottom members may be fabricated from any suitable material but typically are fabricated from materials that are capable of providing one or more of shock and liquid resistance to an encased device when the top and bottom members are properly coupled together. In certain embodiments, the top and bottom members may be composed of various different components and therefore may be fabricated from a plurality of different materials. Suitable materials from which the top and bottom member may be fabricated include rigid, semi-rigid, and flexible materials that may be fabricated together so as to provide shock and/or liquid resistance to the housing. Such materials may include but are not hereby limited to plastics, metals, polycarbonates, nylon, liquid crystal polymers, and/or rubber, thermal plastic urethanes, polyethylenes, and/or polypropylenes, mixtures thereof and the like.

As can be seen with respect to FIGS. 1A and 1B, the top member 2 of the housing 1 includes a front surface 25a and a back surface 25b that is surrounded by a perimeter portion 20. The perimeter portion 20 is defined by a proximal end portion 21 and a distal end portion 22 as well as opposing side portions 23 and 24. The perimeter portion 20 may include a plurality of additional features, such as an "on" and "off" switch 16, a headphone port sealing member 53, button protection elements 12 a and b, which protection elements are configured for protecting a switch element 90 and button features 99a and 99b, as well as a latch door 71, which may be positioned in between sound inlet/outlet apertures 11a and 11b. The front and back surfaces of the top member may be composed of the same material or different materials which materials may be the same or different from the material or materials of the perimeter portion. In certain embodiments, the front 25a and back 25b surface of the housing 1 are comprised of at least one membrane.

Additionally, a bottom member 3 of the housing 1 includes a front 35 and a back 36 surface surrounded by a perimeter portion 30. The perimeter portion 30 is defined by a proximal and a distal end portions 31 and 32 as well as opposing side portions 33 and 34 respectively. The front and back surfaces of the bottom member may be composed of the same material or different materials which materials may be the same or different from the material or materials of the perimeter portion. In certain embodiments, the front 35 and back 36 surface of the housing 1 are comprised of at least one membrane. In other instances, the front 35a and a back 35b surface of the housing 1 is formed of a semi-rigid material, such as polypropylene, that is capable of vibrating in such a manner that it amplifies the sound characteristics emitted from an encased device. As depicted the front surface 35a of the bottom member 3 includes standoffs 16. These standoffs may be positioned anywhere along the front surface 35a of the bottom member, or they may be positioned in such a manner so as to create an audio channel so as to increase the transmission and/or amplification of sound, for instance, be creating an air gap between the front bottom surface 35a and a back surface 135 of a housed device. Such an air gap can both channel sound away from the housing 1 and may further amplify sound by reflecting off of the two surfaces.

Figure 1C:
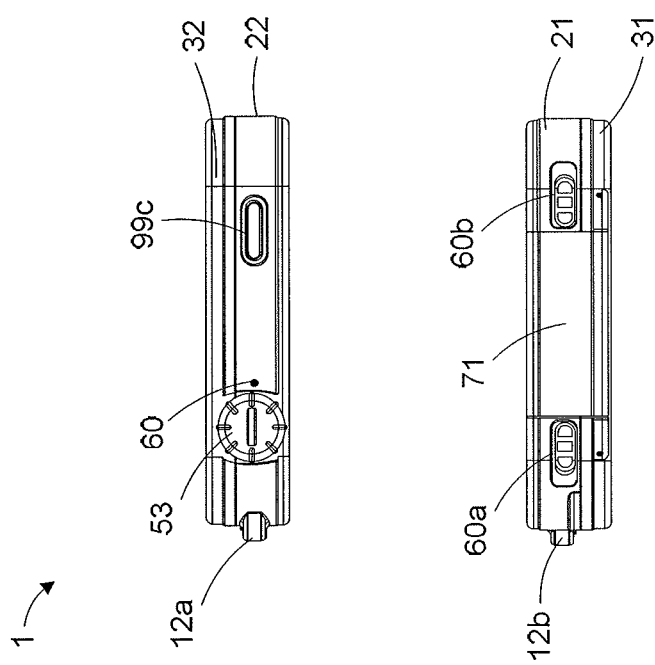
Figure 1D:
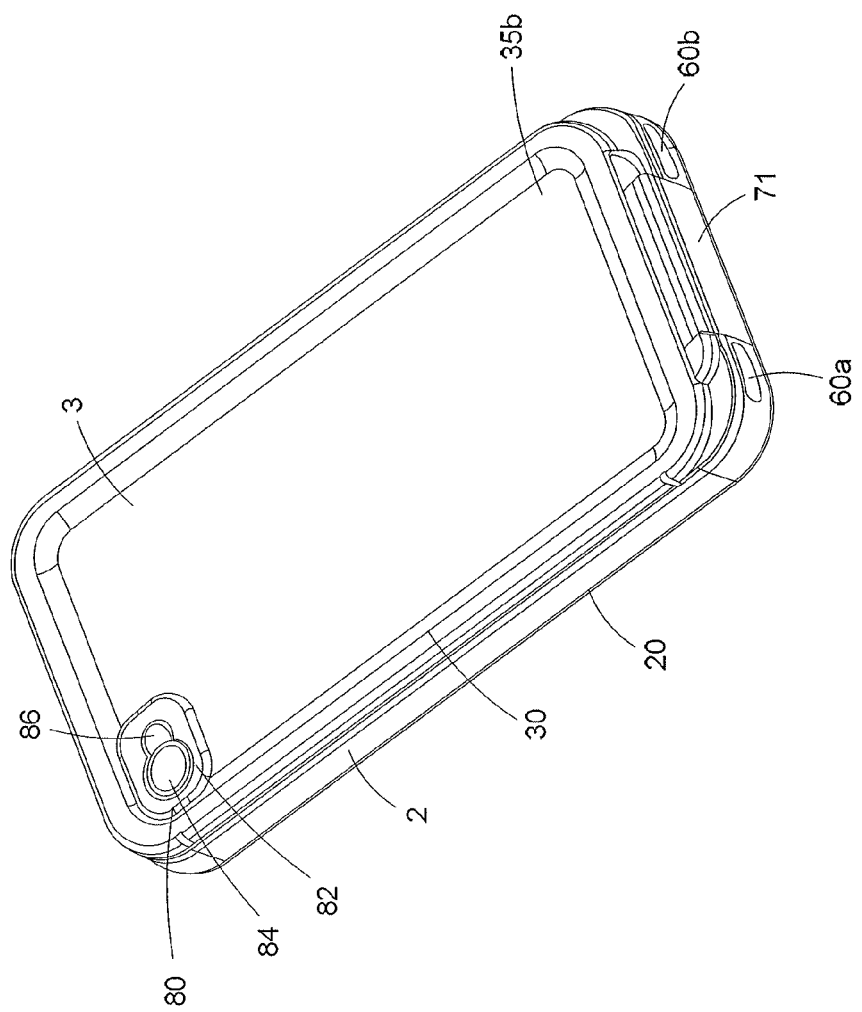

FIG. 1C provides a housing 1 including a top member 2 and a bottom member 3 prior to being fitted around an electronic device 100 to be fitted therein. As depicted, the top 2 and bottom member 3 are aligned with respect to a device 100 to be contained within the housing 1, prior to them being fitted around the device and snapped together. Also depicted are top 2 and bottom 3 members as they would be subsequent to being coupled together around device 100. FIG. 1D provides a perspective view of the housing 1 of FIG. 1C this time from a bottom up view.

Depicted are the top 25 and bottom surface 35 as well as perimeter portions 20 and 30 of the housing 1. The top 25 or bottom 35 surface may include one or more features, such as an acoustic membrane feature 44 and/or a button feature 40. One or more of the outer perimeter portions 20 and/or 30 may also include features. For instance, an outer perimeter portion, e.g., 20 or 30, may include a slider switch 90, one or more button features 99 a, b, and/or a latch feature 71. As depicted, the slider switch 90 and button features 99 a, b are positioned on the top member 2, and the latch feature 71 spans from the bottom member 3 to the top member 2. In other embodiments, one or more of these positions may be reversed.

FIG. 1D provides a perspective view of the bottom back surface 36 and perimeter portions 20 and 30 of the housing 1. The bottom back surface 36 may include one or more features, such as a camera portion 80, which camera portion 80 may include a plurality of sub-portions, such as an optical skirt 82, a camera lens 84, and/or a flash lens or orifice 86.

Figure 2A:
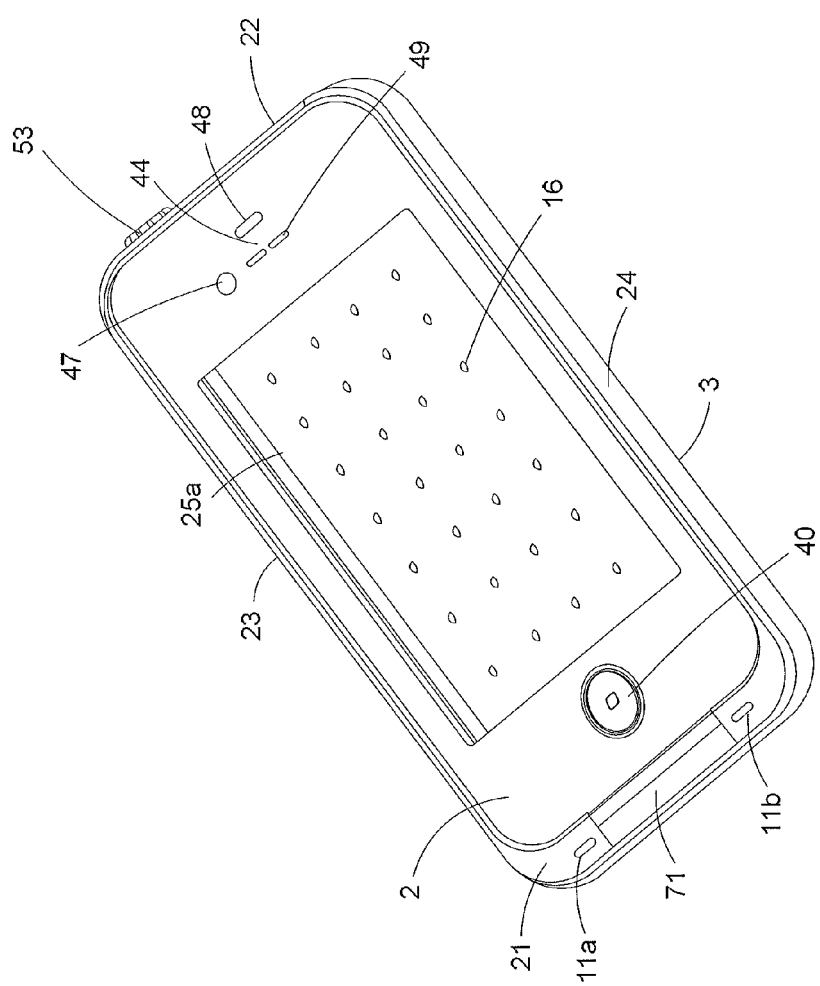
FIGS. 2A-2D provide perspective views of a housing of the disclosure including a front top and front bottom view.

FIG. 2A provides a perspective view of an assembled housing 1, wherein a device to be encased therein is not present. The top front and back surface 25 a,b and outer perimeter portion 20 of the top member 2 as well as the bottom front surface 35 and perimeter portion 30 of the bottom member 3 are depicted. In this embodiment, the top front and back surface 25 is composed of a single translucent membrane. Accordingly, the bottom front surface 35 of the bottom member 3 is seen through the translucent membrane 25 of the top member 2. A portion of the translucent membrane 25 may be configured so as to include one or more opaque regions, such as towards the perimeter of the membrane, which opaque region circumscribes a visibly translucent area. An opaque region may be entirely opaque or may include optically transmissive sub-regions.

As depicted, the top membrane 25 includes a plurality of features. For instance, the top membrane 25 includes a button feature 40, optically clear regions 47 and 48, e.g., corresponding to a video camera portion and a proximity sensor portion of an encased device, respectively; and an acoustic membrane portion 44 including apertures 46 for transmitting sound. Apertures 46 are prevented from passing liquid there through by the presence of a waterproof gasket 45, which gasket is permissive to sound but not to liquid. Such a gasket may be comprised of several different water phobic materials such as GoreTex® and the like. As depicted, the outer perimeter portion also includes a plurality of features including a plurality of speaker sound transmission portions 60 and a latch feature 70 including a latch cover 71 for covering a charge port. Also depicted are stand-offs 16 which may be included on the bottom front surface 35 so as to allow separation between and encased device and the bottom member, for instance, for greater shock absorbance and enhanced sound transmission.

Figure 2B:
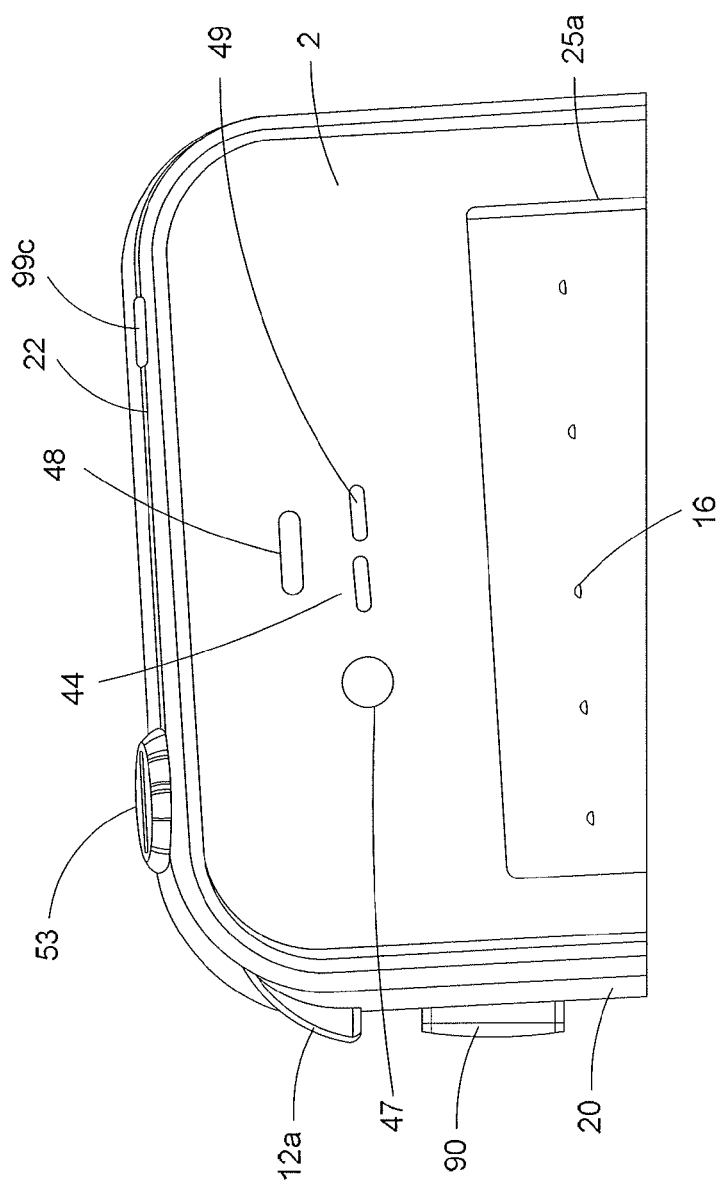

FIG. 2B provides an up close view of the front top portion of the housing 1 of FIG. 2A. The top front surface 25 comprises a transparent membrane that includes an opaque perimeter. As illustrated in this embodiment, the top front membrane 25 includes an acoustic membrane portion 44, including an aperture 46, e.g., for transmission of sound through an acoustic vent 45, an optically clear region 47, configured for being used in conjunction with a video camera of an underlying device, and another optically clear region 48, configured for being used in conjunction with a proximity sensor of an underlying device. It is to be noted that if desired, the optically clear region 47 may be configured to include a lens 80, which lens may be aligned with a camera lens of an underlying device.

Figure 2C:
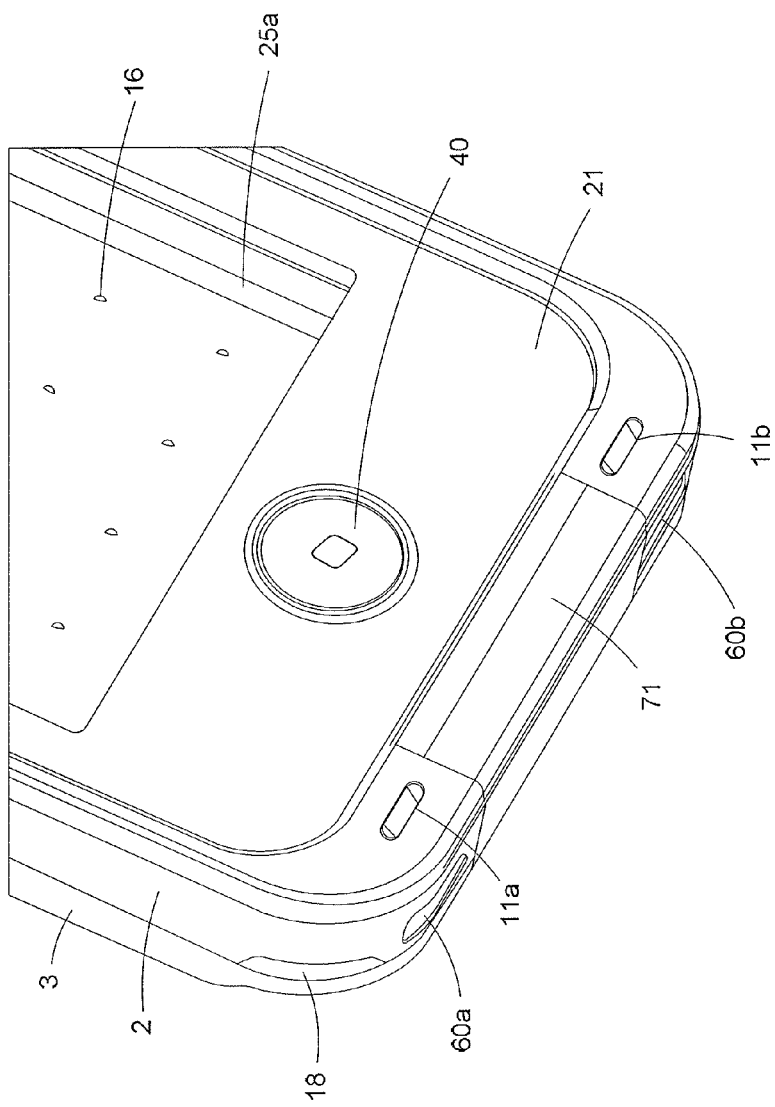

FIG. 2C provides an up close view of a front bottom portion of the housing 1 of FIG. 2A. The bottom portion of the front surface 25 comprises a membrane which includes a button feature 40. The membrane 25 is transparent but includes an optically transmissive portion and an opaque perimeter that is not optically transmissive. Also depicted are sound transmission portions 60 *a* and *b* and a perimeter latch feature 70 both of which, in this embodiment, are positioned at the proximal end 21,31 of the housing 1.

The front and/or back surfaces of the top and/or bottom member of the housing include a perimeter portion. In certain embodiments, the perimeter portion of the top and/or bottom member may include a plurality of sub-portions. For instance, the perimeter portion of a top member 2 may include an interior 20*a* and an exterior 20*b* perimeter portion, which perimeter portions may be configured for interacting with different portions of a top member membrane 25. In certain embodiments, the perimeter portion of a bottom member 3 may include an interior 30*a* and an exterior 30*b* perimeter portion. In certain instances, one or both of the interior 30*a* and exterior 30*b* portions may form an interior bounding member and an exterior bounding member which together may in turn form a channel 10. As depicted, the channel 10 is positioned on the bottom member 3, but this configuration may alternatively be included on the top member 2 and vice-versa.

The perimeter portion of a top and bottom member, or a sub-portion thereof, may be fabricated from any suitable material. The perimeter portion may be fabricated from the same material as a top and/or bottom surface member or may be fabricated from one or more different materials than the top and/or bottom surface members. For instance, in various instances, such as when there is an interior and exterior perimeter portion, such as on a top member, the interior perimeter portion may be fabricated from a rigid material, such as a rigid plastic, polycarbonate, or the like, so as to provide structural integrity to the housing, whereas the outer perimeter portion may be fabricated from a more flexible, e.g., semi-rigid or flexible material, such as a polyethylene or polypropylene material, or the like, so as to provide the perimeter of the housing with a measure of shock absorbance and protection.

Figure 2D:
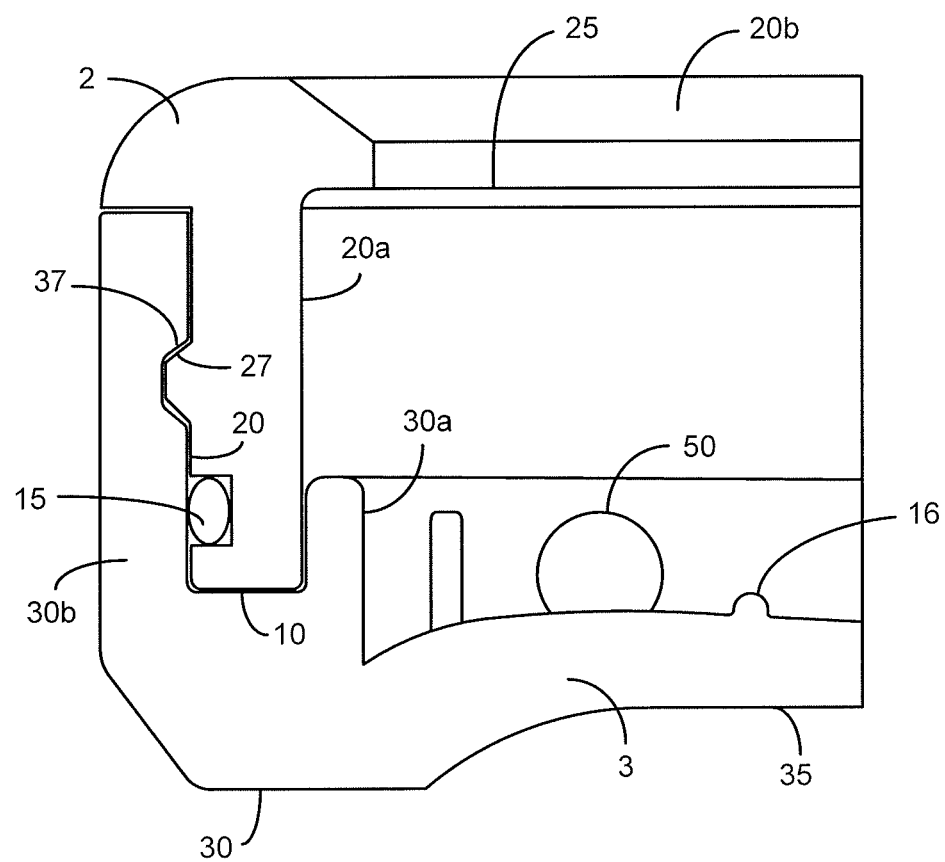

Hence, in certain instances, as depicted in FIG. 2D, the top member includes a more rigid interior perimeter portion 20*a* that is coupled with a more flexible exterior perimeter portion 20*b*. The rigid interior perimeter portion 20*a* provides structure to the top member of the housing, while the flexible exterior perimeter portion 20*b* of the housing provides shock absorbance. As depicted the interior 20*a* and exterior 20*b* perimeter portions are integrally formed together, such as in the manufacturing process, but in other embodiments they may be two separate elements that are capable of being coupled together after the manufacturing process. Accordingly, in some embodiments, the top member 2 may include a perimeter portion 20 that includes a rigid skeletal frame 20*a*, such as a polycarbonate frame, which frame is further associated with, e.g., is overmoulded with, a more flexible material, such as a rubber or a urethane material such as a polyethylene or the like, so as to form an exterior perimeter portion 20*b*.

Further, in certain instances, a perimeter portion of a top or bottom member may include an interior and exterior bounding member. For instance, as depicted in FIG. 2D, bottom member 3 includes a perimeter portion 30, which perimeter portion 30 further includes an interior bounding member 30*a* and an exterior bounding member 30*b*. The interior and exterior bounding members may be fabricated from the same or different materials, such as a rigid material, like a rigid plastic, or the like, or a semi-rigid material, such as a polypropylene material, so as to provide structural integrity to a channel positioned between the interior and exterior bounding members of the bottom member of the housing. The interior 30*a* and exterior 30*b* bounding members may be configured in such a manner so as to form a channel 10 there between.

Hence, in one embodiment, one or both of the top and bottom members may include a channel, such as a channel that extends along at least a portion of the perimeter portion of the top and/or bottom member. It is to be noted that with respect to this instance, the top and bottom members may be separate members configured for being removably coupled together, or they can be a single or a plurality of members joined by a hinge element. The channel may comprise an interior bounding member and an exterior bounding member, which bounding members may at least partially define the bounds of the channel. The channel may further include a gasket, such as an o-ring, positioned within the channel.

In certain instances, the interior and exterior bounding members may run along a portion or the entire perimeter of the top and/or bottom member of the housing. As depicted in FIG. 2D, the interior 30*a* and exterior 30*b* bounding members forming channel 10 circumscribe the entire perimeter portion 30 of bottom member 3. One or both of the interior or exterior bounding members may include a clasping mechanism that also runs along a portion or the entire perimeter of the top and/or bottom member. In this instance, the exterior bounding member 30*b* runs along the entire perimeter of the bottom member 3 of the housing 1. The exterior bounding member 30*b* includes a clasping mechanism 37 that also runs along a portion or the entire perimeter of the bottom member. It is to be noted that where an interior or exterior bounding member of a channel, e.g., of a bottom member, includes a clasping mechanism, the opposing member of the housing, e.g., top member 2, may also include a clasping mechanism 27 that is configured for interacting with the clasping mechanism 37 on the interior or exterior bounding member of the bottom member 3.

The clasping mechanisms of the top and bottom member may have any suitable configuration so long as they are capable of interacting with one another in such a manner so as to couple the top member of the housing with the bottom member of the housing. In certain instances, this coupling is in such a manner so as to provide a liquid-proof seal between the top and bottom members of the housing.

Accordingly, as can be seen with respect to FIG. 2D, the top 2 and bottom 3 members of the housing 1 may include corresponding clasping mechanisms 27, 37 that extend along the perimeter portion of the top and bottom member, which clasping mechanisms may be configured for interfacing with one another in such a manner so as to couple the top 2 and bottom 3 members of the housing with one another thereby sealing the housing.

The clasping mechanism may extend around the entire perimeter of the housing members or a portion thereof. For instance, the clasping mechanisms may extend around about 99% or more, about 95%, about 90%, about 85%, about 80%, about 75%, about 70%, about 65%, about 60%, about 55%, about 50%, about 40%, about 30%, about 25%, about 20%, about 10%, or less of the perimeter, such as where the top and bottom members are joined by a suitable hinge element. For instance, where a top or bottom member includes an interior or exterior perimeter portion and/or a channel bounded by an interior or exterior bounding member, the interior and/or exterior perimeter portion may be configured such that a portion thereof forms the clasping mechanism.

In certain embodiments, the clasping mechanisms may be configured such that they lessen and/or remove the deflection that would be typical when coupling the two members of the housing together when employing a classic latching mechanism known in the art. For instance, when employing a typical latching mechanism known in the art, e.g., one that clasps at single point along a perimeter portion, deflection often occurs as a result of a latching mechanism that only exerts a closing force on discrete locations on the opposing surfaces. Such a latching mechanism leaves substantial gaps between the various tensioning points. A configuration such as this results in deflection as the two parts of the housing work against each other, because these tensioning points between the gaps are where the opposing forces get integrated and therefore are maximized.

In certain instances, the present housing and features thereof are configured for constraining these oppositional forces. For instance, the top or bottom members of the housing may include opposing clasping mechanism that are configured for dispersing these oppositional forces along the length of the housing thereby minimizing the deflection that may be caused by the sealing of the two members of the housing. In certain instances, one or both of the top or bottom member includes a channel, such as a channel that contains a gasket, a portion of which channel may include a clasping mechanism that is configured for dispersing the opposing forces throughout the channel.

For example, as depicted in FIG. 2D, a channel 10 may be included within a member of the housing, e.g., bottom member 3, which channel 10 is configured so as to constrain the oppositional forces caused by clasping the members of the housing 2 and 3 together within the channel 10. In such an instance, the oppositional forces can be constrained to the small space of the channel and further be minimized by a tight coupling of the clasping mechanisms of the top and bottom members 27 and 37, respectively. This is especially beneficial where a gasket 15, such as an o-ring, is included in the channel 10 so as to further compress the gasket and thereby generate a liquid-tight seal.

Gaskets of different sizes may be included so as to facilitate a liquid-tight sealing of the housing. A gasket may be positioned wherever a watertight sealing is beneficial, such as within channel 10. The inclusion of such a gasket, however, creates additional opposing forces as the gasket resists the compression caused by the coupling together of the two members of the housing. The clasping mechanism, therefore, may be configured to be substantially continuous along a substantial circumference of the perimeter so as to better disperse these oppositional forces. Such a continuous, circumferential clasping system may wrap around the entire or a substantial portion of the circumference of the device, minimizing transitional gaps and dispersing the oppositional forces that build up in gaps between tensioning points.

A unique feature of the perimeter portion clasping mechanisms herein depicted with respect to FIG. 2D is that they are entirely internal to the housing 1. By "entirely internal to the housing" is meant that the corresponding clasping mechanisms 27 and 37 are entirely within the bounds of the housing 1 such that when the top member 2 is coupled to the bottom member 3 (See FIG. 1B), the corresponding clasping mechanisms 27 and 37 are contained within the inside of the housing and not exterior thereto, e.g., the clasping mechanisms may be positioned along the inside of the perimeter of the housing 1. Additional latching elements, such as external latching mechanisms, can further be included, e.g., along an outside perimeter of the housing, so as to further ensure that a liquid-tight seal is provided. Additional internal latching mechanisms may also be provided.

Accordingly, a clasping system of the disclosure can provide a small cross section that solves the problems of: how to close/assemble the housing and keep it joined together, how to minimize the material necessary to make the housing (so thicker materials are not required in order to resist the band inflection), and ensuring the gasket, e.g., O-ring, is suitably compressed between the two case housings, thereby creating a liquid-proof and seamless seal.

As set forth above, a plurality of clasping mechanisms both internal and/or external may be included as part of the housing. For instance, the housing may include one or a plurality of internal clasping mechanisms and/or one or a plurality of external clasping mechanisms. As explained below, the clasping mechanisms may have a variety of different configurations. For example, the top and bottom members may each include an internal clasping mechanism that is configured as opposing catches or hooks and/or extended portions and grooves, which clasping mechanisms circumscribe an internal portion of the perimeter of the top and bottom members. Alternatively, or in addition to the opposing catch mechanisms, the top and bottom member may include an internal clasping mechanism that is configured as male and female counterparts, e.g., teeth and holes. Additionally or alternatively the housing may include an external clasping mechanism that may have any suitable configuration such as a clip or peg and slot configuration. One or more of these configurations are detailed further herein below.

In certain instances, the perimeter of the housing may include one or more additional features, such as an earphone port. In such an instance, it may be beneficial for a perimeter portion, such as an internal perimeter portion having a clasping mechanism associated therewith, to have an altered configuration so as to compensate for the space occupied by the additional perimeter feature.

For instance, as can be seen with respect to FIG. 2D, in certain embodiments, the perimeter portion 30 of the bottom member 3 includes a channel 10 defined by an interior 30*a* and exterior 30*b* bounding member. The channel 10 may have at least a portion of a gasket 15 therein, such as an O-ring, as well as a clasping mechanism 37, e.g., associated with the exterior 30*b* (or interior) bounding member. In such an instance, the exterior 20*b* (or interior) perimeter portion of the top member 20 may include a respective clasping mechanism 27 configured for being coupled to the clasping mechanism 37 associated with the exterior bounding member 30*b* of the bottom member 3. Where an additional feature, such as a port feature 50, is further included along the perimeter portion 30 of the bottom member 3, the perimeter portion 30 and clasping mechanism 37 of the bottom member 3 may have a configuration, such as a raised portion, that is adapted to accommodate the additional feature, e.g., port 50.

For example, the perimeter portion may include an increased length region, e.g., an upper lip ridge region, which region runs along a portion of the perimeter, such as along a corner region thereof. This upper ridge lip region may be configured as a ramp up. Where the ramp up is included along with a channel having a gasket therein, the ramp up will extend beyond the height of a gasket fitted within the channel. Such a feature results in a transition with a step up/step down configuration which thereby allows the top and bottom members to be joined in a manner sufficient to form a tight seal without the additional perimeter feature, e.g., earphone port, interfering with the sealing of the housing.

Specifically, an upper lip ridge feature may be included so as to allow the clasping mechanisms to clear the additional perimeter features. Such a step up/down may be positioned anywhere along the perimeter where there are features that need to be avoided, but may be of particular use around the corners of the housing. Hence, in various embodiments, an upper lip ridge feature may be included so as to allow the consistent coupling, e.g., snapping, of the top and bottom members together without having to add substantial additional material to the width or thickness of the housing member, e.g., so as to compensate for the additional perimeter feature/gasket interaction.

Additionally, such upper ridge lip features may be included along the corners of the perimeter of the housing so as to ensure better sealing regardless of whether additional features are provided. Such upper ridge lip features, therefore, may allow the closing of the housing in such a way that there is not a gap in the closure and thus the seal will be continuous. Because the seal, in this embodiment, is a continuous seal, it is able to snap down all around the circumference of the housing.

Figure 3A:
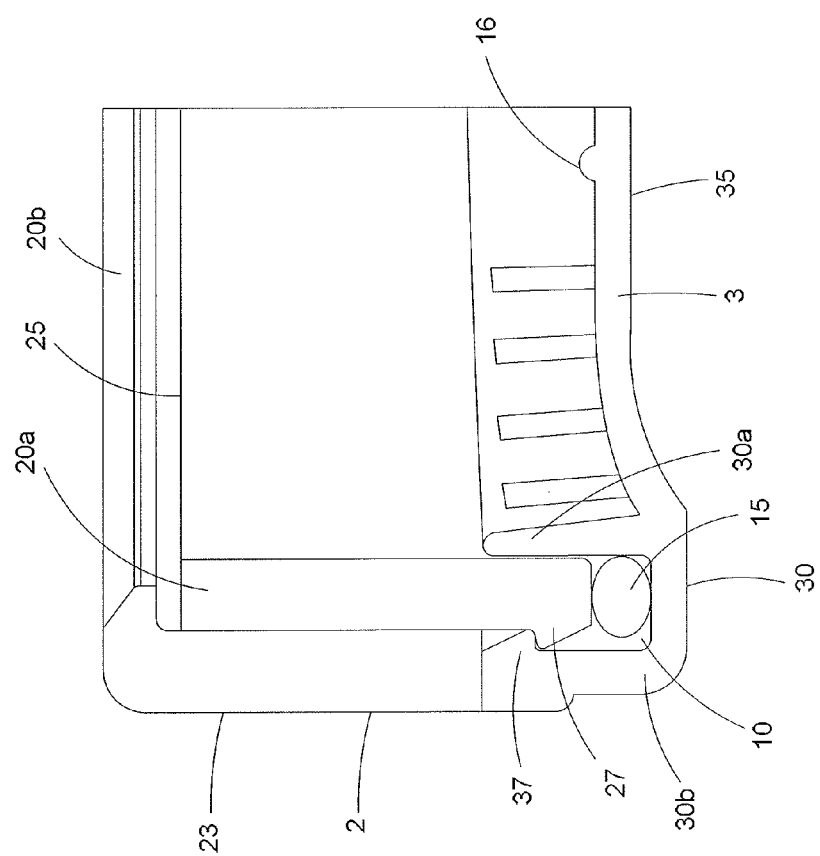
FIGS. 3A-3H provide perspective views of a latching mechanism of a housing of the disclosure.

As can be seen with respect to FIG. 3A, the front 25 and back 35 surfaces of the top 2 and bottom 3 members of the housing 1 include a perimeter portion 20 and 30, respectively. As depicted, the top member 2 includes a perimeter portion 20. The perimeter portion 20 includes an interior perimeter portion 20*a* and an exterior perimeter portion 20*b*. The interior perimeter portion 20*a* is composed of a rigid material, such as a polycarbonate material, and is configured for associating with an enclosed device so as to secure the device within the housing 1 and to dampen the transference of shock from the outer side of the housing to the interior of the housing. The exterior perimeter portion 20*b* is composed of a flexible material, such as TPE, and is positioned above and along a side of the interior perimeter portion 20*a*. The outer perimeter portion 20*b* may function to absorb shock due to impact.

The interior 20*a* and exterior 20*b* perimeter portions may be fabricated together, such as in an overmould process, or be fabricated separately and joined together. For instance, in certain embodiments, the outer perimeter portion 20*b* may be removable from the interior perimeter portion 20*a*. In other instances, the interior 20*a* and exterior 20*b* perimeter portions are fabricated together along with the front surface membrane 25, when included, in such a manner that the interior perimeter portion 20*a* associates with a bottom surface of the membrane, the exterior perimeter portion 20*b* associates with a top surface of the membrane. In such a manner as this, the membrane 25 may be integrally associated with the perimeter portion 20 of the top member 2.

A benefit of this overmould process may be the generation of a flexible protective rim, e.g., composed of the flexible TPE perimeter portion 20*b*, that circumscribes the perimeter portion 20 of the top member 2 and/or the membrane 25. It is to be noted however that such a rim may be fabricated and associated with the perimeter portion 20*a* of the top member 2 in other ways not involving such an overmould process. Additionally, in other instances, the front surface membrane 25 may be attached to an interior perimeter portion 20*a* of a top member 2 through the application of an adhesive, such as a temperature or pressure activated adhesive. In such an instance, the membrane 25 may be attached to a top surface of the perimeter portion 20*a* or a bottom surface thereof. A flexible outer perimeter portion 20*b* may then be added in either an integrated fixed manner or a removable manner. It is further noted, that in various embodiments, the interior bounding member 20*a* includes a clasping mechanism 27.

The bottom member 3 includes a perimeter portion 30. The perimeter portion 30 also includes an interior perimeter portion 30*a* and an exterior perimeter portion 30*b*. In this instance, the interior perimeter portion forms an interior bounding member 30*a* and the exterior perimeter portion forms an exterior bounding member 30*b*. Together the interior and exterior bounding members 30 *a*, *b* bound a channel 10. The exterior bounding member 30*b* includes a clasping mechanism 37.

The clasping mechanisms 27 and 37 can have any configuration so long as either clasping mechanism is capable of interacting with the corresponding clasping mechanism. In this instance, clasping mechanism 27 on top member 2 interacts with corresponding clasping mechanism 37 on bottom member 3 so as to provide a seal thereby, such as a liquid-tight seal. Hence, clasping mechanism 27 of the top member 2 is configured for interacting with a corresponding clasping mechanism 37 of the bottom member 3, which clasping mechanisms are configured for coupling the top and bottom members together, such as in a liquid-proof sealing.

As depicted, the clasping mechanism 37 is associated with exterior bounding member 30*b* of the bottom member 3, and the clasping mechanism 27 is associated with interior perimeter portion 20*a* of top member 2. It is to be noted, however, that clasping mechanism 37 may be associated with interior bounding member 30*a* of the bottom member 3, and the clasping mechanism 27 may be associated with exterior perimeter portion 20*b* of top member 2. The channel 10 further includes a gasket 15, such as an O-ring gasket. In this embodiment the clasping mechanisms 27 and 37 are configured as corresponding catches but may have other configurations, such as a rib with extended protrusion member and groove configuration, and the like. It is to be noted, that in this embodiment, the clasping mechanisms 27 and 37 are entirely internal clasping mechanisms. By "entirely internal clasping mechanisms" is meant that the clasping mechanisms are configured for being coupled together in such a manner that when the top and bottom members are coupled together and the housing formed, the clasping mechanisms are entirely internal to the outer bounds of the housing, e.g., they are internal to the housing, such as contained within an internal cavity within the housing. Such internal clasping mechanisms are internal to the housing and not observable by looking at the external perimeter portion.

It is to be noted that although the bottom member perimeter portion 30 is depicted as having bounding members 30*a* and 30*b*, and the top member perimeter portion 20 is depicted as having interior and exterior perimeter portions 20*a* and 20*b*, in certain instances, the top member perimeter portion 20 may have bounding members, e.g., 20*a* and 20*b*, bounding channel 10; and the bottom member perimeter portion 30 may have interior and exterior perimeter portions, e.g., 30*a* and 30*b*, which do not bound a channel.

Also depicted is a plurality of spacer elements on bottom member 3. These one or more spacer elements create acoustic space within the housing for the amplification of sound and further perform the function of increasing shock absorbance. Additionally, such structures can be configured as tensioning elements that may be used to increase the tension on a front membrane 25 when an electronic device to be housed is inserted within the housing 1. For instance, the tensioning elements may be adapted such that as a device is inserted into the housing 1, it presses against the tensioning elements, causing the perimeter portion 20 to press outwards thereby increasing tension on the front membrane 25 attached to the perimeter portion 20 consequently causing the screen to flatten and making for a more responsive user interface.

Figure 3B:
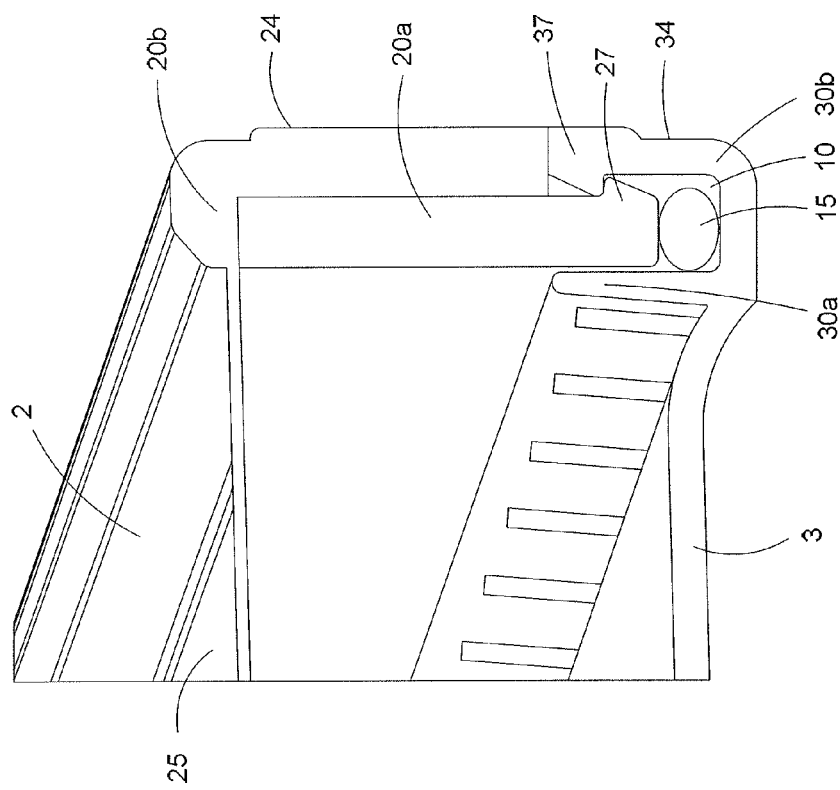

FIG. 3B illustrates a cross-sectional view of the catch clasping mechanisms of the top 2 and bottom 3 members of FIG. 3A. The top member 2 includes an interior perimeter portion 20a and an exterior perimeter portion 20b. In this embodiment, the interior perimeter portion 20 is fabricated from a rigid material, such as a rigid plastic or polycarbonate, and includes top clasping mechanism 27. The rigid plastic provides a structure for the housing 1. The rigid plastic material of the interior perimeter portion 20a is overlaid with a more flexible, e.g., semi-rigid material, such as rubber, TPE, or the like, which material forms the outer perimeter portion 20b, which material may be included so as to provide protection, e.g., against shocks, to the housing.

As set forth above, the top clasping mechanism 27 of the interior perimeter portion 20a of the top member 2; and the bottom clasping mechanism of the exterior perimeter portion, e.g., bounding member 30b, may have any suitable configuration. However, in this instance, the top and bottom clasping mechanisms 27 and 37 are configured as corresponding catches. Accordingly, the clasping mechanisms includes a catch or lip region.

The catch region 27 includes a slanting surface 28 that is intersected by an intersecting surface 29. Together the slanting surface 28 and the intersecting surface 29 form an edge, or lip, that comprises the catch clasping mechanism 27 of the top member 2. The slanting surface 28 and intersecting surface 29 form an angle. Additionally, the catch region 37 includes a slanting surface 38 that is intersected by an intersecting surface 39. Together the slanting surface 38 and the intersecting surface 39 form an edge, or lip, that comprises the catch clasping mechanism 37 of the bottom member 3. The slanting surface 38 and intersecting surface 39 form an angle. For instance, the slanting surfaces may slope with respect to the intersecting surface at a degree that ranges from 0 to about 90 degrees, such as from about 5 or about 10 degrees to about 80 or 85 degrees, for instance, from about 15 or 20 degrees to about 70 or 75 degrees, such as from about 30 or 40 degrees to about 50 or 60 degrees, including about 45 degrees.

Accordingly, the catch clasping mechanism 27 of the top member 2 is configured for engaging a corresponding catch clasping mechanism 37 of bottom member 3. The corresponding clasping mechanisms may have corresponding surfaces, e.g., lip or edge regions or may have different, but complimentary surfaces. In this instance, the top member 2 has a perimeter portion 20 having a catch clasping mechanism 27 that includes a lip or edge region that comprises a slanting surface 38 that is intersected by an intersecting surface 39. The bottom member 3 has a perimeter portion 30 having a catch clasping mechanism 37 that also includes a lip or edge region that comprises a slanting surface 38 that is intersected by an intersecting surface 39. In this embodiment, the corresponding lip or edge regions are configured for being coupled together. It is to be noted that although a particular configuration of clasping mechanisms 27, 37 are depicted, e.g., as corresponding catch clasping mechanisms, other configurations may also be suitable, for instance, where the slanted surfaces 28 are straight or substantially straight, etc. For example, in one embodiment, one of a top or bottom member may have a clasping member configured as described above, e.g., having a lip edge region, and the corresponding member may have a clasping member that is configured as a receiving element, such as a groove, e.g. a circumferential groove, that is adapted for receiving the corresponding lip edge of the opposing member.

However, in this instance, the slanting surface 38 and the intersecting surface 39 comprise the clasping mechanism 37 of the bottom member 3, which clasping mechanism is configured for engaging corresponding surfaces of the top member 2 clasping mechanism 27. Together the top and bottom clasping mechanisms 27 and 37 respectively form opposing snap closures that are configured for interacting with one another in such a manner that when they are coupled together, e.g., snapped together, they seal the housing, for instance, in a liquid-proof seal. It is to be noted in this embodiment, the clasping mechanisms 27 and 37 are entirely internal clasping mechanism that circumscribe the entire perimeter of the housing. Although the top and bottom clasping mechanisms have been described herein with respect to one particular configuration, e.g., entirely internal and circumscribing the entire perimeter portion, it is to be understood that this configuration is a non-limiting example and may be modified in various ways so long as the clasping mechanisms are capable of being joined together in a manner sufficient to couple the top and bottom members together and thereby seal the housing.

Figure 3C:
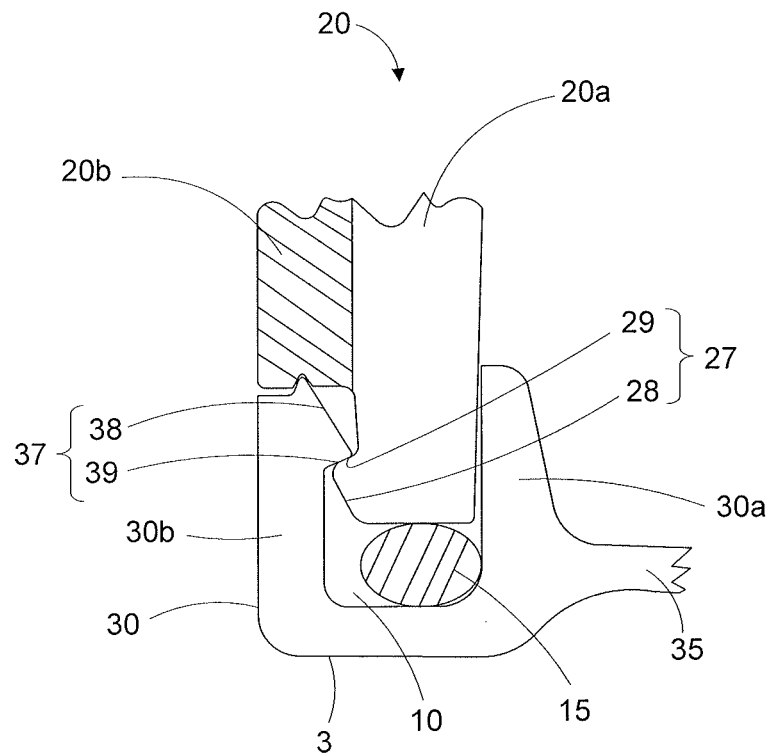

FIG. 3C illustrates another embodiment of a representative clasping mechanisms of the top and bottom members. The top member 2 includes a perimeter portion 20. The perimeter portion 20 includes an interior perimeter portion 20a and an exterior perimeter portion 20b. As depicted the interior perimeter portion 20a of the top member 2 includes a clasping mechanism 27. It is to be noted that although the interior perimeter portion 20a includes the clasping mechanism 27, in certain embodiments, the exterior perimeter portion 20b may include the clasping mechanism 27.

The top member clasping mechanism 27 includes a surface 28, which surface is depicted as slanted. It is to be noted that although this surface is depicted as slanted, in certain embodiments, it may have a different configuration, for instance, it may be substantially straight. The top surface clasping mechanism 27 also includes an intersecting surface, which in this instance is also an interfacing surface 29. The interfacing surface 29 is depicted as a horizontal surface that intersects surface 28. However, this configuration may be modified so long as a suitable clasping mechanism is formed thereby. In this manner a lip or edge is formed, which edge is configured for interfacing with a corresponding clasping mechanism, e.g., a lip edge or groove member, of a bottom member so as to couple and seal the top and bottom members together.

The bottom member 3 also includes a perimeter portion 30. The perimeter portion 30 includes an interior bounding member 30a and an exterior bounding member 30b, which bounding members bound channel 10. As depicted the exterior bounding member 30b of the bottom member 3 includes a clasping mechanism 37. However, in other instances, the interior bounding member 30a of the bottom member 3 may include the clasping mechanism 37.

The bottom member clasping mechanism 37 includes a surface 38, which surface is depicted as slanted. It is to be noted that although this surface is depicted as slanted, in certain embodiments, it may have a different configuration, for instance, it may be substantially straight. The bottom surface clasping mechanism 37 also includes an intersecting surface which in this instance is also an interfacing surface 39. The interfacing surface 39 is depicted as a horizontal surface that intersects surface 38. It is to be understood that the configuration of these surfaces may differ from that depicted so long as it is capable of forming a clasping mechanism for interfacing with a corresponding clasping mechanism on the top surface 2. In a manner such as this a lip or edge is formed, which edge is configured for interfacing with a corresponding edge of a top member so as to couple and seal the top and bottom members together. It is to be noted that although the exterior bounding member 30b includes the clasping mechanism 37, in certain embodiments, the interior bounding member 30b may include the clasping mechanism 37. It is also to be noted, that one of the top or bottom clasping mechanisms may have a configuration as a receiving member, such as a groove, rather than the lip edge configuration described above.

Also depicted is channel 10. Channel 10 is formed in part by the interior and exterior bounding members 30a, b as well as the bottom back surface 36 of the bottom member 3 perimeter portion 30. It is to be noted that although as depicted the channel 10 is included as part of the bottom member 3, in certain embodiments, the channel can be included as part of the top member 2, with the corresponding changes being made to the structures of the top and bottom members. The channel 10 includes a gasket 15, such as an O-ring, which at least partially fills the channel 10.

The interior perimeter portion 20a with the clasping mechanism 27 of the top member 2 is configured for being inserted into the channel 10 and may further be configured for engaging the gasket 15; and may additionally be configured for engaging the clasping mechanism 37 of the exterior bounding member 30b of the bottom member 3 in such a manner as to couple the top and bottom members together, for example, in a liquid-proof seal. In this embodiment, therefore, the interior perimeter portion 20 a includes a gasket interfacing portion that is configured for interfacing with the gasket in such a manner as to compress the gasket and thereby from a liquid-proof seal.

It is to be noted that in certain embodiments a gasket need not be present within the channel. Further, in certain embodiments, the interior and/or exterior bounding members may be configured differently or not included at all. A different clasping mechanism may be included, e.g., a separate clasping mechanism that is external or distinct from the perimeter portions of the top and bottom members, although the clasping mechanism as depicted herein has certain advantages over such an external clasping mechanism. Nevertheless, an external clasping mechanism may be provided, such as a clamp or other form of external clasping mechanism. Such an external clasping mechanism may be included in addition to the internal clasping mechanisms described herein or in substitution therefore.

Figure 3D:
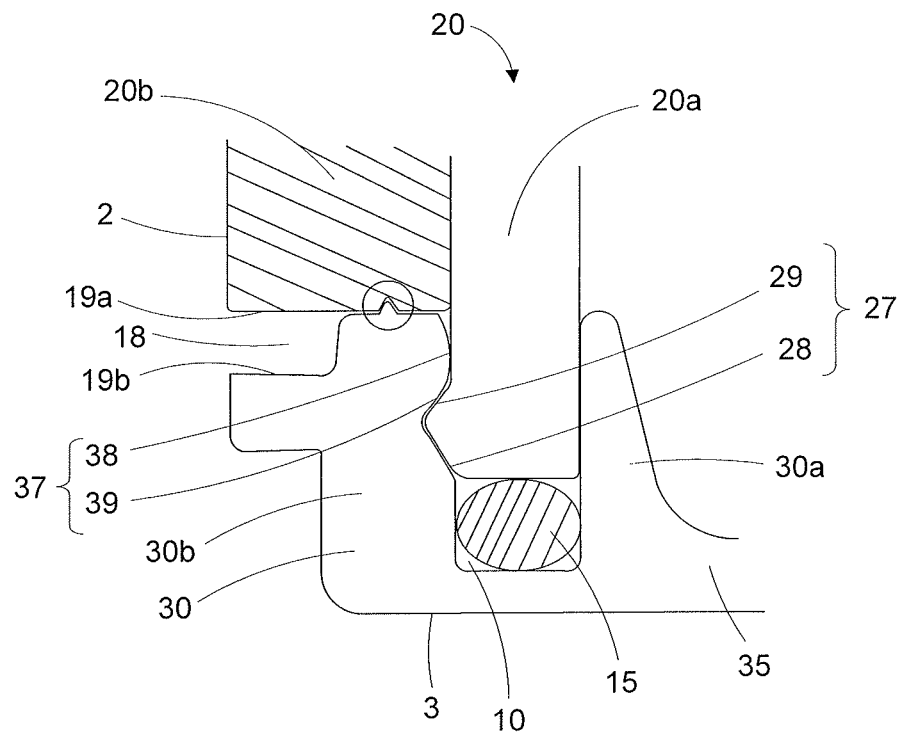

For instance, FIG. 3D illustrates a further embodiment of a suitable clasping mechanism of the disclosure. In this embodiment, the clasping mechanism is depicted in conjunction with a coin slot feature, which feature is described in greater detail herein below. The perimeter portion 20 of the top member 2 includes an interior perimeter portion 20a and an exterior perimeter portion 20b. In one embodiment, the interior perimeter portion 20a is fabricated from a rigid material, such as a plastic, polycarbonate, metal, or the like, so as to provide stability and structure to the perimeter portion 20 of the top member 2. In one embodiment, the exterior perimeter portion 20b is fabricated from a malleable material, such as an elastomeric material, such as rubber, TPE, polyethylene, polypropylene, and the like so as to provide flexibility and/or shock absorbance to the perimeter portion of the top member.

The perimeter portion 30 of the bottom member 3 includes perimeter portion 30 having an interior bounding member 30a and an exterior bounding member 30b which along with a bottom back surface member 36 form a channel 10. In one embodiment, the interior bounding member 30a is fabricated from a semi-rigid material, such as a plastic, or polypropylene material, or the like, so as to provide stability and structure to the perimeter portion 30 of the bottom member 30, while maintaining flexibility. Additionally, the exterior bounding member 30b may also be fabricated of the same or a different semi-rigid material, such as a plastic, or polypropylene material, or the like from which the interior bounding member is made. However, in certain instances, the exterior bounding member 30b may be fabricated or overlaid with a more flexible material, such as flexible or semi-flexible material, for instance, a rubber or polyethylene material.

The bottom back surface 36 may also be fabricated from the same rigid material, such as polypropylene, as the material from which the interior and/or exterior bounding members are made. The interior and exterior bounding members 30 a,b along with the bottom back surface 36 form the channel 10. Channel 10 includes a compressible gasket 15, which gasket may be compressed when contacted with a gasket interfacing region of the top member, e.g., an interior perimeter portion of the top member.

As depicted in FIG. 3D, the configuration of the top and bottom members 2, 3 is such that when they are coupled together a coin-slot feature 18 is formed. The coin slot feature is formed as a cut out 18. A portion of the top member 2 exterior perimeter portion 20b forms a top bounding member 17 of the coin slot feature 18. Further, an extended portion of the bottom perimeter portion 30b of the bottom member 3 includes a bottom bounding member 19 of the coin slot feature 18.

Accordingly, the perimeter of the housing may include a coin slot feature 18 that is comprised of a top bounding member 17, e.g., an overhang portion of a perimeter portion, and a bottom bounding member 19, e.g., an extended portion of a perimeter portion. In certain embodiments, the coin slot feature 18 is included within a single perimeter portion of a top or bottom member, and in other embodiments it is formed by the joining of the top and bottom member. In various embodiments, the coin slot feature is a cut out in one or both perimeter portions of the top and bottom members. The coin slot feature is configured such that a tool may be inserted therein and employed so as to de-couple the top and bottom members and thereby detach and de-seal the top and bottom members one from the other.

Other clasping mechanisms may also be employed with respect to joining the top and bottom members of the housing together in addition to or in substitution for those detailed above. For instance, as can be seen with respect to FIG. 3E, a housing 1 of the disclosure may include a top member 2 and a bottom member 3. The housing 1 may additionally include an external latch feature 5. This external latch feature 5 may be included in addition to the clasping mechanisms described above or may be included in substitution therefore.

The external latch feature may be an entirely external latch feature, such as one or more clamps or clamp regions. The one or more clamps can be positioned on the outside of the housing and configured for clamping down and thereby exerting a coupling force onto the top and bottom members so as to couple the two members together and seal the housing. Alternatively, the external latch feature may be a hybrid external/internal latch feature such as that depicted in FIG. 3E.

Figure 3E:
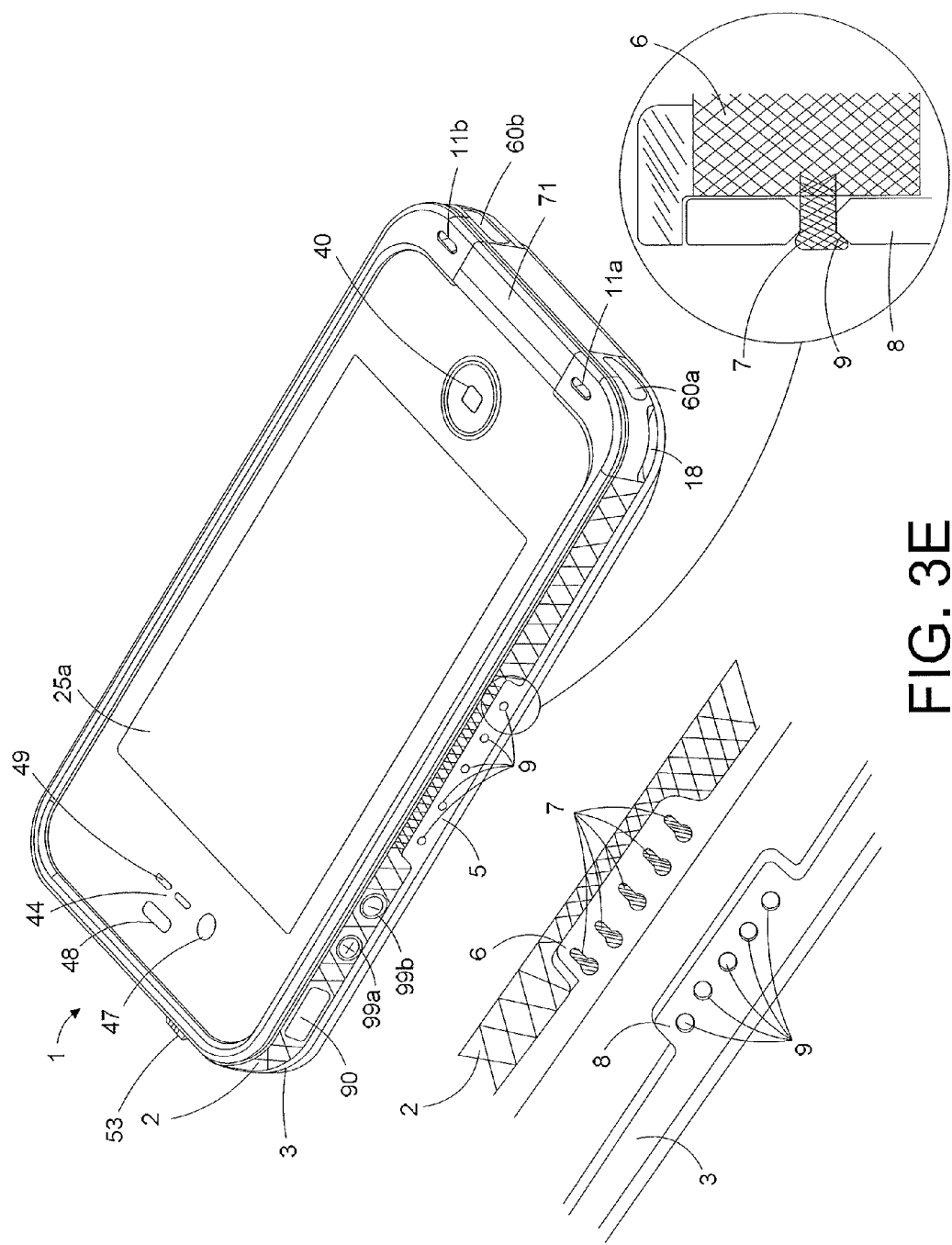

As depicted in FIG. 3E, the external latch feature 5 may be included on one or more sides, e.g., two or four opposing sides, of the housing 1. Accordingly, a plurality of latch features 5 may be included and positioned around the perimeter of the housing 1. For example, sides 23, 33 and 24, 34 may each include 1 or 2 or 3 or more latch features 5. The latch feature 5 may extend along the entire perimeter portion or one or more sections thereof.

As can be seen, the latch feature 5 includes two interfacing regions 6 and 8. As depicted the top member 2 includes latch region 6, and bottom member 3 includes latch region 8. However, the top member 2 may include latch region 8, and bottom member 3 may include latch region 6. Latch region 6 includes one or more pegs 7, and latch region 8 includes one or more corresponding peg receiving members 9. Specifically, the latch region 6 of top member 2 includes one or more pegs 7, which peg(s) 7 is configured for being received within a peg receiving member 9 of latch region 8 of bottom member 3. As depicted, latch region 6 includes a plurality of pegs 7, which pegs 7 are configured for being received within a plurality of peg receiving members 9 of latch region 8. Accordingly, as the top member 2 is coupled to the bottom member 3, the pegs 7 are received within the peg receiving members 9 thereby sealing and/or adding an additional seal to the housing 1.

As described above, the perimeter portion 20 of top member 2 may include an interior perimeter portion 20a and an exterior perimeter portion 20b. The latch region 6, therefore, may be formed out of one or both of the interior and exterior perimeter portions 20a and 20b of top member 2. For instance, a portion of the exterior perimeter portion 20b and the interior perimeter portion 20a may together make up latch region 6. For example, the exterior perimeter portion 20b that makes up part of latch region 6 may include a concave or cutout region, which cutout region exposes the interior perimeter portion 20a. The exposed interior perimeter portion 20a that makes up part of latch region 6 may include the pegs 7.

Accordingly, the latch region 6 may include a concave portion that is a cutout region of exterior perimeter portion 20b. For instance, in an instance where the exterior perimeter portion 20b of top member 2 is comprised of a flexible material that overlays a rigid framework that comprises the interior perimeter portion 20a of top member 2, the concave region of exterior perimeter portion 20b may be a cutout region in the flexible material of perimeter portion 20b. The cutout region may expose the interior perimeter portion 20a, which perimeter portion may include one or more pegs 7. For instance, in an instance where the interior perimeter portion 20a of top member 2 is comprised of a rigid material, the rigid material may also include one or more pegs 7 that are exposed by the cut-out region in perimeter portion 20b. The peg(s) 7 may be configured for being received within one or more complementary peg receiving members 9 positioned in the latch region 8 of bottom member 3, so as to aid in coupling the top member 2 and bottom member 3 together in the formation of the housing 1.

The peg(s) 7 and peg receiving member(s) 9 may be configured such that when the pegs 7 are received within the peg receiving members 9 the latch regions 6 and 8 of the perimeter portions 20 and 30 are flush with the rest of the perimeter portion 20 and 30. In certain instances, the peg(s) 7 and/or peg receiving member(s) 9 may be sized so that the latch regions 6 and 8 are not flush with the rest of the perimeter portions 20 and 30 but are extended or indented. For example, in certain instances, the pegs 7 on the top member 2 may be positioned on the exterior perimeter portion 20b or positioned on the interior perimeter portion 20a but sized such that they extend outward therefrom away from the perimeter portions 20a and 20b. The corresponding latch region 8 on bottom member 3 may therefore include extended peg receiving members 9. This, for instance, could be useful when thicker and longer pegs are employed so as to form an extra secure seal.

Hence, the latch region 6 of top member 2 may be formed in part from a cutout region of the exterior perimeter portion 20b that exposes the interior perimeter portion 20a. The pegs 7 of latch region 6 may be formed as a portion of the interior perimeter portion 20a and may be fabricated of a rigid material, such as a stiff plastic, polycarbonate, metal, or the like. The pegs 7 may be formed so as to be integral with, e.g., of the same material as, the interior perimeter portion. Additionally, the latch region 8 may be formed as a laterally lengthened region of the exterior bounding member 30b of the bottom member 3. The laterally lengthened region 8 may include peg receiving members 9. As can be seen with respect to FIG. 3E, the laterally lengthened region 8 may be configured for fitting within the cutout region 6 such that the perimeter portions 20 and 30 are flush along their length. As set forth above, one or more of the latch regions 5 and 8 may be configured such that the perimeter portion is not flush along its length.

The cutout region of the latch region 6 of the top member 2 and the laterally lengthened region of the latch region 8 of the bottom member 3 are configured such that as the top member 2 is coupled to the bottom member 3, the laterally lengthened region 8 is fitted within the cutout region 6, the pegs 7 are fitted within the peg receiving apertures 9, and the housing is further sealed by the coupling of the latch region 6 with the latch region 8. It is to be understood that although this latching feature 5, e.g., additional latching feature, has been described with respect to the particular embodiment provided in FIG. 3E, it is to be understood that other configurations for latching the top member with the bottom member and thereby sealing the housing can also be employed without departing from the nature of this disclosure.

The front surface 35 of the bottom member 3 may include stand-offs 16 that are of a size and position so as to generate air-channels between the housed device and the bottom member 3. The air channels are adapted to channel and transmit sound through the housing and out through one or more sound ports 60 a and b, or other sound transmission surfaces, such as a front or back surface of the housing (as described below), thereby enhancing the quality and clarity of sound transmission from an underlying device through the housing 1.

In certain instances, the housing 1 may be configured to enhance the sound quality of sound transmission of an underlying device. For instance, the top front surface membrane 25 of the housing 1 may be configured so as to include an air-gap 12 that may be positioned between the housing 1, e.g., membrane 25, and a housed sound emitting device. The air gap 12 may be positioned along a perimeter portion of the top member and may circumscribe the entire or a portion of the perimeter, and may be adapted so as to be in communication with one or more sound ports 60 of the housing 1.

To further enhance sound transmission, the bottom member 3 of the housing 1 may be fabricated of a rigid or semi-rigid material, such as polypropylene, that is capable of resonating and thereby amplifying the sound generated by an encased device. As depicted, the bottom member 3 includes a bottom surface having a bottom member front surface 35 and a bottom member back surface 36.

Figure 3F:
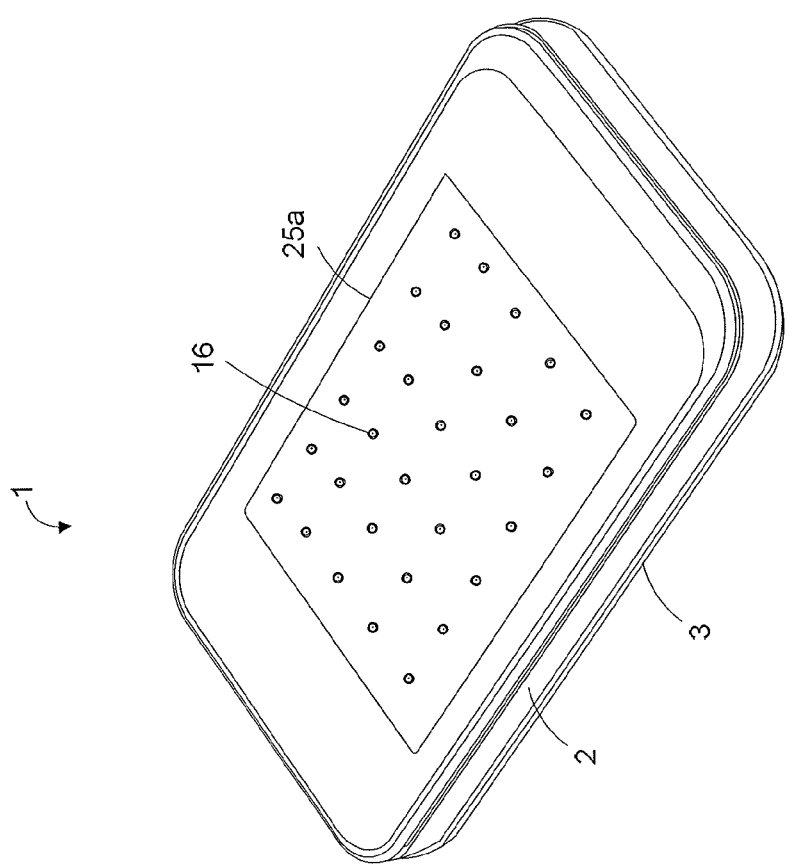

FIG. 3F provides a perspective view of the top 2 and bottom 3 members of the housing 1. As can be seen with respect to FIG. 3F, the top member 2 includes a perimeter portion 20 and a front membrane 25. The front membrane 25 includes an optically opaque region and an optically clear region. The top surface of the bottom member 3 and standoffs 16 positioned thereon may be seen through the optically clear region.

Figure 3G:
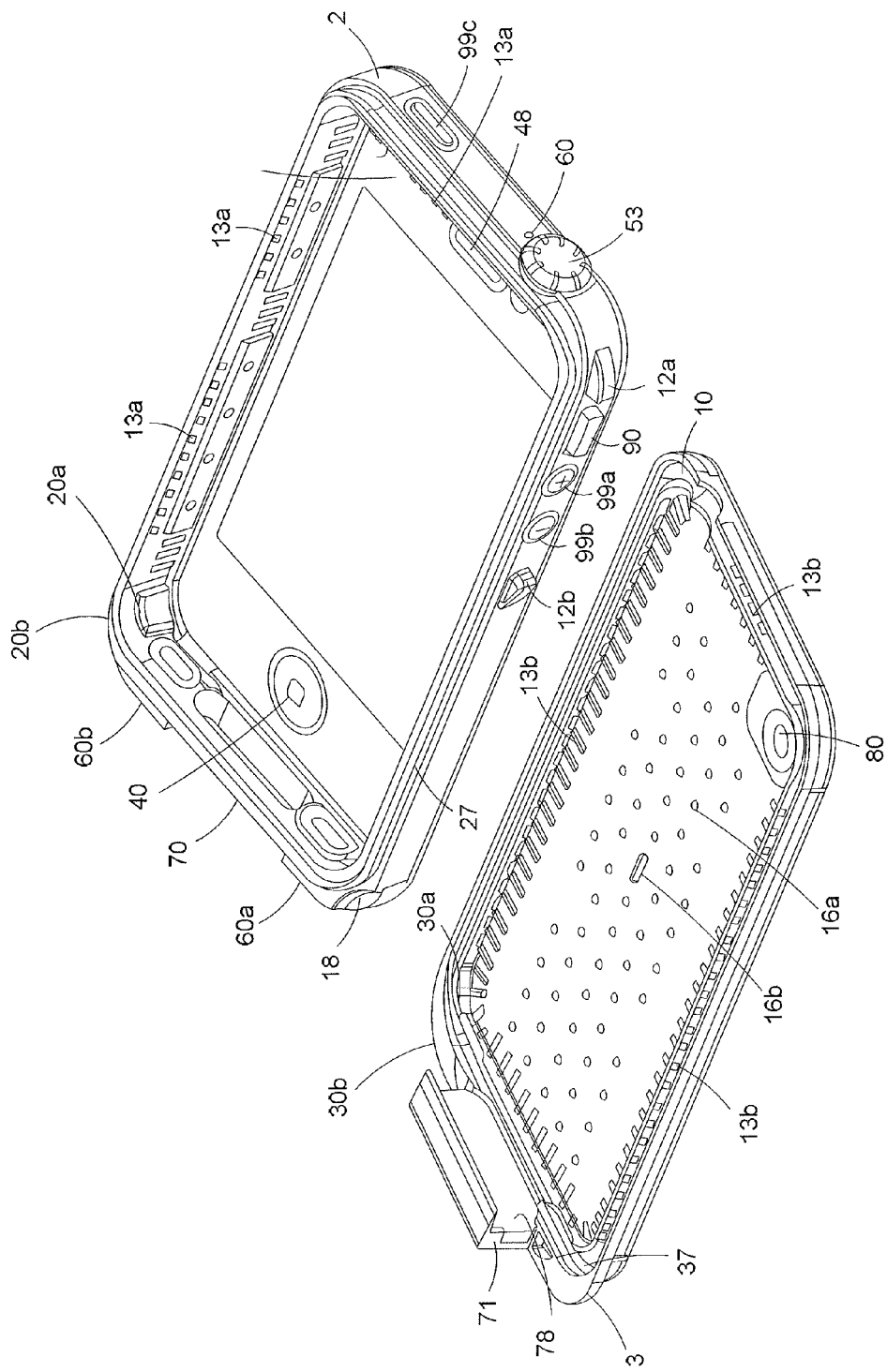
Figure 3H:
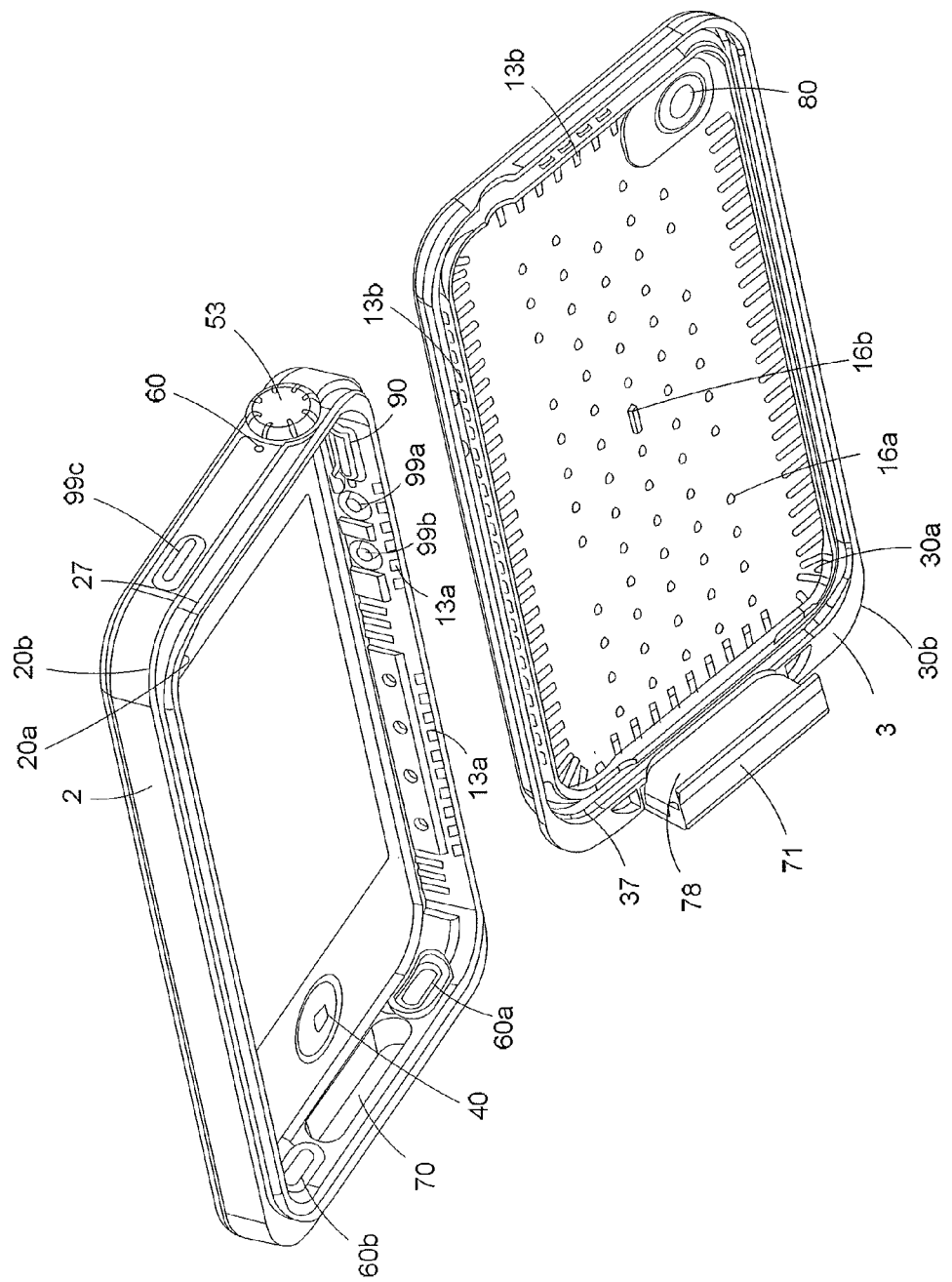

FIGS. 3G and 3H provide a perspective view of the top 2 and bottom 3 members of the housing 1. As can be seen with respect to FIGS. 3G and 3H, the top member 2 includes a perimeter portion 20. The perimeter portion 20 includes an interior perimeter portion 20a and an exterior perimeter portion 20b. The bottom member 3 includes a perimeter portion 30. The perimeter portion 30 also includes an interior perimeter portion 30a and an exterior perimeter portion 30b wherein the interior and exterior perimeter portions bound a channel 10. Accordingly, the interior perimeter portion of the bottom member 3 comprises an interior bounding member 30a, and the exterior perimeter portion of the bottom member 3 comprises an exterior bounding member 30b, which bounding members 30a and 30b bound the channel 10.

As can be seen with respect to FIGS. 3G and 3H, the housing 1 further includes an interior clasping mechanism 27 and 37. As depicted, the interior clasping mechanisms 27 and 37 are an entirely internal clasping mechanism. In this instance, the entirely internal clasping mechanisms 27 and 37 circumscribe the entire internal circumference of the perimeter of the housing 1, however, in other instances, the clasping mechanisms 27 and 37 need not circumscribe the entire perimeter portions of the top 2 and bottom 3 members. These entirely internal clasping mechanisms 27 and 37 effectively seal the housing in such a manner that the seal is internal to the housing. As depicted, the entirely internal clasping mechanism is configured as a catch and groove clasping mechanism, e.g., clasping mechanism 27 of top member 2 is configured as a circumferential hook or catch element that fits into the clasping mechanism 37 of bottom member 3, which is configured as a circumferential groove that is adapted for receiving the hook element of the top member and locking the two housing members together so as to form the housing 1.

Specifically, in this embodiment, the top member 2 includes an internal clasping mechanism catch or hook 27, and the bottom member includes a corresponding internal clasping mechanism groove 37. The top catch 27 and bottom groove 37 are configured for being coupled together so as to seal the housing members 2 and 3 one with the other. It is to be noted that although the entirely internal clasping mechanism 27 has been set forth herein in a certain embodiment, other variations to the entirely internal clasping mechanism 27 and 37 can be provided without departing from the nature of this disclosure. For instance, in certain instances, the clasping mechanism need not circumscribe the entire perimeter portion of the top and/or bottom member, need not be entirely internal, and may be configured differently from the catch and groove configuration set forth herein.

In addition or as an alternative to one or more of the clasping mechanisms set forth herein above, e.g., clasping mechanisms 27 and 37, the housing may include an entirely internal clasping feature having a different configuration than the hook and groove clasping mechanisms described above. For instance, as depicted with respect to FIG. 3F, the housing 1 may include a tooth and receptacle clasping mechanism 13. As depicted, this tooth and receptacle clasping mechanism 13 may be in addition to the hook and groove clasping mechanisms 27 and 37, or in other instances, it may be substituted therefore.

The entirely internal tooth and receptacle clasping feature 13 of FIGS. 3G and 3H may include one or more sections of one or more teeth 13a. The entirely internal clasping feature 13 may also include one or more sections of one or more teeth receiving members 13b. The tooth or teeth 13a may be configured for interfacing with the tooth or teeth receiving members 13b in such a way that as the teeth 13a are coupled with the teeth receiving members 13b, the top member 2 and bottom member 3 are coupled together so as to form the housing 1.

For instance, in certain embodiments, the teeth 13a may be positioned along a perimeter portion of a top 2 or bottom 3 member, and the corresponding top or bottom member will have the corresponding teeth receiving members 13b. In this instance, the teeth 13a are positioned along a perimeter portion 20a of the top member 2, and the teeth receiving members 13b are positioned along a perimeter portion 30a of the bottom member 3. However, in other instances, the teeth 13a may be positioned along a perimeter portion 30 of the bottom member 3, and the teeth receiving members 13b may be positioned along a perimeter portion 20 of the top member 2.

As depicted with respect to FIGS. 3F and 3G, there are three teeth regions positioned along the perimeter portion 20a of the top member 2. Each teeth region may include one or a plurality of teeth. In this instance, each teeth region 13a includes a plurality of teeth. The teeth 13a extend laterally and internally toward the internal cavity of the housing away from the longitudinal length of the interior perimeter member 20a of the top member 2. The teeth 13a are configured for being received within corresponding teeth receiving members 13b of the bottom member 3.

Consequently, as depicted, there are three teeth receiving regions 13a, positioned along the interior perimeter, e.g., interior bounding member, 30a of the bottom member 3. As depicted, the teeth receiving members 13b are configured as apertures within which the teeth 13b may be fitted. Accordingly, as the top member 2 is coupled to the bottom member 3 the teeth 13a of the three teeth regions interface and engage with the corresponding teeth receiving members 13b of the three teeth receiving member regions of the bottom member 3. Consequently, the housing 1 is therefore formed by the coupling of the top member 2 with the bottom member 3 and sealed by the clasping mechanisms 27 and 37 as well as clasping mechanisms 13a and 143b joining together. It is noted that in various embodiments, either clasping mechanisms 27 and 37 or 13a and 13b may be provided individually by themselves or in combination as depicted in FIGS. 3G and 3H. Additionally, although clasping mechanisms 13a and b have been described herein as being positioned around the perimeter portion in 3 different regions, they can be so positioned in more or less than three regions, so long as they are capable of providing a liquid proof and shock proof sealing thereby.

Accordingly, it is to be noted that the teeth and teeth receiving members may have any suitable configuration so long as they are capable of interacting with one another so as to couple the top and bottom members of the housing together. Hence, the number, size, and location of the teeth and/or corresponding teeth receiving members may vary. For example, one long tooth or several short teeth may be included. The teeth may be positioned along the entire perimeter portion or any number of sub-portions thereof. As depicted, there are three teeth regions positioned along three sides of the top member. However, the teeth can be positioned on the bottom member instead of the top member and/or where desired one, two, three, or more teeth regions can be included along one, two, three, or more sides of the top or bottom member.

Likewise, one long tooth receiving member or several short teeth receiving members may be included. The teeth receiving members may be positioned along the entire perimeter portion or any number of sub-portions thereof. As depicted, there are three teeth receiving member regions positioned along three sides of the bottom member. The teeth receiving members are configured so as to correspond to and interact with the teeth members so as to secure and seal the housing when the top and bottom members are coupled together. It is to be noted that the teeth and/or teeth receiving members can be positioned on either or both of the top or bottom members as well as on the interior or exterior perimeter portions, as desired.

Figure 3I:
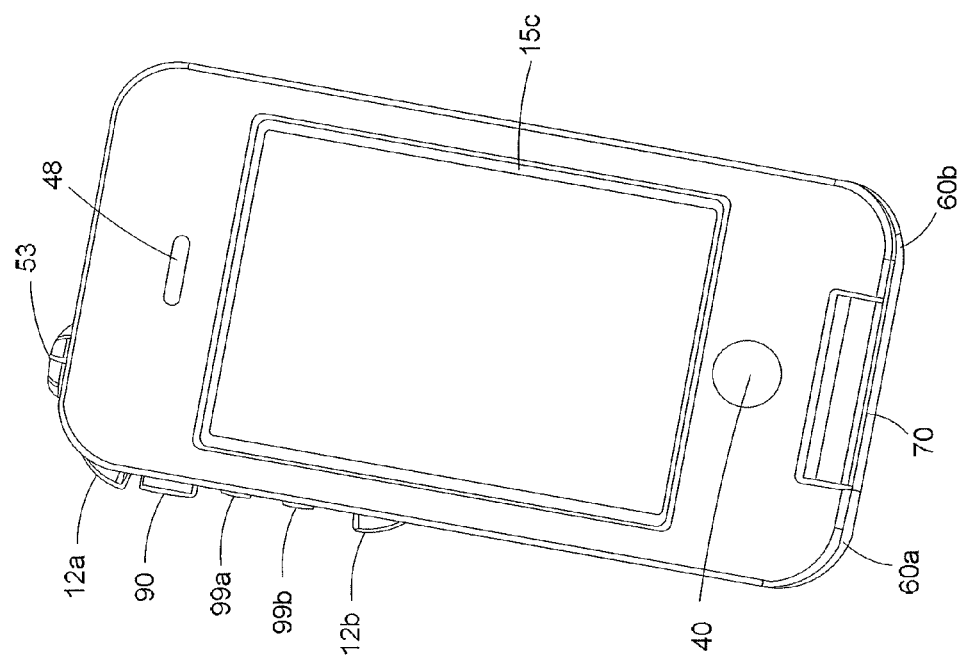

FIGS. 3I and 3J provide another embodiment of a housing 1 of the disclosure, however, in this instance, the top member 2 does not include a front membrane 25. Rather, an additional gasket 15b is provided between the interface of a perimeter portion 20 and the front surface 125 of a housed device 100. This additional gasket 15b functions to prevent liquid from entering through the top housing member where the housing interfaces with the front screen 125 of a housed device.

Specifically, the housing includes a top member 2 and a bottom member 3 that are configured for being coupled together, as described above, so as to form the housing 1. However, it has been found that the clamping force generated by the top and bottom member clasping mechanisms, as described herein, is sufficient to create a liquid proof seal at the top member device interface, such that a top surface membrane 25 is not necessary. The inclusion of an additional gasket, or even an adhesive, at the top member device interface, is sufficient to produce a water and dirt proof seal.

Accordingly, as depicted in FIGS. 3I and 3J, the top surface of the top member 2 includes a top surface perimeter portion 20c that at least partially circumscribes a top perimeter portion of the top member 2. This top surface perimeter portion 20c may be fabricated from any suitable material such as a rigid or semi-rigid plastic, such as polycarbonate. It may cover a larger or a smaller portion of the top surface of the top member, but typically does not cover the entire top surface. Rather, a windowless window region is provided so that a user may have direct access to the touchscreen of an underlying device.

As can be seen with respect to FIGS. 3I and 3J the gasket circumscribes a substantial portion, e.g., an entire portion, of the perimeter portion 20c thereby providing a circumferential seal between the perimeter portion 20c and the front screen of a housed device. For instance, as the top member 2 is coupled to the bottom member 3, the clasping force is sufficient to compress the gasket 15b between the perimeter portion 20c and the front screen of a housed electronic device thereby generating a liquid and dirt proof seal there between. The gasket 15b may be attached to the top member 2, e.g., to the top surface perimeter portion 20c by an sufficient mechanism, such as by the addition of an adhesive.

It is noted that in this embodiment, the top surface perimeter portion 20c would cover a substantial perimeter portion of a housed electronic device, so as to cover the non-capacitive interactive front screen portion of a typical housed device. These non-capacitive interactive portions of the housed device typically include additional features such as button feature 140, sound outlet feature 144, video lens feature 147, and proximity sensor 148. Accordingly, the top surface perimeter portion 20c may be configured to include corresponding feature elements, as described herein, to allow these underlying functionalities of a housed device to continue to function. For instance, the top surface perimeter portion may include one or more of additional features such as button feature 40, sound outlet feature 44, video lens feature 47, and proximity sensor 48, as described herein. For example, with respect to button feature 40, the button element 40 may be comprised as a cutout region in the top surface perimeter portion and a gasket portion 15b that has been formed to fill the aperture created by the cutout region. The top surface perimeter portion 20c may be optically clear, optically opaque, a mixture of the two, and/or screen printed so as to include one or more decals. Further, as depicted the gasket member 15b circumscribes the entire top surface perimeter portion 20c, however, in certain instances, it need not circumscribe the entire perimeter portion.

Figure 3K:
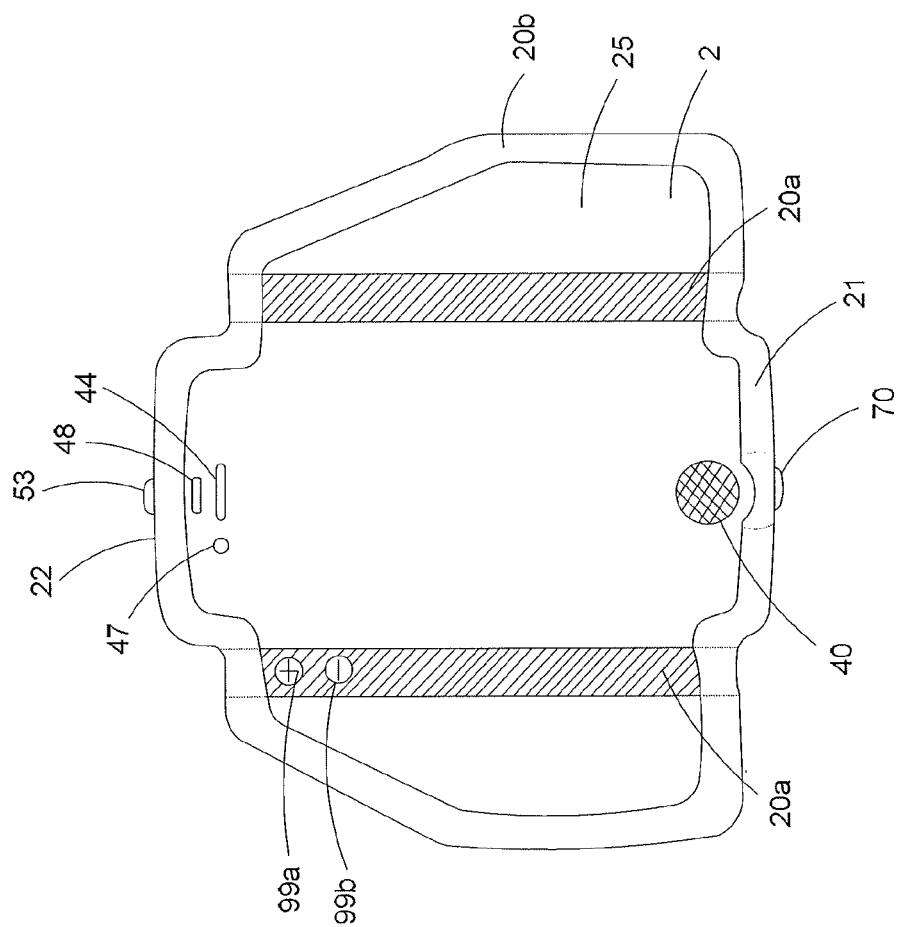
FIGS. 3K-3M provide a perspective view of another embodiment of a housing of the disclosure.
Figure 3L:
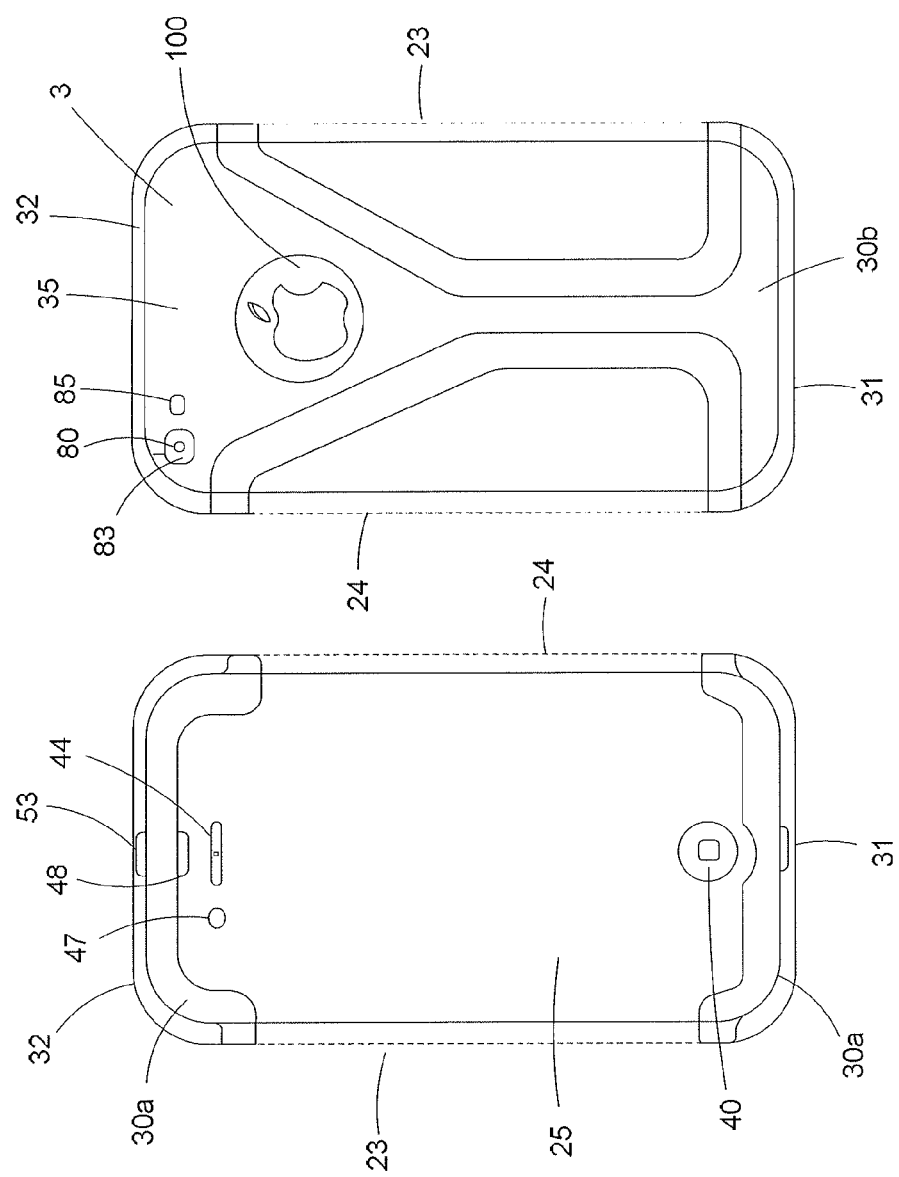

FIGS. 3K-3L provide another embodiment of a housing of the disclosure. In this embodiment, there are three different housing elements that may be applied to device to be housed individually or in combination, each adding a different layer of protection. For instance, as can be seen with respect to FIG. 3K, in certain embodiments, a housing 1 of the disclosure may be composed simply of a top member 2, which in this instance, is comprised of a membrane. The membrane 2 includes several portions that are designed to be attached to an electronic device 100 and folded there around so as to provide a modicum of shock and scratch resistance for the underlying device, e.g., to a front or back surface thereof, and also to provide waterproof protection.

As depicted, the housing 1 includes several features that may or may not be included in a final embodiment. For instance, in certain instances, the membrane 2 may include a face, form fitting portion 25 that is configured to be attached to the front screen portion 125 of an electronic device 100. It further may include a plurality of internal or edge perimeter portions 20a, which internal perimeter portions 20a are configured for being attached to side edges of an underlying device 100. It may additionally include a plurality of external perimeter or back portions 20b, which external perimeter portions 20b are configured for wrapping around and covering a back portion 135 of a housed device.

The membrane 2 may include a plurality of additional feature elements as described herein. For instance, the internal perimeter edge portions 20a of membrane 2 may include a bumper portion, such as a portion comprised of a flexible material, such as a rubber or TPE material. Further, the edge portions 20a may include formed button 99 a and b or switch features, which features may be formed into the membrane 2 or the side bumper portions, if included. The front surface of the membrane 25 may include one or more of a button feature 40, a sound transmission portion 44, a proximity sensor portion 48 and/or a video or camera portion 47. These portions may be formed into the membrane 25 in a manner such as that described above. In certain instances, for instance, the home button element 40 may simply be an formed indented region on the front surface membrane 25 or it may be an added feature such as a rubber or TPE formed button. The membrane 2 may additionally include top 22 and/or bottom 21 foldable regions, which regions may be configured for folding over top or bottom edge portions 22 and 21 respectively.

It is to be noted that although the membrane 2 is depicted as having side wing portions 20a and 20b as well as top and bottom foldable portions, in various embodiments, one or more of these portions may be omitted or configured differently. For instance, in certain instances, the top 22 and bottom 21 foldable portions and/or the side wing portions 20 a and b, need not be included. In other embodiments, the side wing and/or top and/or bottom foldable portions are provided, but the front membrane portion 25 is omitted. When included, the top and bottom foldable portions 22 and 21 may be configured to cover various features of an underlying device 100, such as a headphone 150 or charge port 170 feature, or they may include openings coincident with the same, and thus be configured to interact with one or more plug or cover elements (such as those described herein) that are designed to be fitted within the port feature and interact with the membrane 2 so as to provide a liquid and/or dirtproof sealing of the port feature, such as described above.

The membrane 2 may be configured for being attached directly to an electronic device to be housed, or it may be employed in combination with one or more other structural elements. For instance, in various instances, the membrane 2 may be adhered directly to an electronic device 100 to be housed, e.g., via an adhesive or static pressure or the like, or it may be attached to an external framework 3, such as that provided in FIG. 3L, which framework 3 is coupled to the electronic device 100 prior to the application of the membrane 2 to the framework 3. In such an instance, the housing 1 would be comprised of a bottom member framework 3 to which a top member membrane 2 is attached so as to form the housing 1.

As can be seen with respect to FIG. 3L, in certain embodiments, a housing 1 of the disclosure may be composed simply of a perimeter framework member 3, which in this instance, is comprised of a rigid or semi-flexible material, such as polycarbonate, polypropylene, TPE, rubber, and the like. The framework 3 includes several portions that are designed to be coupled to an electronic device 100 and/or folded there around so as to provide a modicum of shock and scratch resistance, such as to the edges, of the underlying device, and may also provide a modicum of waterproof protection.

As depicted, the housing 1 includes several features that may or may not be included in a final embodiment. For instance, in certain instances, the framework 3 may include a form fitting top 32 and bottom 31 member, which members are configured for being fitted over a distal and proximal portion of an underlying electronic device 100. The proximal 31 and distal 32 cap members may be comprised of a rigid or semi-rigid or flexible material so as to be formfitting to the proximal and distal portions of the electronic device to be housed. The proximal 31 and distal 32 cap members may additionally include one or more features so as to accommodate corresponding features of an underlying device 100. For instance, a proximal 31 or distal 32 end portion may include one or more of an accessory, e.g., headphone, inlet port 50, a sound transmission port 60, a charger port 70, and the like. These features may be formed into the housing member as described herein.

In various instances, the framework member 3 may additionally include a back member 35, which back member may be integral with the end cap members 31 and 32, such as where the framework member is composed of a flexible or semi-flexible material, or may otherwise be attachable thereto, e.g., where the framework member is composed of a rigid material such as polycarbonate. As depicted the back framework member 35 does not cover the entire back portion of a housed device 100 or the side portions. However, in various embodiments, the framework member 3 may include a back member 35 that covers a substantial portion if not the entire back portion and/or may include perimeter, e.g., side edge, portions as well. As depicted, the back member 35 further includes a window portion and further includes a lens portion 80 with a camera and flash lens set therein.

Figure 3M:
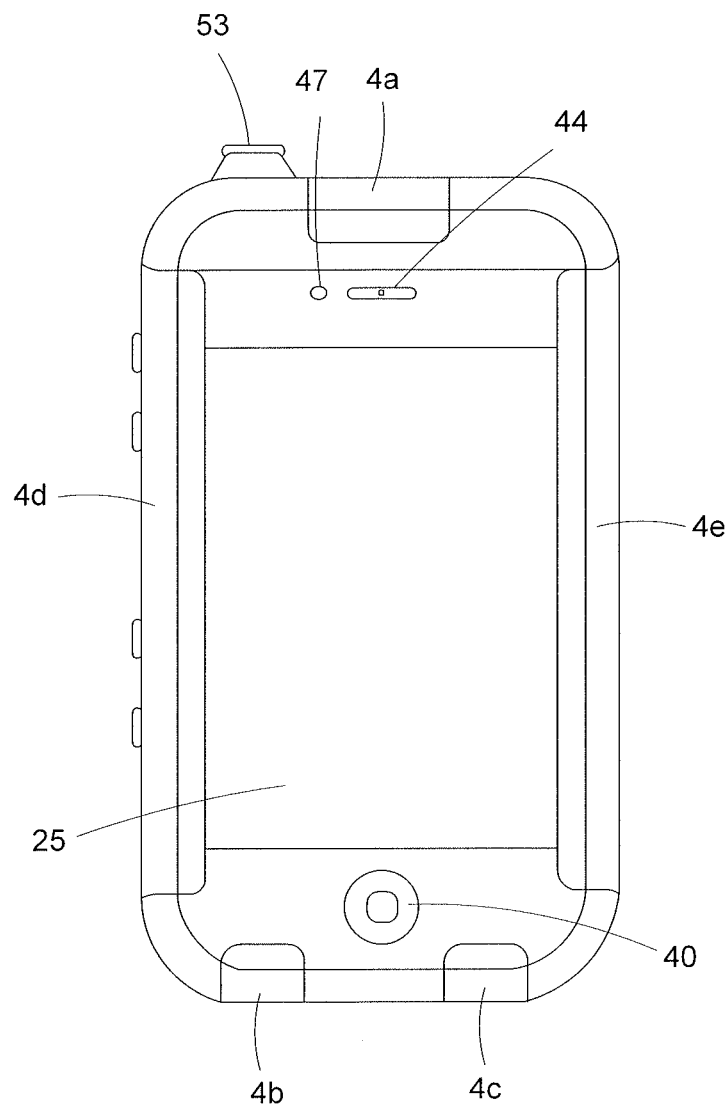

The framework member 3 may be configured for being attached directly to a device 100 to be housed and used by itself as a housing 1 or it may be configured for being used in conjunction with one or more other housing elements, such as in conjunction with one or more of a membrane, e.g., front membrane, portion 2, and/or with a an over-framework portion 4, such as that provided with respect to FIG. 3M.

FIG. 3M provides an external framework feature 4 that may be employed as a housing 1 by itself or in combination with a membrane 2 and internal framework portion 3, as described herein. As depicted, the external framework portion 4 includes a back member (not shown), which back member is configured for cradling an electronic device 100 to be housed and/or for interacting the membrane 2 and internal framework 3 so as to do the same. The back member includes a plurality of clip portions, which clip portions are configured for wrapping around respective edges of a device 100 to be housed therein. In this instance, there are five clip portions, a distal clip portion 4a, proximal clip portions 4b and 4c, as well as side clip portions 4d and 4e. Although 5 clip portions are provided herein, in other instances 1, 2, 3, 4, 6, or more clip portions may be provided. The external framework portion 4 may be fabricated from any suitable material, such as a rigid, semi-rigid, or even flexible material. However, in this instance the external framework member 4 is composed of a semi-rigid material that is capable of flexing in such a manner that the clip portions may be snapped over the edges of a device 100 so as to be retained therein. The back member may also be configured for being associated with one or more other features, such as a belt clip member, a bike clip member, an armband member, and the like. It may also include a cut out portion to accommodate a lens portion or speaker or microphone portion of an underlying device.

As mentioned, the membrane 2, internal framework member 3, and external framework portion 4 are configured for either being used separately, e.g., by being directly attached to a device 100, or may be used in combination with one or both of the others. Accordingly, one or more of the housings disclosed herein can be packaged separately or together for instance as a kit.

FIG. 4 provides several different variations for a housing of the disclosure. FIG. 4A provides a top member 2 having a clasping mechanism 27, and a bottom member 3 having a clasping mechanism 37. In this embodiment, the top member 2 and bottom member 3 may be comprised of perimeter portions, however a front and/or back surface of the housing, such as a front 25 and/or 35 back membranes, may also be provided in addition to the perimeter portions 2 and 3. A gasket 15 may also be included. The top 2 and bottom 3 member and/or gasket 15 may circumscribe an electronic device. An adhesive 26 may also be provided so as to join the top 2 and bottom 3 members together along with the gasket 15 and front screen 125 of a housed electronic device 100.

Figure 4A:
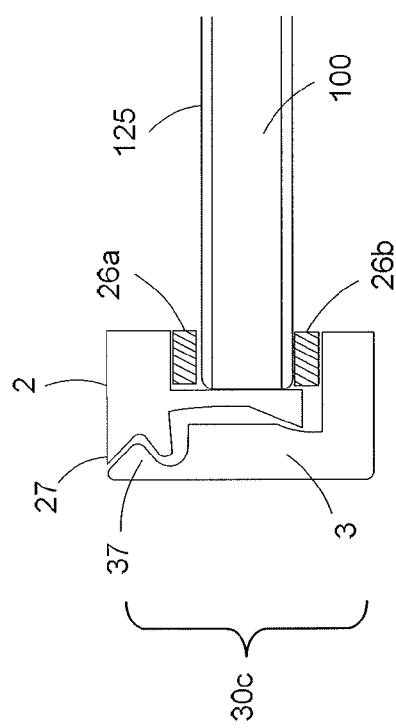
FIGS. 4A-4N provide various side views of different latching mechanisms for use in sealing a housing of the disclosure.
Figure 4B:
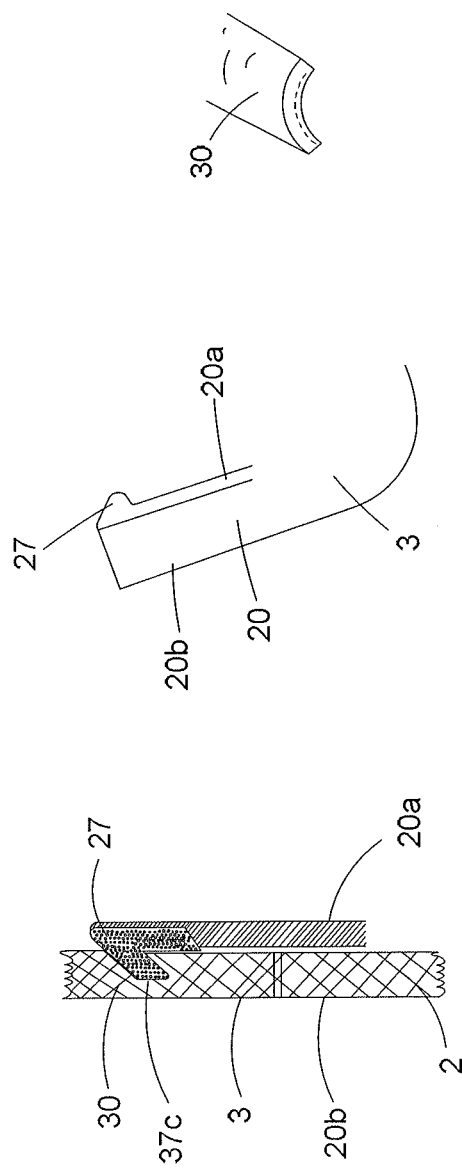

FIG. 4B provides a close up view of a latching mechanism of the disclosure. A top member 2 and a bottom member 3 are provided. The top member 2 includes an interior perimeter portion 20a and an exterior perimeter portion 20b. The interior and exterior perimeter portions may be composed of the same or different materials. For instance, the interior perimeter portion may be composed of a stiff plastic, such as polycarbonate, and the exterior perimeter portion 20b may be composed of a more flexible material such as TPE. The top member 2 additionally includes a clasping mechanism 27. The clasping mechanism 27 may include a stiff element, such as a polycarbonate. The bottom member 3 may also include an interior and exterior member. As depicted a perimeter portion 30 is provided. The perimeter portion 30 includes a clasping mechanism 37c, which clasping mechanism may be configured as one or more apertures or grooves that are adapted for receiving the clasping mechanism 27 of the top member, which clasping mechanism may be configured as a ridge member or one or more teeth members. The clasping mechanism 27 of the top member 2 may be held within the clasping mechanism 37 by an elastic force provided by the flexible material of the exterior perimeter portion 20b. The perimeter portions of the top 2 or bottom members 3 may be flat or substantially curved.

Figure 4C:
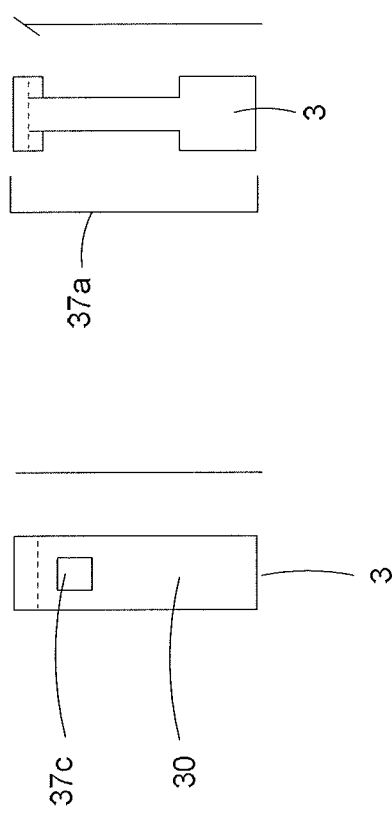

FIG. 4C provides a close up front and side view of two different embodiments of a perimeter portion clasping mechanism 37c of FIG. 4B. As can be seen with respect to FIG. 4C, the clasping mechanism 37c may be configured as a receptacle, such as for a corresponding toothlike clasping mechanism 27 of a top member, or it may be configured so as to include one or more groove elements. Front views and side views are depicted.

Figure 4D:
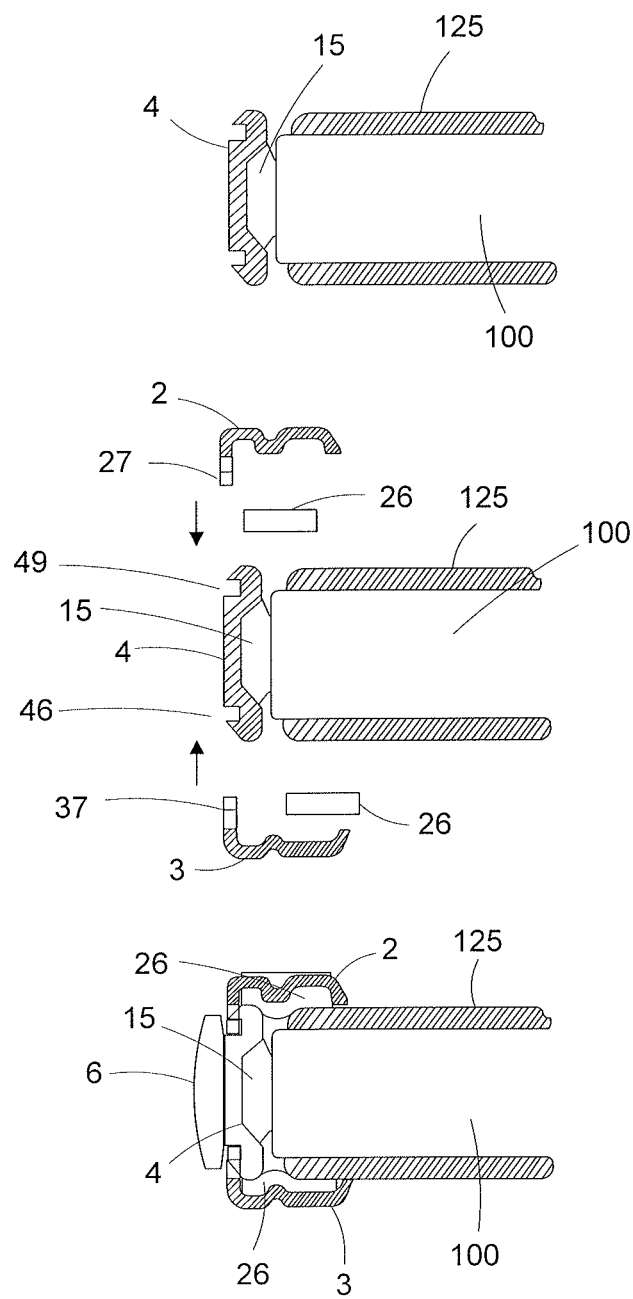

FIG. 4D provides another embodiment of a suitable clasping mechanism of a housing of the disclosure. The housing includes a top member 2, having a clasping mechanism 27 that may be foldable, and a bottom member 3, having a clasping mechanism 37 that may be foldable. A further perimeter portion 4 may be included, which perimeter portion 4 may include a plurality of clasping mechanisms 4a and *b*. The perimeter portion 4 and clasping mechanisms 4 a and b may be designed to receive the clasping mechanisms 27 and 37 of the top 2 and bottom 3 members respectively. A compressible gasket 15 may also be provided between the perimeter portion 4 and a perimeter of a housed device, such that as the top and bottom members are coupled with perimeter portion 4, e.g., snapped together, the gasket may be compressed causing a tension to be exerted against the clasping mechanisms thereby locking them into place. An additional clasping member 6 may further be coupled to the top, bottom, and perimeter members for further security. Additionally, one or more adhesive members 25 may be included for additional security and a stronger attachment. In this manner, by assembling the housing a watertight seal may be provided.

Figure 4E:
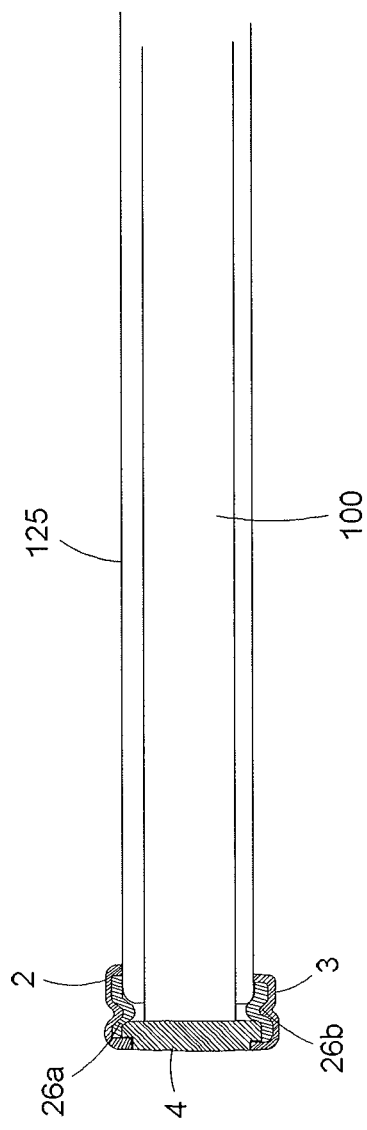

FIG. 4E provides another embodiment of a housing 1 of the disclosure. The housing 1 includes a top member 2, a bottom member 3, and a perimeter member 4. The top and bottom members may be comprised of a semi-flexible or flexible material and the perimeter portion may be composed of a rigid member. The top member 2 may include a clasping mechanism 27 which corresponds to a clasping mechanism 4a on the perimeter member 4. The bottom member 3 may include a clasping mechanism 37 which corresponds to a clasping mechanism 4b on the perimeter member 4. One or more gaskets 15 may also be included. In various embodiments, the top and/or bottom members may be fabricated from a rigid or semi-rigid plastic or metal, such as a pressed or formed metal. The perimeter portion may composed of a plastic such as a rigid plastic like polycarbonate or a more flexible material such PTE. In this embodiment, a front and/or back membrane need not be included.

Figure 4F:
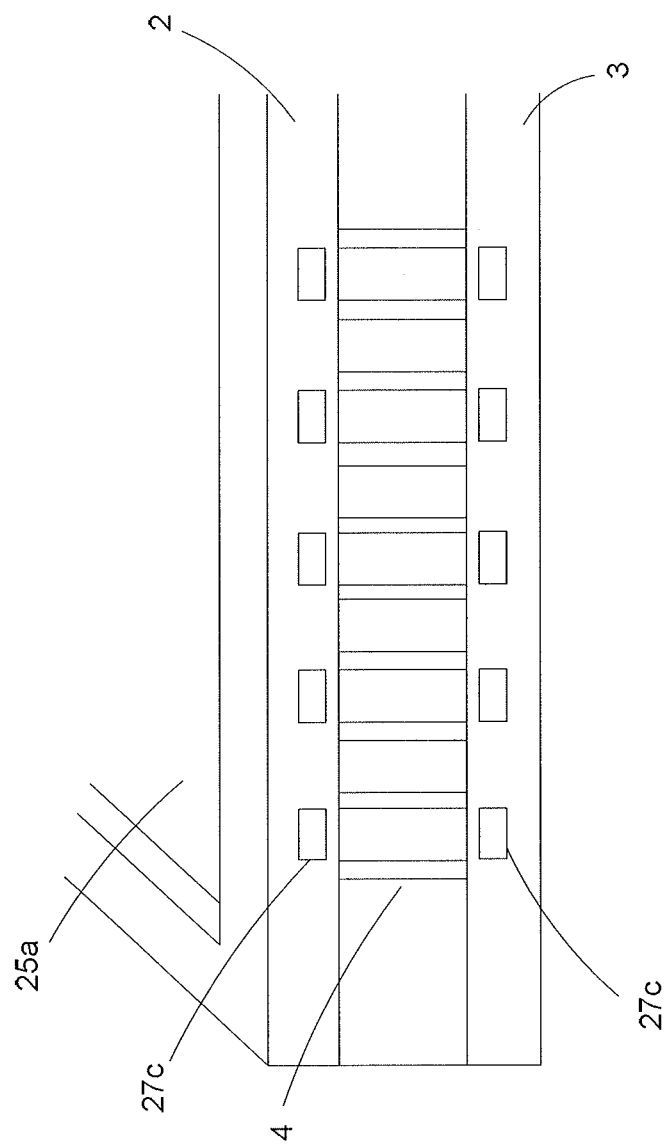

FIG. 4F provides a side view of the housing 1 of 4E as it would be when assembled around an electronic device 100, such as a mobile telephone. The housing 1 includes a top member 2, a bottom member 3, and a perimeter member 4. Clasping mechanisms 27c are shown as they would be when the top, bottom, and perimeter portions are assembled together and clasping mechanisms 27, 37, 4a, and 4b are coupled together so as to seal the housing 1 around the device 100 in a waterproof sealing.

Figure 4G:
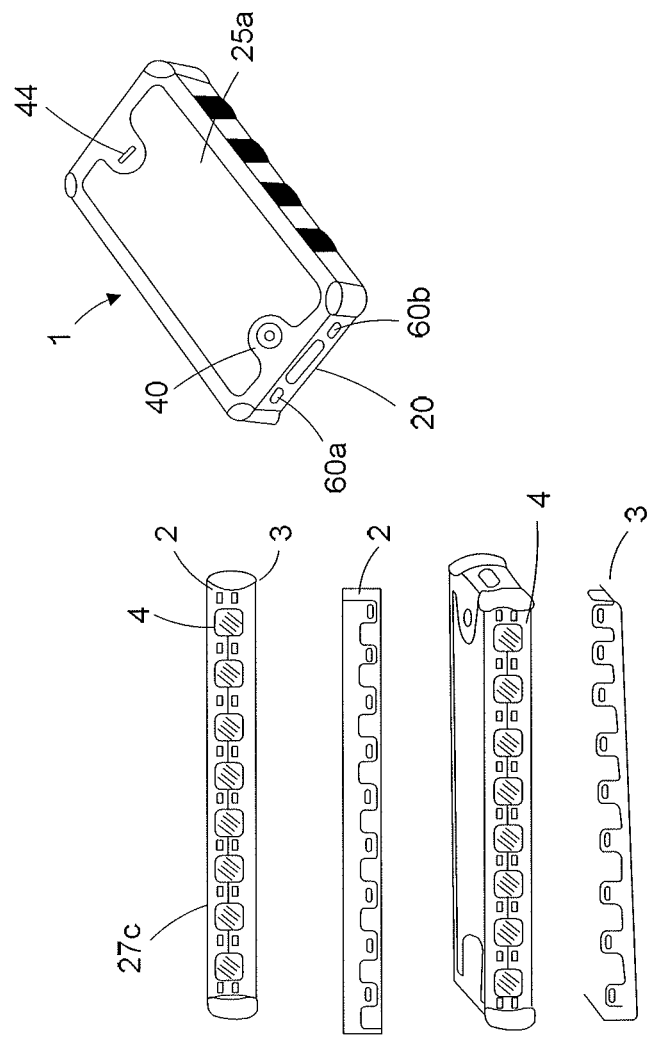

FIG. 4G provides another similar embodiment to that of FIG. 4E. In this embodiment, both the top member 2 and the bottom member 3 include undulating clasping mechanism 27 and 37 having either male or female locking elements, and the perimeter member 4 also includes corresponding female and/or male locking elements 4a and 4b, such that as the top 2 and bottom 3 members are coupled, e.g., snapped, together the male and female locking elements are joined thereby sealing the housing 1 around the device 100 in a watertight seal.

Figure 4H:
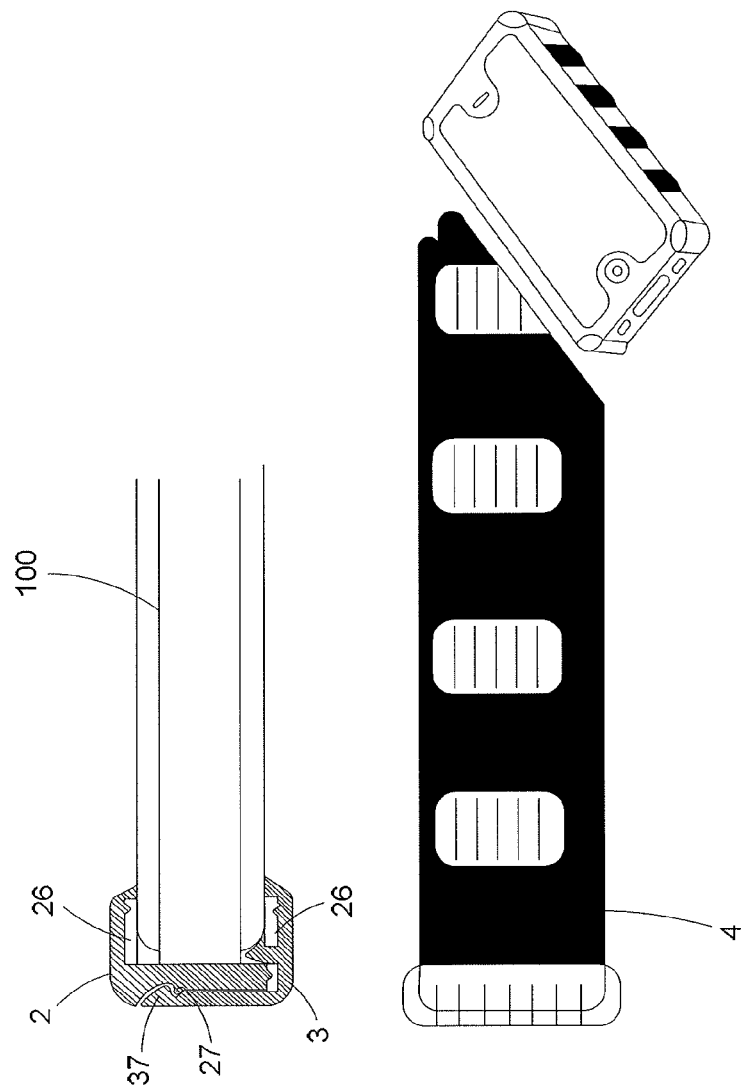

FIG. 4H provides another embodiment of FIG. 4E with a modified configuration, this time without an intervening perimeter member 4 between the top 2 and bottom 3 members. In this embodiment, the top member 2 and the bottom member 3 include corresponding clasping mechanisms 27 and 37 that are configured for being coupled together thereby forming and sealing the housing 1 around a device 100. In this embodiment, the top and bottom members may additionally include several additional standoffs, e.g., 16 *a, b, c,* d, etc. One or more gaskets 15 may additionally be included. The top 2 and/or bottom 3 member may further include one or more bumper portions 8b, such as TPE corner bumper portions that are inserted between one or more hard plastic, e.g., polycarbonate, exterior portions 8a.

Figure 4I:
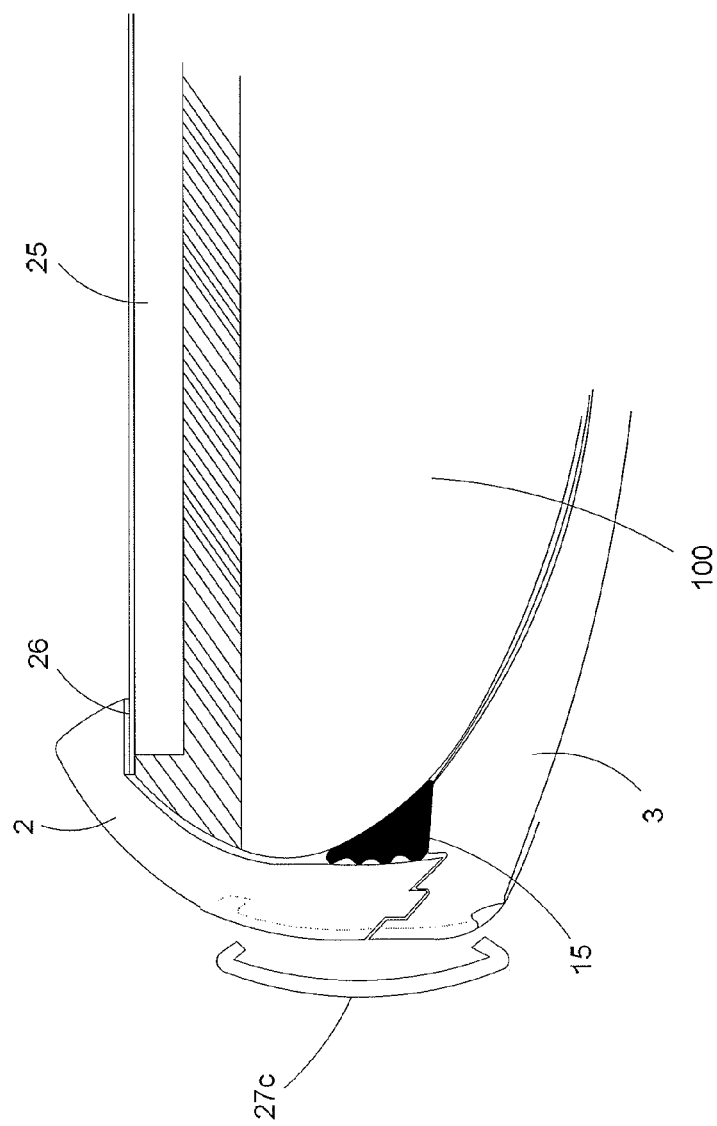

FIG. 4I provides another embodiment of a housing of the disclosure. The housing includes a top member 2 having a clasping receptacle 27a, and a bottom member 3 having a clasping receptacle 37b. The top member 2 and bottom member 3 are coupled together and sealed by the addition of an additional clasping mechanism 27c, which may include a plurality of end portions configured for being inserted within and thereby attaching to the clasping receptacles 27a and 37a. The clasping mechanism 27c may be configured as a flexible, e.g., spring, clip member that when associated with the top 2 and bottom 3 members, the housing 1 is formed and sealed in a liquid-proof sealing. The top 2 and bottom 3 members may further include an additional locking mechanism. For instance, the top 2 and bottom 3 members may include additional corresponding male and female clasping mechanisms 27b and 37b, which are configured for being coupled together and thereby seal the members of the housing 1 together. In various embodiments, the top and bottom members are configured such that as they are joined they form a channel 10 into which a gasket 15 may be inserted. A waterproof adhesive may also be employed at a housing device interface to effectuate the sealing. In this embodiment a front surface membrane need not be included as an adhesive may be used to seal the top member 2 with the front screen 125 of the electronic device 100.

FIG. 4J provides another embodiment of FIG. 4H, however, in this embodiment, when the top 2 and bottom 3 members are coupled together, the channel 15 is formed on a top surface of the housing 1, rather than on a bottom surface of the housing 1. It is also noted that in this embodiment, the top 2 and bottom 3 members include corresponding clasping mechanisms 27 and 37 that are configured for being coupled together so as to seal the housing in a watertight sealing. In this embodiment an external clipping mechanism 27c is not provided, however, if desired the top and bottom members could be configured so as to include an additional clasping mechanism configuration as embodied in FIG. 4I.

Figure 4K:
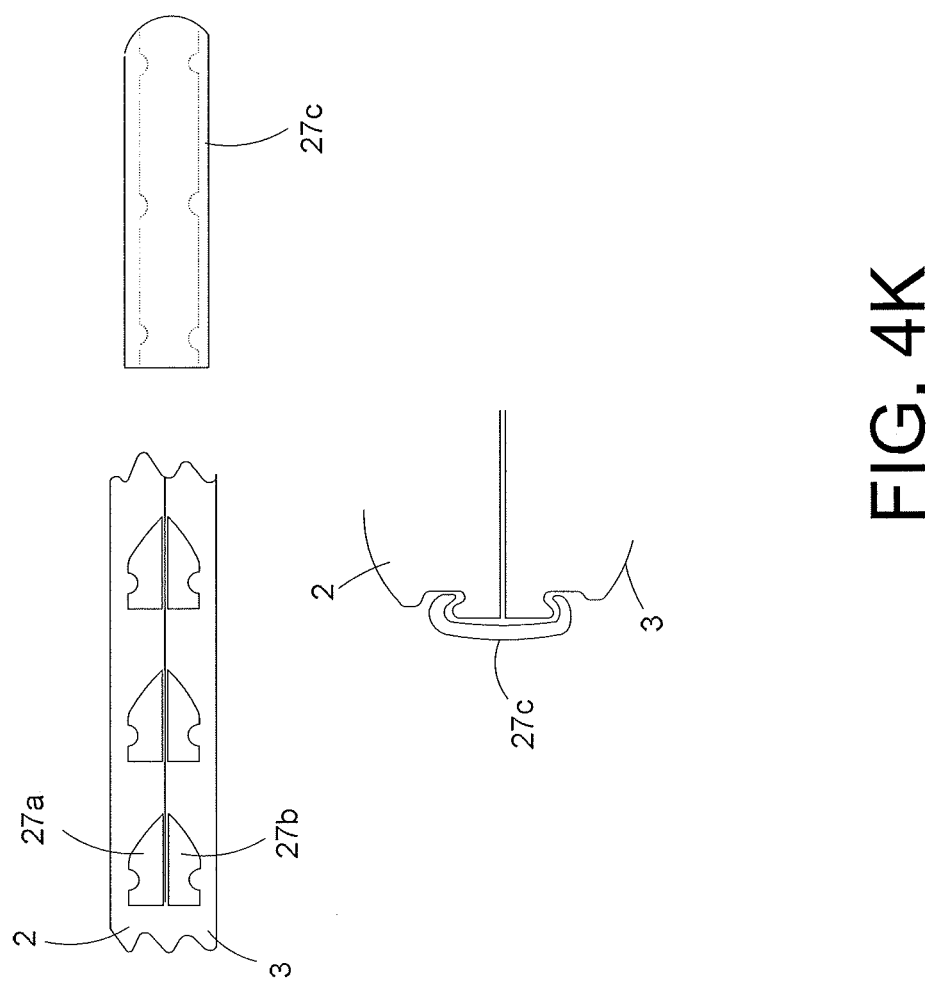

FIG. 4K provides another embodiment of FIG. 4H wherein the top 2 and bottom 3 members include extended clip receiving elements 27a and 37a respectively. An external clipping mechanism 27c is also provided. In this embodiment, the top 2 and bottom 3 members are configured for being coupled together in such a manner that as the housing 1 is formed clip receiving elements 27a and 37a are aligned. When so aligned, the clip mechanism 27c may be slid over the corresponding clip receiving elements so as to lock the top and bottom members together and thereby provide a liquid-tight sealing for the housing 1. It is noted that the clip receiving elements and clip mechanism may additionally include corresponding male and female elements so as to further secure the snapping together of the housing members.

Figure 4L:
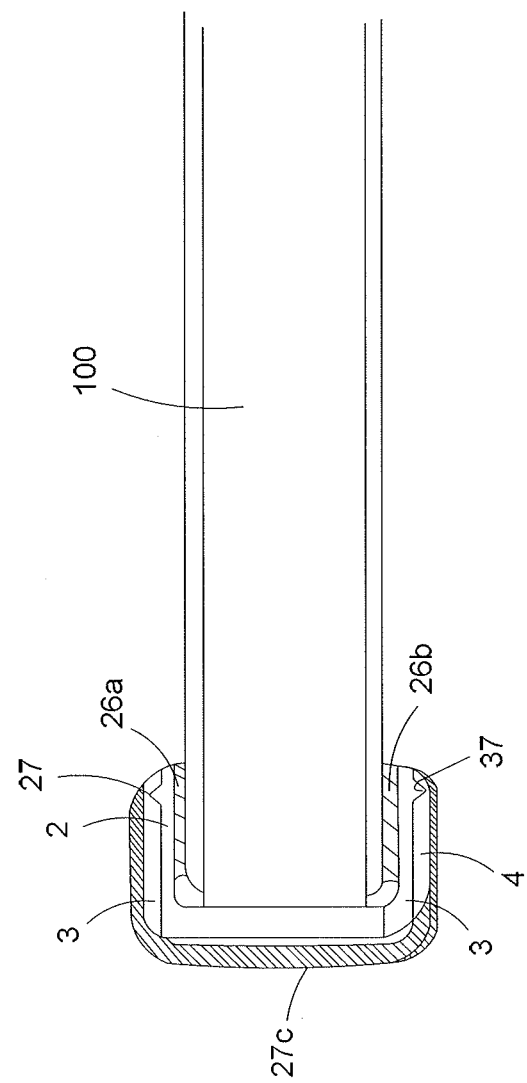

FIG. 4L provides another embodiment of a housing of the disclosure. The housing 1 includes a top member 2 and a bottom member 3 that are configured for being coupled together by the joining of corresponding clasping mechanisms 27 and 37. A combination gasket and adhesive 26 may further be provided so as to ensure a waterproof engagement between the housing 1 and a housed device 100. In this embodiment, a binding clip 27c, as described above, is further provided to additionally secure the housing. The clip element 27c may be a clamping member that is flexible enough to be fitted over the top and bottom members, but rigid enough so as to seal the two members together in a liquid proof seal.

Figure 4M:
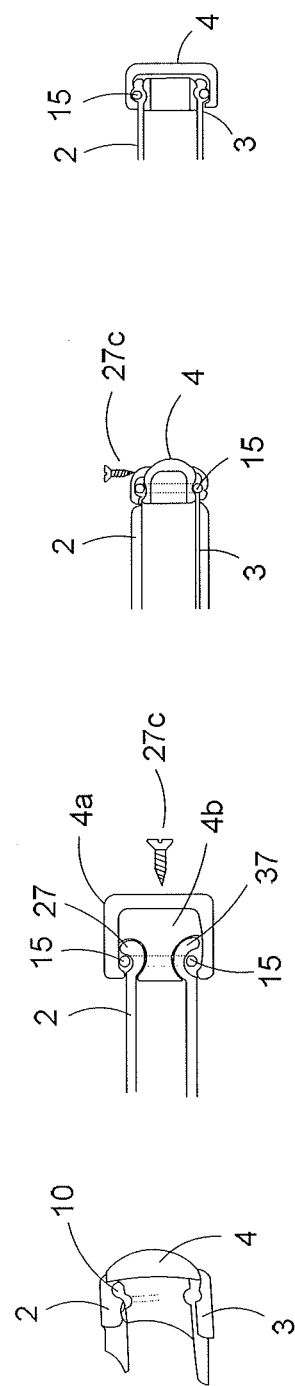

FIG. 4M provides an alternative embodiment of a housing of the disclosure. The housing 1 includes a top member 2 having a clasping mechanism 27 and a bottom member 3 having a clasping mechanism 37. A clip element 4 is also provided. In this embodiment, the clip element 4 includes locking elements that are configured so as to be coupled with corresponding clasping mechanisms 27 and 37 respectively. Further, in this embodiment, the clip element 4 includes an internal member 4b and an external member 4a. In various instances, both internal 4a and external 4b clipping members may include one or more apertures within which a securing member 27c, such as a screw member, may be joined so as to further lock the members of the housing together. The securing member 27c may be configured for being attached to the clip element from a vertical or horizontal entry point.

FIG. 4N provides a front and back view of the housing of FIG. 4M, housing a device 100, with the screw elements 27c locked into place along a perimeter portion of the housing 1.

Figure 5A:
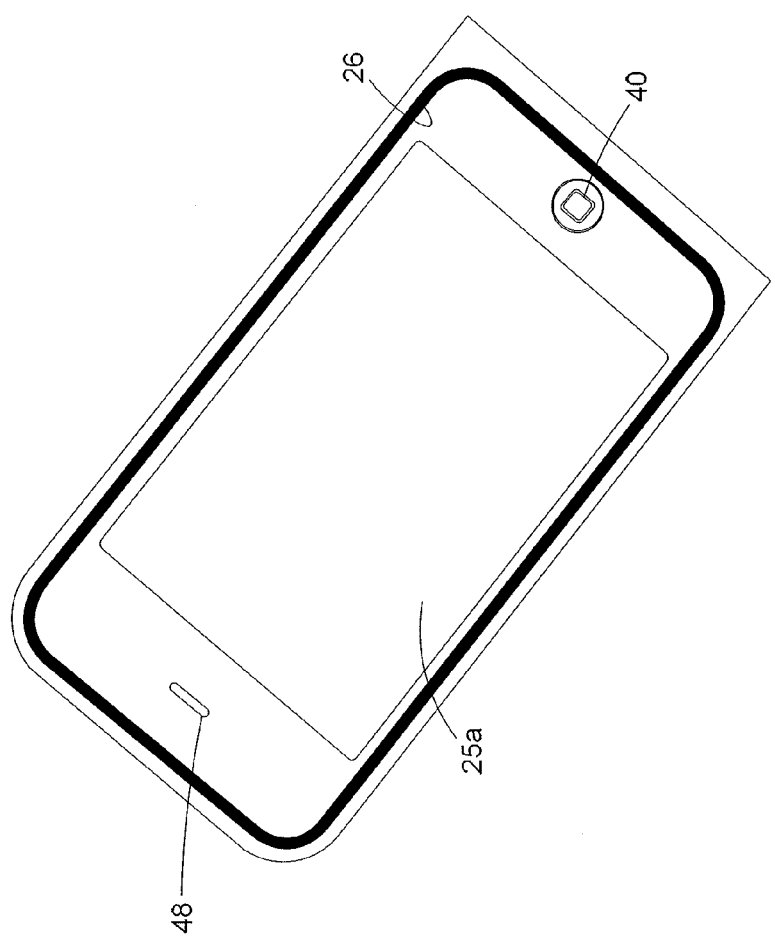

FIG. 5A is a perspective view of a top surface 25 of a top member 2 of the disclosure. The top surface 25 comprises a membrane. The membrane may be fabricated from any suitable material. The membrane is typically transparent, but may contain one or optically opaque regions. An opaque region may be entirely opaque or may include one or more optically transmissive regions. Accordingly, as depicted in FIG. 5A the membrane 25 includes an optically transmissive region and an opaque region, which opaque region includes two features, an optically clear region, e.g., a proximity sensor feature 48, and a button feature 40.

Figure 5B:
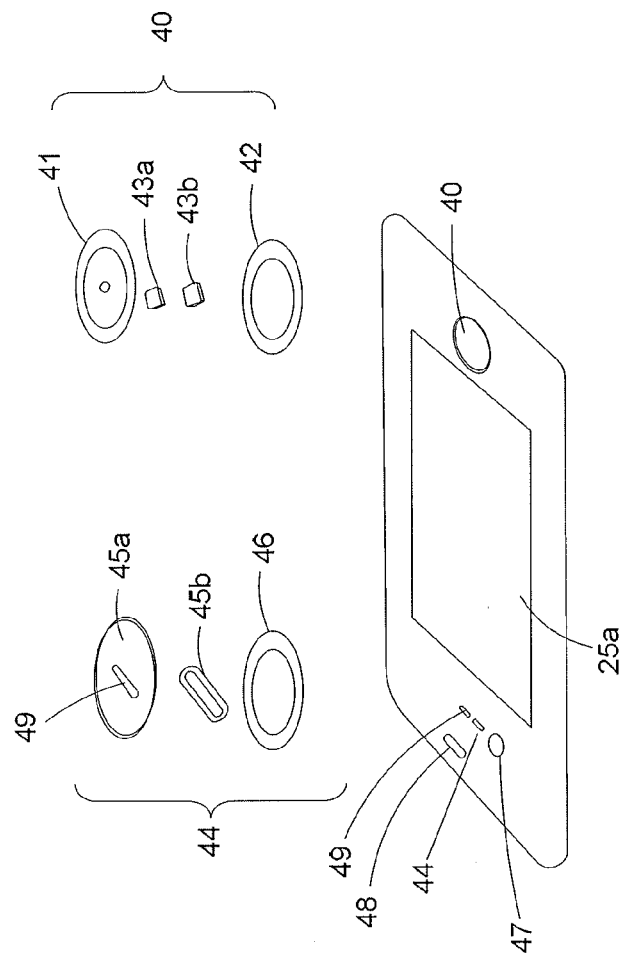

FIG. 5B illustrates several other features, and their components, which may be included in a top member, e.g., membrane 25, of the housing 1. These features include button feature 40 (or home aperture), an acoustic aperture feature 44, a camera lens portion 47, and a proximity sensor portion 48.

In this embodiment, the button feature 40 includes a plurality of sub-features. For example, the button feature 40 may include a button feature membrane with a button feature first transition 41 that interacts with a button feature pivot 42 such that as the button is depressed, the button feature pivot deforms. The button feature 40 may also include a standoff or actuator that is coupled to the button feature membrane, such as to the underside of the button feature membrane via a suitable adhesive. The button feature standoff may be configured such that as the button feature is depressed the standoff interfaces with a button of an underlying device so as to effectively manipulate said button. The home button 40 may be fabricated in any suitable manner such as being fabricated from component parts and assembled together, as described herein, or may be formed, such as thermal formed, in conjunction with the front membrane 25. Accordingly, it is to be noted that while in this embodiment the button feature 40 is composed of several different elements, in various other embodiments the button feature may simply be an indented portion, e.g., a thermally formed indented portion, of the front membrane 25 circumscribed by a raised region. Although not shown herein, in certain embodiments, an inward facing surface of the home button may include a standoff, such as an adhesive spacer element, that may function so as to allow the home button 40 better engage a home button 140 of an underlying device.

In various embodiments, the acoustic aperture feature 44 may be comprised of an acoustic exit aperture 49 that is overlaid with water-impermeable gasket, e.g., an acoustic membrane or vent material 45, which membrane material covers the acoustic aperture 49 thereby preventing the ingress of water there through while at the same time allowing the transmission of sound. With respect to FIG. 5B, in this embodiment, the acoustic aperture feature 44 includes a plurality of sub-elements. For instance, the acoustic aperture feature 44 includes an acoustic membrane material 45a, the acoustic membrane material 45a includes an acoustic exit aperture 49. The acoustic membrane material 45a is offset from the membrane 25 and attached therewith by an adhesive ring 46 and is further associated with an acoustic vent material 45b, which acoustic vent material is sound permeable but liquid impermeable. The acoustic vent material 45b may be associated with the acoustic membrane material 45a such that it covers the acoustic exit aperture 46 so as to prevent the ingress of water there through while at the same time allowing the transmission of sound.

The membrane 25 may also include video camera 47 and proximity sensor 48 regions, which regions may be configured for interacting with a video camera and proximity sensor of an underlying device. In this embodiment the video camera and proximity sensor regions are optically clear regions. In various other embodiments, the camera region may include a lens configured to be aligned with the camera lens of a housed device.

In certain instances, the proximity sensor 148 of the underlying electronic device 100, if included therein, is typically incorporated into the device, e.g., touch screen device, such that when the device is placed close to the face of a user or bounds of a pocket or other storage element, etc. the touch capabilities of the touch screen 125 are disabled, so as to prevent unintended operation of the touch interface by the face, ear, or other object. As can be seen with respect to FIG. 5C, such proximity sensors 148 are typically comprised of an infra-red transmitter 148a, and an infra-red receiver 148b to detect reflections from the infra-red transmitter from objects, such as a face or pocket, etc., that is in close proximity.

In certain instances, such as depicted in FIG. 5C, when the device 100 is housed within a housing 1, an air-gap can develop between the screen or membrane 25 of the housing 1 and the screen surface 125 of the electronic device 100 having the proximity sensor 148, thereby causing the proximity sensor 148 to detect a reflection of its own beam, resulting in a false trigger of the proximity sensor, and consequently unintended disabling of the touch screen interface 125.

In certain embodiments, the housings 1 of the present disclosure may overcome these problems in a variety of ways, as depicted in FIG. 5C. For instance, an unintentional air-gap may be prevented and/or reduced, thereby mitigating the false-triggering of the proximity sensor 148, in one or more of the following ways. An optically transparent member 48a, e.g., spacer, of a determined thickness may be molded or otherwise adhered to the membrane 25 to fill the air-gap. The adhesive could be any suitable adhesive, such as, in certain instances, the adhesive could be glue, adhesive tape, heat-welding, molding, static cling, surface tension, and/or the like. Further, a physical deformation 48b may be added to the membrane 25 so as to form the optically clear region of the proximity sensor portion 48 of the membrane 25 to reduce the air-gap. Such a depression may be performed with cold-pressing, or by thermo-forming the membrane. Additionally, the membrane 25 may be over-formed to provide a continuous positive tension thereon. Also, a member of double-sided optically clear adhesive with a pre-determined thickness can be applied to membrane 25, and then the membrane 25 may be adhered to the screen of the electronic device 100 to completely eliminate the air-gap. The adhesive may be formed by surface tension, static cling, viscous fluids, adhesive, and/or the like.

Figure 5D:
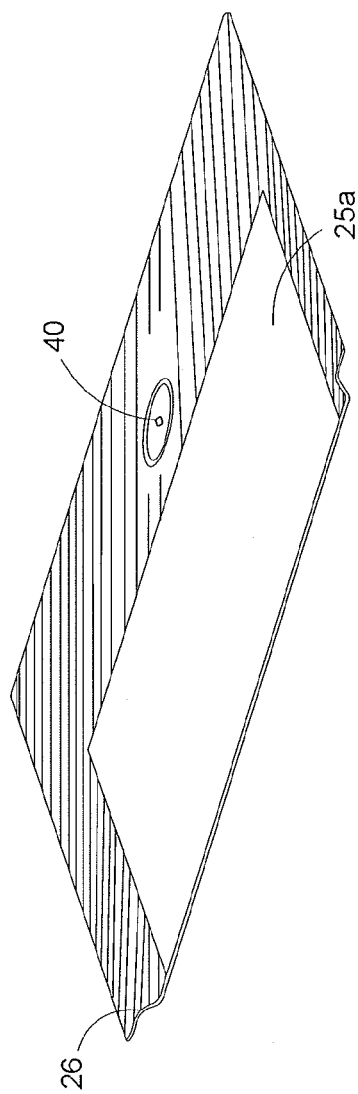

FIG. 5D is a cross section view of the membrane 25 of FIG. 5A. As depicted in FIG. 5D the top surface membrane 25 spans from one side 23 of the top member 2 to the other side 24 of the top member. The membrane 25 may include a raised ridge portion 43 which circumscribes the membrane 25. The raised ridge portion may be configured for interfacing with a perimeter portion 20 of the top member 2 in a manner such as described with respect to FIG. 6 below. In certain embodiments, the membrane 25 is flat across its surface and therefore the perimeter portion 43 of the membrane 25 is not a raised ridge portion.

However, as illustrated in FIG. 5D, in certain instances, the membrane 25 may include an interior portion and an outer perimeter portion 43, such as a portion that may interface with a perimeter portion, e.g., of the housing 1, e.g., top member. As described above, the perimeter portion 20 of the top member 2 may include a plurality of sub-portions, such as a first sub-portion or interior perimeter portion 20a that includes an interior membrane interfacing member, and a second sub-portion or exterior perimeter portion 20b that includes an exterior membrane interfacing member. The membrane 25, therefore, may be configured such that it spans from one side of the perimeter 23 to another 24 in such a manner that the back surface of the membrane 25 associates with at least a portion of the interior membrane interfacing member of the interior perimeter portion 20a, and the front surface of the membrane 25 associates with at least a portion of the exterior membrane interfacing member of the exterior perimeter portion 20b. See, for instance, FIG. 6 below.

FIG. 6. Illustrates an exemplary embodiment of how the membrane 25 of FIG. 5D may associate with the perimeter portion 20 of the top member 2. As can be seen with respect to FIG. 6A the membrane 25 includes an interior portion that spans across the top member 2 and a perimeter portion 26 that interfaces with the perimeter portion 20 of the top member 2. The perimeter portion 20 of the top member 2 includes an interior perimeter portion 20a that includes an interior membrane interfacing member; and an exterior perimeter portion 20b that includes an exterior membrane interfacing member.

The membrane 25 is configured such that it spans from one side 23 of the top member to the other side 24 of the top member 2. The membrane has a front surface 25a and a back surface 25b. The back surface of the membrane 25b associates with at least a portion of the interior membrane interfacing member of the interior perimeter portion 20a of top member 2; and the front surface of the membrane 25a associates with at least a portion of the exterior membrane interfacing member of the exterior perimeter portion 20b of top member 2.

In this embodiment, the interior perimeter portion 20a comprises an under-moulded material, such as a rigid material, for instance, a rigid plastic, metal, polycarbonate, and the like, that is fabricated in a first moulding process; the membrane 25 is then added and attached thereto; and the exterior perimeter portion 20b comprises an over-moulded material, such as a semi-flexible material, such as rubber, TPE, polyethylene, or the like, that is fabricated in a second moulding process, for instance, after the rigid interior perimeter portion 20a has been fabricated and the membrane 25 attached thereto. Hence, once the rigid first perimeter portion 20a has been fabricated, the membrane 25 may be applied from one side of the perimeter 23 to the other 24 and attached thereto, such as by an adhesive layer. Subsequently, the semi-flexible or flexible exterior perimeter portion 20b may be fabricated and applied to the interior perimeter portion 20a and over a perimeter portion 43 of the membrane 25, e.g., in an overmould process.

In such an instance, the interior perimeter portion 20a of the top member 2 includes an interior or back surface membrane interfacing region which associates with a back surface of the membrane 25b, either directly or through an intermediary adhesive layer(s); and the exterior perimeter portion 20b includes an exterior or top surface membrane interfacing region that associates with the top surface of the membrane 25a, either directly or through an intermediary adhesive layer(s). In this undermould/overmould process the membrane 25 is secured to the perimeter portions in a liquid-proof seal. It is noted that as depicted the membrane 25 includes an exterior perimeter ridge feature 26, however, in certain embodiments this ridge feature need not be included.

Figure 6A:
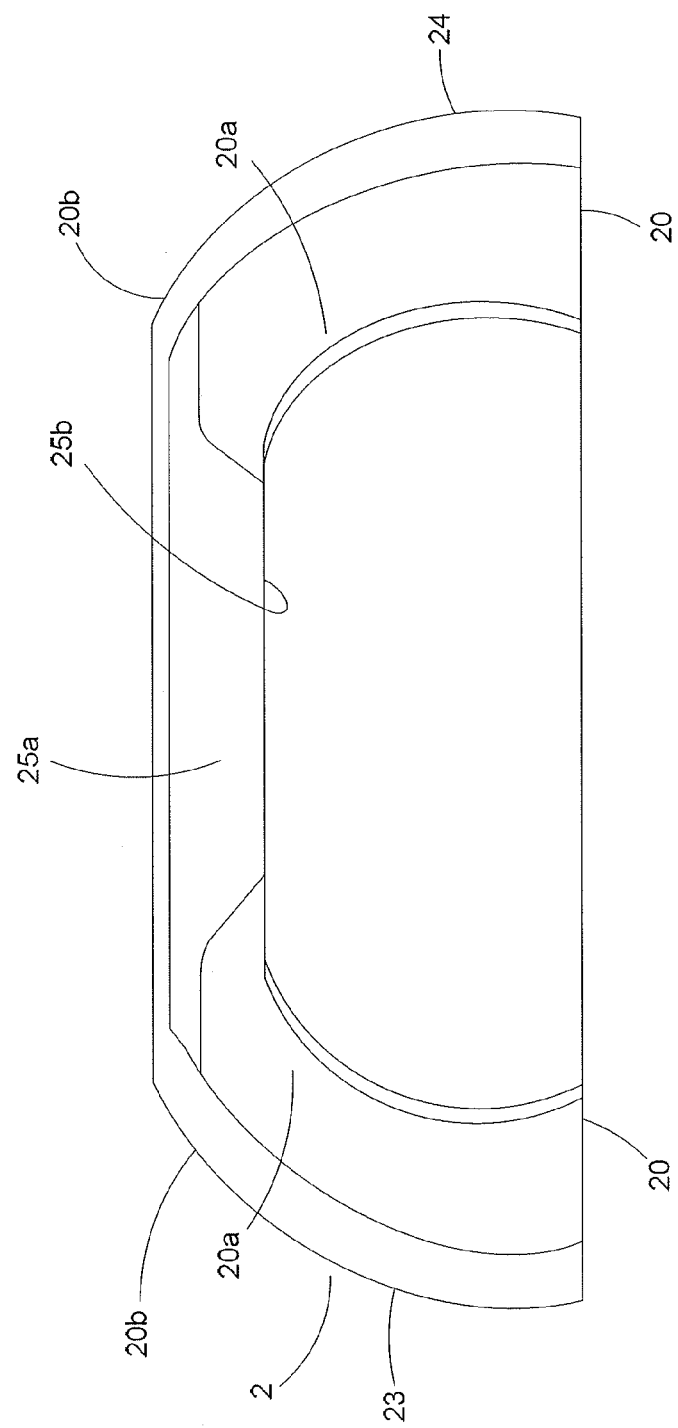
FIGS. 6A-6E provide various side cut-away views of a housing of the disclosure showing the interaction between the top surface membrane and perimeter portions of the housing as well as a suitable latching mechanism.
Figure 6B:
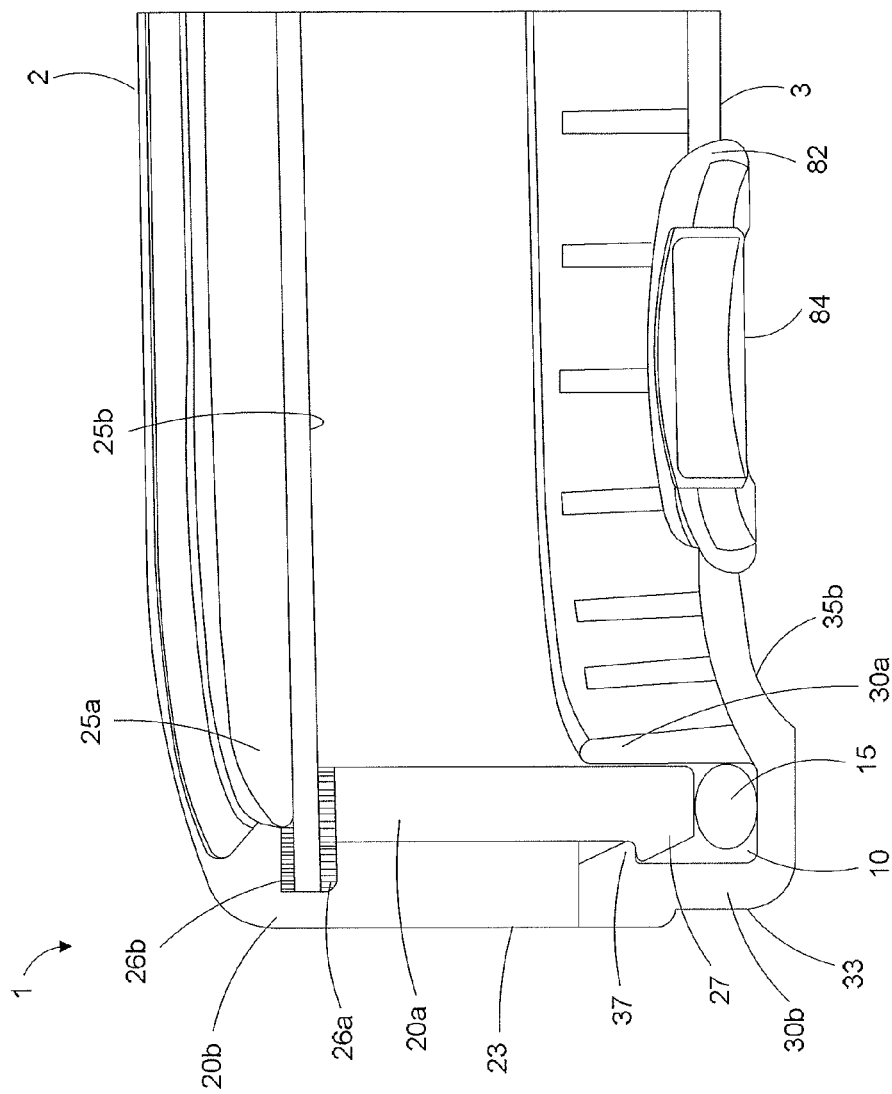

FIG. 6B illustrates a cross section of a side portion of the device of the disclosure. Depicted therein are sides 23 and 33 of top and bottom members 2, 3 respectively of the housing 1. With respect to top side member 23 of top member 2, the side member 23 comprises a perimeter portion 20 of the top member 2. The perimeter portion 20 in this embodiment includes an interior perimeter portion 20a and an exterior perimeter portion 20b. The interior perimeter portion 20a is fabricated from a rigid or semi-rigid material. A membrane 25 spans across from one side 23 of top member 2 to another side 24 (not shown). The membrane 25 includes a front or top surface 25a and a back or bottom surface 25b. The back or bottom surface of the membrane 25b is moulded or otherwise attached to the interior perimeter portion 20a.

For instance, the membrane 25 may be attached to the interior perimeter portion 20a via a suitable adhesive or directly via the fabrication, e.g., moulding, process. The exterior perimeter portion 20b is fabricated from a flexible or semi-flexible material. The exterior perimeter portion 20b may be associated with the interior perimeter portion 20a by various means known in the art, such as by a moulding, e.g., overmoulding, process. The front or top surface of the membrane 25a is moulded or otherwise attached to the exterior perimeter portion 20b. For instance, the membrane 25 may be attached to the exterior perimeter portion 20b via a suitable adhesive or directly via the moulding process. In this manner the membrane 25 is attached to the perimeter portion 20 to form a reliable, tight seal. It is to be noted that although a particular embodiment has been depicted, various aspects of the configuration may be changed without digressing from the depicted embodiment. For instance, in certain instances, the membrane 25 may be attached directly to the rigid frame 20a of the perimeter portion 20 of the top member 2, while the flexible outer perimeter portion 20b is not overmoulded therewith but is adapted so as to be removable therefrom. A gasket, such as a circumferential gasket may or may not be included therewith.

Figure 6C:
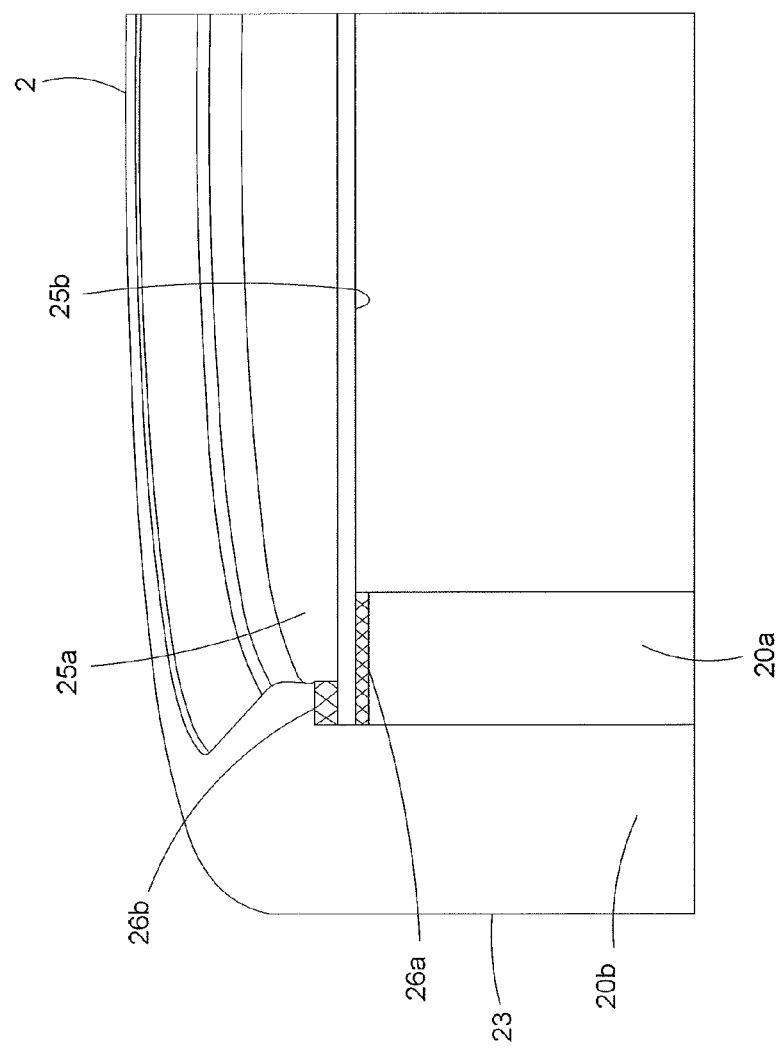

FIG. 6C illustrates an embodiment of how the membrane 25 associates with a top side portion 23. The top side portion 23 includes an interior perimeter portion 20a, which portion comprises a rigid framework body that can be fabricated in a first process. The membrane 25 can then be attached either directly during the fabrication process, e.g., the moulding process, or indirectly through the addition of one or more intervening adhesive layers, e.g., 25 c and d. In certain embodiments, the one or more adhesive layers need not be included.

In one embodiment, once the rigid internal framework 20a has been fabricated and the membrane 25 attached thereto, a second, more flexible perimeter portion 20b may be fabricated and overlaid or otherwise moulded over the interior perimeter portion 20a and membrane 25. In certain instances, the membrane 25 may be attached to the perimeter portions 20 a and/or b via one or more adhesives 25 c and/or d. In a manner such as this a liquid-tight seal is produced between the membrane 25 and the perimeter portion 20, wherein the interior perimeter portion 20a interfaces with a bottom surface 25b of membrane 25 (e.g., via adhesive 25c), and an outer perimeter portion 20b is configured with respect to the top member 2 such that it interfaces with a top surface 25a of the membrane 25 (e.g., via adhesive 25d).

Figure 6D:
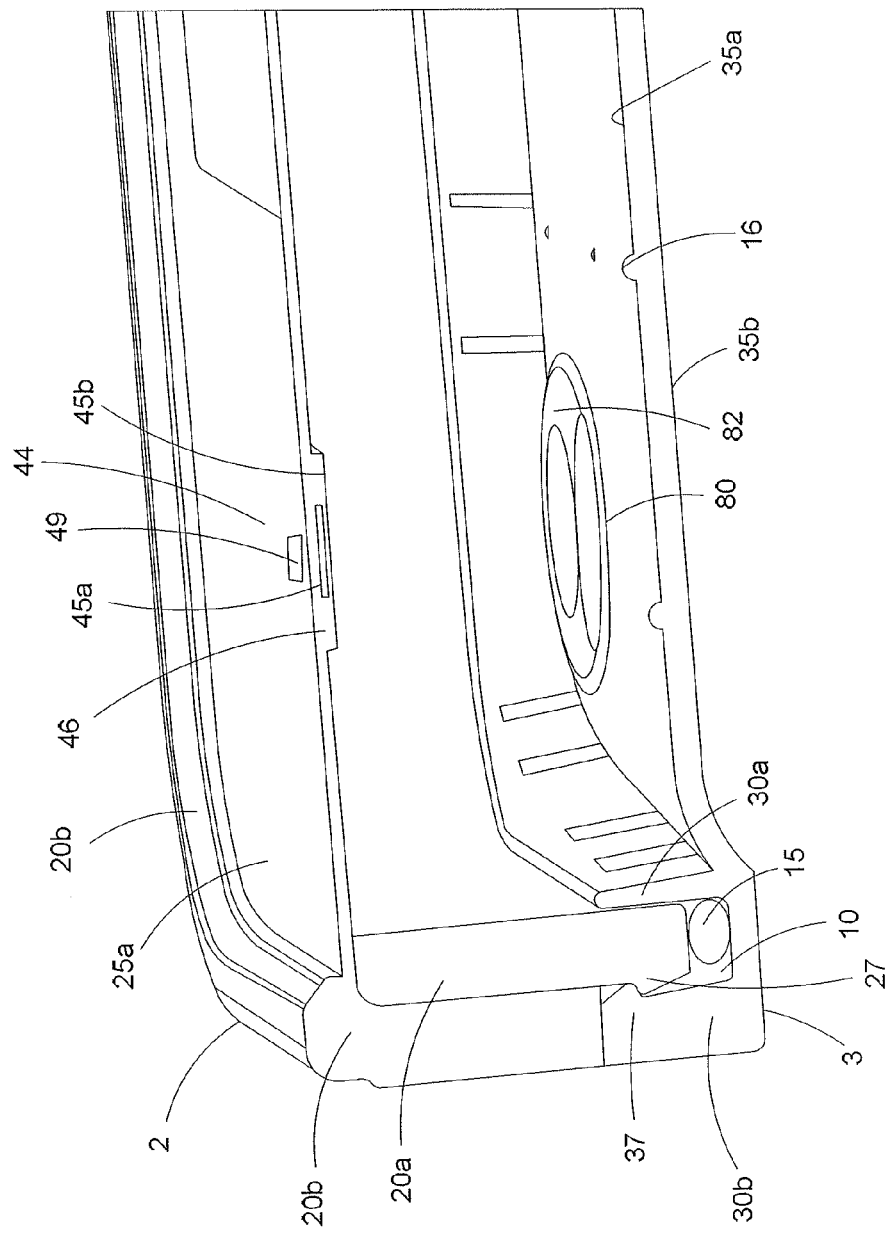

FIG. 6D depicts a further embodiment of the overmoulded top member 2 of FIG. 6C. The rigid interior member 20a is fabricated such as from a hard polycarbonate material and a membrane 25 is associated therewith, e.g., by the application of an intervening adhesive. Any suitable adhesive or molecular bonding material may be employed. Once the membrane 25 has been attached to the rigid body 20a, a second more flexible member 20b, e.g., a semi-flexible or flexible material such as TPE, may be fabricated and molded over both the rigid body 20a and a perimeter portion 26 of the membrane 25, so as to circumscribe the perimeter thereof. In this manner the internal rigid body 20a will give the top member 2 a strong internal framework and the flexible external body 20b will provide a layer of shock absorbance to the top member 2. Furthermore, an over-moulding process such as this will enhance the bonding of the membrane 25 to the external and internal bodies 20 a, b of the perimeter portion 20 thereby enhancing reliability of the seal and ensuring that the seal is liquid-proof.

As can be seen with respect to FIG. 6D, the rigid interior perimeter portion 20a of top member 2 includes a clasping mechanism 27 that is designed to associate with a corresponding clasping mechanism 37 of the exterior perimeter portion, e.g., bounding member 30b, of the bottom member 3 in a liquid tight seal. The liquid tight seal is further insured by the presence of the gasket 15 within the channel 10 of bottom member 3. For instance, as the clasping member 27 of the interior perimeter portion 20a of the top member 2 slides into the channel 10 of the bottom member 3 so as to associate with its corresponding clasping member 37 of the exterior bounding member 30b, a portion of the interior perimeter portion 20a of the top member 2 contacts and presses down on the gasket 15 thereby compressing the gasket and further insuring a liquid tight seal therewith. In this embodiment, the clasping member 37 of the exterior perimeter portion 30b is formed as a circumferential groove that circumscribes at least a portion of the channel 10. Hence, the clasping mechanism 27 of the interior perimeter portion 20a of the top member 2 is configured for at least partially being received within the groove 27 so as to be coupled therewith and therefore at least partially circumscribes the channel 10 when the top member 2 is coupled to the bottom member 3.

Also depicted is top surface membrane 25, which top surface membrane 25 includes an acoustic vent feature 44, which acoustic vent feature 44 includes an acoustic exit aperture 49 that is overlaid with water-impermeable gasket, e.g., an acoustic membrane 45, which membrane material covers the acoustic aperture 49 thereby preventing the ingress of water there through while at the same time allowing the transmission of sound. In this instance, the acoustic membrane material 45 is offset from the membrane 25 and attached therewith by an adhesive ring 46. Further depicted is lens feature 80 positioned on a back surface member 35 of bottom member 3. The top surface 35a of bottom surface member 35 also includes standoffs 16. As depicted, the standoffs are illustrated as bump portions 16, although in certain instances they may be elongated, raised line members, which may be positioned anywhere along an interior portion 35a of the bottom member 3, such as in a central portion of the bottom member 3. For instance, the bottom member 3 may include a plurality of parallel raised standoff members in the center portion of the bottom member 3. Such a position may be optimal for maximizing sound resonance without creating increased distortion.

Figure 6E:
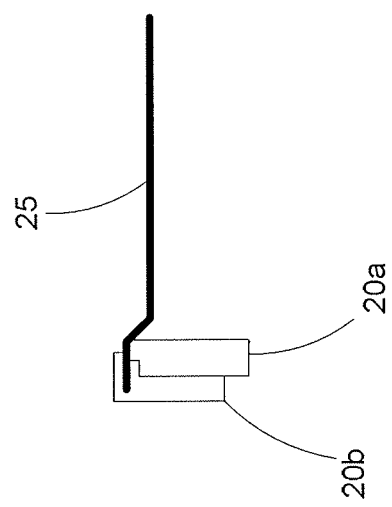

FIG. 6E illustrates an overmould process as described above. This manufacturing process may be employed for fabricating the members of the housing. First a rigid interior structure 20a is fabricated from a rigid material such as polycarbonate. Second, a membrane 25, such as an IMD-PET film, may be provided. In certain instances, the film or membrane may include one or more graphics thereon and in such an embodiment, the graphics, such as 3D graphics, may be printed on the film. The membrane is then cut to size and loaded into a fabrication tool. The membrane, e.g., film, is then associated, e.g., overmoulded, with the rigid polycarbonate structure 20a. The membrane 25 may include a hard or semi-hard coating which may be positioned so that the hard coat is facing up. This surface may be hard to bind to. This coating may be positioned on a top surface of the membrane 25a, so as to be facing up. The rigid material perimeter structure 20a, and in certain embodiments the membrane 25 may then be overmoulded with a more flexible material, such as with TPE, to form a more flexible outer perimeter portion 20b. For instance, an additional, semi-rigid or semi-flexible material 20b, such as TPE, may be added over the rigid material 20a and a perimeter 26 of the membrane 25. In this manner the membrane 25 may be attached to the rigid internal structure 20a of the housing 1 and a more flexible second structure 20b may be moulded there over so as to form a secure seal therewith.

Accordingly, as can be seen with respect to FIGS. 6A-E, the perimeter portion 20 of the top member 2 of the housing 1 may include a plurality of sub-portions, a first sub-portion being an interior perimeter structure portion 20a with a membrane interfacing region, e.g., a region that interfaces with a perimeter portion 26 of the bottom of the front membrane 25b; and a second sub-portion being an exterior perimeter flexible portion 20b with an additional membrane interfacing region, e.g., a region that interfaces with a perimeter portion 26 of the top of the membrane 25a. Hence, the membrane 25 is configured such that it spans from one side 23 of the perimeter to another 24 in such a manner that the back surface 25b of the membrane associates with the interior perimeter portion 20a at the membrane interfacing region; and the front surface 25a of the membrane 25 associates with the exterior perimeter portion 20b at the membrane interfacing region. The membrane may further comprise one or more surface features as described herein.

For example, in certain embodiments, the top or bottom member may include a front and/or back surface, wherein the top and/or back surface comprises a membrane, the membrane may be a single or a plurality of membranes associated with one another. The membrane may include one or more features, such as features that allow the housing to accommodate particular features of an underlying device to be housed therein. Such features may include an acoustic membrane feature, button feature, a proximity sensor aperture, a video camera aperture and/or lens feature, and/or the like.

Figure 6F:
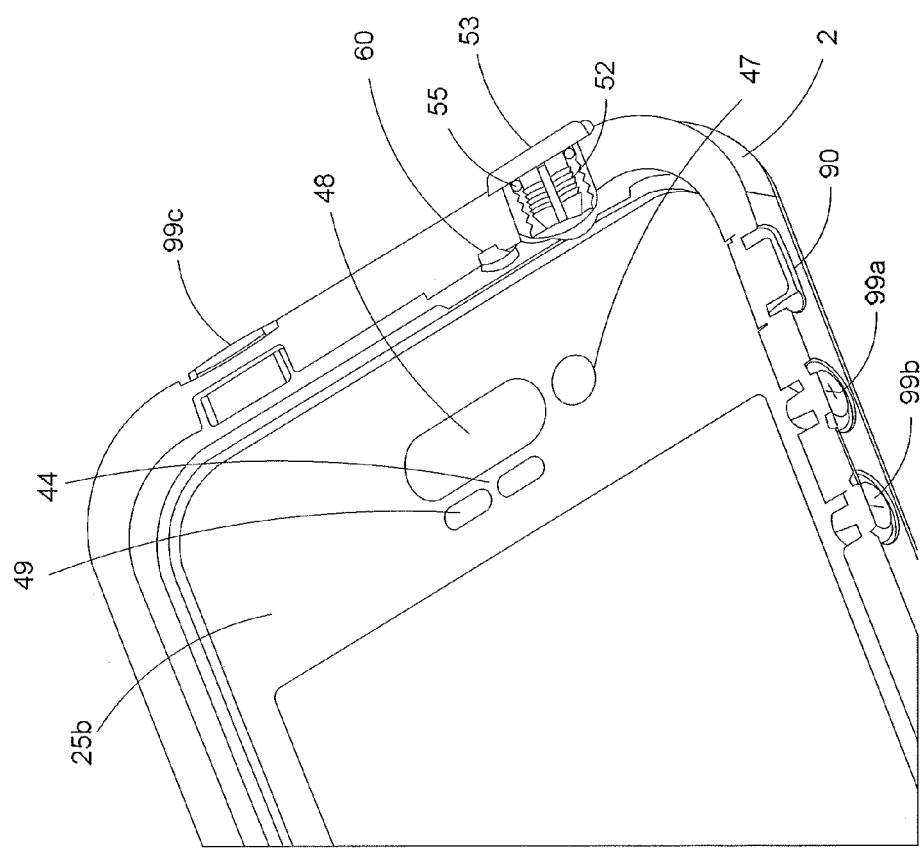
FIGS. 6F-6H provide a perspective view of various features of a membrane of a housing of the disclosure.
Figure 6G:
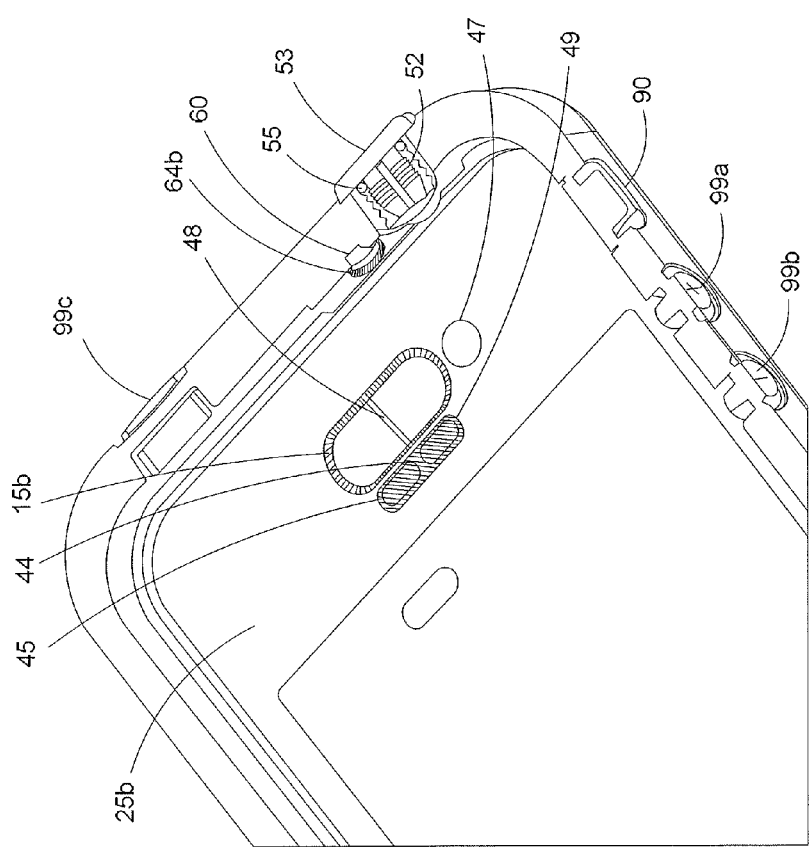
Figure 6H:
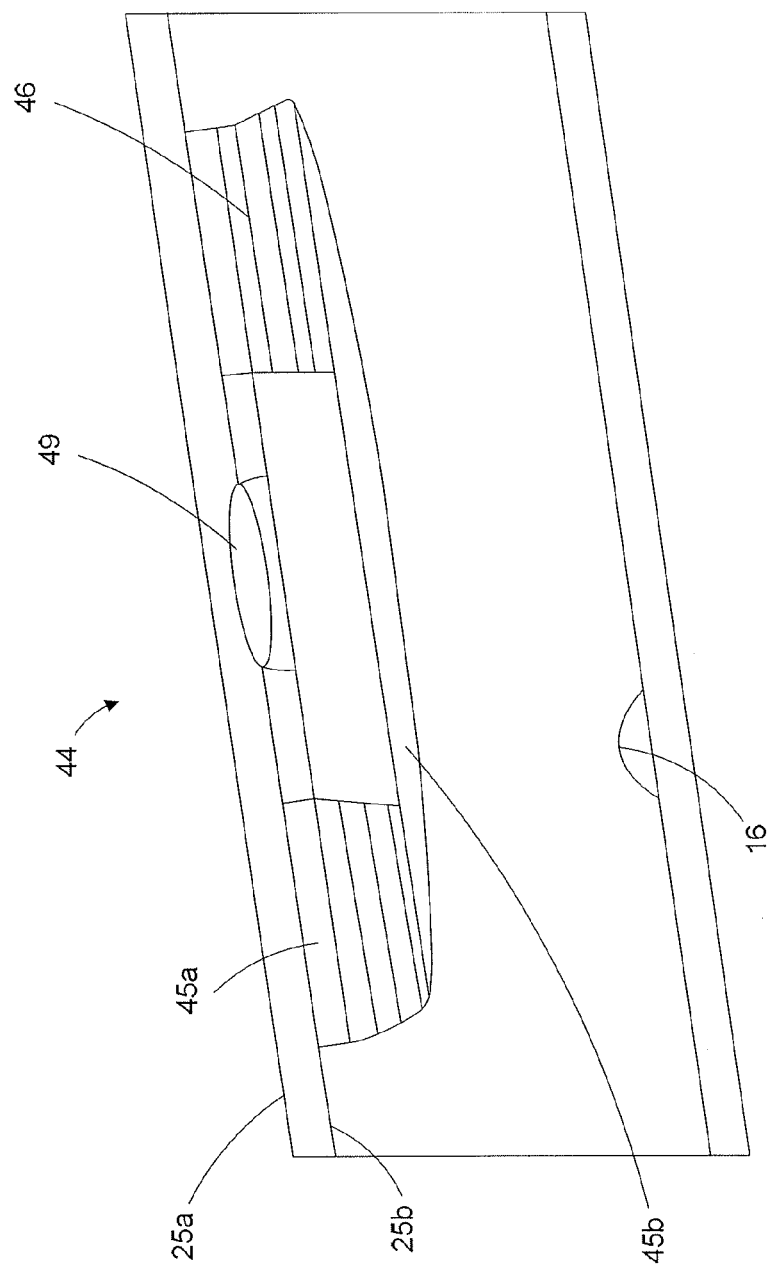

Accordingly, as can be seen with respect to FIGS. 6F-6H, the membrane 25 may include a plurality of features, such as an acoustic membrane feature 44, a lens feature 47, and a proximity sensor feature 48. FIG. 6F provides a cut-away view of the housing 1. The acoustic membrane feature 44 may include an acoustic exit aperture 49 in the membrane 25 to which a second membrane 45, e.g., an acoustic membrane, may be coupled, such as in an offset fashion. However, in this embodiment, an acoustic membrane 45 is not attached. Rather, the acoustic aperture 49 is left open. The lens feature 47 may include a lens, such as a video camera lens, as described herein below with reference to the bottom member 3, or it may include an optically transparent region. In this embodiment, the lens feature is simply an optically clear region. The proximity sensor feature 48 may include an optically transparent region and/or may include a proximity sensor gasket 17. In this embodiment, a proximity sensor gasket 17 is not included.

Additionally, although not depicted herein, a spacer element, such as a long strip of adhesive tape may be applied to a back surface 25b of the top membrane 25. The space may run along one or more sides and may run substantially all the length or a lesser portion thereof. Such a spacer element could be useful for creating a slight gap between the back surface 25b of the front membrane 25 and the front surface 125 of a screen of an electronic device 100. This gap may be useful for a number of reasons such as for enhanced sound transmission, such as that caused by allowing sound to more freely resonate between the front membrane 25 and the front screen 125 of a housed device 100, and/or for preventing a "rainbow," or Newton ring, from forming due to the internal reflection of light that may be caused by the front membrane 25 sticking to the front surface of a housed electronic device. Although the spacer element is described as being an adhesive strip, it may have any of a number of configurations so long as it is capable of attaching to a front membrane 25 or a perimeter portion 20 and capable of preventing Newton rings (e.g., reflective rainbow circles) from forming between the front membrane 25 and the screen of a housed device.

FIG. 6G depicts the top member 2 back surface membrane 25b of the housing 1 as depicted in FIG. 6F, wherein a liquid proof acoustic vent membrane 45 is attached to the acoustic vent portion 44, and a spacer gasket 17 is attached to the proximity sensor portion 48. As can be seen, the top member 2 comprises a membrane 25. The membrane 25 includes a plurality of regions. A first region, e.g., a center region, includes an optically clear region through which the touchscreen interface of a touchscreen electronic device may be interacted with; and a second region, e.g., a perimeter region, that is masked so as to be opaque. In this embodiment, the opaque region is not entirely opaque but includes a plurality of optically clear regions, such as video camera optical aperture 47 and a proximity sensor 48. The opaque region also includes an acoustic vent feature 44 having an acoustic aperture 49 covered by a water-impermeable gasket 45.

In this embodiment, a water impermeable acoustic membrane 45 is attached to the membrane 25 enclosing the aperture 49 in a liquid proof sealing that allows sound to pass there through but not water. In a manner such as this sound from a speaker portion 144 of an underlying device 100 may be transmitted through the aperture 49, but liquid cannot. The proximity sensor feature 48 not only includes an optically transparent region it further includes a proximity sensor gasket 17. The proximity sensor gasket 17 functions to reduce if not entirely eliminate the reflection of light from the membrane 25 being directed back to the proximity sensor 148 of an underlying device thereby activating it, such as described with reference to FIG. 5C. The gasket 17 may have any suitable configuration, but in various instances it may be configured to circumscribe the proximity sensor region 48 and may further include a transecting element that travels from one perimeter to the other so as to transect the gasket. This transecting region may function to further prevent the membrane 25 from activating the proximity sensor 148 of an underlying device 100.

FIG. 6H provides a cut-away, close up view of the acoustic membrane feature 44 of FIG. 6F. As can be seen with respect to FIG. 6H a membrane 25 is depicted. The membrane 25 includes an aperture 49 configured for allowing sound to exit through the top member 2 of the housing 1. The aperture 49 is overlaid with a secondary membrane, such as an acoustic membrane 45. The second membrane 45 is offset from the first membrane 25 and attached thereto by an adhesive rim 46. The second membrane 45 is permeable to sound but not to liquid, such as water.

For instance, as can be seen with respect to FIG. 6H, the adhesive rim may further be configured as a spacer 46 that may be adhered to the acoustic membrane 45, e.g., along a perimeter thereof, so as to offset the acoustic membrane 45 from the membrane 25. Accordingly, in certain instances, a spacer may be included and adhered to the acoustic membrane 45 and the membrane 25 by an adhesive. In other instances, a spacer need not be included, rather, the acoustic membrane 45 may be offset from the membrane 25 by the mere presence of the adhesive.

The second membrane 45 may be an acoustic membrane that is transmissive to sound and/or gas but not to liquids or solids. For example, the acoustic membrane 45 may be a semi-permeable membrane such as GorTex®. The adhesive may be any suitable adhesive and may be applied to the second, e.g., acoustic membrane, 45 so as to attach it to the first membrane 25. As such, the acoustic membrane 45 will allow sound to travel through the acoustic exit aperture 46 of the membrane 25 at the same time as keeping liquid, e.g., water, and dirt from passing there through. As depicted, the acoustic membrane 45 includes two portions 45a and 45b. The first portion 45a includes an opening therein and is attached directly to the underside 25b of the front membrane 25 in such a manner that the openings aligned. An adhesive spacer 46 is positioned on top of the membrane 45a and is further attached to an additional water impermeable membrane 45b, which membrane 45b spans the openings in membranes 45a and 25. The acoustic membrane 45b covers the acoustic vent aperture 49 so as to prevent the ingress of liquid, such as water, but to allow the egress of sound out of the housing 1.

A common feature of electronic devices, such as mobile telephones, is a navigation button, e.g., a home button, that when manipulated allows a user to navigate through various menus contained within the programming of the underlying device. Accordingly, a housing 1 of the disclosure may include a front surface 25 having a corresponding navigation interface feature, such as a button feature 40. As can be seen with respect to FIGS. 7A (a)-(f), in certain embodiments, the front surface of the top member 2 may be a membrane 25 having a button feature 40.

Figure 7A:
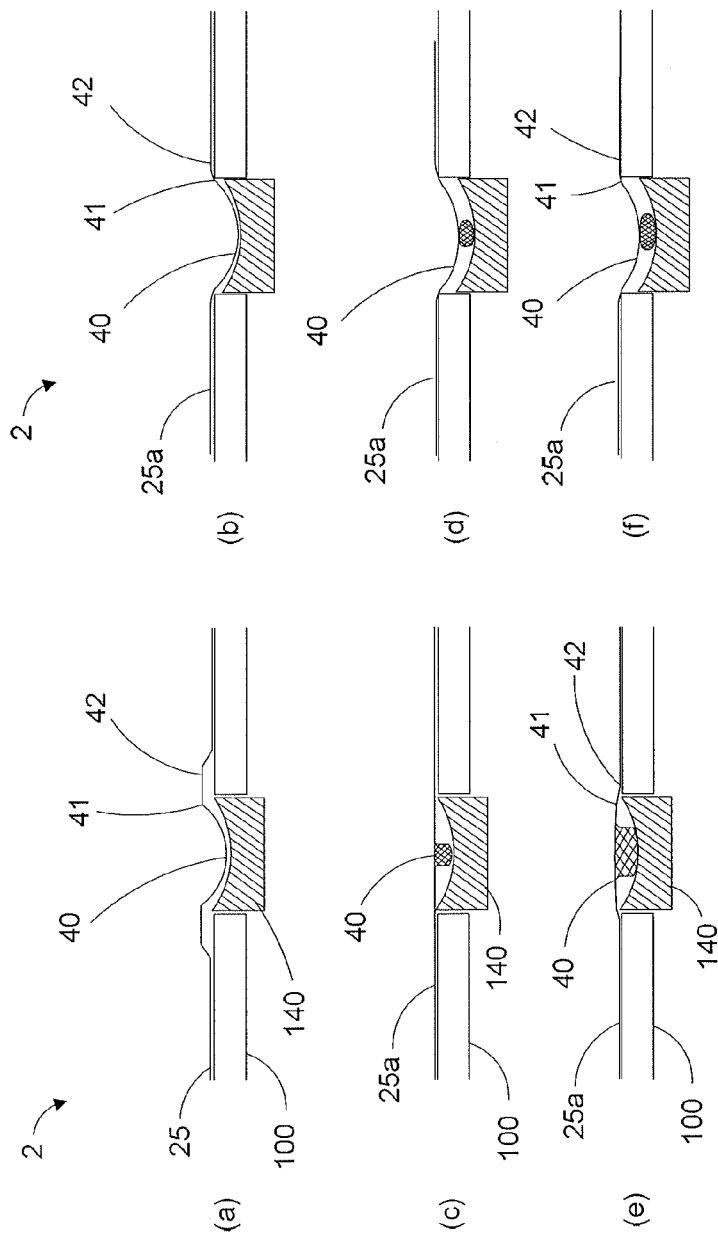

FIG. 7A illustrates three various embodiments of a button feature 40 that may be employed with the housing 1 of the disclosure. The button feature 40 may have any suitable configuration so as to allow the membrane 25 of the top member 2 to effectively interact with an underlying button feature 140 of an encased device 100, e.g., without substantial deformation of the membrane 25.

For instance, the button feature 40 may simply be a specifically designed detent that is integral with the membrane material 25, or it may be an additional feature added to the membrane, such as a feature that includes a layer of stiff or flexible material that has been molded, adhered, or otherwise attached to the membrane 25 as a button area. If the button feature 40 is an additional feature to be added to the front membrane 25, the button feature may be configured such that the button feature does not increase the thickness of the membrane 25 so as not to decrease the functionality and aesthetics of the housing 1.

As can be seen with respect to FIG. 7A (a) the top surface 25 of the housing 2, e.g., the membrane, such as a PET membrane, includes an indented region 40 that is at least partially surrounded by a raised ridged or pivot region 42, which pivot region 42 may be associated with at least a first transition 41. The indented button feature 40, the first transition 41, and the pivot region 42 are configured such that as the button feature 40 is depressed, the ridged pivot region deforms 42 allowing the indented portion to travel without causing substantial stretching of the membrane 25 outside of the button region. In certain embodiments, the pivot region 42 comprises a ridged circumference that can be adapted so as to create a pivot point with an increased pivot radius.

Accordingly, in a manner such as this the button feature 40 may be manipulated in such a manner that it interfaces with a navigation region 140 of an underlying device 100 thereby allowing a user to easily navigate through the various menus of an encased device. As can be seen with respect to FIG. 7A (a) and (b), a three dimensional form of a button feature 40 may be present in the top surface 25 of the housing 1, e.g., the membrane. For instance, the membrane 25 may include an indented region that may or may not be surrounded by a ridged circumference having a first and/or second transitions 41 and 42, respectively.

For example, where a ridged circumference is included, the ridged circumference may have a first transition 41 and may further have a second transition 42, such that the ridged circumference surrounds a flat or an indented button surface of the button feature 40. As the button surface is depressed, at least the first transition 41 of the ridged region deforms thereby allowing the indented portion to travel without causing substantial stretching of the membrane 25 outside of the button region 40.

Additionally, the ridged circumference can be adapted so as to create a pivot point 42 with an increased pivot radius. See FIG. 7A (b). As the button surface is depressed, the first transition 41 of the ridged region deforms pivoting about the second transition 42 which further allows the indented portion to travel without substantially stretching the membrane 25.

In a further embodiment, as can be seen with respect to FIG. 7A (c) and (d), the button feature 40 may be configured as a substantially flat surface or a surface having a minor detent therein and having a formed or attached nipple associated with a back surface of the membrane 25b. The nipple may be positioned in the direct center of the button feature or may be offset therefrom, e.g., so as to accommodate different features of a home button and/or different configurations thereof. In this embodiment, an indented region and/or ridged circumference 42 is not included. Rather, the first transition 41 is linear and sharp thereby creating a sharp pivot interface. Further, as seen with respect to FIGS. 7(c) and (d), the button feature 40 is substantially flat all the way across but includes a nub or nipple on an underside of the membrane 25 that may be pressed into the button of the underlying device when the button feature is depressed. The button feature 40, first transition 41, and nipple are configured such that as the button feature 40 is depressed, the membrane 25 flexes along the sharp pivot 41 and the nipple interfaces with the navigation button 140 of an underlying device 100 thereby allowing a user to navigate through the various menus of an encased device.

In an additional embodiment, as can be seen with respect to FIG. 7A (e) and (f), the button feature 40 may be configured as a raised membrane member 40 having a knob associated with a back surface of the membrane 25b. The knob feature may be positioned in the direct center of the button feature or be offset therefrom. In this embodiment, a ridged circumference is not included. Rather, the first transition 41 is raised and the membrane 25 is stretched over the knob. The button feature 40, raised first transition 41, and knob are configured such that as the button feature 40 is depressed, the raised membrane portion is lowered and the knob interfaces with the navigation button 140 of an underlying device 100 thereby allowing a user to navigate through the various menus of an encased device. Hence, the button feature 40 may include a raised, but depressible knob portion having the membrane 25 material stretched over it. The knob portion may be positioned so as to allow the button feature to interact with the button 140 of an underlying device 100.

Figure 7B:
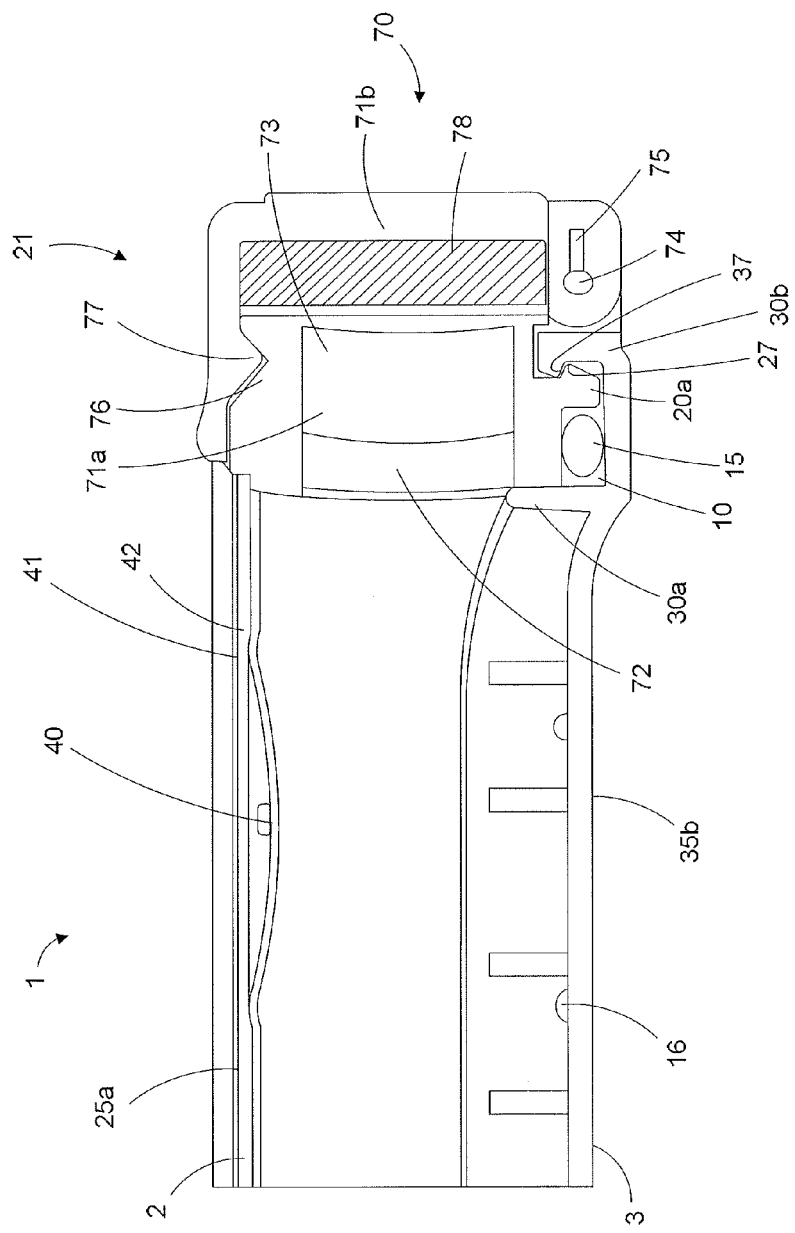

FIG. 7B provides a side cut-away, cross section view of a housing 1 of the disclosure, showing the indented button feature 40 of FIG. 7A (a). The housing 1 includes a top member 2 and a bottom member 3. The top member 2 includes a front surface, which in this embodiment is composed of a flexible membrane 25. The front membrane includes a button feature 40, which button feature includes a pivot edge 41 and a raised pivot ridge 42. The button feature 40 is indented and configured to interface with the "home" or "menu" button of an encased device. The pivot ridge portion 42 is raised and at least partially circumscribes the button feature 40 so as to accommodate the travel pursuant to the button 40 being depressed. For instance, as the button 40 is depressed, pivot edge 41 flattens and pivot ridge 42 extends downwards.

The top member 2 further includes a charge port feature 70 on its proximal end 21. The charge port feature 70 includes a charge port opening 71a, which charge port opening is covered by a charge port latch cover or door 71b. The charge port opening 71a is bounded by a bounding member. The bounding member may be formed of any suitable material and may be in any suitable shape.

For instance, the charge port bounding member may be composed of the same material from which the interior and/or exterior perimeter portions 20 a and/or b are made. Hence, the charge port bounding member may be integrally formed along with the interior perimeter portion 20b and/or further formed along with the exterior perimeter portion 20b. In certain embodiments, the charge port bounding member may be integrally formed along with the stiff and/or rigid interior perimeter portion 20a of the top member 2 so as to form a charge port opening 71a. A second flexible perimeter portion 20b may then be overlaid upon the rigid interior perimeter portion 20a, wherein a charge port cutout may be cut into the flexible perimeter portion 20b so as to at least partially bound the charge port opening 71a of the interior perimeter portion 20a.

However, in certain instances, as depicted in FIG. 7B, the charge port bounding member may include a plurality of materials from which the charge port opening 71a is composed. For instance, the charge port opening 71a may be bounded by a plurality of materials having a different stiffness. For instance, a first bounding material may be a stiff material 72 which material is provided to give structure to the charge port opening 71a. A second more flexible material 73 may be included which material is configured for receiving a portion of a charge port door gasket 78.

The charge port feature 70 may further include a charger port door 71b that may include a charge port door gasket 78.

Together the charge port door 71*b* and gasket 78 function to provide a waterproof sealing of the charge port orifice 71*a*. For instance, in this embodiment, the charge port bounding member includes a charge port door latch ramp receiving member 76, and the charge port door 71*b* includes a corresponding charge port door latch ramp 77. The charge port door latch ramp 77 is configured for being received within the charge port door latch ramp receiving member 76 thereby latching the charge port door 71*b* to the bounding member. Thus, when the charge port door 71*b* is closed, the gasket 78 covers the charge port opening 71*a* thereby effectively sealing the opening 71*a* and preventing the entrance of liquid there through. The gasket may be composed of any suitable compressible material, which if desired may be further overlaid with a less flexible rubber material so as to provide greater resilience to the gasket 78.

The charge port door 71*b* is configured for opening and closing so as to allow and/or prevent access to the charge port opening 71*a*. Hence, the charge port feature 70 may further include a charge port axle 74. The charge port door 71*b* therefore may be configured to include an axle receiving orifice 75 though which the axle 74 is fitted. In a manner such as this, the charge port door 71*b* may be rotated about the axle 74 from an opened to a closed position thereby permitting access to the charge port opening 71*a*, when in the opened position, or preventing access thereto by providing a waterproof seal when the charge port door 71*b* is in the closed position.

Also depicted is bottom member 3. The bottom member 3 may include a perimeter portion 30 having a channel 10 therein. The channel 10 may be bounded by an interior perimeter portion 30*a* and an exterior perimeter portion 30*b*. The bottom member 3 is configured for being connected to the top member 2, such as via corresponding latching mechanisms 27 and 37, so as to form a waterproof sealing of the housing 1. Specifically, the top member 2 may include an interior perimeter portion 20*a* that further includes an internal clasping mechanism 27. The exterior perimeter portion 30*b* of the bottom member 3 may include the clasping mechanism 37. The clasping mechanisms 27 and 37 may be configured for being coupled together so as to clasp the top 2 and bottom 3 members together thereby forming the housing 1.

To further insure a waterproof sealing, a channel 10 may also be included along a perimeter portion of the housing 1. The channel 10 may include a gasket 15 positioned therein. Accordingly, as the interior perimeter portion 20*a* of the top member 2 is aligned with the exterior perimeter portion 30*b* of the bottom member 3, and the corresponding clasping mechanisms 27 and 37 are coupled together, the interior perimeter portion 20*a* of the top member 2 compresses the gasket 15 within the channel 10 of the bottom member 3 thereby creating a waterproof sealing of the housing 1.

Also depicted on a front surface 35*a* of bottom member 3 are standoffs 16. In certain embodiments, a bottom or top member may include one or more stand-offs 16. For instance, in certain embodiments, such as for increased shock protection and/or sound transmission, a top and/or bottom member may include one or more preformed standoffs 16, such as on an interior surface of the top 2 or bottom member 3. As indicated above, the stand-offs 16 can be configured with a size, shape, and configuration so as to enhance the transmission of sound throughout the housing 1.

FIG. 7C provides a close up view of another embodiment of the button feature 40. As can be seen with respect to FIG. 7C, in various embodiments, a top member 2 and/or a bottom member 3 may include the channel 10, which channel 10 may include gasket 15. For instance, in this embodiment, the top member 2 includes an interior perimeter portion 20*a*, wherein the interior perimeter portion 20*a* is further configured to include an interior channel bounding member 20*a*1 and an exterior channel bounding member 20*a*2. In this instance, the exterior channel bounding member 20*a*2 includes clasping mechanism 27, and the exterior perimeter channel bounding member 30*b* of bottom member 3 includes corresponding clasping mechanism 37. However, in various instances, this configuration could be reversed. Accordingly, where included, the channel 10 of the housing 1 may be included in either a top member 2 or a bottom member 3 or in both top and bottom members 2 and 3 respectively.

Figure 8A:
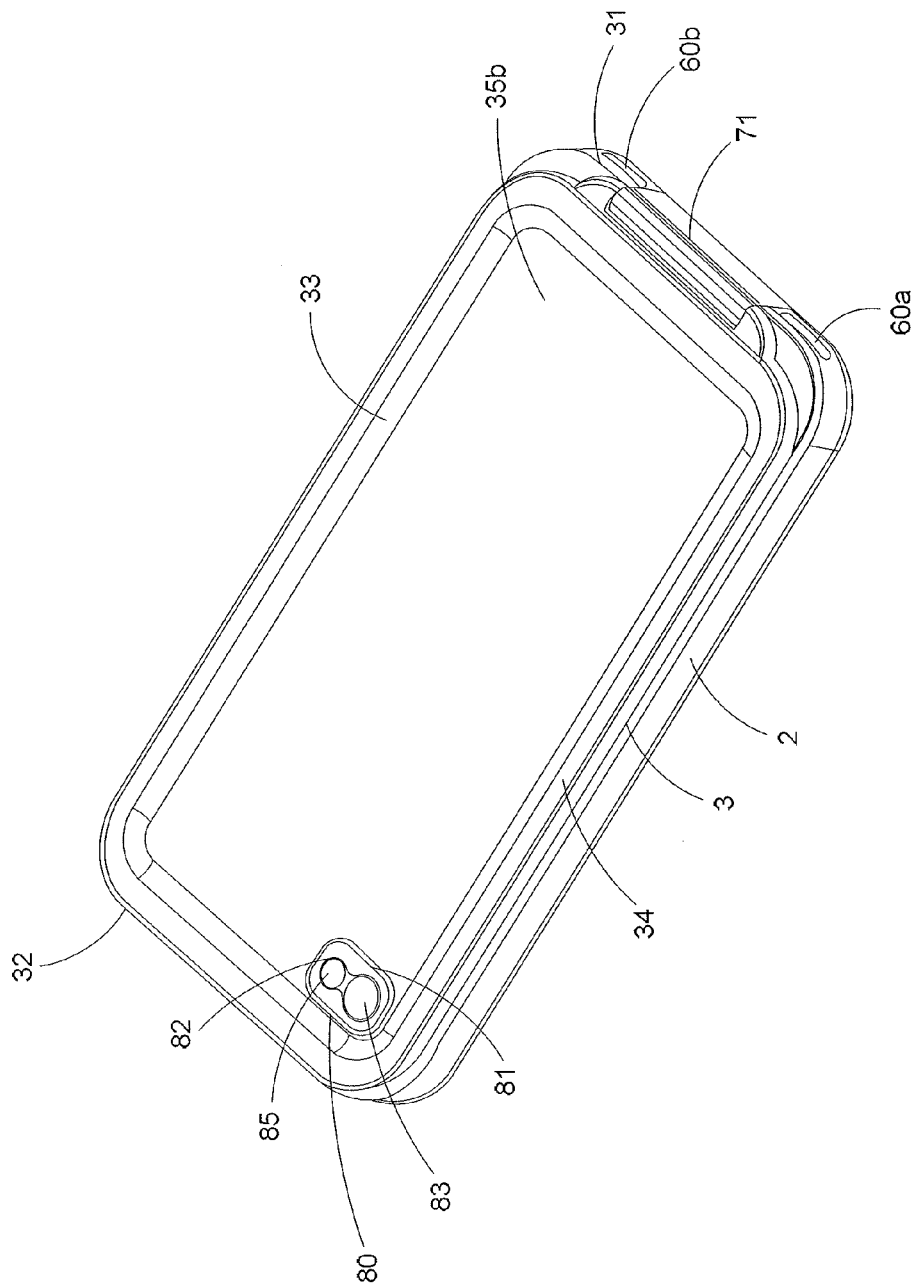

In certain embodiments, a bottom member may additionally include one or more features. For instance, although a top or bottom member may include a lens feature, in certain instances, the bottom member 3 includes a lens feature 80. For example, FIG. 8A provides a perspective view of a back surface 35*b* of a bottom member 3. The bottom member 3 includes both distal and proximal end portions 31 and 32 as well as bottom side portions 33 and 34. A camera portion 80 is also included. The camera portion 80 may include one or more of a raised lip portion 81 surrounding an optical skirt 82. The optical skirt 82 is configured for housing at least a camera lens region 83 having a camera lens therein and may additionally include a flash lens region 85, having a flash lens therein. Either lens can be replaced by an optically transmissive region.

Accordingly, in certain embodiments, a top and/or a bottom member 2,3 may include a camera portion 80 having a lens feature, such as a camera and/or flash feature 83 and/or 85 respectively. In typical cases, a lens and/or flash feature is not provided. Rather, there is simply an optically transmissive region provided. Such a region may be problematic because it may interfere with the clarity of pictures taken by a camera and/or flash of a housed device. For instance, where a flash is provided, an unprotected optically clear region may allow the transmission of light incident to the camera lens of the underlying device thereby causing pictures taken to be washed out. In other instances, the camera portion simply comprises a cut-out portion of the casing through which pictures may be taken. However, this is not ideal as it may prevent the case from being water resistant. If a camera and/or lens is to be provided in a housing of the disclosure, it may be so provided in such a manner as to be stepped up from the housing. This, however, may not be ideal because it may be hard to clean, easy to scratch, and hard to protect.

Accordingly, as can be seen with respect to FIG. 8A in certain embodiments, a lens feature 80 is provided wherein one or more lenses, such as a camera 83 and/or a flash 85 lens, are positioned within the top 2 or bottom 3 member of the housing 1 so as to be integral therewith and not substantially stepped up there from. The lens feature may include a lens 83 for a camera and/or another lens 85 for a flash, and may further include an optical skirt 82 surrounding the one or more lenses so as to prevent inerrant light transmission, e.g., to reduce internal reflection and thereby reduce flair.

In fabricating a lens feature, the one or more lenses may be pressed into the top or bottom member, so as to be pressed flush against the housing material. Such a fabrication method may be better than molding because typical molding process using rubber and other such materials are difficult with respect to glass due to the difference in thermal expansions and contraction. Further, it is difficult to make such seals watertight.

Accordingly, in one embodiment, a housing containing a lens element is provided wherein one or more lenses are provided therein. The lenses may be designed to have a diameter that is less, equal, or greater than that of the lenses provided in the underlying device. In fabricating a housing member having a lens element, the housing member may be fabricated, e.g., molded, and a suitable lens provided separately. A mandrel, or other such tool, may then be employed to press the lens feature into the housing member. This will give the lens feature a clean, well fit interface with the surrounding material of the housing member. The lens feature should be configured such that the transition is flush with no cavities between the lens feature and the housing material.

In certain instances, the camera feature 80 may include an elastomer material into which one or more lenses may be pressed. The elastomer may be configured so as to form an optical divider separating one lens from another, such as a camera lens from a flash lens. Such optical divider may be useful in preventing radiating light from one lens, such as a flash lens 85, from impinging into the other lens, such as the camera lens 83. The elastomeric lens containing material may then be added directly to the bottom member 3 or may be added to another material, such as an optically clear plastic material, which plastic material may then be attached to the bottom member 3, e.g., via an adhesive. For example, a bottom member 3 may be fabricated, such as from a polypropylene material, wherein the bottom member 3 includes a lens feature orifice. A lens containing elastic material may then be fabricated, as described above. A plastic base member may be fabricated and the lens containing elastic material may then be inserted therein. The plastic material may then be attached to the polypropylene bottom member 3, e.g., via adhesive, so as to cover the lens feature orifice. It is to be noted that the elastomeric skirt may completely circumscribe the lens, e.g., the camera lens 83 or flash lens 85, or may partially circumscribe the lens, such as in a tong like configuration.

Also depicted in FIG. 8A is latch door 71, described above, as well as sound inlet and outlets 60 *a* and *b*, described herein in greater detail below.

Figure 8B:
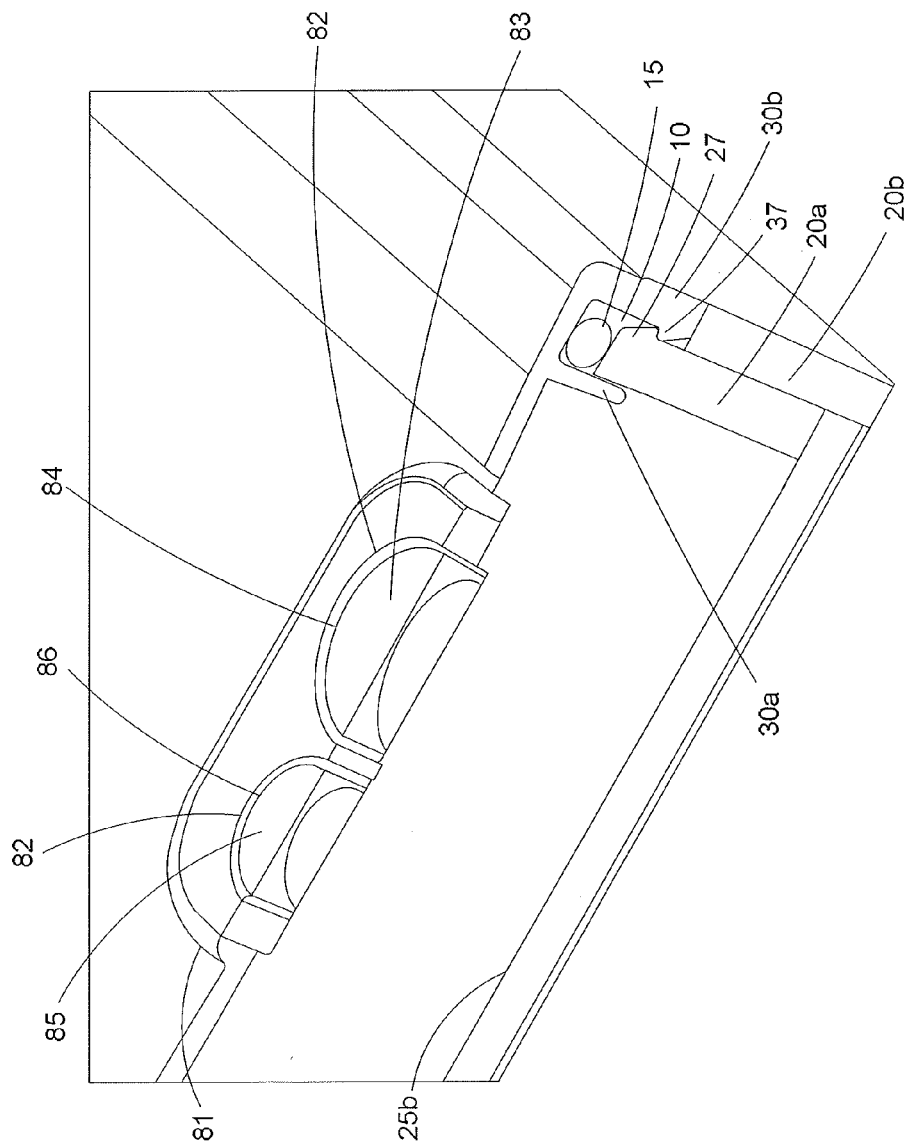

FIG. 8B provides a cut-away cross section view of the lens feature 80, e.g., camera feature, of FIG. 8A. In this embodiment, the lens feature 80 is provided on a bottom member 3 of the housing 1, although in various other embodiments, the lens feature 80 may be provided on a top member 2. The camera feature 80 includes a raised lip portion 81 that surrounds an optical skirt 82. The optical skirt 82 includes a camera lens orifice 84 containing a camera lens 83 and a flash lens orifice 86 containing a flash lens 85.

Figure 8C:
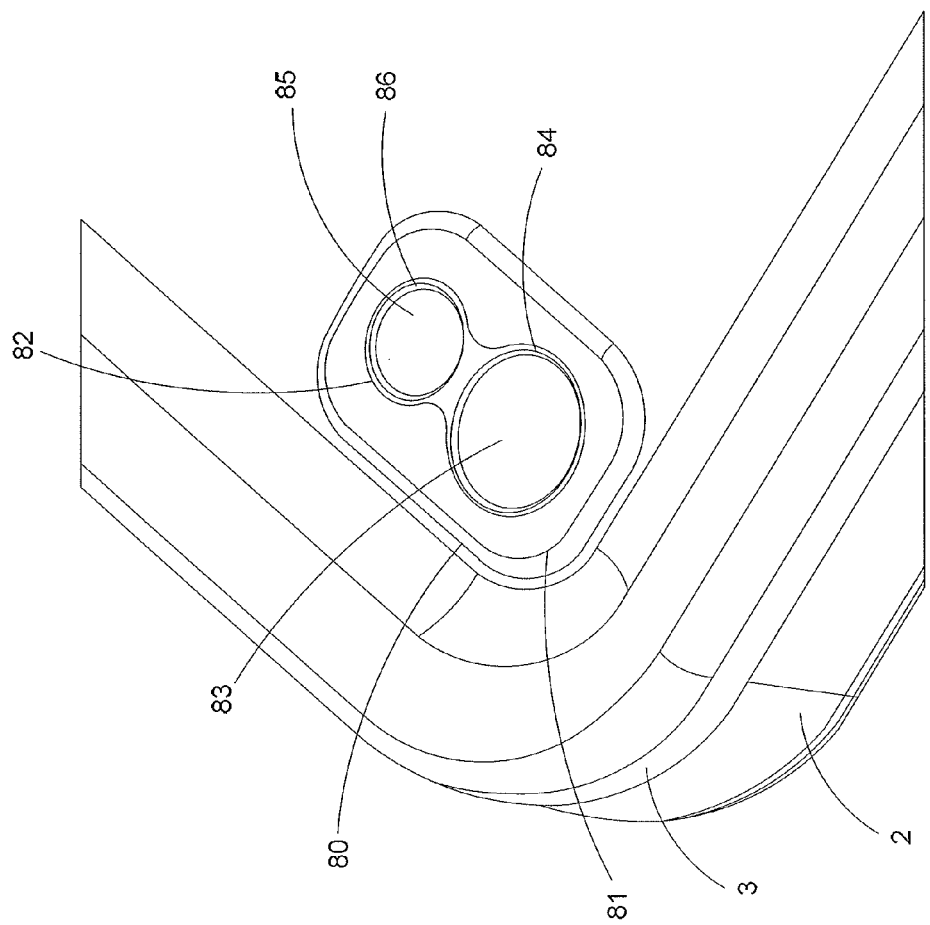

FIG. 8C provides a close up view of the lens feature of FIG. 8B. The camera feature 80 includes a raised lip portion 81 that surrounds an optical skirt 82. This configuration provides a liquid proof interface between the bottom housing 3 and the camera feature 80. The optical skirt 82 includes a camera lens orifice 84 containing a camera lens 83 and a flash lens orifice 86 containing a flash lens 85, wherein the optical skirt is configured for preventing the transmission of light from one lens to another.

Figure 8D:
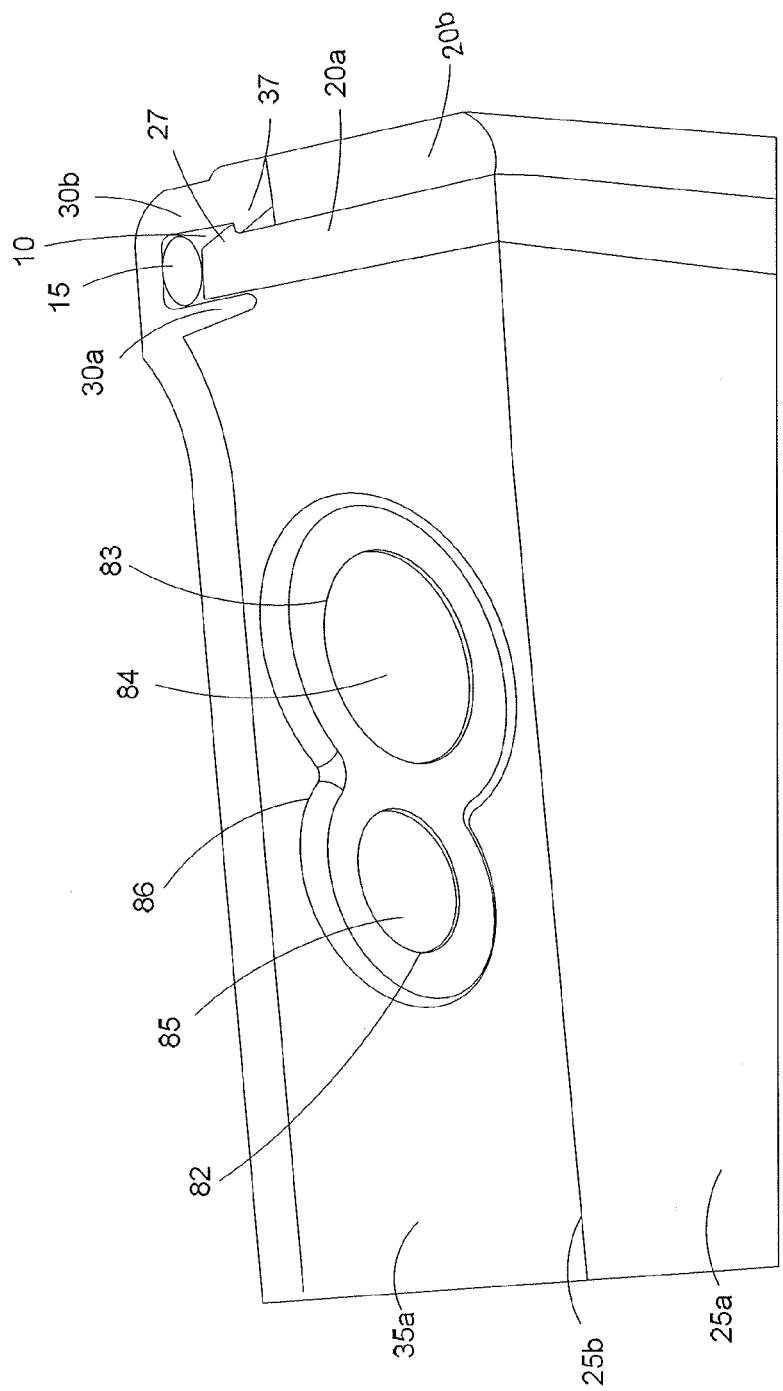

FIG. 8D provides a top-down view of the lens feature 80 of FIG. 8C showing the interior of the bottom housing member 3. The lens feature 80 includes an optical skirt 82. The optical skirt 82 includes a camera lens orifice 84 containing a camera lens 83 and a flash lens orifice 86 containing a flash lens 85. It is to be noted that in this embodiment a flash lens 85 is provided, however, in other embodiments, a flash lens need not be present. Rather, a simple optically clear transmissive region may be provided instead. The optical skirt 82 may be configured so as to prevent the transmission of light from the flash to the camera lens.

Figure 8E:
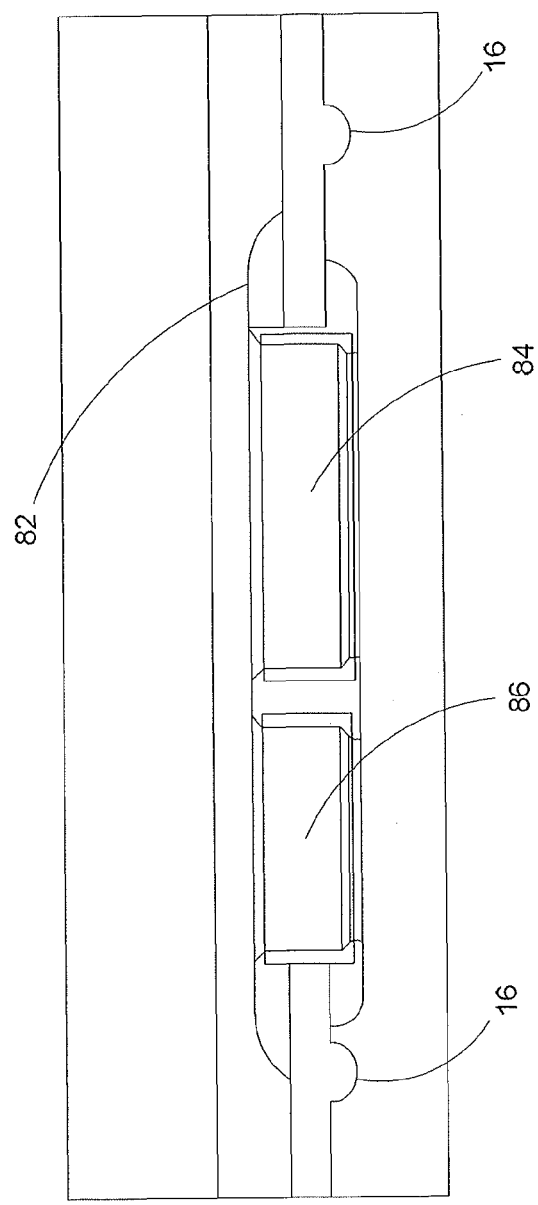

FIG. 8E provides a cut-away view of the optical skirt 82 of FIG. 8D showing the camera lens region 84 and the flash lens region 86.

Figure 8F:
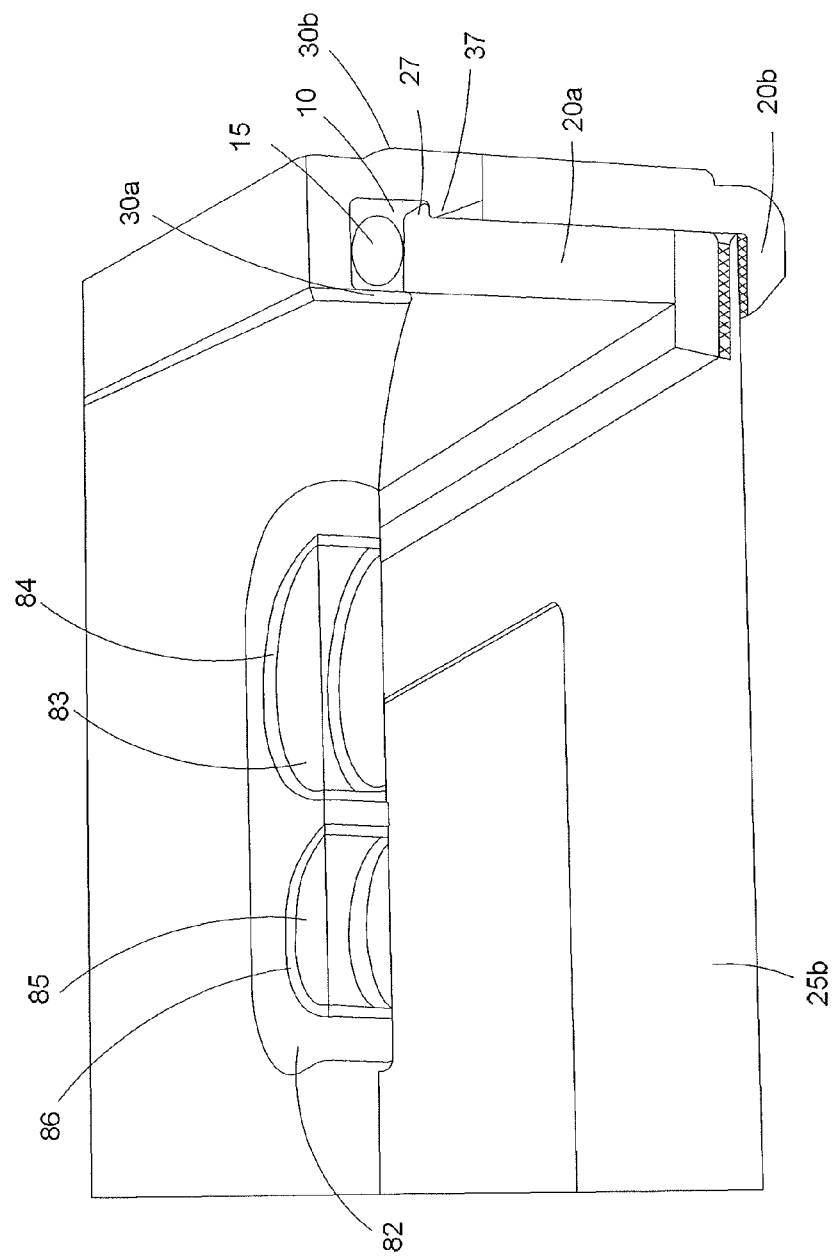

FIG. 8F provides a cut-away cross-section view of the optical skirt 82 of FIG. 8E, showing the camera lens orifice region 84 with camera lens 83 and the flash lens region 86 with flash lens 85.

Figure 8G:
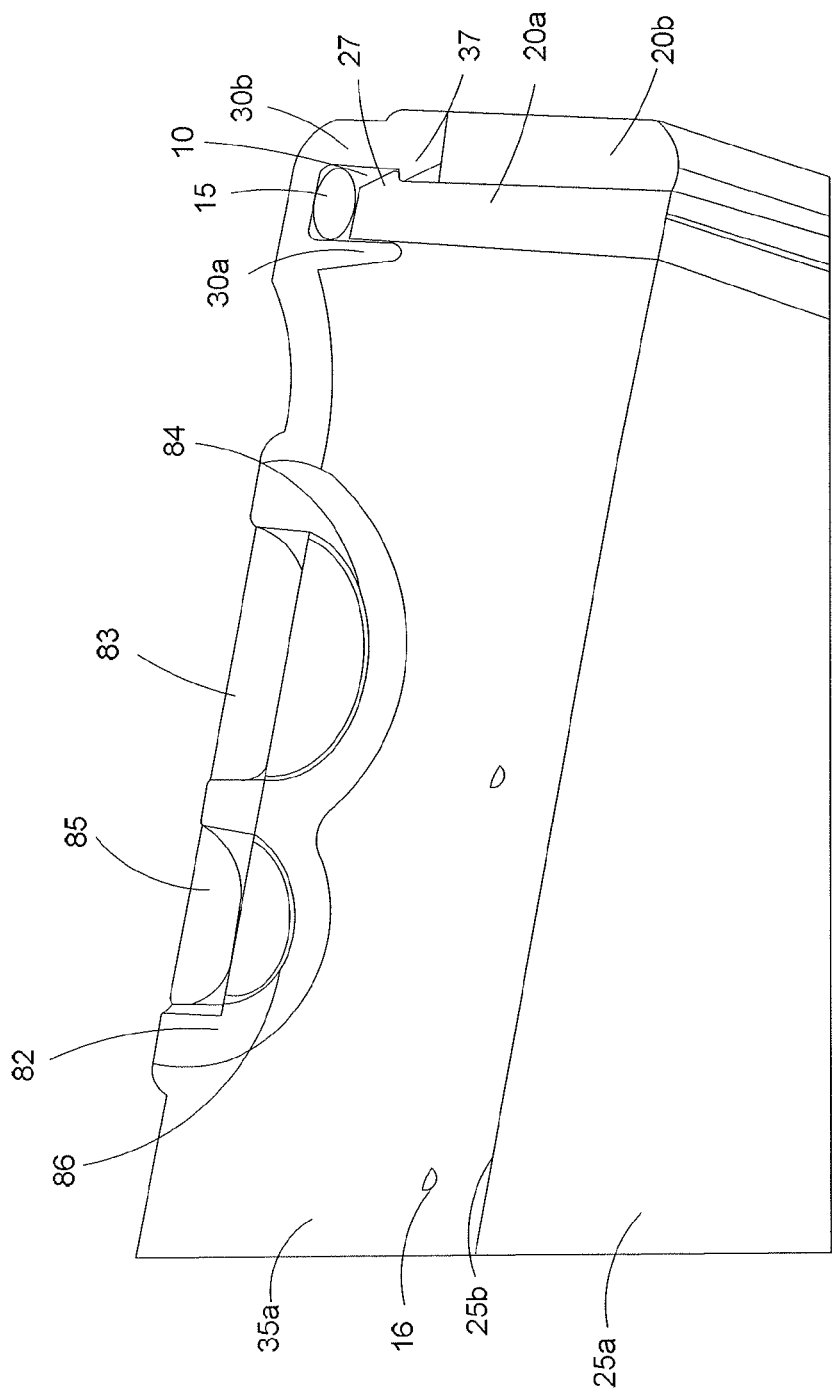
Figure 81:
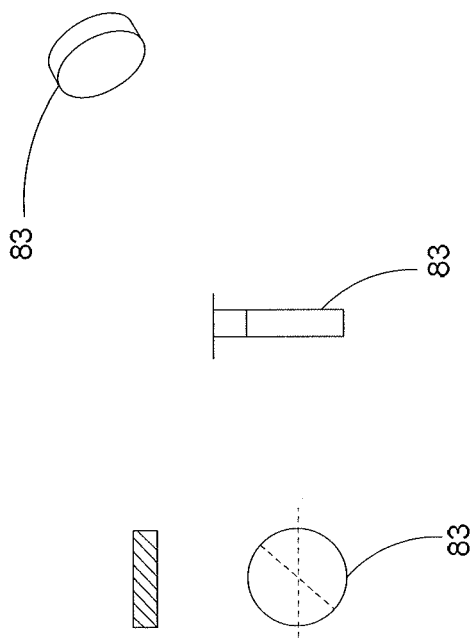

FIG. 8G provides a cross section view of the optical skirt 82 of FIG. 8F showing the interior of the bottom housing member 3. The optical skirt 82 includes a camera lens orifice 84 containing a camera lens 83 and a flash lens orifice 86 containing a flash lens 85.

FIG. 8H provides an illustration of the lens 83 and lens skirt 82 interface of the housing 3. The lens skirt 82 includes a concentric baffle detail which provides an enhanced field of view for the lens 83. Also provided is an illustration of a suitable camera lens 83 and flash lens 85.

FIG. 8I provides an illustration of a camera lens 83 to be fitted within a camera lens aperture 84 of an optical skirt 82.

Figure 8J:
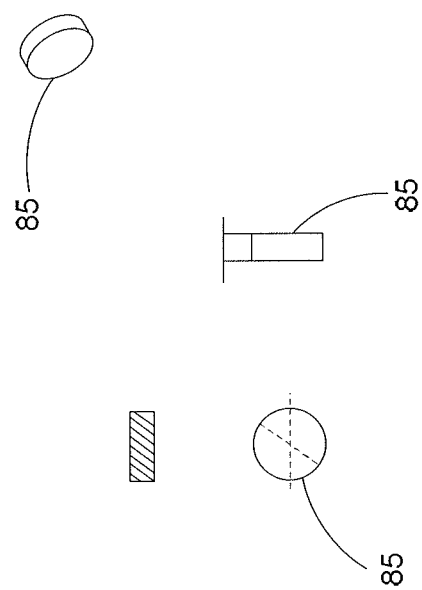

FIG. 8J provides an illustration of a flash lens 85 to be fitted within a flash lens aperture 84 of an optical skirt 82.

As described briefly above, in certain embodiments, the housing may include a port opening, such as an electrical interface port, for instance, or a charge port. To ensure increased protection of the underlying device, such as to protect the underlying device from dirt, liquid, shock, etc., the housing may additionally include a port cover latch that is capable of opening and closing so as to cover and seal the port opening. The port and/or latch cover may be positioned, for instance, along a perimeter of the housing, such as at a proximal or distal end or a side thereof. In certain instances, the port and port cover latch is a shock and water resistant latch port cover. The port and latch cover may be positioned on a top or a bottom perimeter member of the housing and may be configured for spanning across from one side of the opening to another.

Figure 9A:
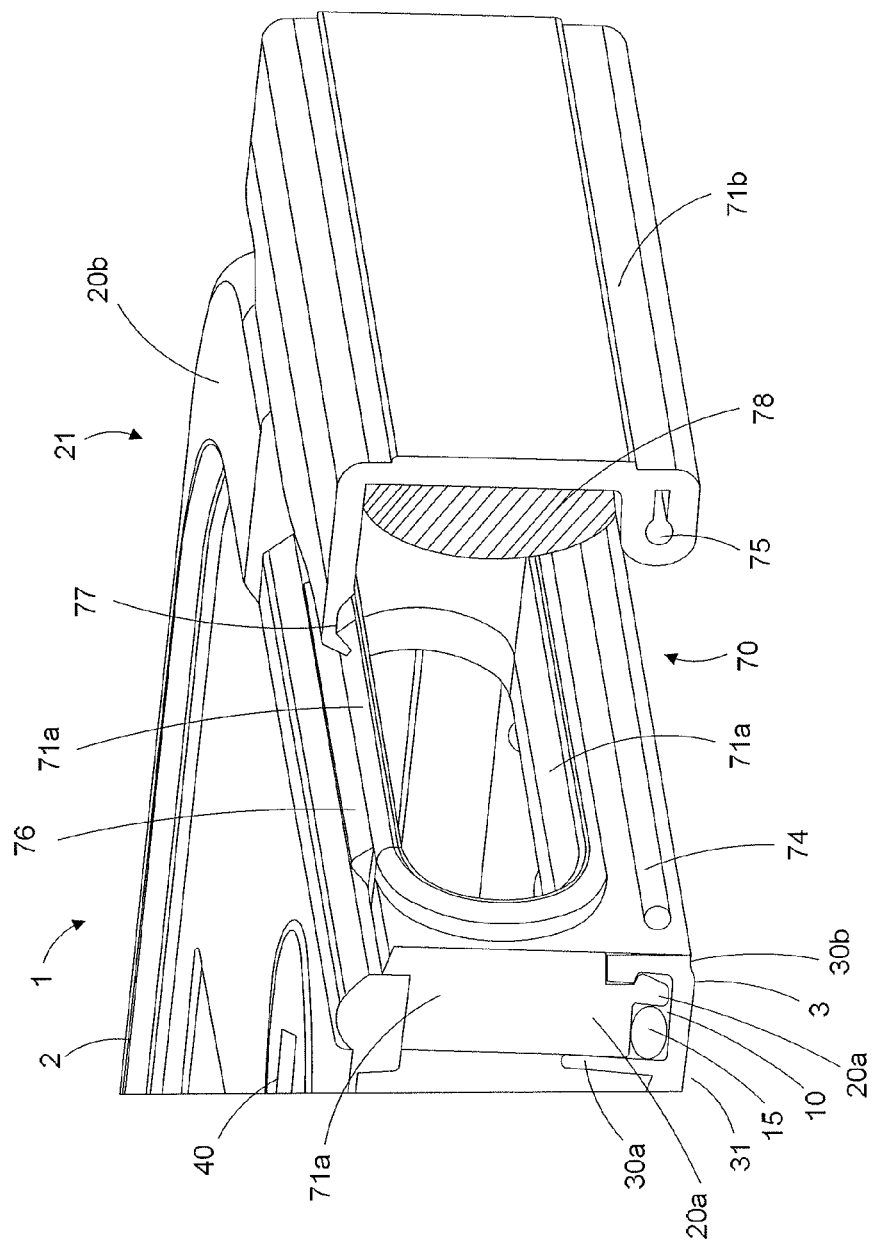
FIGS. 9A-9K provide various views of a latch feature positioned at a proximal end of a housing of the disclosure.

For example, as can be seen with respect to FIG. 9A, in certain instances, a latch feature 70 may be positioned on a proximal end of the housing 1. The latch feature 70 includes a port or latch opening bounding member 71*a*, having a port opening therein, and may further include a latch cover 71*b*. The port opening bounding member 71*a* circumscribes the opening, wherein the opening may be configured to receive a charge member for charging an underlying electronic device. The latch feature 70 may also include a latch cover 71*b* that is configured for covering the latch opening bounding member 71*a*. In this embodiment, the latch opening bounding member 71*a* is formed integrally with an interior perimeter portion 20*b* of the top member 2, which perimeter portion forms a port opening.

The latch feature 70 and port opening bounding member 71*a* may have any suitable configuration. In one embodiment, the latch feature 70 is positioned entirely in one of the upper 2 or lower 3 housing members. Consequently, all of the latch feature components will be positioned entirely on that housing member. In an alternative embodiment, as depicted in FIG. 9A, the latch feature 70 is configured for spanning from one housing member, e.g., 2, to the other housing member, e.g., 3. Thus, the opposing housing members 2 and 3 will have corresponding latch feature interfaces that are configured for engaging the latch cover 71*b* so as to seal the port opening bounded by 71*a*. In either instance, the port opening bounding member 71*a* includes an opening, and the port covering 71*b*, e.g., a latch cover, is configured for moving from an open to a closed position so as to cover the port opening.

As can be seen with respect to FIG. 9A, the latch feature 70 is configured for spanning from one housing member 2 to the other housing member 3. Accordingly, each of the housing members 2, 3 will include corresponding latch interfaces. For instance, the latch feature bounding member 71a is positioned within the proximal end portion 21 of top member 2, and the latch feature cover 71 is positioned upon the proximal end portion 31 of bottom member 3. The latch feature 70 also includes a plurality of latch cover interfaces, such as a latch cover connector 74, which connector 74 connects the latch cover 71b to the bottom member 3.

The latch cover connector 74 may have any suitable configuration so long as it is capable of interfacing with a latch cover 71b, connecting the latch cover 71b to a top 2 or bottom 3 member, and facilitating the movement of the latch cover 71, such as from an opened to a closed position. In this instance, the latch cover connector 74 is configured as a latch axle that is positioned on the proximal end portion 31 of the bottom member 3. The latch cover connector 74 is positioned below the latch feature bounding member 71a, which is contained in top member 2. The latch cover connector 74 is configured for engaging the latch cover 71b via a latch connector orifice 75 so as to assist the latch cover 71b in moving from an opened to a closed position, where in the closed position the latch cover 71b spans the opening bounded by the latch cover bounding member 71a. Thus, the moving of the latch cover 71b from an opened to a closed position results in the covering and/or sealing of the opening bounded by the latch cover bounding member 71a. In this instance, the latch cover 71b is configured for rotating about the latch cover connector 74.

Above the latch cover bounding member 71a is another latch cover interface that is configured for engaging the latch cover 71b so as to secure the latch cover 71b in a closed position. In this instance, the latch cover interface above the latch cover bounding member 71a is a latch ramp receiving member 74, which latch ramp receiving member 74 is configured for engaging a corresponding latch ramp interface portion 77 of the latch cover 71b when the latch cover is in the closed position thereby securing the latch cover 71b in the closed position. As depicted, the latch ramp receiving member 74 is positioned on the top member 2 above the latch port opening bounding member 71a.

In certain embodiments, the closing of the latch cover 71b closes the port opening in a liquid-tight seal. To ensure a liquid-tight seal, the latch feature 70 may have one or more additional features. For instance, the latch feature 70 may include a gasket 78, such as an O-ring or other depressible gasket. For example, as depicted in FIG. 9A, the latch cover 71b includes a gasket 78, which gasket is of a dimension so as to be fitted within the opening of the latch opening bounding member 71a such that as the latch cover 71b is moved from an opened to a closed position, the gasket 78 is fitted within the port opening, thereby sealing the port. In other embodiments, the gasket 78 is configured for not fitting entirely within the latch port opening, but rather surrounding it.

Figure 9B:
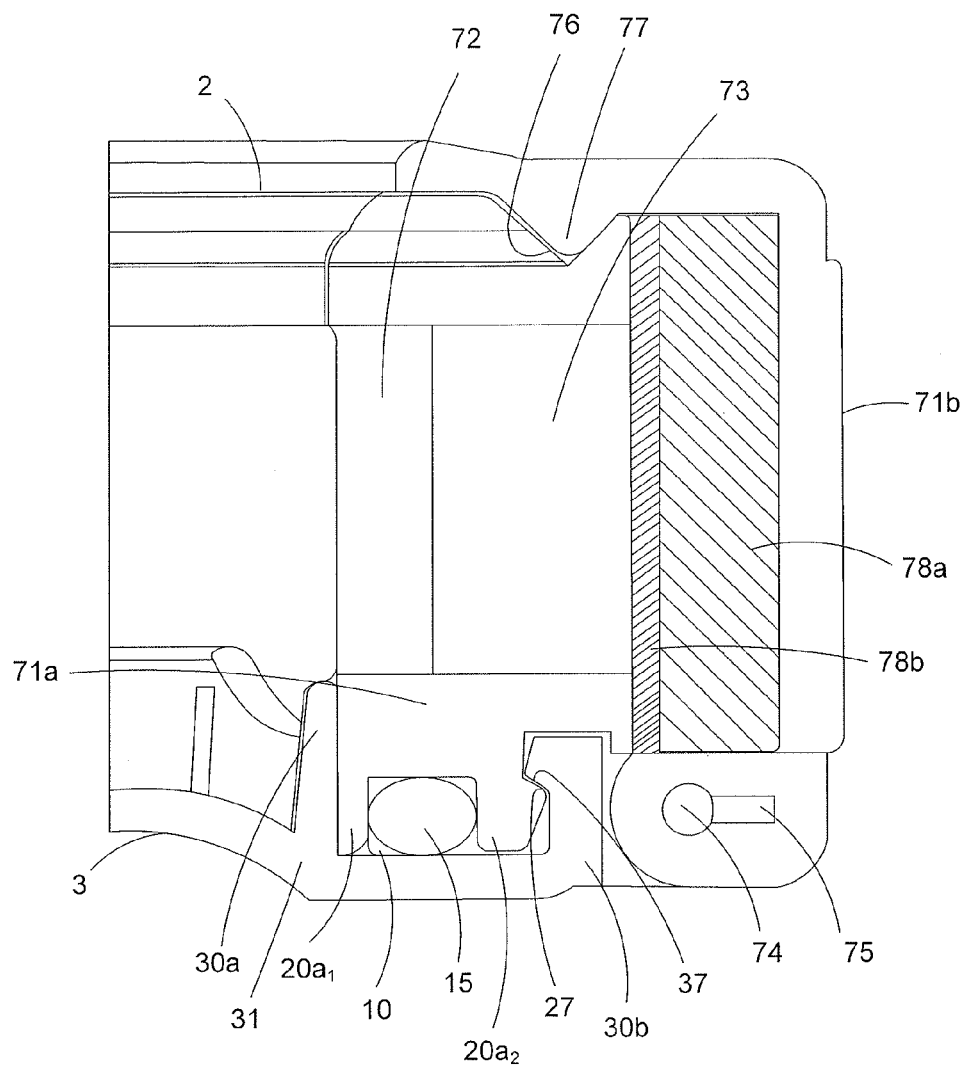

As depicted in FIG. 9B, the latch opening bounding member 71a includes a gasket interface surface 73 that is positioned in such a manner so as to interact with the gasket 78a and thereby provide a watertight seal when the latch cover 71b is in the closed configuration, e.g., when the latch ramp interface 77 is coupled to the latch ramp 76. One or more of the gasket seat 73 and gasket 78a may be positioned on a latch cover bounding member 71a or may be positioned on a latch cover 71b or both. In certain embodiments, the gasket 78a may further include an over-gasket 78b, which over gasket may be less compressible, less porous material, such as rubber, laminated material, or elastomeric or formed elastomeric material, so as to effectuate a firmer sealing of the latch feature 70.

To facilitate this interaction, in certain embodiments, it may be beneficial for the housing member, e.g., housing member 2, having the port opening bounding member 71a therein to include an additional rigid structural feature 72, which structural feature 72 may be positioned in such a manner as to provide increased structural integrity to the port opening bounding member 71a and thereby provide additional support for the port opening. For example, in certain instances, when there is a port opening bounding member 71a in a top member 2 of the housing 1, the port opening may have a tendency to make the immediate surrounding material weaker. Therefore, a rigid support material 72 may be associated with this material so as to support the region surrounding the port opening.

Without the inclusion of the rigid support material the top and bottom portions surrounding the opening may be forced away from one another thereby compromising the ability of the opening to be sealed in a watertight manner. In such an instance, the rigid stiffening material may be added so as to insure the integrity of the port opening. In certain instances, this reinforcing is accomplished without thickening the material of the housing member because this might result in making the overall housing thicker, wider, and/or longer, although it can be done in this manner.

In an alternative embodiment, therefore, as provided in FIG. 9B, a rigid element 72 is added to the top member 2 having the port opening 71a therein. For instance, an injection molded stiffener, such as a stainless steel, magnesium, rigid plastic component, polycarbonate, or the like may be included in the top member 2 and associated with the material surrounding the port opening 71a so as to provide increased rigidity thereto, thereby maintaining the physical integrity of the port opening and preventing flexing. It is to be understood that although the above has been described with respect to the port opening being positioned in the top member 2, the port opening can be positioned in the bottom member 3 as well with consequent changes to the other latch features.

Accordingly, FIG. 9B provides a cut-away view of the proximal end of the housing 1 having the latch feature 70 of a housing of the disclosure. The latch feature 70 includes a port opening bounding member 71a having a latch cover 71b. As depicted, the top member 2 includes the port opening bounding member 71a having a latch ramp receiving member 76 associated therewith. The latch opening bounding member 71a bounds an opening, e.g., a port opening, in the top member 2. The bottom member 3 includes a latch axle, e.g., a pivot axle 74. A latch cover 71b interfaces with the pivot axle 74 on the bottom member 3 via axle receptacle 75. The latch cover 71b additionally includes a latch ramp interface portion 77 that interfaces with the latch ramp receiving member 76 of the port opening bounding member 71a of the top member 2. Accordingly, when the latch cover 71b is in the closed position the latch ramp interface portion 77 couples with the latch ramp 76 to close and/or seal the port opening. It is to be noted, in this embodiment, both the top and bottom members 2 and 3 include corresponding channel members 10.

Figure 9C:
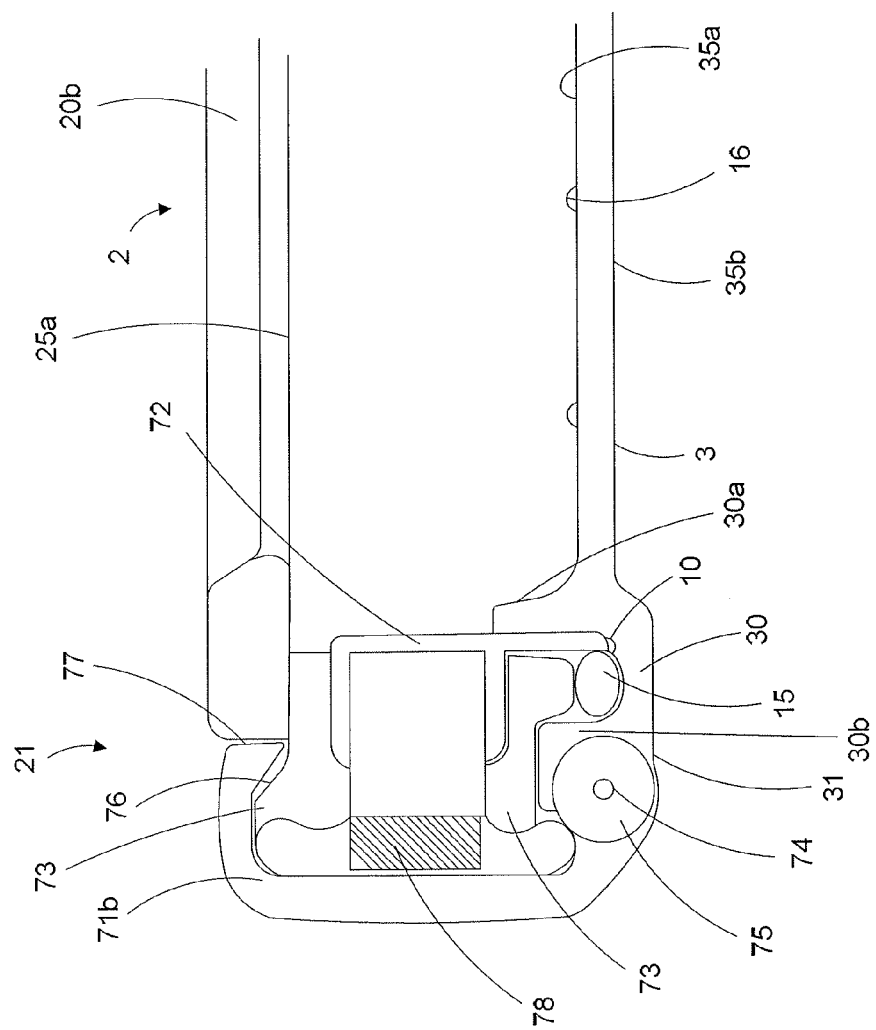

FIG. 9C depicts a cross section of a latch feature 70 of the disclosure. The latch feature 70 is in a closed position. Depicted is a bottom member 3, having a back surface 35b and a proximal end 31 perimeter portion 30. The bottom member 3 includes a channel 10, which channel is bounded by bounding members 30a and b. The channel 10 includes a gasket 15. The bottom member 3 also includes a pivot axle 74.

A latch cover 71b is also provided. The latch cover 71b interfaces with the pivot axle 74 on the bottom member 3 via a pivot axle interface 75. The latch cover 71b therefore includes a pivot axle interface, e.g., configured as an axle orifice 75. The axle orifice 75 is configured for receiving the pivot axle 74 therein. The interaction between the pivot axle 74 and the pivot orifice 75 allows the cover 71b to rotate about the axle 74 so as to move from an open to a closed position. Additionally, the latch cover 71b includes a latch ramp interface portion 77 that interfaces with the latch ramp receiving member 76 of the latch opening bounding member 71a of the top member 2 so as to secure the latch cover 71b in the closed position.

Accordingly, also depicted is top member 2 having a top surface membrane 25. The top member 2 includes a proximal end portion 21. The proximal end portion 21 includes an outer perimeter portion 20b, which outer perimeter portion is comprised of a semi-flexible material, and an interior perimeter portion 20a, which interior perimeter portion is comprised of a rigid material.

The proximal end portion 21 of the top member 2 also includes a port opening. The port opening is bounded by a port opening bounding member 71a. In this instance, the outer perimeter portion 20b includes a cutout portion, which cutout portion accommodates the port opening bounding member 71a. The port opening bounding member 71a may therefore be contiguous with, e.g., formed by, the rigid material comprising the interior perimeter portion 20a, or may be added thereto.

For instance, as depicted, the top member 2 may include a rigid stiffening member 72 which stiffening member may be associated with the port opening bounding member 71a. For example, in certain embodiments a rigid member 72 may be included around the port opening so as to increase the dimensional integrity of the proximal end portion 21 of the housing 2 surrounding the opening. The port opening bounding member 71a may also include a gasket interface 73 that is configured for interfacing with a gasket, such as a gasket 78 associated with a latch cover 71b, e.g., a gasket that is dimensioned for fitting within or over the port opening and sealing the port opening when the latch cover 71b is in a closed position.

The port opening bounding member 71a and/or rigid stiffener 72 of the top member 2 may be formed from the interior perimeter portion 20a of the top member 2, or may be one or more separate elements added thereto. Where the port opening bounding member and/or rigid stiffener 72 are a separate element added to the proximal end 21 of the top member 2, the port opening bounding member 71a and/or stiffener 72 may additionally be configured for engaging the components of a bottom member 3 clasping mechanism 37. The port opening bounding member 71a and/or stiffener 72, therefore, may be configured to include a clasping mechanism component that is configured for interfacing with the clasping member 37 of the bottom member 3. In this manner, the bottom member interfacing portions of the port opening bounding member 71a and/or stiffener 72 and/or gasket seat 73 are configured for maintaining the consistent sealing along the perimeter of the housing 1.

The port opening bounding member 71b further includes a latch ramp receiving member 76 that is configured for coupling with a corresponding latch ramp interface portion 77 of a latch cover 71b. Accordingly, when the latch cover 71b is in the closed position the latch ramp interface portion 77 couples with the latch ramp receiving member 76 to close and/or seal the port opening. The port opening bounding member may additionally include a gasket seating member 73, which member may be a rigid, semi-rigid, or flexible member that is configured for interfacing with a gasket 78 of the latch cover 71b so as to provide a liquid-tight seal when the latch cover 71b is in the closed position.

Figure 9D:
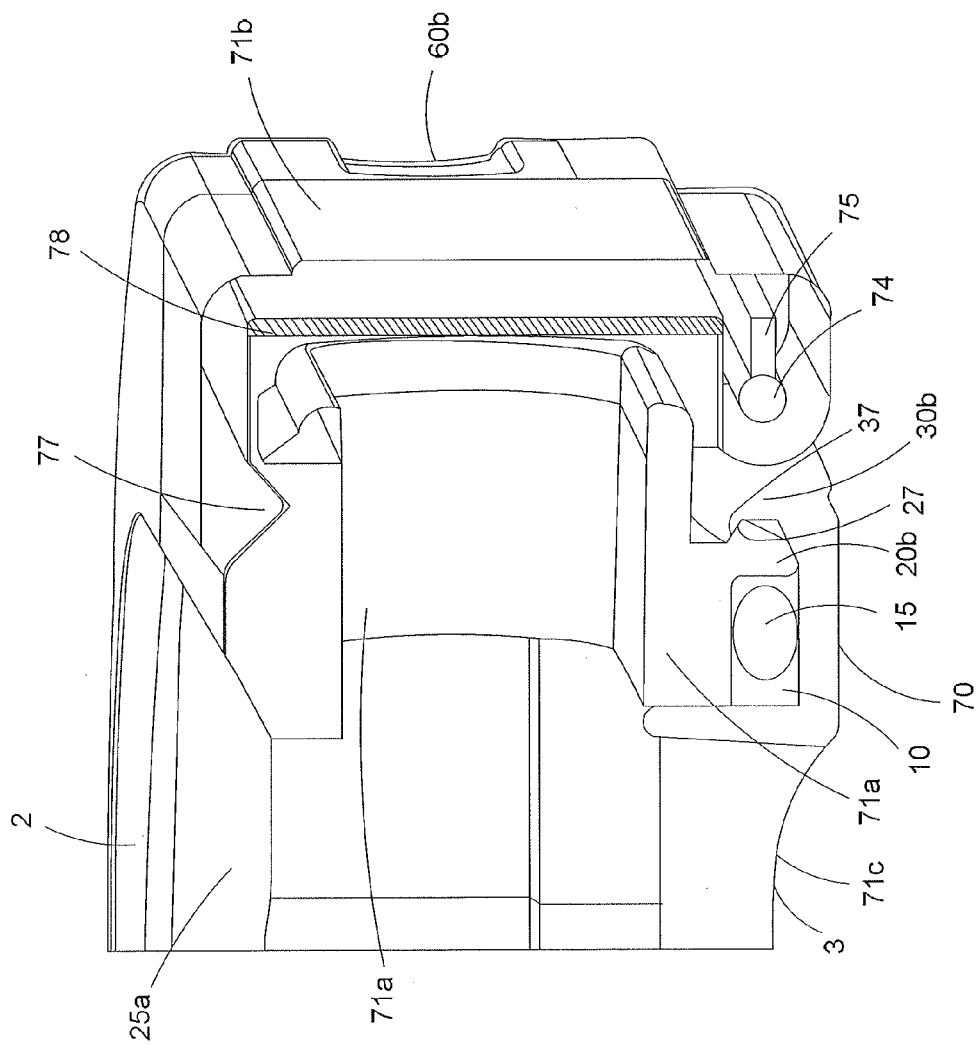

FIG. 9D provides a cross section view of the housing 1 set forth in FIG. 9A. A top member 2 having a port opening bounding member 71a is provided, wherein the port opening bounding member 71a is integrally formed as part of the interior perimeter portion 20a of the top member 2 and forms a port opening which in part makes up the latch feature 70. The latch feature 70 also includes a latch cover 71b positioned on the bottom member 3. The latch cover 71b is in a closed position. The latch cover 71b includes an axle orifice 75 that interfaces with the pivot axle 74 on the bottom member 3. Additionally, the latch cover 71b includes a latch ramp interface portion 77 that interfaces with the latch ramp receiving member 76 of the latch opening 71a of the top member 2 so as to secure the latch cover 71b in the closed position.

Figure 9E:
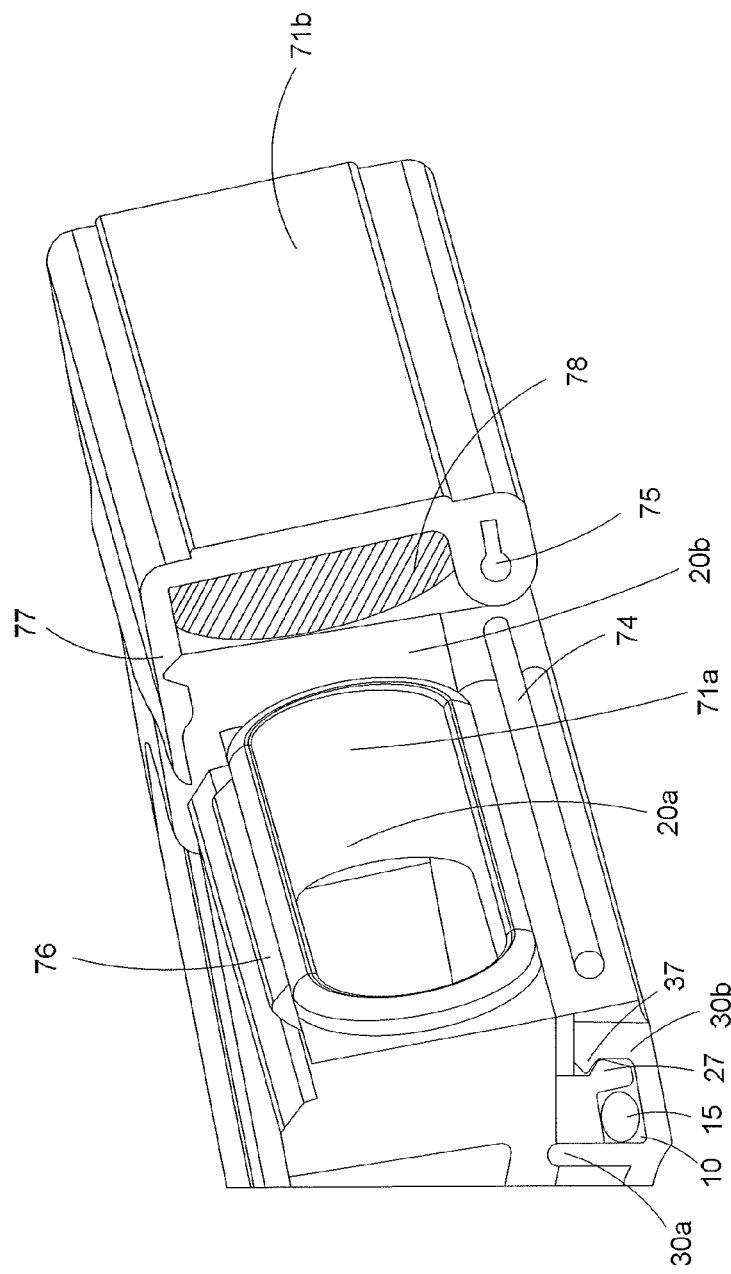

FIG. 9E provides an angle view of the proximal end portion of the housing 1 of FIG. 9D showing the latch assembly 70 having port opening bounding member 71a, a latch cover 71b, and a pivot axle 74. As depicted the latch cover 71b is disassembled from the latch assembly 70 and disassociated from the pivot axle 74. The port opening bounding member 71a is formed in conjunction with the interior perimeter portion 20a of the top member 2. As can be seen, the exterior perimeter portion 20b of the top member 2 has been cut away to make room for the latch feature 70. However, in this embodiment, the port opening bounding member 71a includes a latch mechanism that is configured slightly differently than the latching mechanism of FIG. 9D. In this instance, the latching mechanism includes a latch ramp 76 that is configured as extended member that is adapted for associating with a corresponding latch ramp receiving interface portion 77 of the latch cover 71b. The latch cover 71b further includes a depressible gasket 78.

Figure 9F:
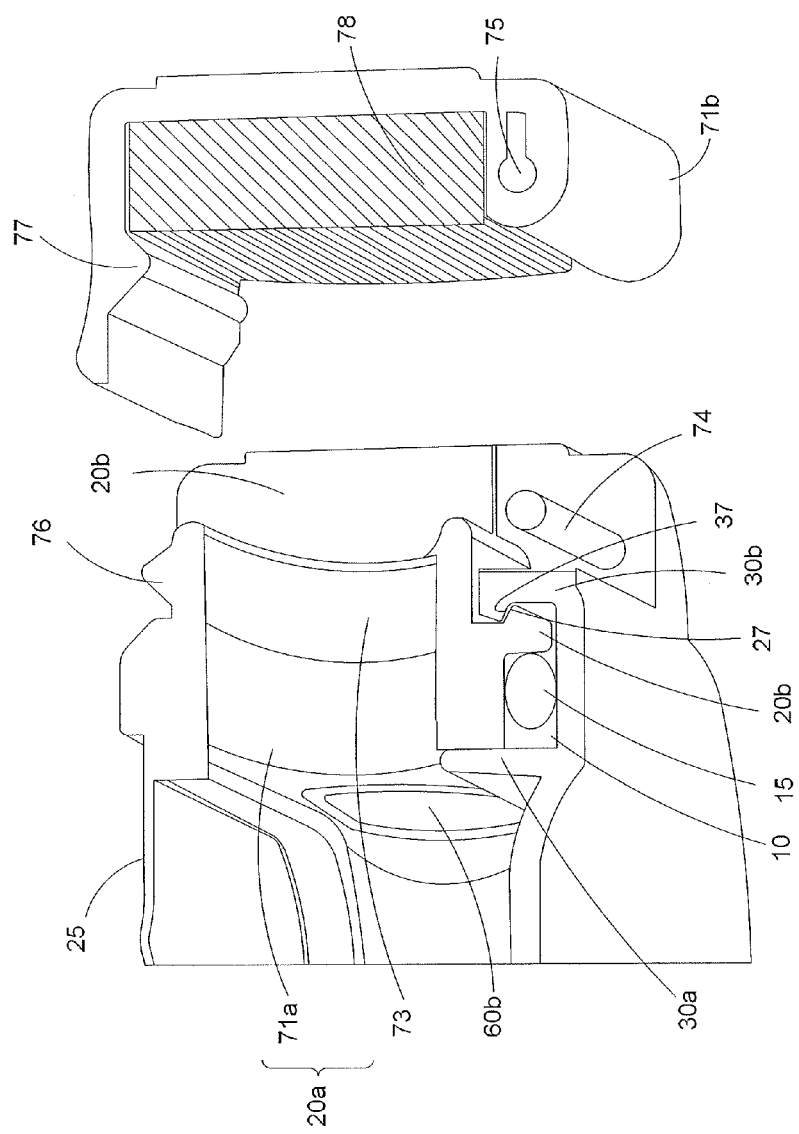

FIG. 9F provides another cross section view of the proximal end portion depicted in FIG. 9E, with the latching assembly provided in FIG. 9A. The latch assembly 70 includes a port opening bounding member 71a and a latch cover 71b having an axle orifice 75, wherein the latch cover 71b is disassembled from the latch assembly 70 and the axle orifice 75 is disassociated from the pivot axle 74. The port opening bounding member 71a is formed in conjunction with the interior perimeter member 20a of top member 2. As shown, the exterior perimeter portion 20b of the top member 2 has been cut away to make room for the latching feature 70. Accordingly, the rigid gasket seat 73 is comprised of the same material as the port opening bounding member 71a. It is understood that in different embodiments, the gasket seat 73 may be comprised of a different material than that of the interior perimeter portion 20a of the top member 2, such as a semi-rigid or flexible material. The port opening bounding member 71a additionally includes a latch ramp receiving member 76 that is configured for associating with the latch ramp interface portion 77 of the latch cover 71b. As depicted, an interior sound transmission portion 60b is also shown.

Figure 9G:
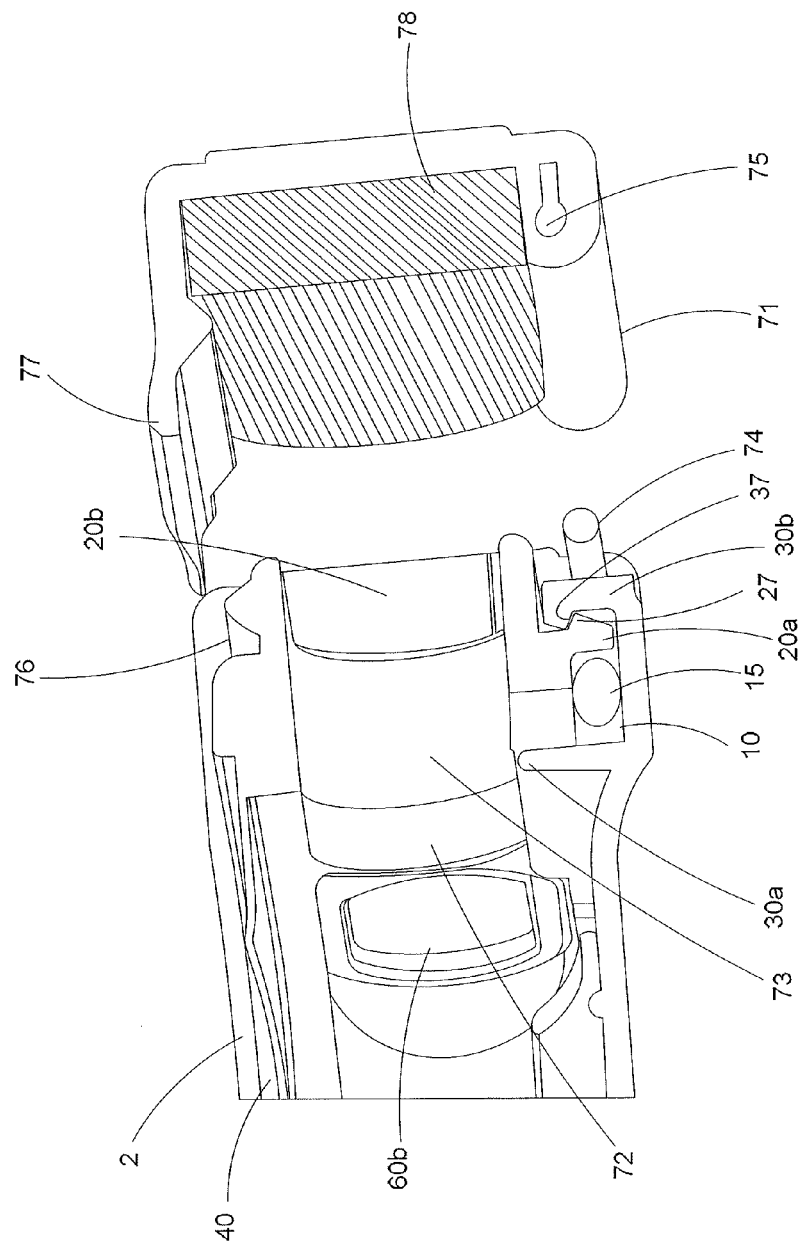

FIG. 9G provides a side cross section view of the proximal end portion depicted in FIG. 9B. The latch assembly 70 includes a port opening bounding member 71a and a latch cover 71b having an axle orifice 75. The latch cover 71b is disassembled from the latch assembly 70 and the axle orifice 75 is disassociated from the pivot axle 74. The port opening framing member 71a is formed and a rigid stiffener member 72 and gasket seat 73 is then associated therewith. Accordingly, in this embodiment, the top member 2 includes both a rigid stiffening member 72 and a semi-rigid gasket seat 73, which members are associated with the port opening framing member 71a.

As depicted, the rigid stiffening member 72 and/or gasket seat 73 includes a gasket engaging portion that fits within the channel 10, e.g., between the interior and exterior bounding members 30a and b of the bottom member 3, so as to contact and/or compress the gasket 15. One of the port opening framing member 71a, rigid stiffener 72, and gasket seat 73 includes a clasping mechanism 27 that is configured for coupling with the clasping mechanism 37 of the bottom member 3 so as to maintain a consistent seal with the top and bottom members when they are coupled together to form the housing 1.

It is to be noted, however, in certain instances, the port opening bounding member 71a and/or stiffening member 72 and or gasket seat 73 may be fabricated so as to be fit within the interior perimeter portion 20a and/or exterior perimeter portion 20b of the top member 2. In such instances, the port opening bounding member 71 and/or rigid stiffening member 72 and/or gasket seat 73 may not need to have these gasket engaging and/or clasping elements. For instance, where the interior bounding member 71a is fabricated in conjunction with the interior perimeter portion of the top member 2. It is also to be noted that in various instances, a separate port opening bounding member 71 and rigid stiffening member 72 may not be included, rather, in various instances, their separate functions may be fulfilled by a single port bounding member that is rigid enough to bound the port opening without unduly increasing the dimensions of the housing as a whole.

As depicted, a gasket interface 73 is also included. The gasket interface is configured as a gasket seat that is adapted for interfacing with a gasket, such as a closed cell form or solid gasket 78 associated with a latch cover 71b. The gasket seating member 73 is configured for interfacing with the gasket 78 of the latch cover 71b and thereby provides a liquid-tight seal when the latch cover 71b is in the closed position. In various instances, the gasket seating member 73 is the same element as the port opening bounding member 71a and/or may be the same member as a rigid stiffener 72.

Figure 9H:
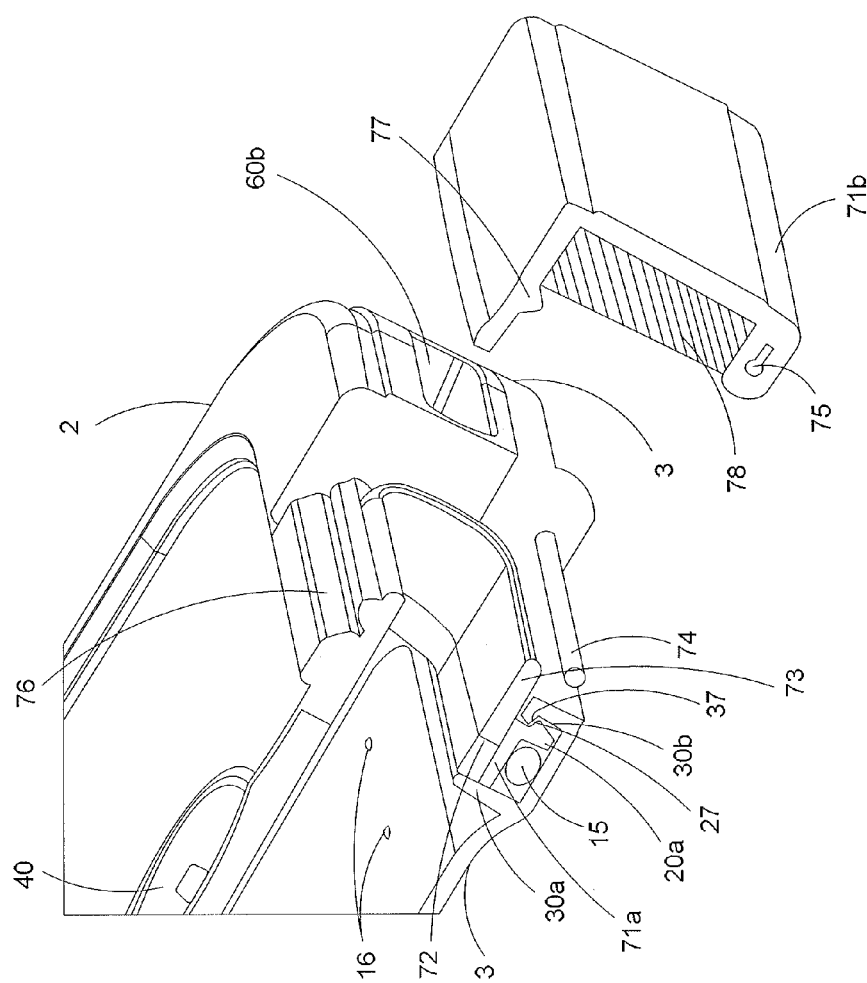

FIG. 9H provides a proximal end exploded view depicted in FIG. 9F. The latch assembly 70 includes a port opening bounding member 71a and a latch cover 71b having an axle orifice 75, wherein the latch cover 71b is disassembled from the latch assembly 70 and the axle orifice 75 is disassociated from the pivot axle 74. The port opening bounding member 71b is formed in conjunction with the rigid stiffener 72 and the rigid gasket 73.

As can be seen, the port opening bounding member 71a is configured to include a clasping mechanism portion 27 that is adapted for interfacing with a corresponding clasping mechanism 37 of a bottom member 3. The port opening bounding member 71 is configured for engaging the gasket 15 and interior bounding member 20a of channel 10 and is further configured for engaging the bottom member clasping mechanism 37. It is to be noted, however, that in certain embodiments the port opening bounding member 71a may be formed in conjunction, e.g., integral, with an interior perimeter portion 20a of the top member 2, and therefore in certain instances, the port opening bounding member 71a does not include a separate rigid stiffener, gasket seat, and/or clasping mechanisms. The port opening bounding member 71a additionally includes a latch ramp receiving member 76 that is configured for associating with the latch ramp interface portion 77 of the latch door 71b. Also depicted is a sound transmission port 60b.

Figure 9I:
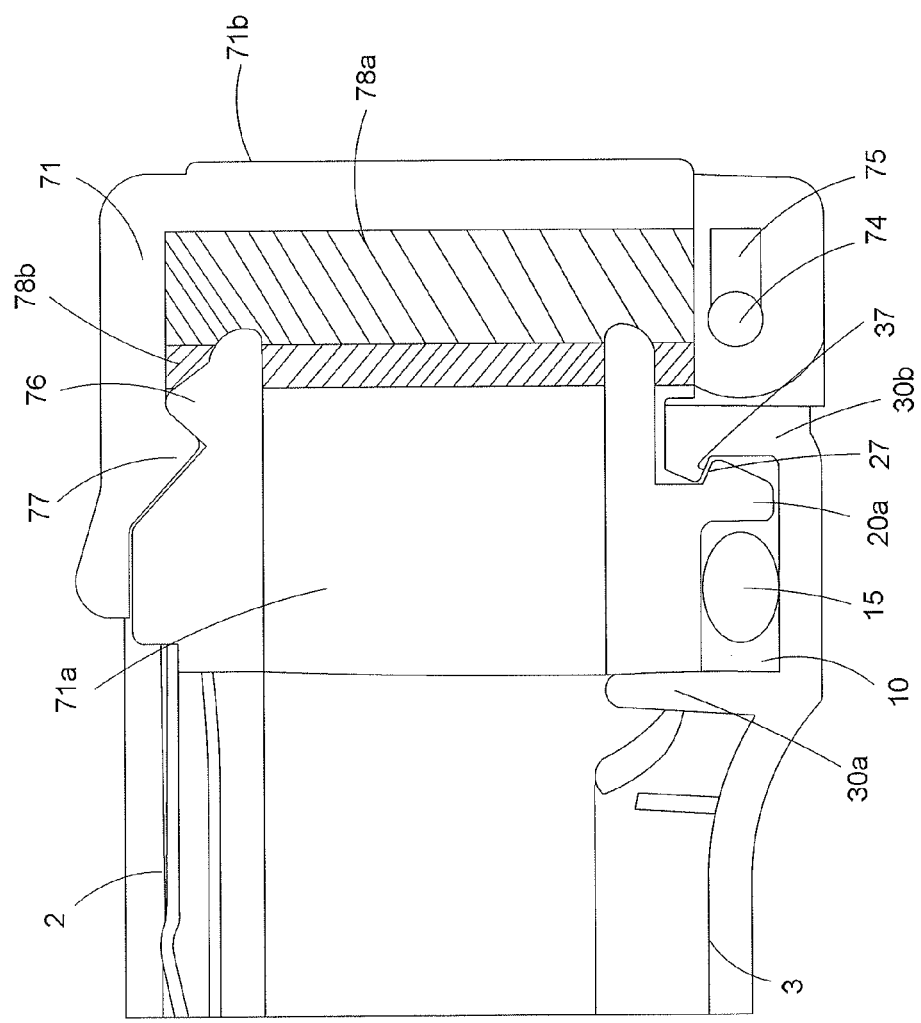

FIG. 9I provides a side cross section view of the latch feature 70 positioned at the proximal end of the housing of FIG. 9A. As can be seen, the port opening bounding member 71a is configured to include a clasping mechanism portion 27 that is adapted for interfacing with a corresponding clasping mechanism 37 of a bottom member 2. The port opening bounding member 71a also includes a portion for engaging the gasket 15 and interior channel boundary member 20b. The port opening bounding member 71a further includes a latch ramp receiving member 76 that is configured for associating with the latch ramp interface portion 77 of the latch cover 71. The latch cover 71 is in the closed position and the latch ramp receiving member 76 is coupled with the latch ramp interface 77. The gasket 78a is further associated with an over-material 78b, which material functions to provide increased structural integrity to the gasket 78a.

Figure 9J:
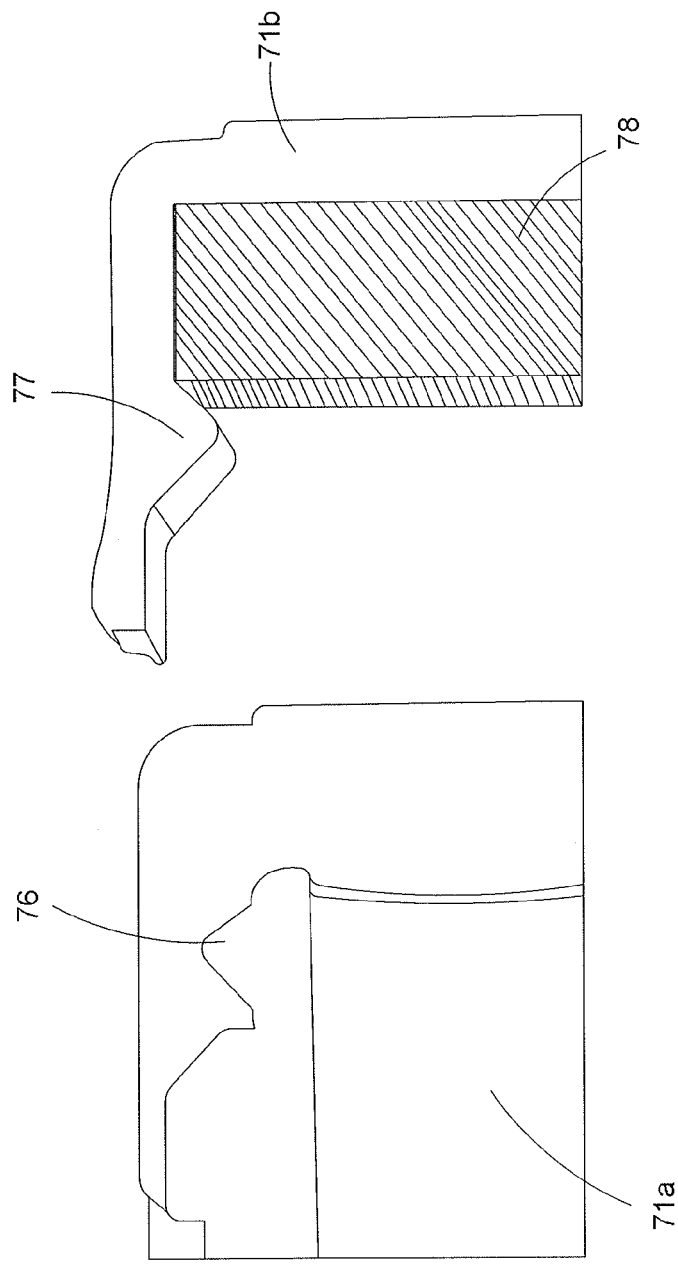

FIG. 9J provides a side, close up, cross section view of the latch ramp sealing surface 76 of the port opening bounding member 71a, and the latch ramp interface 77 of the latch cover 71b. The latch cover 71b is further associated with a gasket 78.

Figure 9K:
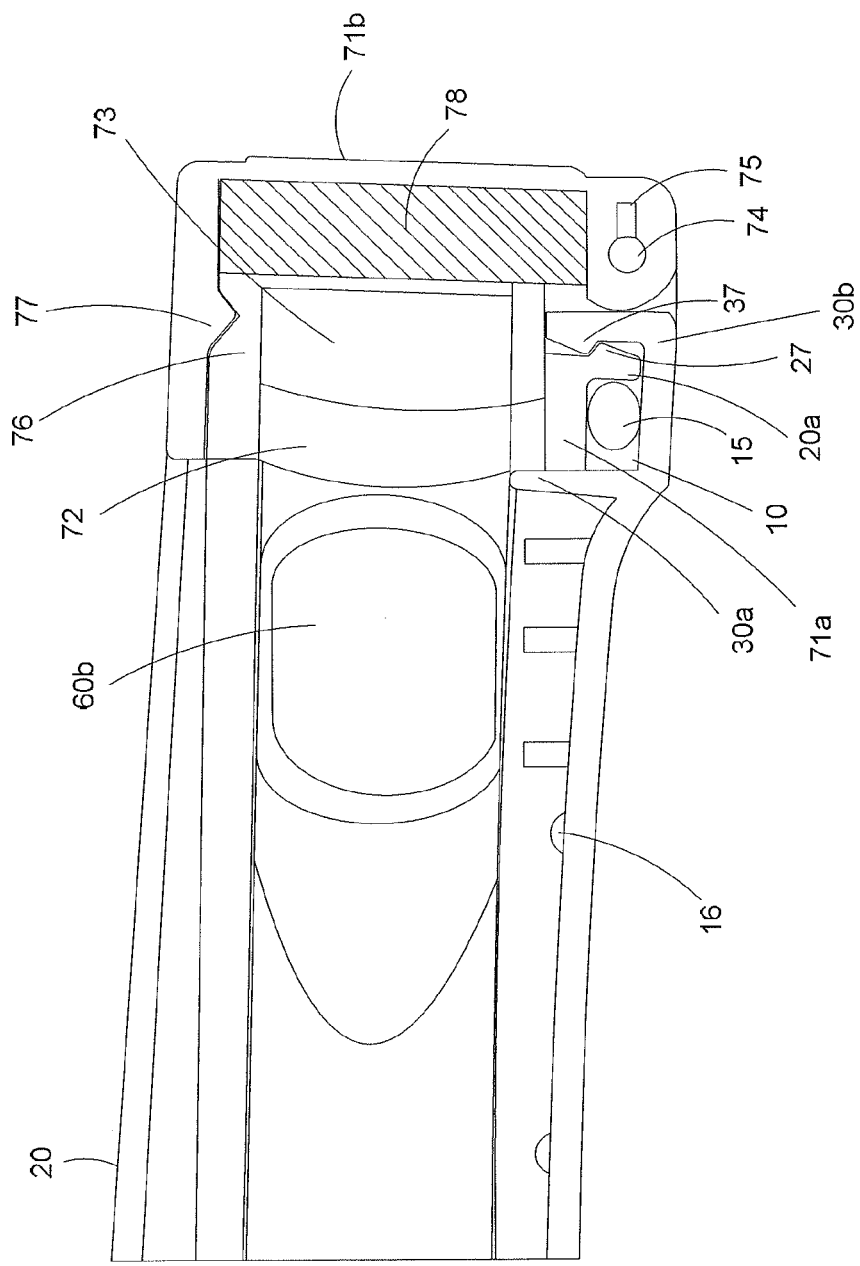

FIG. 9K provides a side, close up view of the port opening bounding member 71a showing the association between the rigid stiffener 72 and the rigid gasket seat 73. The rigid stiffener 72 is configured so as to assist in maintaining the dimensional integrity of the bounding member 71a and to assure that a suitable sealing pressure is asserted between the gasket seat 73 and the gasket 78 thereby insuring a liquid-proof seal when the latch cover 71b is in the closed position. The bounding member 71a includes a portion for engaging the gasket 15 and interior channel boundary member 20a, thereby ensuring a firm seal is established upon the coupling of the top and bottom members. The bounding member 71b also includes a clasping mechanism 27 for engaging clasping mechanism 37. As depicted, sound transmission port 60b is also illustrated.

Accordingly, in certain embodiments, a perimeter portion of the housing may include additional features, such as one or more sound ports configured for enhancing the transmission of sound through the housing. One such sound port is configured as an acoustic vent portion, which acoustic vents are adapted for transmitting and/or directing sound there through such as toward a microphone portion, or away from a speaker portion, of an underlying electronic device housed within the housing.

For instance, the perimeter portion, such as a distal or proximal end portion, may include an acoustic vent feature for transmitting sound. The acoustic vent feature may include a sound channel having an acoustic vent material positioned therein. The acoustic vent material may span the sound channel at an angle from 0 to 180 degrees in a forward or reverse direction. The sound channel may extend from an exterior portion of the perimeter to an interior portion of the perimeter and the acoustic vent material may transect the sound channel, e.g., at an angle with respect to a centerline there through.

Figure 10A:
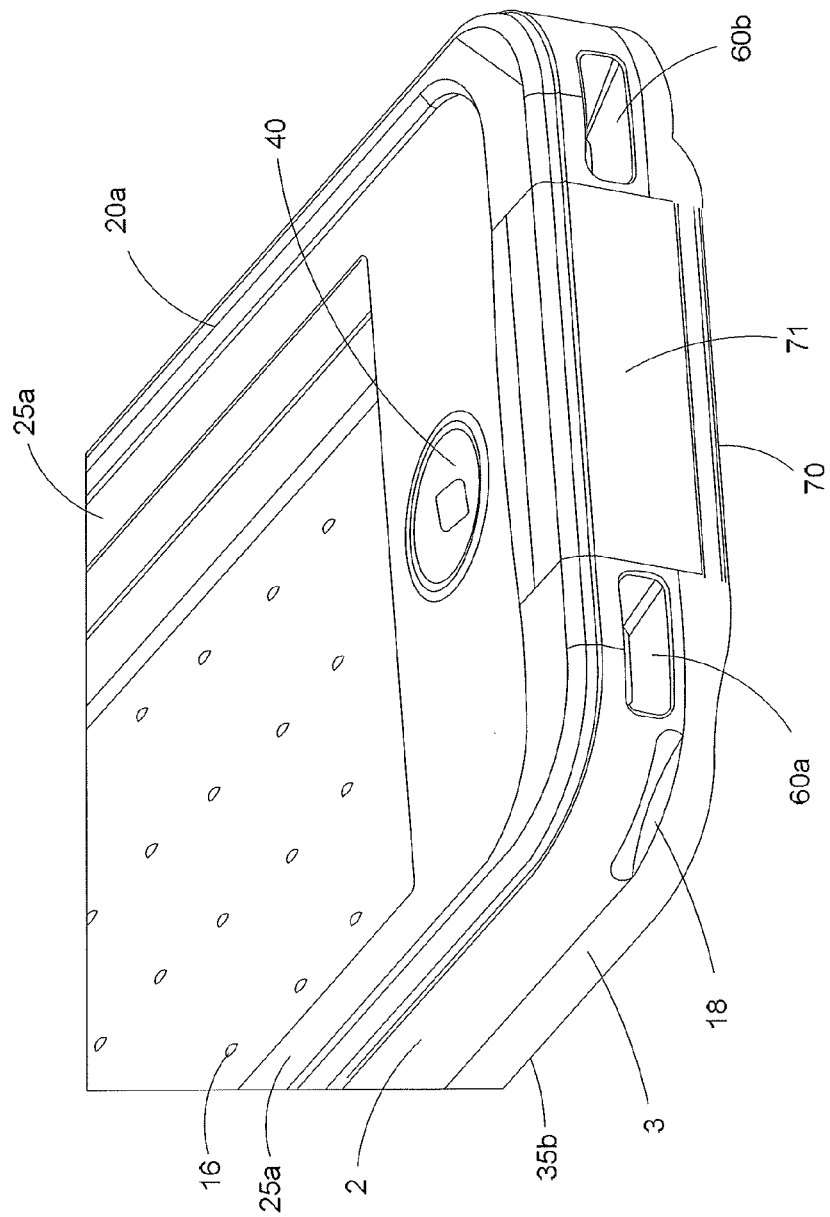

As can be seen with respect to FIG. 10A, a proximal end portion of the housing 1 may include one or more, such as a plurality of sound transmission portions 60 *a* and *b* having a plurality of acoustic vents, for instance, a microphone acoustic vent 65a and a speaker acoustic vent 65b. The proximal end portion of the housing may further include a latch feature 70 having a port opening latch cover 71b and a coin slot feature 18, which coin slot opening is configured for assisting in the separating of the top member 2 from the bottom member 3.

Figure 10B:
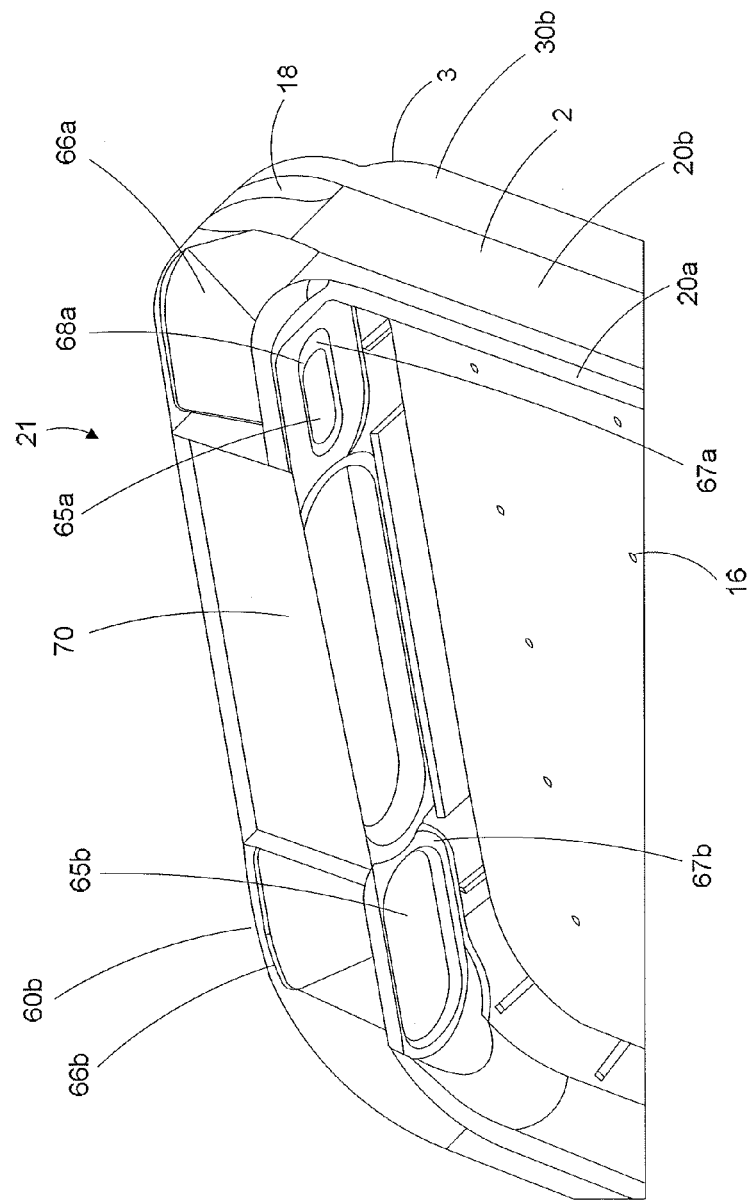

FIG. 10B provides an interior outward view of the proximal end portion of FIG. 10A. As depicted the sound transmission portions 60 *a* and *b* are positioned on the top member 2. However, it is understood that they may alternatively be positioned on the bottom member 3. The proximal end portion 21 of the top member 2 includes a plurality of sound transmission portions 60 *a* and *b* including a sound channel 66*a* leading to a microphone acoustic vent 65*a*, and a second sound channel 66*b* leading to a speaker acoustic vent 65*b*.

As can be seen with respect to FIG. 10B, the sound transmission portions 60 are positioned within a top member 2 and traverse from the outside of the housing 1, through the exterior and interior perimeter portions 20 *a, b* of the top member 2 and into the interior of the housing 1. The acoustic channels 66 *a, b* include respective acoustic membranes 65 *a, b* that transect the acoustic channels 66 *a, b*.

The housing surrounding the acoustic membranes 65 *a, b* may be configured so as to be overmoulded therewith. Hence, the sound channels 66 *a* and *b* may further include overmould portions 67 *a, b*, which portions are configured to interface with a perimeter portion of the membranes 65 *a, b* so as to be overmoulded therewith and thereby secure a liquid-tight seal between the housing and the acoustic membranes.

However, in various embodiments, elements 67 *a, b* may simply form a gasket seat upon which acoustic vent membranes 65 *a, b* are positioned. Nevertheless, in this embodiment, as can be seen with respect to FIG. 10B, the sound transmission channel 60*a* channels sound to a microphone portion of a housed device. In such an instance, it may be useful to have an overmould portion, e.g., 68*a*, which overmould portion circumscribes the acoustic membrane so as to provide an interface between the acoustic membrane 65*a* and the speaker portion of an underlying device. This interface may be useful for preventing the internal transmission of sound from the speaker channel 60*b* to the microphone channel 60*a*, which transmission could create interference with respect to the microphone portion of the underlying device. Additionally, such a raised, circumscribing element can also prevent the degradation of sound entering the microphone channel 66*a* by focusing and directing it to the microphone portion of an underlying device.

The acoustic membranes 65 *a, b* are transmissive for sound but are non-transmissive for liquid. Thus, sound can travel through the sound channels 66 *a* and *b* in the housing but liquid, such as water, cannot because it cannot pass through the acoustic vent membranes 65 *a* and b. A latch feature 70 and latch cover 71*b* are also provided on the proximal end of the housing 1 in between the two sound transmission portions 60 *a* and b.

Figure 10C:
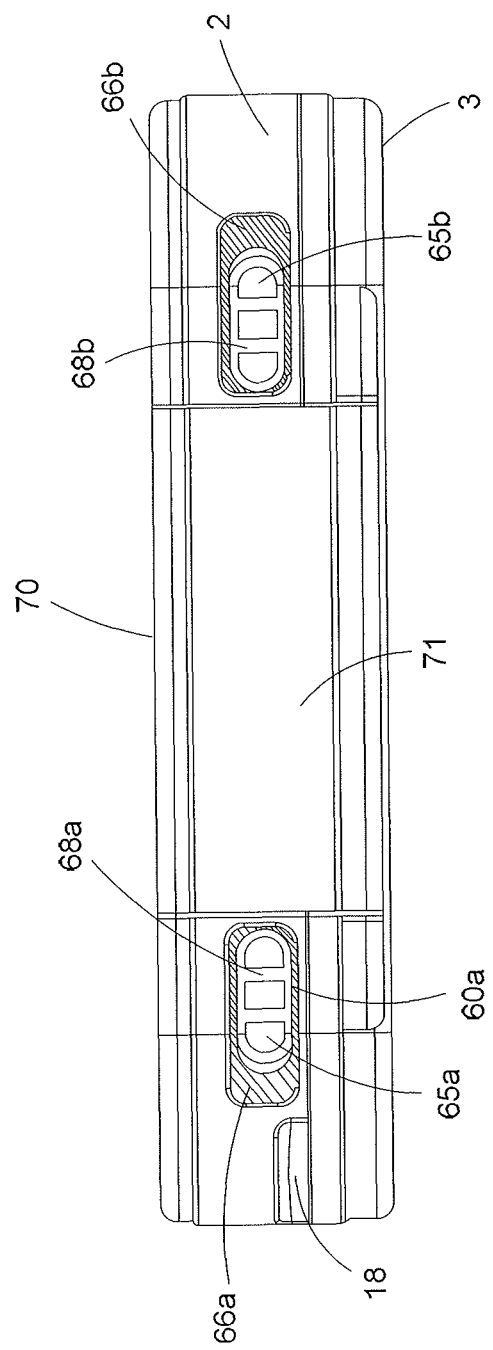

FIG. 10C provides an exterior inward view of the proximal end portion of the housing 1 of FIG. 10A. The proximal end portion may include a plurality of sound transmission portions, e.g., 60 *a* and b, each of which may include a sound channel 66 that is transected by an acoustic membrane 65. For instance, one sound transmission portion, such as 60*a*, may be configured as a microphone transmission portion that includes a sound channel 66*a* leading toward a microphone portion of an underlying device. The sound channel 66*a* is transected by microphone acoustic vent 65*a*. The second sound transmission portion, such as 60*b*, may be configured as a speaker sound transmission portion that includes a sound channel 66*b* leading toward a speaker portion of an underlying device. The sound channel 66*b* is transected by a speaker acoustic vent 65*b*. It is understood that these positions could be reversed. One or more of the sound channels 66 *a* and *b* may further include a molded grill portion 68 *a* and/or *b*, which functions to provide structural integrity to the sound channel and/or support to the acoustic vent materials 65 *a* and/or *b*.

As can be seen with respect to FIG. 10C, the acoustic vent portions 60 and b are positioned within a top member 2 and traverse from the outside of the housing 1 into the interior of the housing. However, they could just as well be positioned on a bottom member 3. The acoustic channels 60 *a, b* include respective acoustic membranes 65 *a, b* and grille portions 68 *a, b*, which grille portions are configured for providing additional support for the acoustic membranes. A latch feature 70 and latch cover 71*b* are also provided on the proximal end of the housing 1 in between the two sound transmission portions 60.

Figure 10D:
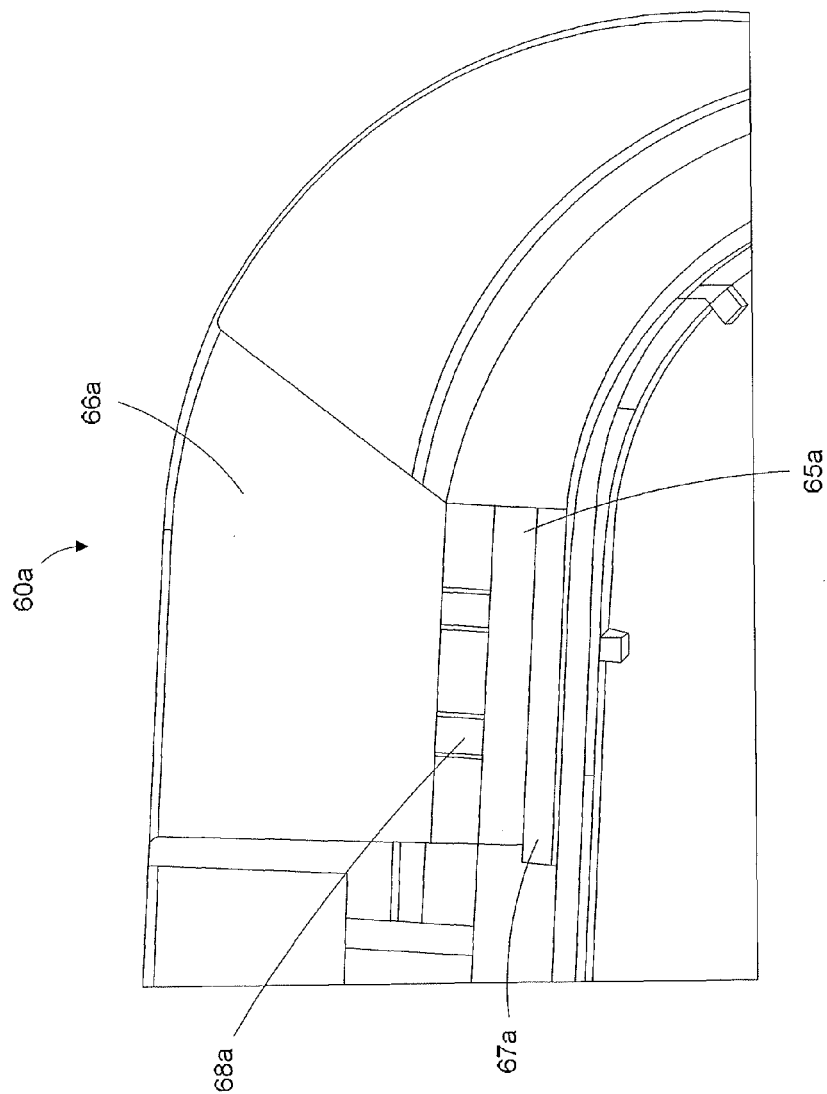

FIG. 10D provides a top-down, inside out view of the microphone acoustic vent 60*a* portion of a housing 1 of the disclosure. The acoustic vent portion 60*a* includes a sound channel 66*a*, wherein the sound channel 66*a* tappers toward a microphone acoustic vent material 65*a*, which sound channel is configured for directing sound toward a microphone portion of an underlying electronic device housed within the housing 1. An acoustic vent bounding member, e.g., an overmoulded skirt sea 67*a* is also included and circumscribes the acoustic vent membrane 65*a*. For instance, a portion of the acoustic vent material 65*a* has been overmoulded with a rigid material 67 *a* so as to facilitate the isolation and reduction of internal transmission of sound, such as from the speaker vent portion, so as to prevent interference therewith, and may further strengthen the seal between the housing and the acoustic membrane thereby ensuring the liquid-proof nature of the acoustic vent 60 *a*. As indicated above, in various embodiments, the acoustic vent bounding member 67 may be configured simply as a gasket seat, which gasket seat is adapted so as to be coupled with a suitable acoustic vent material 65 *a*, e.g., via a suitable adhesive. Also provided is an additional structural support, e.g., grille 68*a*, which grille 68*a* provides additional structural integrity to the acoustic membrane 65*a*.

Figure 10E:
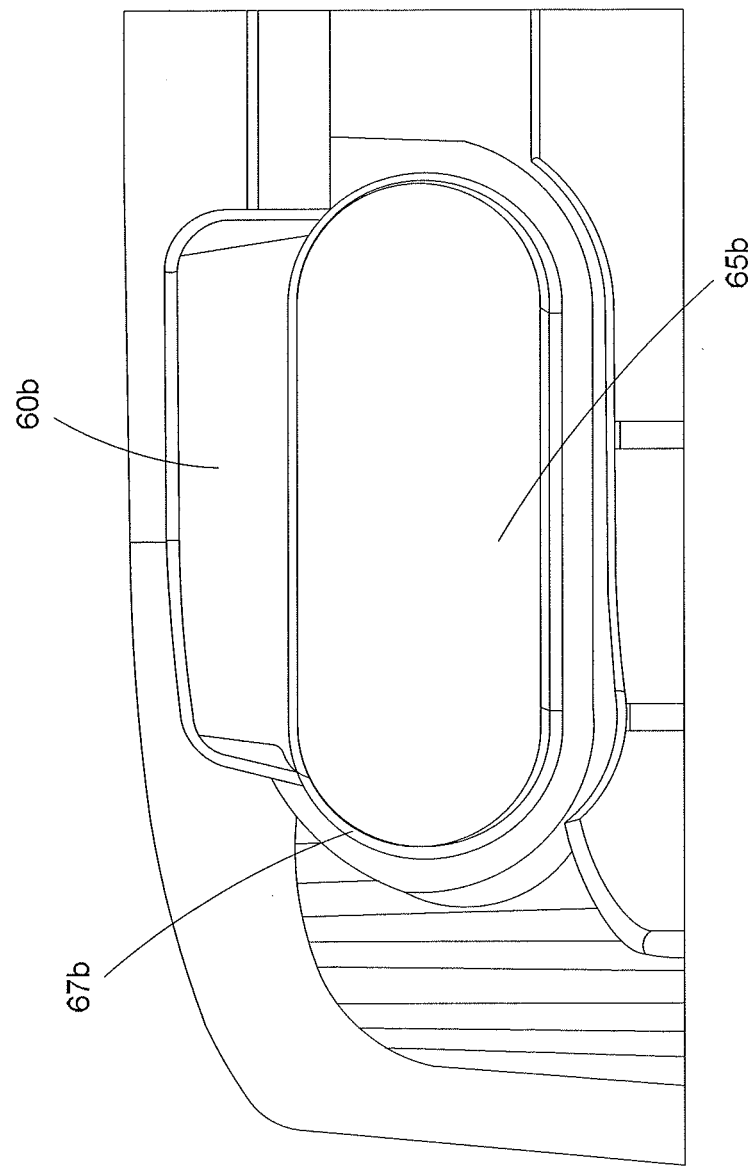

FIG. 10E provides an inside view of the speaker acoustic vent portion 60*b* of FIG. 10C. The acoustic vent portion 60*b* includes a sound channel 66*a* that tappers toward an acoustic vent material 65*b*. An overmoulded acoustic vent bounding member 67*b*, is also included, wherein the bounding member 67*b* at least partially circumscribes the perimeter of the acoustic vent material 65*b* so as to enhance the sealing contact between the housing and the vent material as well as providing an additional contact for directing sound from a speaker portion of an underlying device through the speaker sound channel 66*b*. It is noted that although in this embodiment a bounding member 67*b* is included herein, in various embodiments it need not be.

FIG. 10F provides a cross section of the speaker acoustic sound transmission assembly 60*b*. The assembly includes a sound channel 66*b* for transmitting and directing the transmission of sound toward an acoustic vent material 65*b*. The acoustic vent material 65*b* may be a membrane, such as a GoreTex® membrane, which membrane may be cantered at an angle from 0 to 180 degrees, such as from 90 to 180 degrees. The acoustic vent material 65*b* is bounded by an acoustic vent bounding member 67*b* that may be overmoulded therewith or fabricated prior to attachment of the acoustic vent material 65*b*. The acoustic vent assembly 60*b* may also include an acoustic grille 68*b* to provide additional structural integrity to the acoustic vent. It is to be noted that although the sound transmission portions 60 are positioned on a proximal end of the housing 1, they could be positioned anywhere along the perimeter of the housing without departing from the nature of the disclosure.

FIG. 10F provides a cross section of the microphone acoustic sound transmission assembly 60*a*. The assembly includes a sound channel 66a for transmitting and directing the transmission of sound toward an acoustic vent material 65a. The acoustic vent material 65a may be a membrane, such as a GoreTex® membrane, which membrane may be cantered at an angle from 0 to 180 degrees, such as from 90 to 180 degrees. The acoustic vent material 65a is bounded by an acoustic vent bounding member 67a that may be overmoulded therewith or fabricated prior to attachment of the acoustic vent material 65a.

In this embodiment, the acoustic vent bounding member 67b has a straight horizontal edge configuration. However, in various other embodiments, the edge of the acoustic vent bounding members 67a and/or 67b may be slanted. Such a slanted edge could be useful so as to create an air gap, which air gap could be useful in directing sound toward the bottom or top of the case whereby increased sound amplification and or transmission may result.

For instance, one or more air gaps may be positioned within the housing 1 so as to direct sound to be emitted through the front or back surface of the housing thereby increasing surface of sound transmission. For example, the sound channels 66 a and b have a limited capacity for transmitting sound there through. Placing one or more sound gaps, such as along a sound channel perimeter portion 67 a and b, e.g., along a top or bottom facing surface, can act as a sound channel funneling sound toward and through the larger top and/or bottom surface thereby acting like sound resonator and enhancing the sound transmitting surface. Additional air gaps may be positioned along the top 2 and/or bottom 3 members of the housing 1, e.g., along the circumference such as where a front 25 or bottom 35 surface meets a perimeter portion, so as to enhance sound transmission. In this manner at least 10%, for instance, at least 15%, such as at least 20%, for example, at least 30%, such as at least 40%, for instance, at least 50% of the sound energy emitted from a housed device may be directed and emitted from a front 25 or back 35 surface of the housing.

The acoustic vent assembly 60a may also include an acoustic grille 68a to provide additional structural integrity to the acoustic vent. It is to be noted that although the sound transmission portions 60 are positioned on a proximal end of the housing 1, they could be positioned anywhere along the perimeter of the housing without departing from the nature of the disclosure.

FIG. 10G provides a close up view of the acoustic vent assembly 60b of FIG. 10F. The vent assembly 60b includes an acoustic port 66b including a shaped channel leading to an acoustic membrane 65b. The acoustic membrane 65b is overlaid with an acoustic grille 68b and bounded by housing portion 67b. The acoustic grille 69a/acoustic membrane 67a interface includes one or more air gaps to facilitate the transmission of sound. Although not depicted herein, in various embodiments, a vent assembly, such as vent assembly 60b may include an additional vent overlay or screen, such as a mesh scrim, which scrim may be positioned over, e.g., attached to, the acoustic membrane, e.g., 65b, so as to reduce distortion, such as distortion from a speaker portion of a housed device. Such a scrim may be fabricated from any suitable material so long as it is capable of transmitting sound energy in an efficient manner, such as a thin plastic material membrane, which membrane may be adhesively attached or otherwise mounted to the acoustic membrane 65b.

Figure 10H:
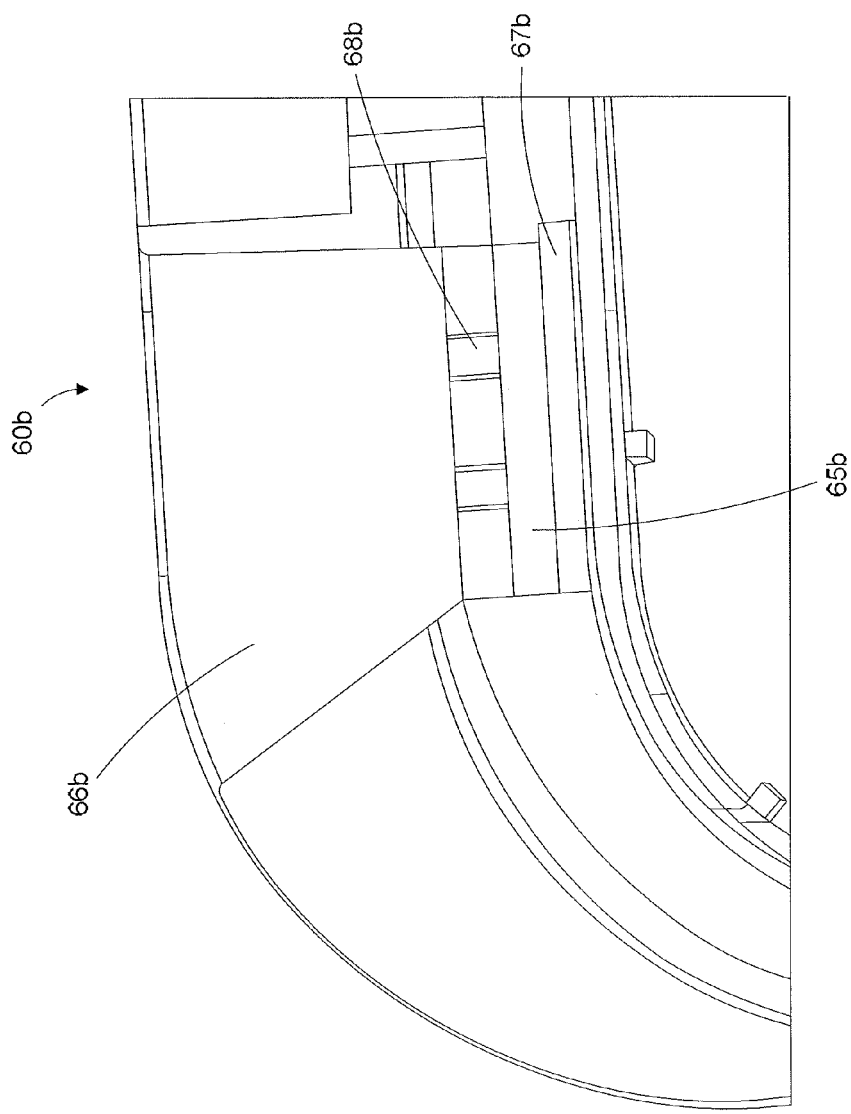

FIG. 10H provides a cross section view of a speaker acoustic vent assembly 60b. The acoustic vent assembly 60b includes a port 66b configured as a tapered channel for directing sound toward a speaker acoustic material 65b, such as a membrane, e.g. a GoreTex® membrane, configured for receiving and transmitting sound, but is not transmissive to liquids, such as water. The acoustic membrane 65b is circumscribed by an bounding region 67b and may further be overlaid by an acoustic grille 68b.

Figure 10I:
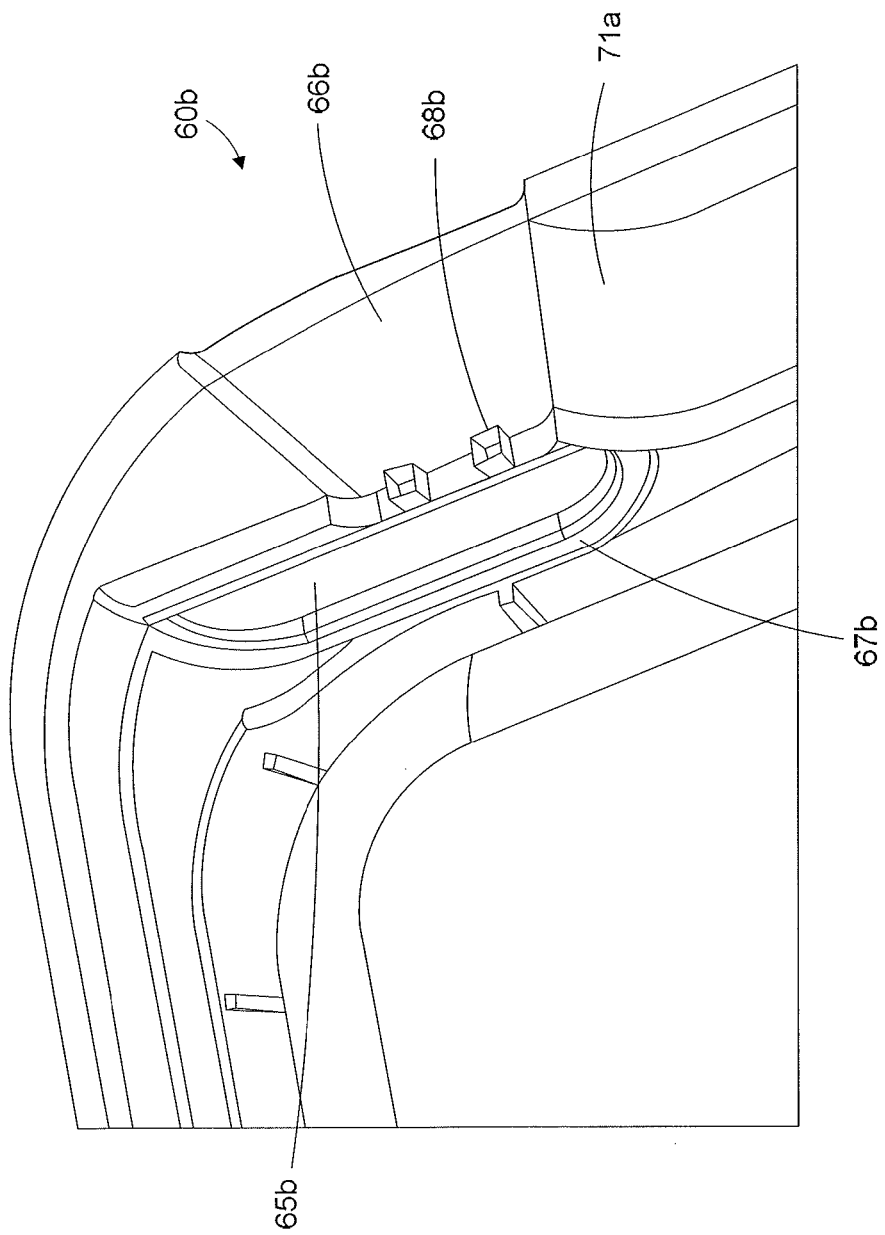

FIG. 10I provides a further cross section view of the speaker acoustic vent assembly of FIG. 10H. The acoustic vent assembly 60b includes a port 66b configured as a tapered channel for directing sound toward a speaker acoustic material 65b, such as a membrane configured for receiving and transmitting sound. The acoustic membrane 65b is circumscribed by a bounding region 67b and may further be overlaid by an acoustic grille 68b. The interface between the grille and acoustic membrane may be configured to include various airgaps there between.

Figure 10J:
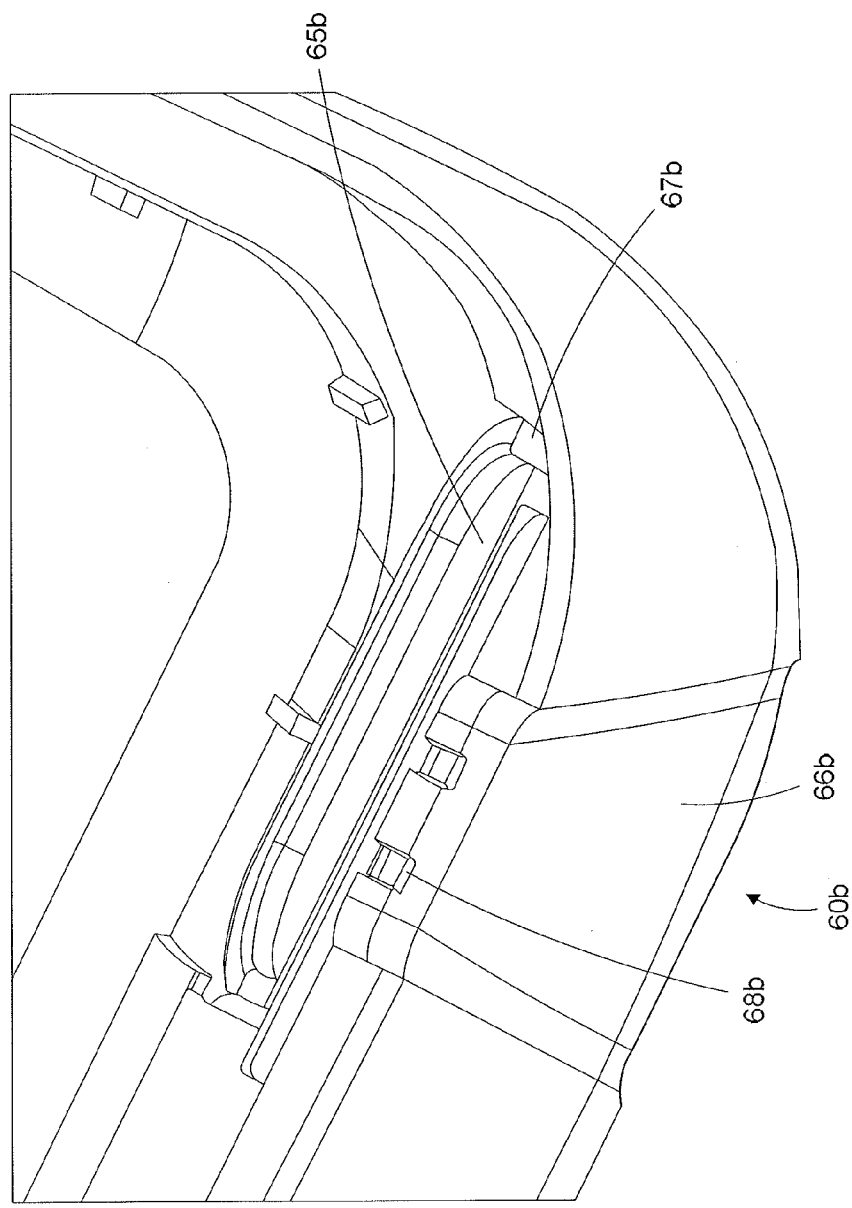

FIG. 10J provides another example of an acoustic vent assembly. In this instance, the acoustic vent assembly is fabricated as a single member including both a microphone acoustic vent assembly 60a and a speaker acoustic vent assembly 60b, such as could be used in an embodiment provided with respect to that of FIG. 19. As depicted the microphone and speaker assemblies 60 a and b are formed within a larger framework portion 5, which framework portion is adapted as an end portion that is capable of being inserted into a larger housing 1. The framework portion 5 includes a plurality of sound transmission portions 60 and b, having sound channels 66 a and b, and further includes a latch port portion 70.

Additionally, the framework portion 5 may include one or more clasping mechanisms, gaskets, gasket seats, and or channels as described herein. For instance, where the framework portion is meant to be inserted into a housing 1, the framework portion 5 may include a circumferential clasping mechanism that may additionally include a circumferential gasket and/or gasket seat, which together are designed to create a waterproof sealing between the housing 1 and framework portion 5 when the two are sealably coupled together.

As depicted, the sound channels 66 a and b include acoustic vent membrane seats 67 a and b that are angled with respect to a transverse central line of the channels 66 a and b. Hence, when the acoustic vent membranes 65 a and b are attached thereto they are angled. The angling of the acoustic vents 65 a, b is configured such that the surface area of the included vent material is increased thereby increasing the transmission of sound through the sound channels 66 a and b. A latch feature 70, as described herein, is also included, as well as grooves that are adapted to receive an external latching mechanism, which may be employed so as to further secure the framework portion 5 to the housing 1. For instance, see FIG. 19.

Figure 10K:
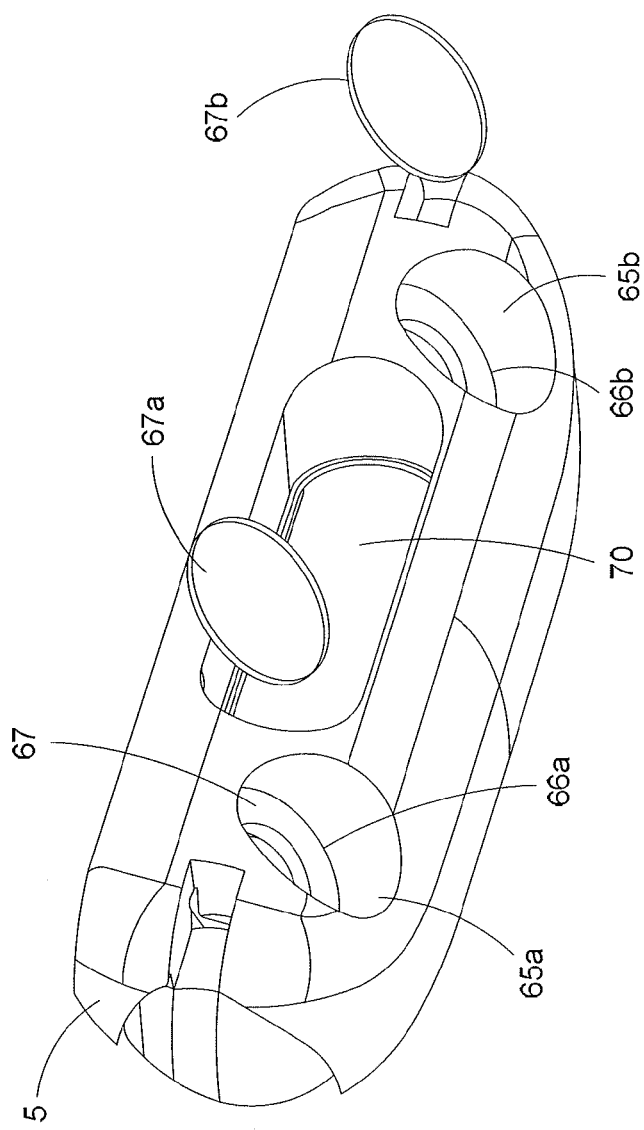

FIG. 10K provides a cross section view of the end member framework portion 5 having the acoustic vent assembly of FIG. 10J. The framework portion 5 is attached to the housing 1 via corresponding clasping mechanisms 27 and 37. The framework portion further includes a channel 10 having a gasket 15 therein, such that as the end member framework portion 5 is coupled to the housing 1 a liquid tight seal is provided thereby. The framework portion 5, further includes a microphone acoustic vent portion 60 a. The microphone acoustic vent portion includes an acoustic channel 66a leading to a microphone acoustic vent material 65a, which vent material 65a is held in place by an acoustic vent seat 67a. The acoustic vent material 65a is positioned within the channel 66a at an angle so as to increase the cross sectional area of the vent material for improved sound transmission.

Figure 10L:
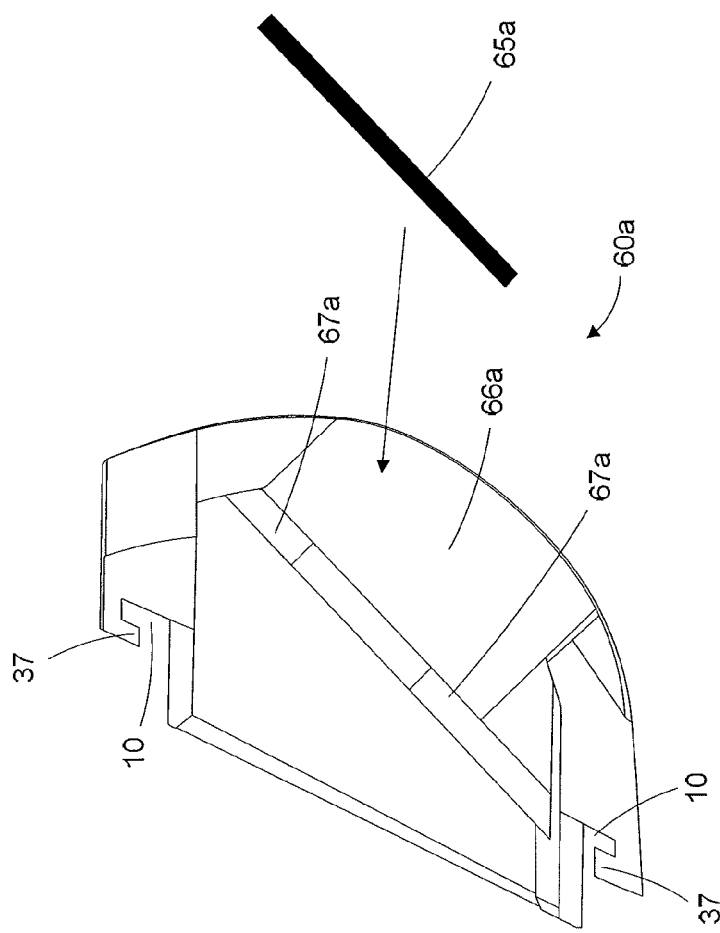
FIGS. 10L-10M provide alternative close up cross section views of the acoustic vent assembly of FIG. 10k.
Figure 10M:
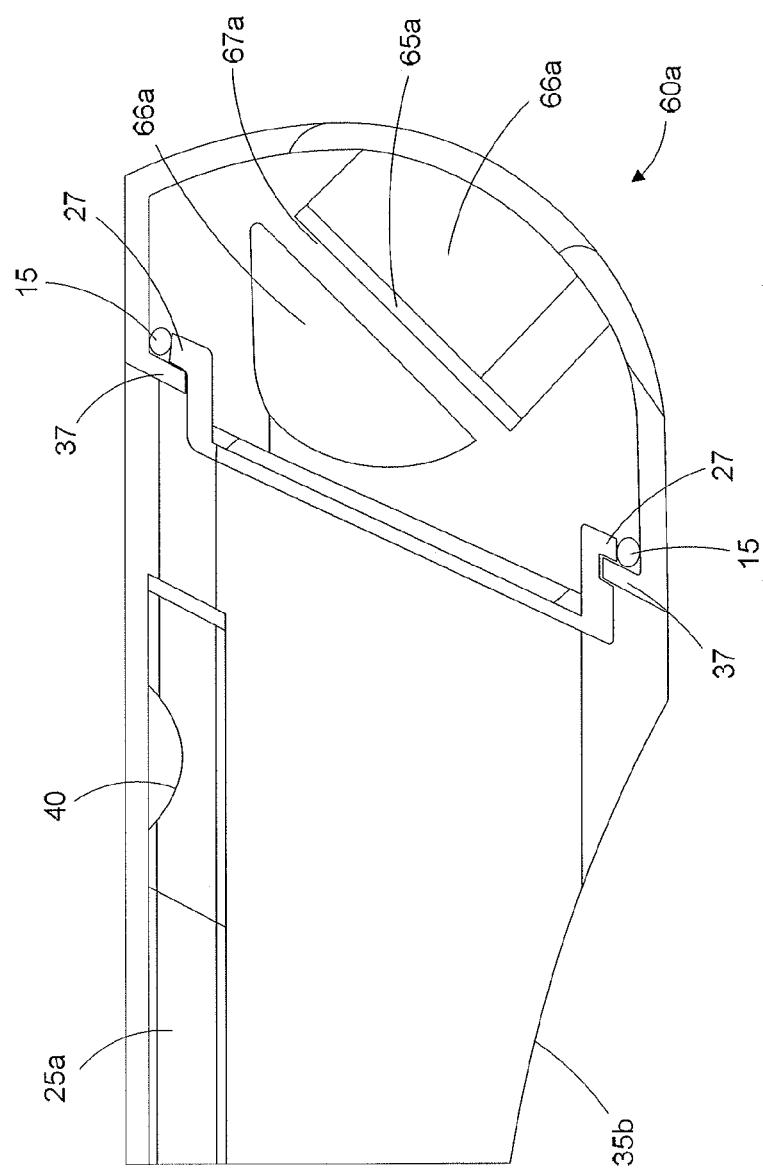

FIGS. 10L and 10M provide a close up cross section view of the acoustic vent assembly 6a of FIG. 10 providing a microphone sound channel 66a leading to an acoustic vent material 65 *a*, which vent material is angled with respect to the channel 66*a*. As can be seen, the end member 5 includes a channel 10 within which a gasket 15 may be positioned.

In certain embodiments, a perimeter portion of a housing of the disclosure may include one or more fabricated switch or button features. For instance, a switch or button feature for engaging a switch or button mechanism of an encased device, such as a silence switch or volume control or "on"/"off" button, may be provided. As can be seen with respect to FIG. 11A, a switch feature 90 may be included on a portion of the housing 1, such as on one of the opposing side portions. The perimeter of the housing 1 may further include other features such as one or more volume control buttons 99 *a*, *b*; a coin slot feature 18; one or more sound transmission portions 60, a latch feature 70; and the like.

The switch 90 and button 99 features are fabricated along with the housing 1 and are specifically configured for engaging the corresponding switches and buttons of a housed device. Hence, the switches and buttons are designed to model and ensure both the functionality and aesthetics of the underlying switches and buttons of the underlying device.

Figure 11A:
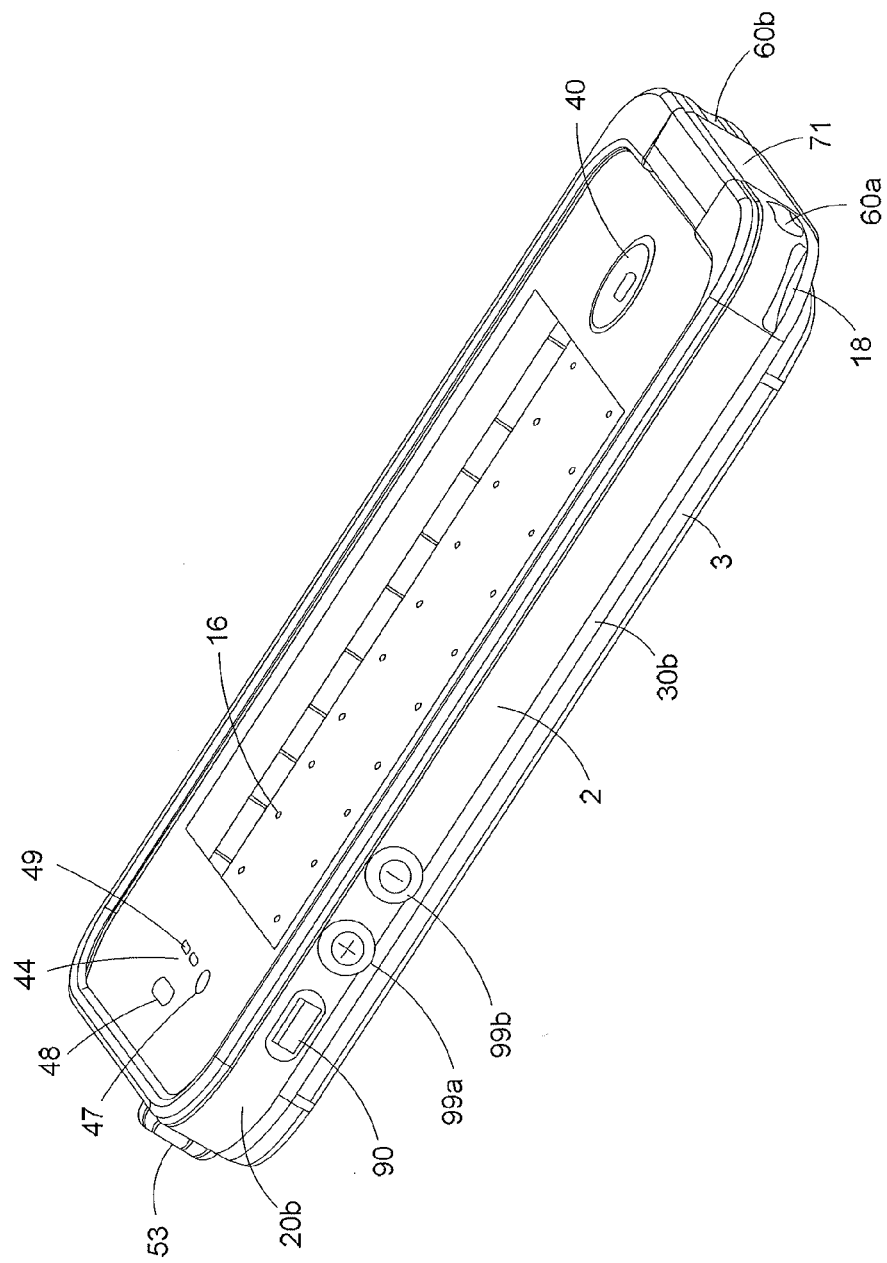
FIGS. 11A-11G provide various views of a switch and button feature of a housing of the disclosure.
Figure 11B:
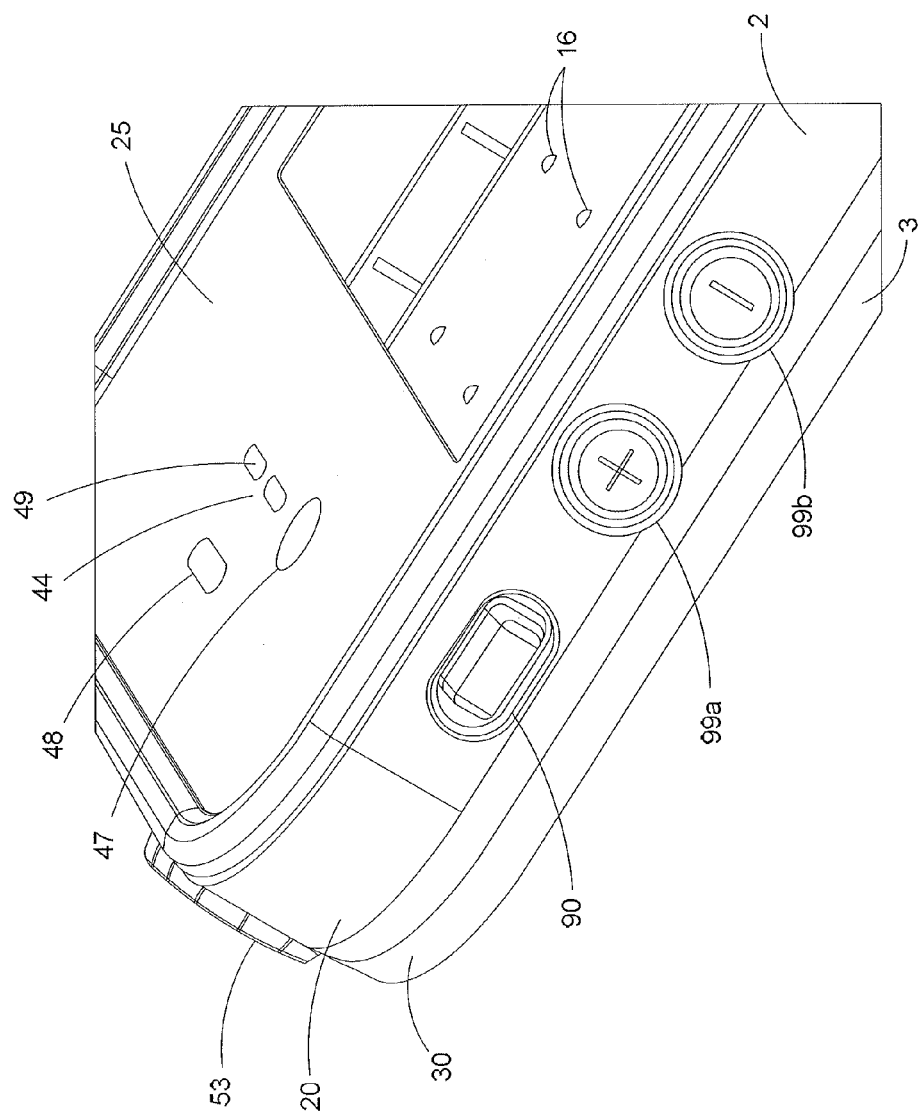

FIG. 11B provides a close up view of FIG. 11A showing the perimeter portion of the housing 1 that contains the silence switch feature 90 and volume buttons 99. The housing 1 includes a top housing member 2 having a perimeter portion 20, and a bottom housing member 3, having a perimeter portion 30. As depicted, the switch feature 90 and volume buttons 99 are positioned along a perimeter portion 20 of the top member 2, but in other embodiments may be positioned on the bottom member 3.

In this embodiment, the style of the switch 90 and button 99 features are designed to retain the stylistic features and functionality of the switches and buttons of the underlying device. The silence switch 90 is configured for engaging a respective silence switch of a housed device so as to silence the noise feature of the housed device. The volume control toggles or buttons 99 *a* and *b* are configured for engaging their corresponding buttons on a housed device for the increasing and decreasing of the volume of an underlying device. These configurations may differ as the configuration of the underlying device differs. For instance, one or more extension elements, such as compressible plug elements may be included to increase the functionality of the button or switch members.

The perimeter portion 20 of top member 2 additionally includes an earphone jack 50 having a port sealing bung 53 inserted therein. It is to be noted that one or more of these features could be positioned along the perimeter portion 30 of a bottom member 3 as well. Additionally depicted is a top surface membrane 25 of top member 2, which top member 2 includes a video camera lens or optically clear region 47, a proximity sensor 48, and an acoustic vent portion 44 including an sound transmission aperture 49 for transmitting sound through the top member membrane 25. The bottom front surface 35*a* of the bottom member 3 includes stand-offs 16.

Figure 11C:
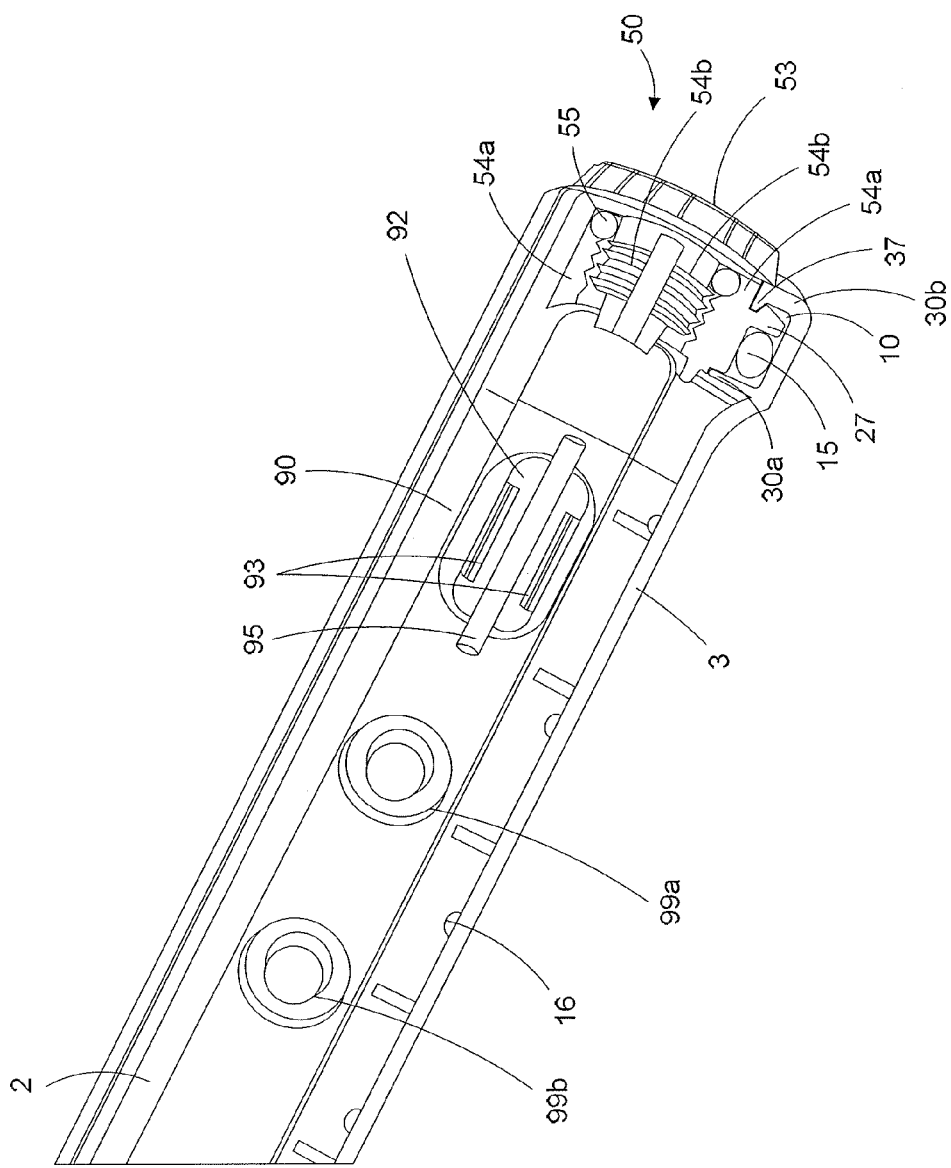

FIG. 11C provides a cutaway side view of the silence switch feature 90, volume toggles 99 *a*, *b* as well as earphone jack port 50 with port sealing bung 53 inserted therein as depicted in FIG. 11A. The silence switch feature 90 includes an actuator base 92, which may be fabricated from a rigid material, and may include an axle or rocker 95 that pivots along with the base 92 so as to effectively engage a silence switch of a housed device. Also depicted are switch interfaces 93, which interfaces are configured for engaging opposing sides of a switch of an underlying device such that as the switch feature 90 rotates about rocker 95, the switch is translated from one position to another. It is to be noted that the rigid actuator 92, the rocker 85, and the switch interfaces 93 may be configured as one complete element or two or three separate elements that are joined together.

Volume control toggles 99 *a* and *b* include a flat user engagement surface portion, which may be engaged by a user and an extended button engagement portion that is configured for engaging a button of a housed device. One or more additional spacers may be added to the extended button engagement portions so as to enhance the engagement of the buttons of a housed device.

Also depicted is earphone jack port 50 having port sealing bung threads 54*a*. A port sealing bung 53 having corresponding threads 54*b* to the earphone jack port threads 54*a* is also provided. The port sealing bung 53 further includes a gasket 55 circumscribing the port sealing bung 53. It is noted that although the gasket 55 is depicted as being associated with the port sealing bung 53, it other instances it may be associated with the earphone jack port 50. In this embodiment, the port sealing bung 53 is inserted into the earphone jack port 50, bung threads 54*b* are aligned with port threads 54*a*, and the gasket 55 is compressed by the screwing of the port sealing bung 53 into the bung port 50 thereby creating a watertight sealing therewith.

Figure 11D:
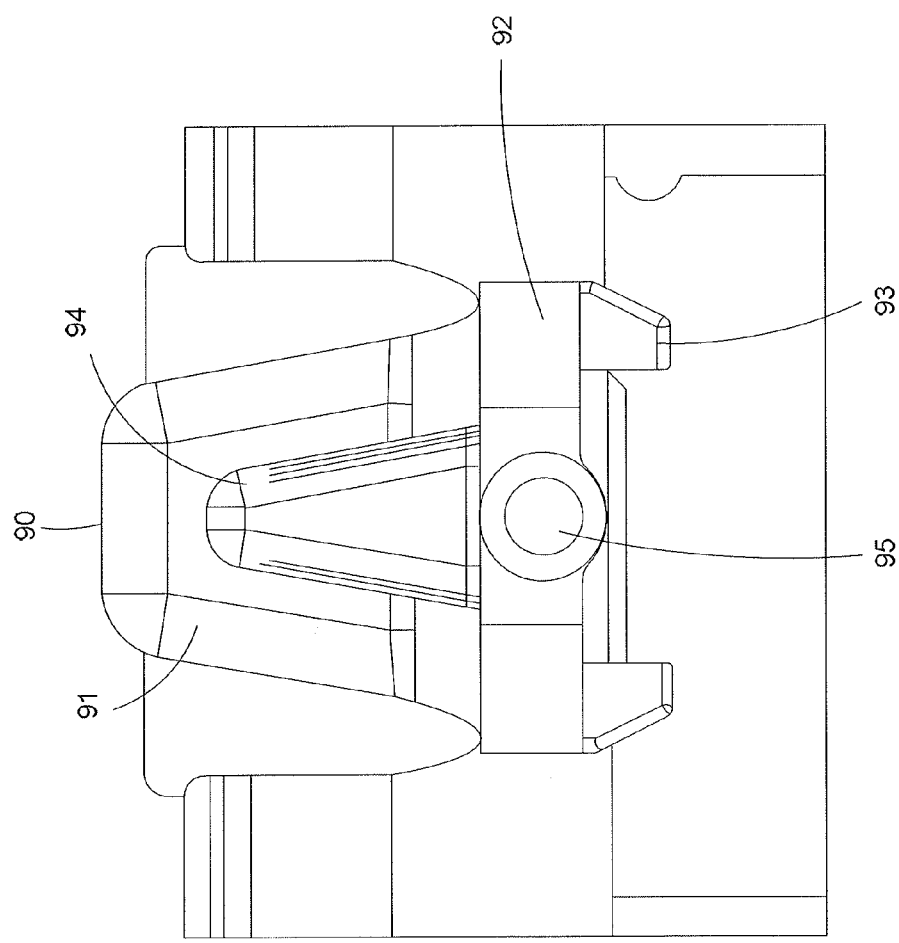

FIG. 11D provides a cross section view of the silence switch feature 90. The switch feature may be configured as a slider switch 90, which slider switch 90 includes a switch housing 91, an actuator top member 94, having a rigid actuator switch base 92 and switch interface 93. The silence switch feature 90 further includes an axle or rocker 95 about which the actuator top member 94 and switch interface 93 rotates. The switch interface 93 may include two opposed teeth members or a cavity portion for surrounding opposing sides of a switch, e.g., a silence switch, of an underlying device.

Accordingly, the switch interface 93 couples with a slider switch, such as a silence switch of an underlying device, so as to manipulate the silence switch, e.g., from a normal to a silenced position. For instance, a user may place a downward force on the rigid actuator top member 94 thereby causing the base member 92 to rotate along with axle 95 and causing the wings or cavity of the switch interface 93 to move upward. In a manner such as this the downward force on the actuator top member 94 is translated into an upward force on the switch interface 93 and silence switch of an underlying device thereby moving the silence switch from a first to a second position, e.g., from an "off" to an "on" position.

It is to be noted, that although the switch feature 90 has been described as having various switch components with respect to FIG. 11D, various of the switch components may be included or excluded or modified without departing from the nature of the switch feature 90 so long as the switch feature is capable of engaging and manipulating a switch of an underlying device. For instance, in certain instances, a switch feature 90 may include a flexible, semi-rigid switch housing 91, which housing includes one or more switch interface portions 93 that are associated with an inside surface of the housing 91, which switch interface portions 93 are configured for engaging a switch of the underlying device. In such an instance, the switch housing 91 may be a raised member that is configured for being depressed in an up or down direction, which depression allows one of the switch interface portions 93 to engage and manipulate the switch of a housed device either upwards or downwards. A reinforced base portion 92 may also be included if desired.

Figure 11E:
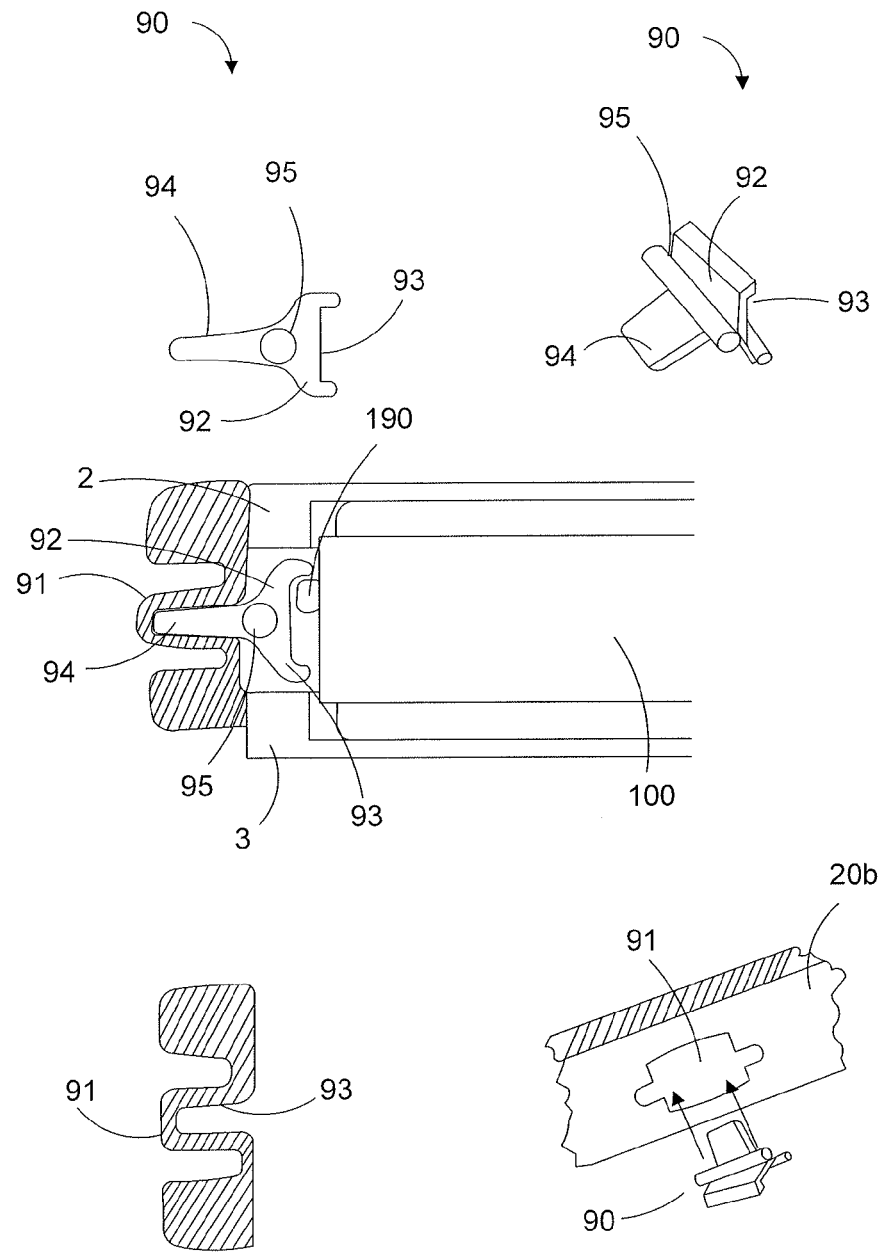

FIG. 11E illustrates several different views of a silence switch feature 90. The silence switch feature 90 shows a housing 91 configured to include a slider switch top member 94 and a silence switch interface 93. As depicted the silence switch top member 94 is associated with a rigid actuator base member 92 and rigid actuator switch interface 93, which elements rotate about a rocker, e.g., axle, member 95 as the switch feature 90 is manipulated to move the switch interface 93 upwards or downwards and consequently moving a silence switch of an underlying device "on" or "off".

As illustrated the silence switch feature 90 includes an actuator switch housing 91 that overlays the switch top member 94, axle 95, and base member 93. The switch feature 90 may additionally include an adhesive, such as applied to a top member 94, or a barb features such as applied to the axle portion 95, so as to secure the top member 94 within the housing member 91. As the top member 94 is manipulated, e.g., moved upward or downward in a linear direction, the base member 93 rotates about the axle 95 thereby causing the switch interface 93 to translate the switch of an underlying device in an opposing linear direction, e.g., thereby silencing or un-silencing the underlying device.

Also depicted is a housing for the switch feature 90. As depicted, an interior perimeter portion 20a of a top member 2 is provided. The interior perimeter portion 20a of the top member includes a switch cutout portion into which a switch feature 90, as described above, may be fitted. The switch feature 90 therefore extends from an insider perimeter of the housing 1 toward an outside perimeter portion of the housing 1. The exterior perimeter portion 20b of the top member 2 forms an exterior portion of the switch housing 91 so as to cover the external switch components. Consequently, the top member 2 may be fabricated so as to form a switch housing portion 91 on its perimeter portion into which a suitable switch 90 is fitted, e.g., post production.

Figure 11F:
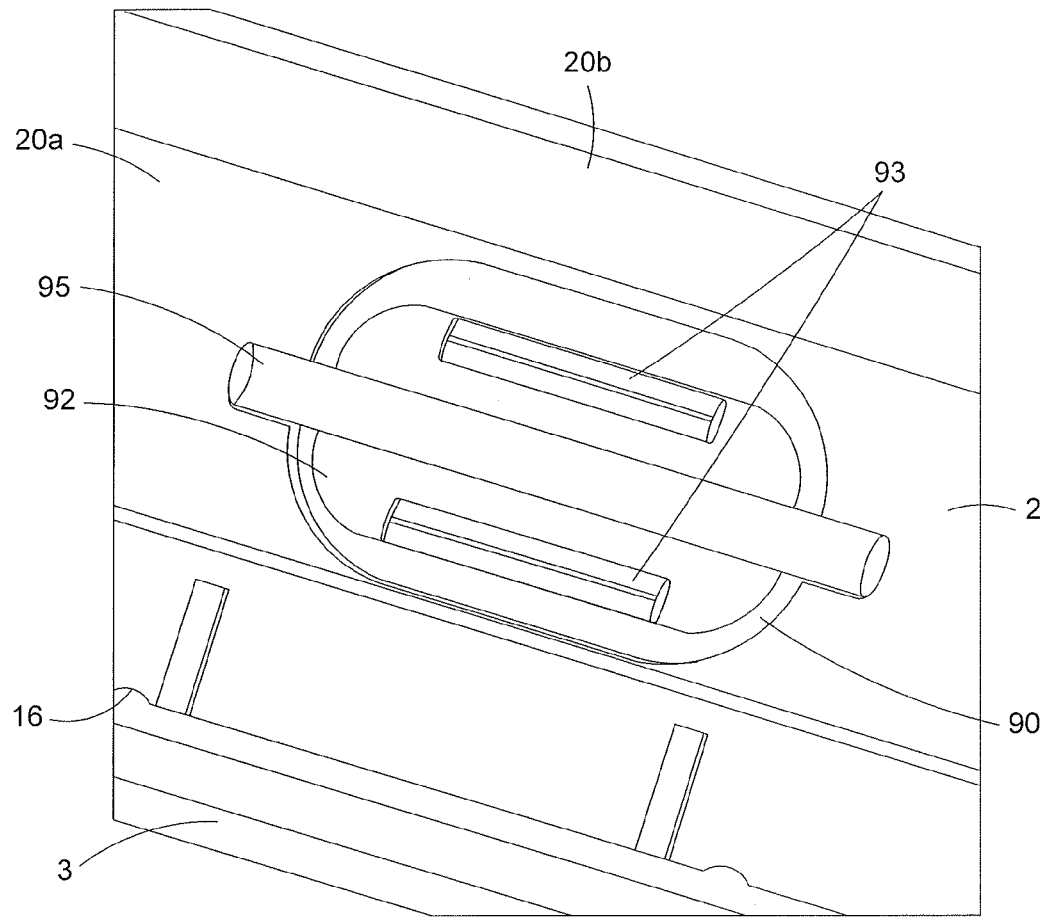

FIG. 11F provides an inside view of the silence switch mechanism 90, which switch mechanism 90 includes a switch top member 94 that is not seen, which top member 94 extends from an interior portion 20a of the top member 2 to an exterior portion 20b thereof. As the top member 94 is engaged by a user it thereby moves about axle 95. The axle 95 is adapted for allowing the rigid actuator base 92 to also rotate around the axle 95. Hence, the switch feature 90 is configured such that as the switch top member actuator 94 rotates about the axle 95 within the switch housing 91, the switch interface 93 causes the switch to move from a first to a second position, such as from an "on" to an "off" position.

Figure 11G:
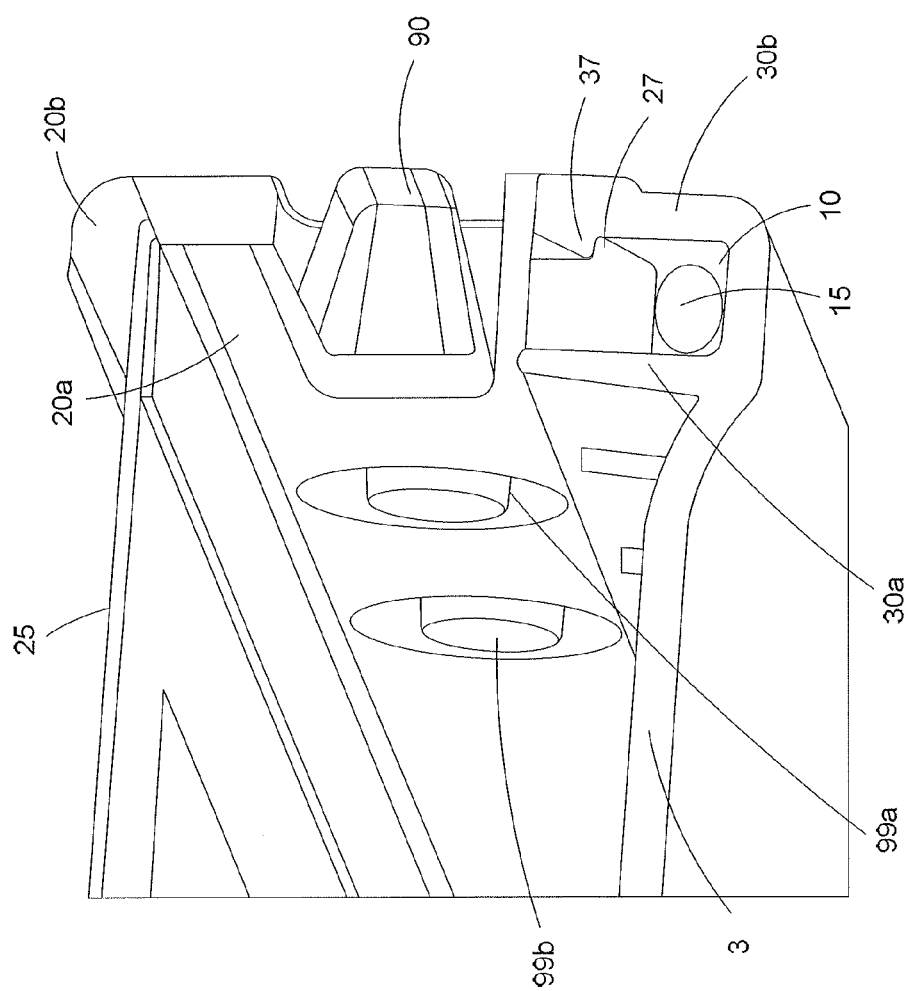

FIG. 11G provides a cross section view of the switch feature of FIG. 11A. It is to be noted, that this configuration is such that as the design of an underlying device is changed over time, the switch feature 90 should be able to accommodate minor changes in the configuration of the underlying device and still be effective in performing its function.

Additionally, the top and/or bottom member may be configured so as to include a slot region to facilitate in separating the top member from the bottom member of the housing. For instance, a tool may be placed within the slot and twisted thereby causing the two members of the housing to separate, e.g., unzip. In this regard, the flexible material of the housing, e.g., the overmoulded exterior perimeter portion 20b of the top member 2 and the semi-rigid, e.g., polypropylene, material of the bottom member 3 may facilitate such an interaction because if the material of the housing were exclusively rigid such an interaction would be hard to achieve in addition to a consistent seal.

Figure 12A:
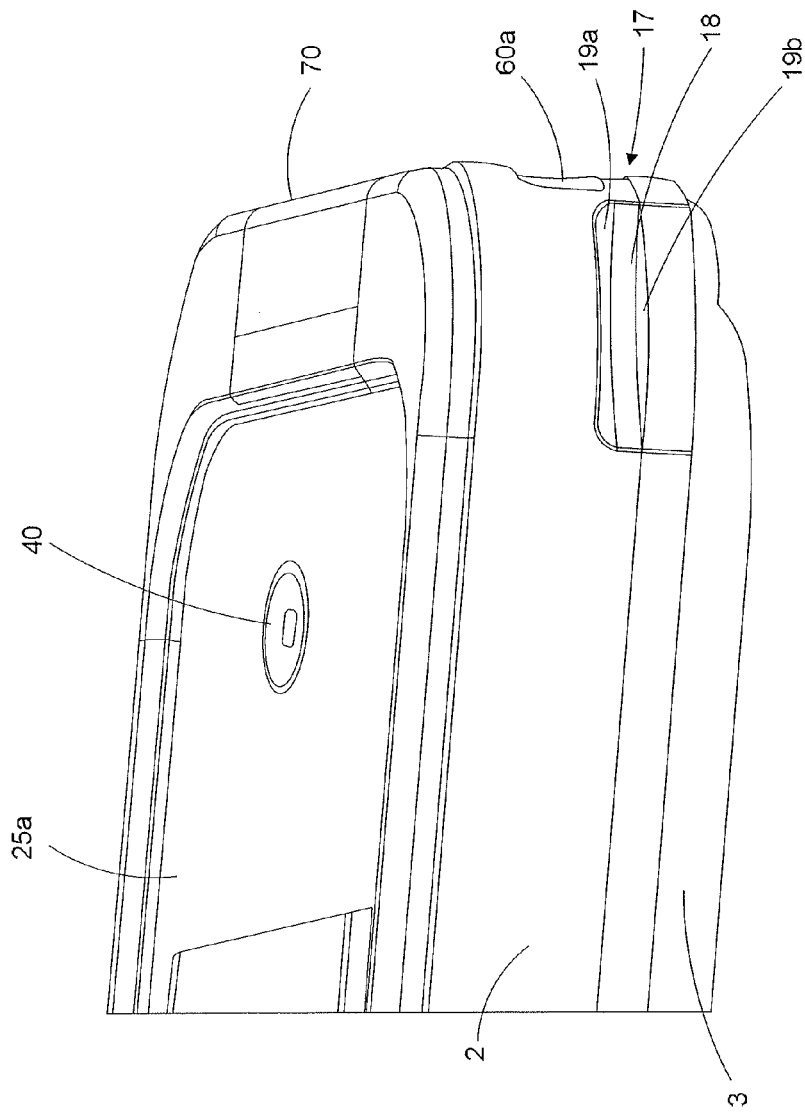
FIGS. 12A-12D provide various views of a coin-slot feature of a housing of the disclosure.

Accordingly, in certain embodiments, as depicted in FIG. 12A an outer perimeter portion of the housing 1 may include a slot feature 18, such as a coin slot feature, for assisting in separating the top member 2 of the housing from the bottom member 3 of the housing. The slot feature may include an indented, e.g., cut out, portion 17 of the perimeter. The cut out portion 17 may be positioned in top member 2, and further be bounded by a plurality of bounding members 19 a, b, such as overhang (or non-cutout) portions in top housing 2 and bottom housing 3, respectively.

Figure 12B:
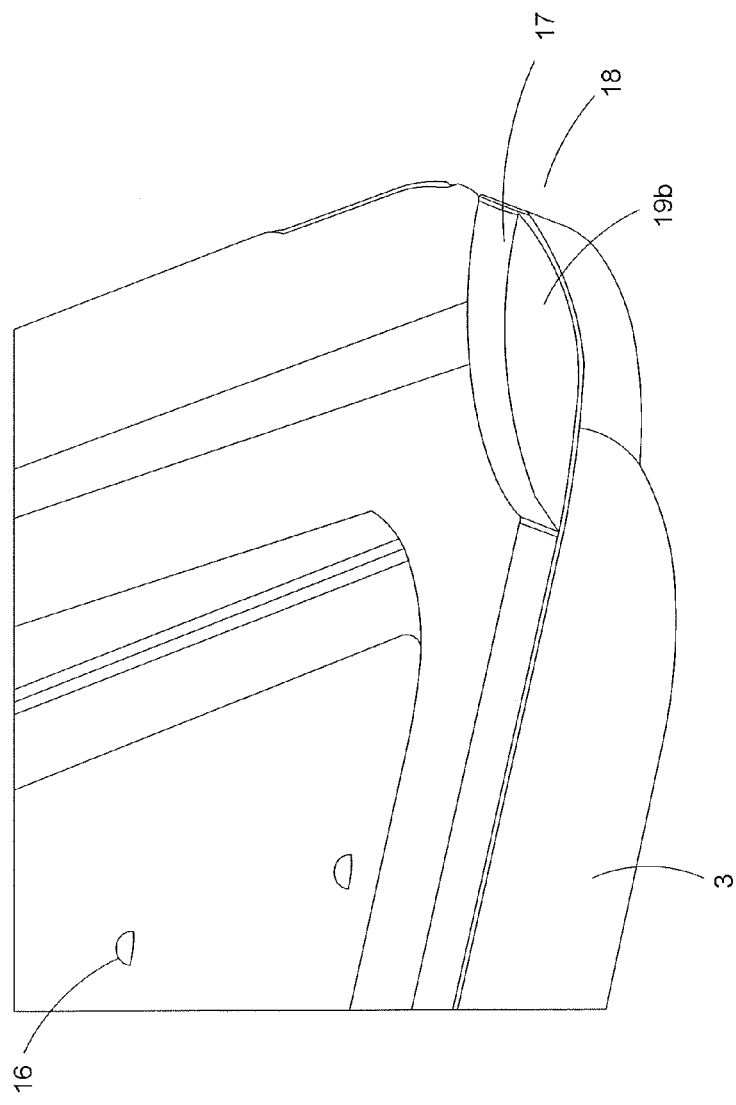

FIG. 12B provides a close up cross section view of the coin slot feature 18 of FIG. 12B. The top member 2 includes both a concave configuration 17 and a convex overhang or non-cutout configuration 19a, while the bottom member 3 also includes a convex or non-cutout configuration 19b, such that as the top 2 and bottom 3 members are joined together a coin slot feature 18 is formed so as to assist a user in opening the opposing members of the housing 1, such as by inserting a tool, such as a coin, into the concave region 17 and twisting thereby forcing the top member 2 away from the bottom member 3.

Figure 12C:
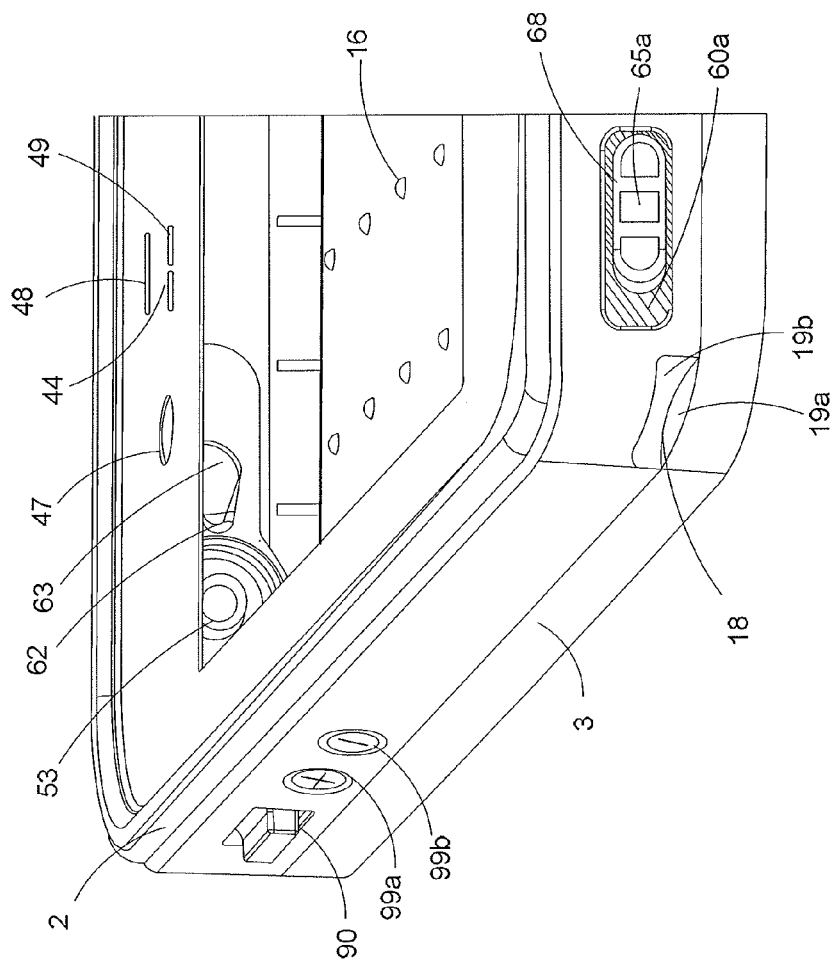

FIG. 12C provides a cross section view of the coin slot feature 18 of FIG. 12A. The coin slot feature 18 is formed within the top member 2 and includes a concave region 17 and a convex region 19a that overhangs the concave, cutout region 17. The corner portion of the bottom member 3 naturally forms the other bounding member 19b of the coin slot feature 18.

Figure 12D:
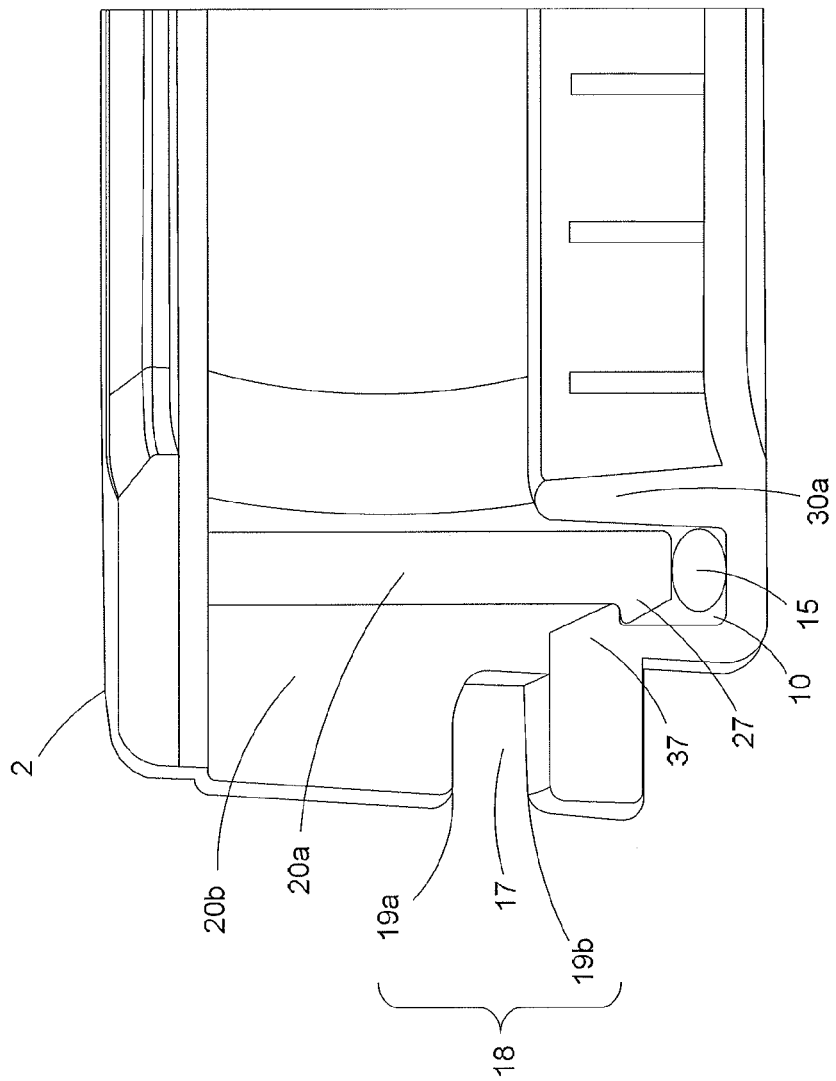

FIG. 12D provides a cross section view of the coin slot feature 18 of FIG. 12A, which coin slot feature 18 includes a concave region 17 bounded by a plurality of convex regions 19a and 19b, wherein the convex region 19a is positioned on top member 2 and the convex region 19b is positioned in bottom member 3.

Figure 13A:
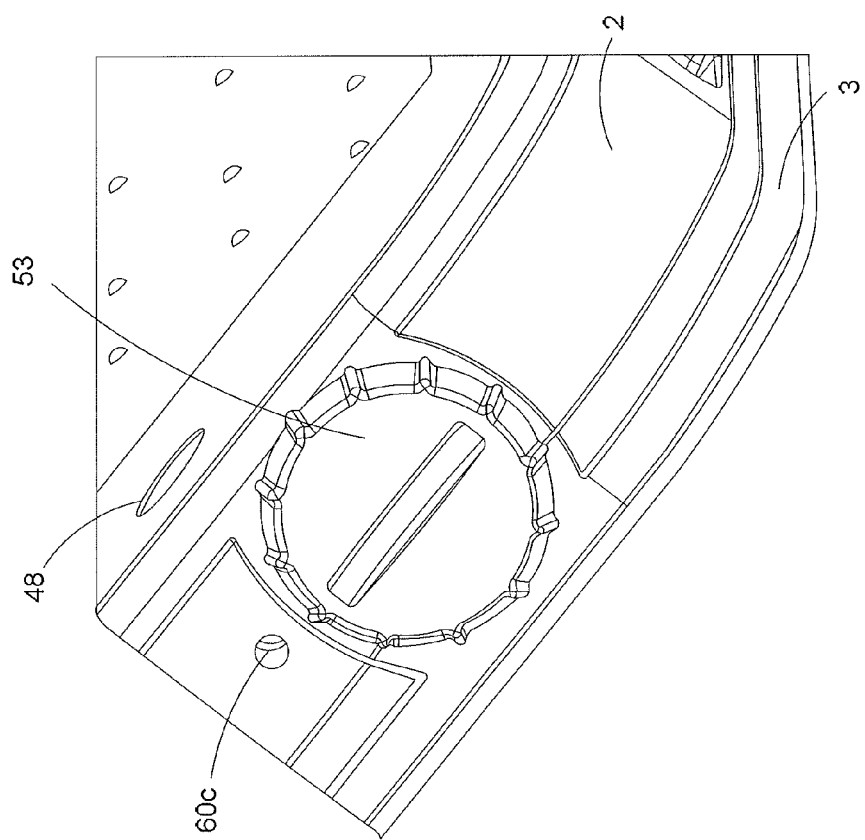
FIGS. 13A-13D provide various views of a noise cancelling feature of housing of the disclosure.

In a further embodiment, as seen with respect to FIG. 13A the outer perimeter portion of the housing 1 may include a sound transmission portion 60c that is configured as a noise cancelling feature. In this configuration, the noise cancelling feature 60c functions for assisting in directing ambient noise toward a noise cancelling microphone present on an encased device thereby facilitating in the cancelling of ambient noise. The noise cancelling feature 60c may be positioned anywhere on the housing 1, on a top member 2 or bottom member 3, such as along the perimeter 20 or 30. As depicted, the noise cancelling feature 60 is positioned on a top member 2 and is offset from a liquid proof headphone jack outlet 50, which headphone jack includes a port sealing bung 53. For instance, it is to be noted that in various instances, a noise cancelling feature may be included within an earphone port 50, more specifically, within earphone port closure 53. For example, the port sealing bung 53 could include the noise cancelling feature 60, such as where an underlying electronic device has a noise cancelling feature associated with its accessory, e.g., headphone, connection inlet.

Figure 13B:
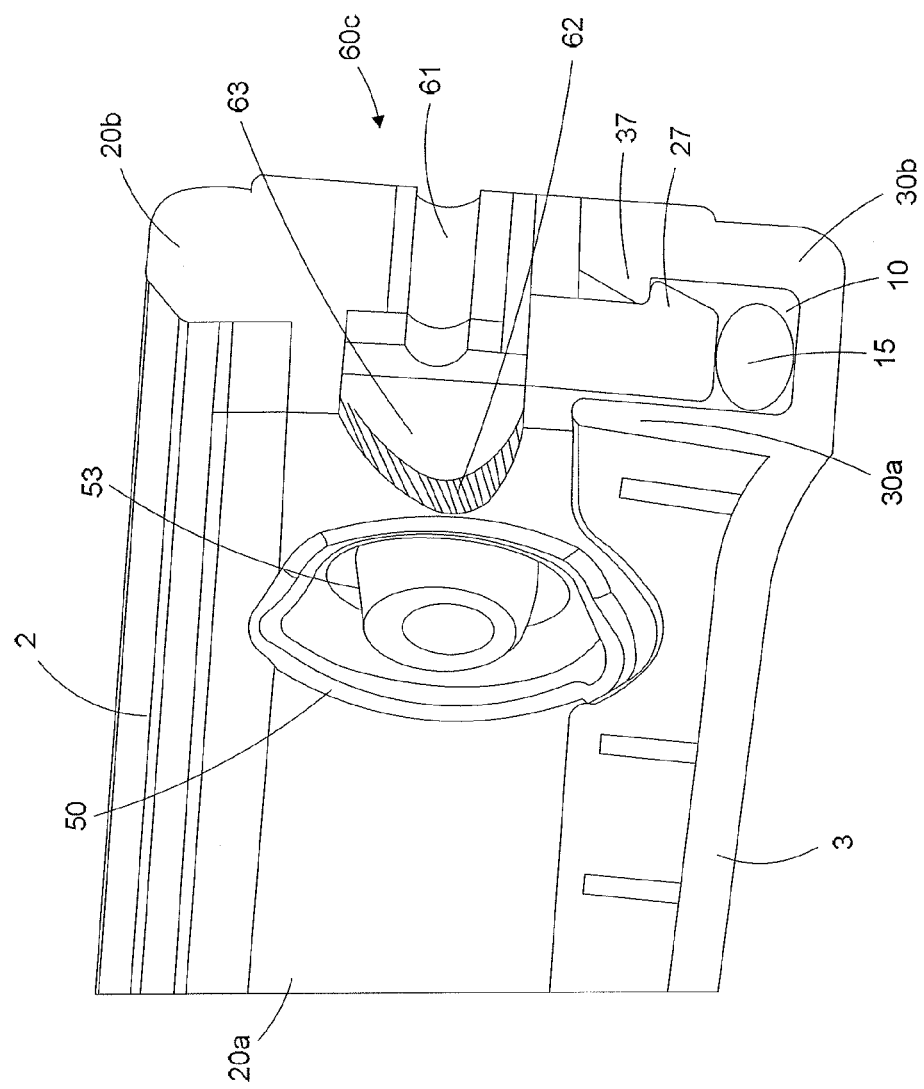

FIG. 13B provides a cross section view of the noise cancelling feature 60c of FIG. 13A. The noise cancelling feature 60c includes an acoustic inlet aperture 61 that communicates with a sound guide channel 62, which channel 62 directs sound toward an acoustic membrane 63 positioned in a transverse manner within the sound guide channel 62. The acoustic inlet aperture 61 is offset from a noise cancelling microphone of an encased device, but configured for directing ambient noise thereto. Additionally, as can be seen with respect to the accessory inlet aperture 50, e.g., headphone port, of FIG. 13B, in various embodiments, the head phone port 50 may include a structural circumferential feature that is designed to contact and/or at least partially circumscribe an earphone inlet port 150 of a housed device 100 so as to protect the inlet port 150 of the device 100 form being subjected to dirt or liquid that might otherwise enter the housing 1.

It is further to be noted that although in this embodiment the noise cancelling feature 60 is in an offset fashion, in certain embodiments it can be configured to be directly inline with a noise cancelling feature of a housed device. For instance, where a noise cancelling feature of an underlying device is positioned within an accessory inlet portion, such as in a headphone jack receiving portion, then the noise cancelling feature 60 may be positioned within an earphone jack port 50 plug. In such an instance, the port sealing bung 53 would be configured to include the noise cancelling feature 60, which in turn would include one or more of an acoustic inlet aperture 61, e.g., positioned on closure top member 58, which communicates with a sound guide channel 62, positioned underneath thread portion 54, which channel 62 would direct sound toward an acoustic membrane 63 positioned in a transverse manner within the sound guide channel 62. In such an instance, the noise cancelling feature 60 would be directly in line with a noise cancelling feature of a housed device.

As depicted, the noise cancelling feature 60c includes one or more sound inlet apertures 61, a sound guide channel 62, and an acoustic vent membrane 63, which are positioned on a perimeter portion 20 of a top member 2. The sound guide channel 62 is configured for directing sound toward a noise cancelling microphone present on an encased electronic device. The acoustic vent membrane 63 may be positioned so as to intersect the sound guide channel 62.

Figure 13C:
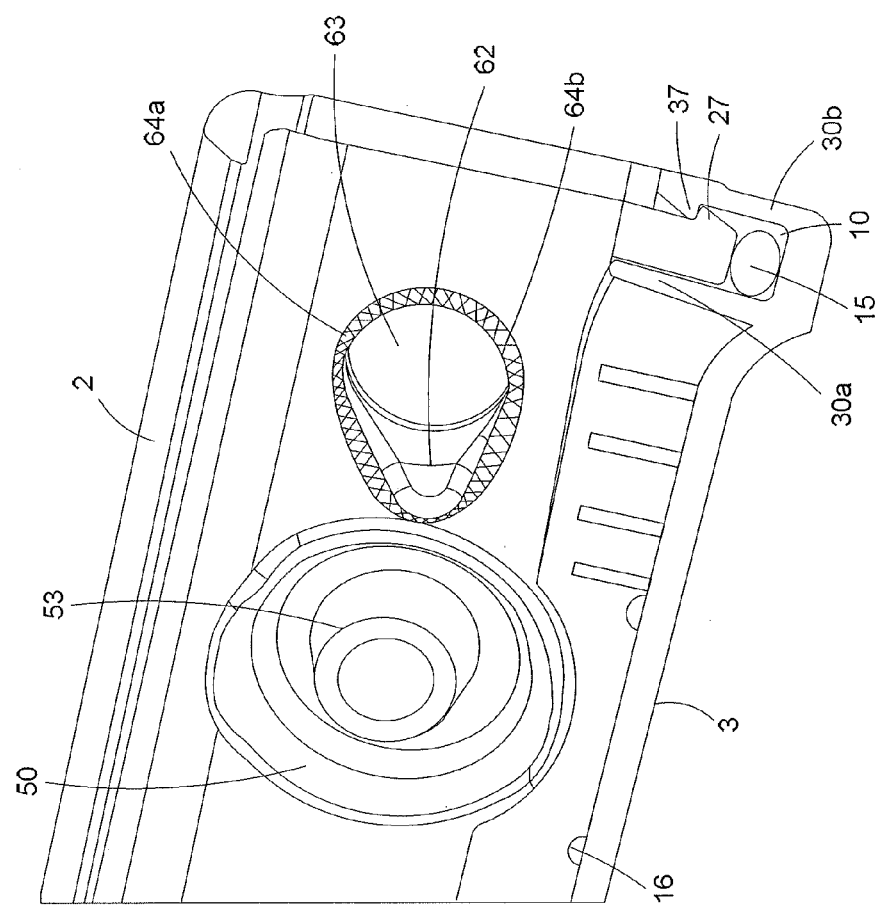

Further, in certain embodiments, as can be seen with respect to FIG. 13C, the noise cancelling feature 60c may additionally include an echo cancelling gasket 64b that may be positioned on a gasket seat 64a, which gasket seat 64b and gasket 64a circumscribe the interior perimeter of the noise cancelling feature 60c.

For instance, in certain configurations, when a housed device, such as a mobile telephone, having a noise cancelling microphone is entirely enclosed within the bounds of a housing, sound emitted from the housed device may be reflected internally to the noise cancelling microphone thereby causing echoing. For example, where the enclosed device is a mobile telephone, sound emitted from the device from a person speaking on the other end of the line may sometimes hear an echoing of their words because of the internal reflection of the sound of their speaking. This reflection of noise makes communication through the enclosed device more difficult than it otherwise would be.

To prevent such echoing a gasket 64b may be placed on an internal perimeter portion 20a of the top member 2 in such a manner that it circumscribes the internal perimeter portion of the noise cancelling feature 60c. The gasket 64b may be composed of any suitable material, such as a compressible foam material, elastic material, rubber material, a mixture of the same, and/or the like, and should be positioned such that it surrounds the noise cancelling microphone feature inlet of the enclosed device thereby preventing internally reflected sound from entering the noise cancelling microphone inlet of the enclosed device and thereby causing echoing. With an appropriately positioned gasket 64b positioned around the noise cancelling microphone inlet of an enclosed device, this echoing is diminished if not completely prevented. For further effect, the noise cancelling gasket 64b may be positioned on a gasket seat 64a which gasket seat 64a functions to more firmly position the gasket 64b against the encased device. See FIG. 13C.

Accordingly, FIG. 13C provides an inside out view of the noise cancelling feature 60c of FIG. 13A. Depicted is an acoustic vent membrane 63 that transects a sound guide channel 62. The sound guide channel 62 is circumscribed by a echo cancelling gasket seat 64a, upon which gasket seat 64a is positioned an echo cancelling gasket 64b. The sound guide channel 62 is offset from an earphone jack port 50, which earphone port is coupled with the port sealing bung 53. Although the sound guide channel is offset from the earphone jack port 50, it is configured for guiding sound to a noise cancelling microphone on the body of an encased electronic device, such as a mobile telephone.

As indicated, FIG. 13C provides a noise cancelling feature with a noise cancelling gasket 64a present. As can be seen, the noise cancelling gasket 64a sits within gasket seat 64b and circumscribes the internal perimeter portion of the noise cancelling feature 60c thereby preventing the internal reflection of sound from entering a noise cancelling microphone inlet of an encased device thereby preventing the experience of echoing.

Figure 13D:
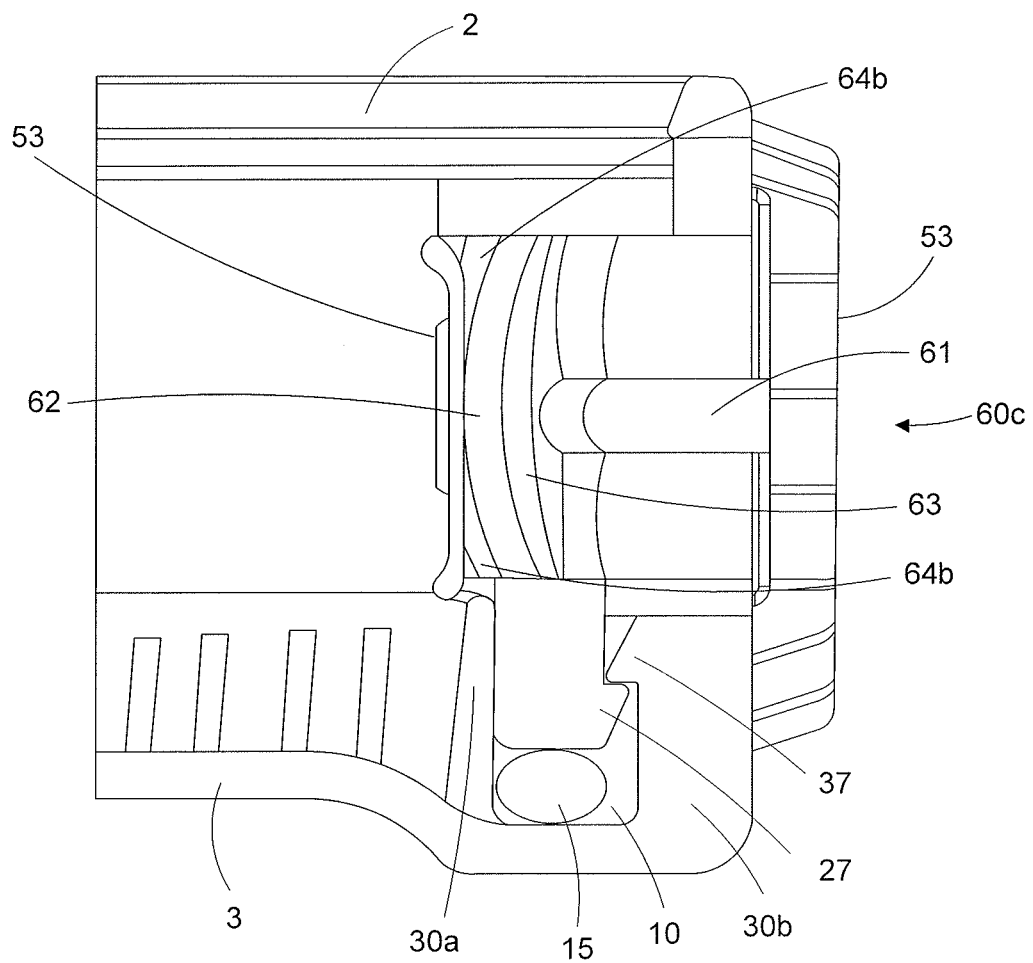

FIG. 13D provides a cut away view of the noise cancelling feature 60c of FIG. 13A. The noise cancelling feature 60c includes a sound inlet aperture 61, a sound guide channel 62, an acoustic vent membrane 63, and a noise cancelling gasket 64a positioned on a gasket seat 64b. The acoustic vent is in an offset position so as to facilitate the transmission of sound there through. In the same manner described above, the acoustic membrane 63 may be associated with the housing 1 in an overmoulded configuration and/or an adhesive may be included to secure the membrane to the housing.

Figure 14A:
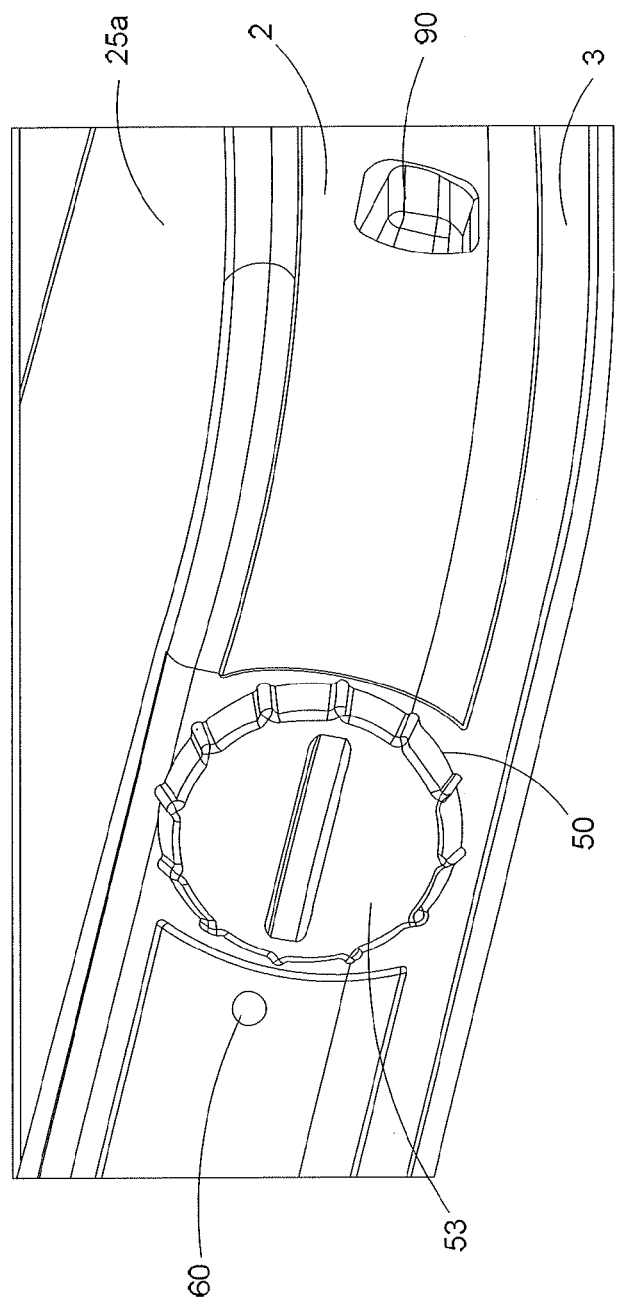
FIGS. 14A-14D provide various views of an accessory port feature with closure device of a housing of the disclosure.

In an additional embodiment, as can be seen with respect to FIG. 14A, the outer perimeter portion of the housing 1 may include a port feature aperture 50, for instance, for receiving either a jack, such as a jack of an accessory, such as a headphone or speaker assembly, or a closure device, e.g., a bung, or the like. The headphone port feature may be included in a top and/or bottom member 2, 3. A noise cancelling feature inlet aperture 61, as described above, is also depicted.

Figure 14B:
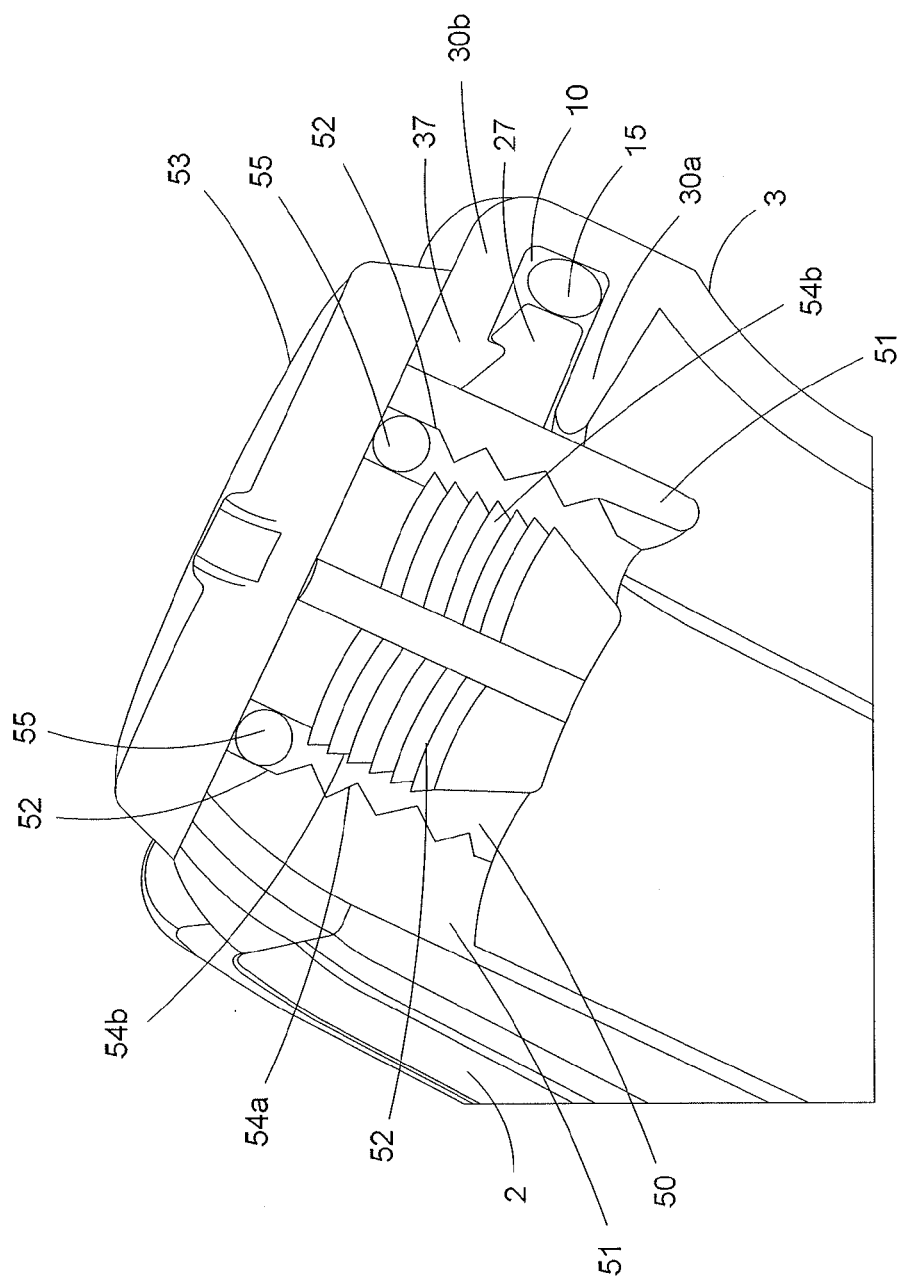

FIG. 14B provides a cross section view of the headphone port feature 50 of FIG. 14A. The headphone port feature 50 may include an aperture bounding member 51 positioned in one or both of the top and bottom members 2, 3. The aperture bounding member 51 bounds an aperture. The bounding member includes a threaded region 54a that is configured to correspond to a threaded region 54b on the port sealing bung 53, which port sealing bung 53 is adapted to be inserted into the port feature aperture 50. In various embodiments, the bounding member may also include a gasket seat and a gasket, such as an o-ring. However, as depicted, although aperture bounding member 51 includes a gasket seat 52, the gasket seat is configured for interfacing with a gasket 55 positioned on the earphone port bung 53.

The threaded region 54a may be configured for receiving a corresponding threaded region 54b present on an accessory, such as a headphone jack 57 or a closure device, such as an earphone port sealing bung 53. Accordingly, a suitable headphone jack 57 or closure device such as port sealing bung 53 will include a corresponding thread feature 54b and may additionally include a gasket 55. If the headphone jack 57 and/or port sealing bung 53 includes a gasket, then the aperture bounding member 51 need not include a gasket 52b, rather it will simply include a gasket seat 52 and a threaded feature 54a. If the headphone jack 57 and/or closure device does not include a gasket 55, then the aperture bounding member 51 will include a gasket seat 52a as well as a gasket 52b and a threaded feature 54a. The threaded region 54a may be configured as a typical thread feature or may be configured as a cam feature. Hence, it is to be noted, that a gasket 52b may be present within the housing of the aperture bounding member 51 or may be present on the earphone port bung 53 or headphone jack 57.

Figure 14C:
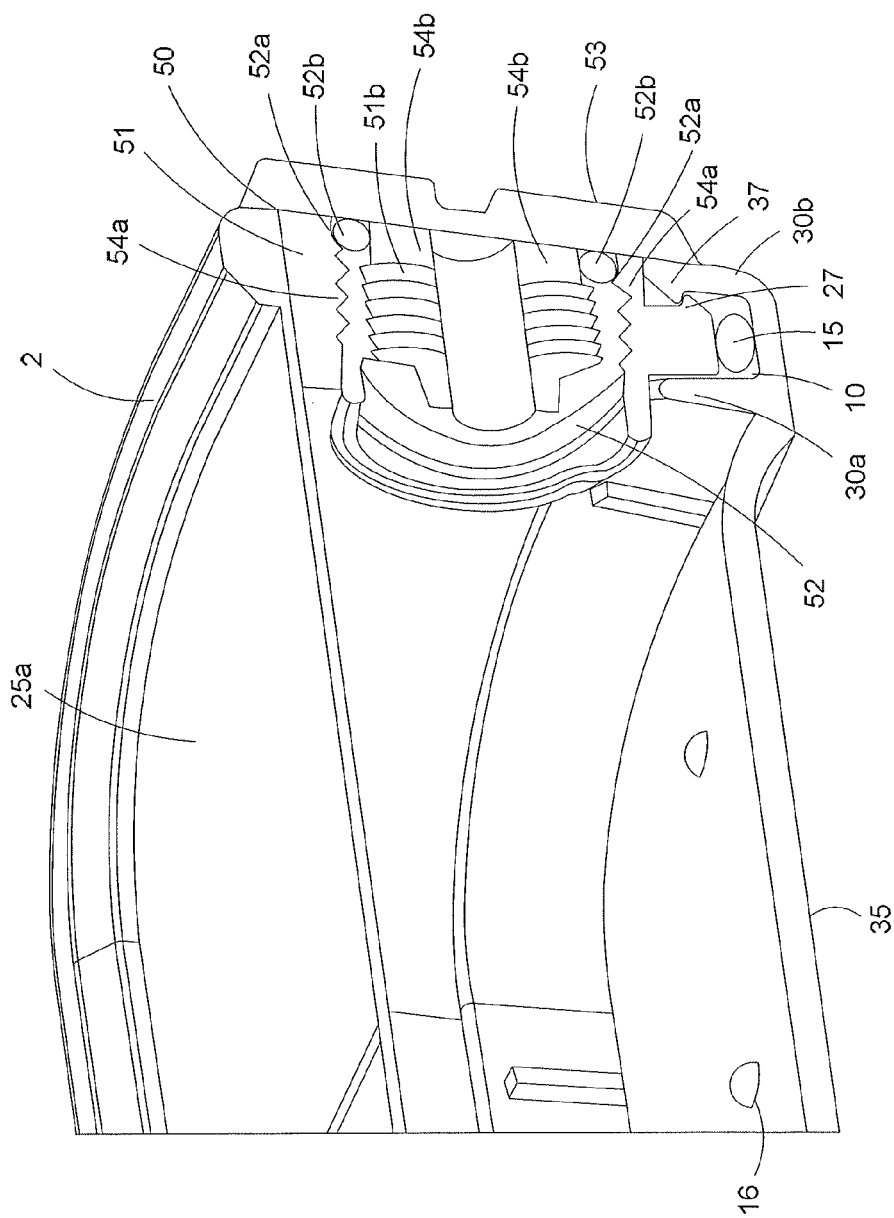

FIG. 14C provides a cross-section view of the headphone port feature 50 of FIG. 14A. The headphone port feature 50 includes an aperture 51 positioned in top member 2. As can be seen with respect to FIG. 14C, in certain instances, the headphone port feature 50 may be configured to be coincident with or otherwise include a clasping mechanism interface 27 for coupling with a clasping mechanism 37 of a bottom member 3. However, in other embodiments, the port feature 50 includes an aperture 51 that is entirely positioned in a top 2 or bottom 3 member, wherein the port feature 50 is positioned above a respective clasping mechanism 27 or 37.

For instance, the port feature 50 may be entirely positioned in a top member 2, wherein the aperture spans from a semi-rigid exterior perimeter portion 20b, through the rigid interior perimeter portion 20a, into the interior of the case. Therefore, the perimeter portion 20 of the top member 2 is configured to entirely accommodate the port feature 20. In such an instance, although the port feature 50 spans the interior and exterior perimeter portions 20 a, b of the top member 2, it does not interfere with the clasping mechanism 27 of the top member 2 that is positioned on either the interior or exterior perimeter portion 20 a, b. In such an instance, the perimeter portion of the bottom member 3 may include an arched cutout region so as to accommodate the port feature 50, so long as the cutout does not interfere with the clasping mechanism 37.

The aperture bounding member 51 may include both a gasket seat 52a and gasket 52b (e.g., if not included in a corresponding port bung 53 and/or jack 57), and a threaded region 54a, which threaded region 54a is configured for receiving the corresponding threaded region 54b on port sealing bung 53 and/or corresponding threaded region 58 on an earphone or speaker jack 57. In this configuration, the coupling of the earphone port sealing bung 53 or jack 57 with the headphone port feature 50 results in a liquid and dirt tight seal, which seal prevents a liquid, such as water, and/or dirt from entering the housing 1 through the headphone port 50.

Figure 14D:
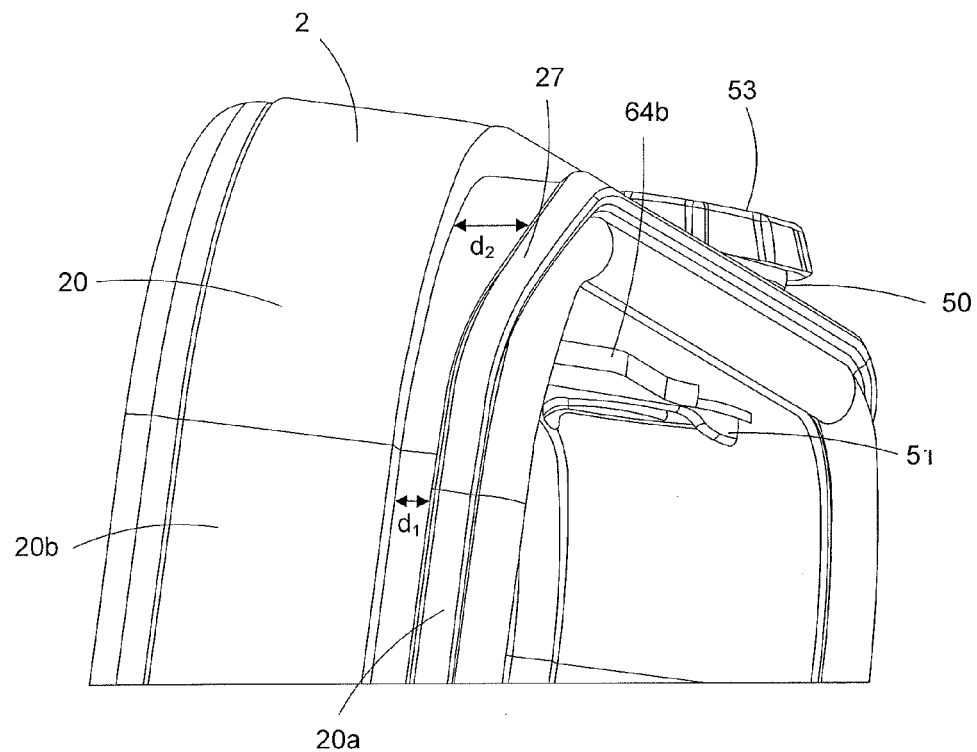

Additionally, as can be seen with respect to FIG. 14D, in certain embodiments, the perimeter 20 of the top member 2 may include a stepped up configuration so as to allow the separate housing members 2 and 3 to more closely interface with one another, despite the presence of one or more features of the housing and/or an underlying device, such as headphone port feature 50.

For instance, where the interior perimeter portion 20a of the top member 2 includes the clasping mechanism 27, the interior perimeter portion 20a and clasping mechanism 27 may have a transition that moves from lower d1, along the sides of the housing, to higher d2, along the corners of the housing. This transition may be included along all the corners to ensure a tight seal, and/or may be included anywhere suitable so as to accommodate for the presence of a perimeter feature such as the headphone port feature 50.

Accordingly, FIG. 14D provides a view of a corner edge detail showing the transition of interior perimeter portion 20a and clasping member 27 from low to high, which transition accommodates for the presence of the headphone port 50 by providing the necessary clearance. It is to be noted that this transition may be included without reference to its relation to any other perimeter feature and may be included in a top or bottom member with consequent changes being made to its components.

As indicated above, an element of the housing 1 may be a port opening, such as a headphone port 50, that is configured for acting as an interface between a headphone, speaker, or other jack containing accessory device 57 and a jack port 150 of an underlying electronic device 100 so as to provide a liquid-proof interface between the headphone 57, speaker jack, etc. and the underlying device 100. In such an instance, the interface is a liquid and dirt proof seal.

In certain instances, however, a headphone, speaker, or other device containing a waterproof jack interface 57 may not be included or may not otherwise be associated with the housing 1 or an underlying device 100 associated therewith. In such an instance, a port sealing bung 53 may be associated with the port 50 of the housing 1 so as to maintain a liquid and dirt proof seal when a liquid-proof jack 57, such as the one described herein below, is not associated with the port of the housing.

Figure 15A:
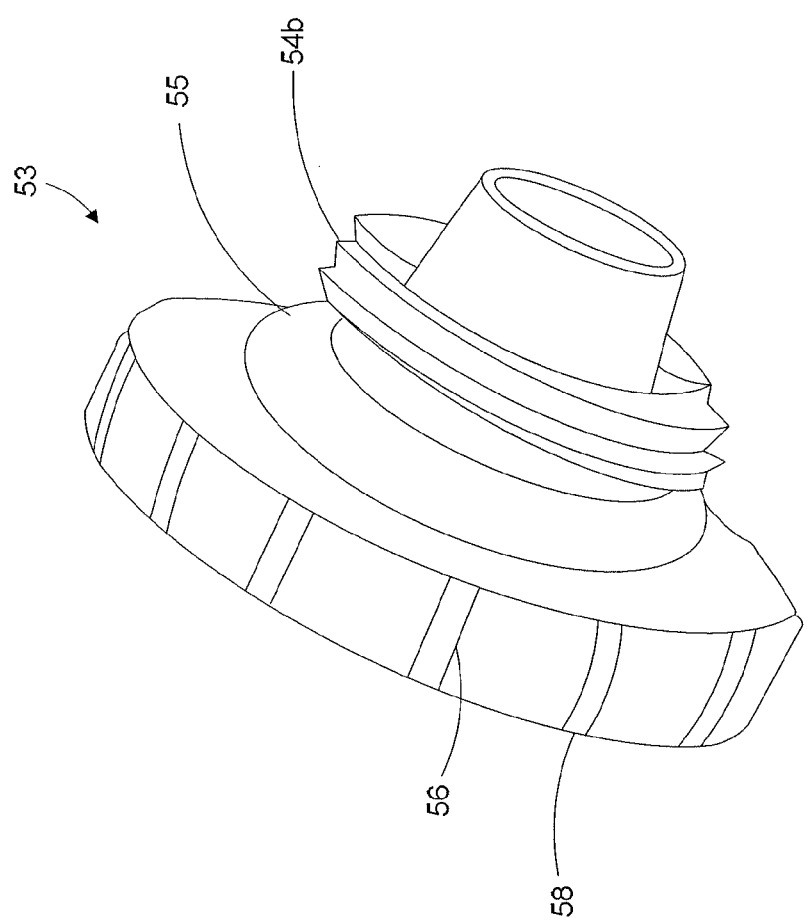
FIGS. 15A-15G provide various views of closure device and a correspondingly configured port opening of a housing of the disclosure.

Accordingly, as can be seen with respect to FIG. 15A, in certain instances, a port sealing bung 53 is provided for sealing an associated port 50 of a housing 1. The port sealing bung 53 may include a top member 58, which top-member may further include a grip feature region 56. The port sealing bung 53 may also include a gasket region containing a gasket 55 and a threaded region containing threads 54b, which threads are configured for coupling with corresponding threads 54a of a jack port 50 so as to establish a liquid and dirt tight seal there between. It is to be noted that the threaded regions may be configured as a thread feature or a cam feature.

Figure 15B:
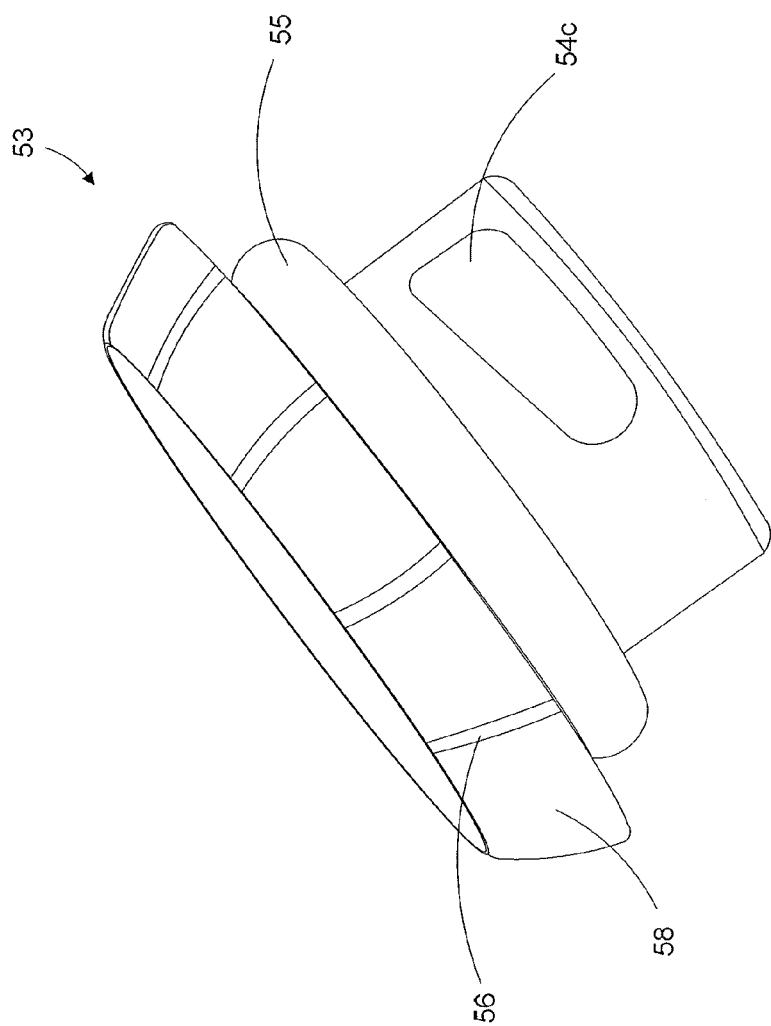

As can be seen with respect to FIG. 15B instead of the threaded region depicted in FIG. 15A, a cam feature, such as a bayonet cam feature 54c can be provided. The cam feature 54c is configured for coupling the jack port sealing bung 53 with the jack port 50 in a liquid-tight seal when the port 50 is not associated with a corresponding liquid-proof jack interface 57. The port sealing bung 53 also includes a top member 58 having a grip feature 56 and gasket 55.

Figure 15C:
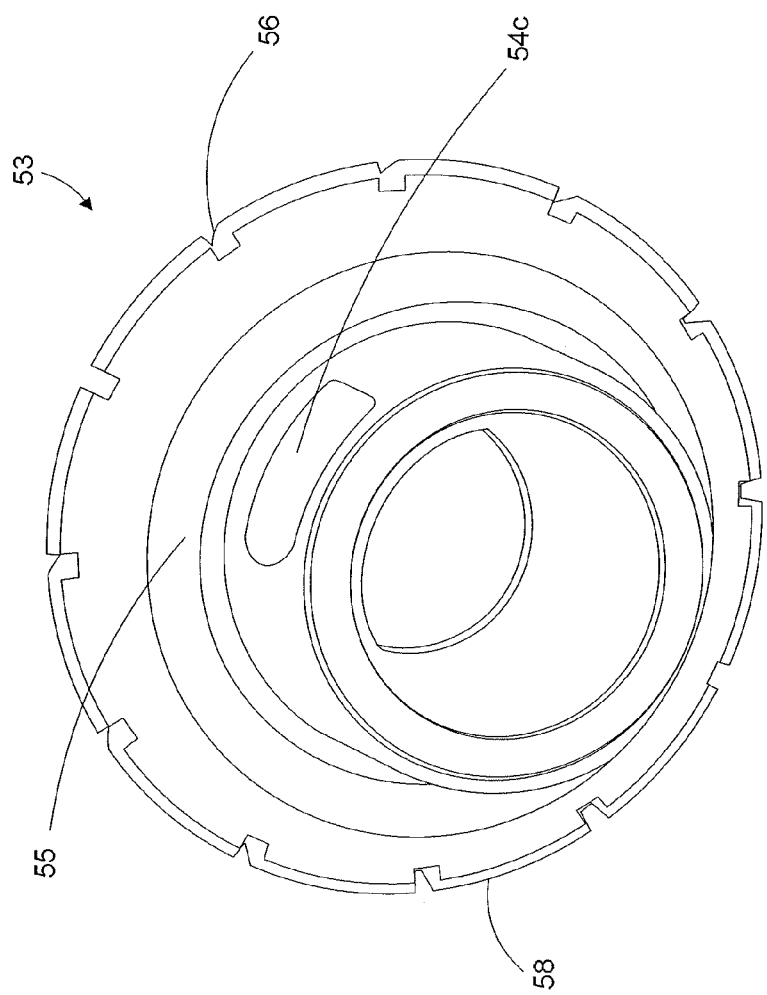

FIG. 15C provides a bottom-up perspective view of the port sealing bung 53 of FIG. 15B. The port sealing bung 53 includes a top member 58 with grip features 56. The port sealing bung 53 includes a gasket region with gasket 55 and a bayonet cam feature, which in this instance is an indented region 54c. It is to be noted that when the cam feature 54c is included in the port sealing bung 53, a corresponding protruding cam feature is substituted for the threaded region 54a of the port jack 50.

Figure 15D:
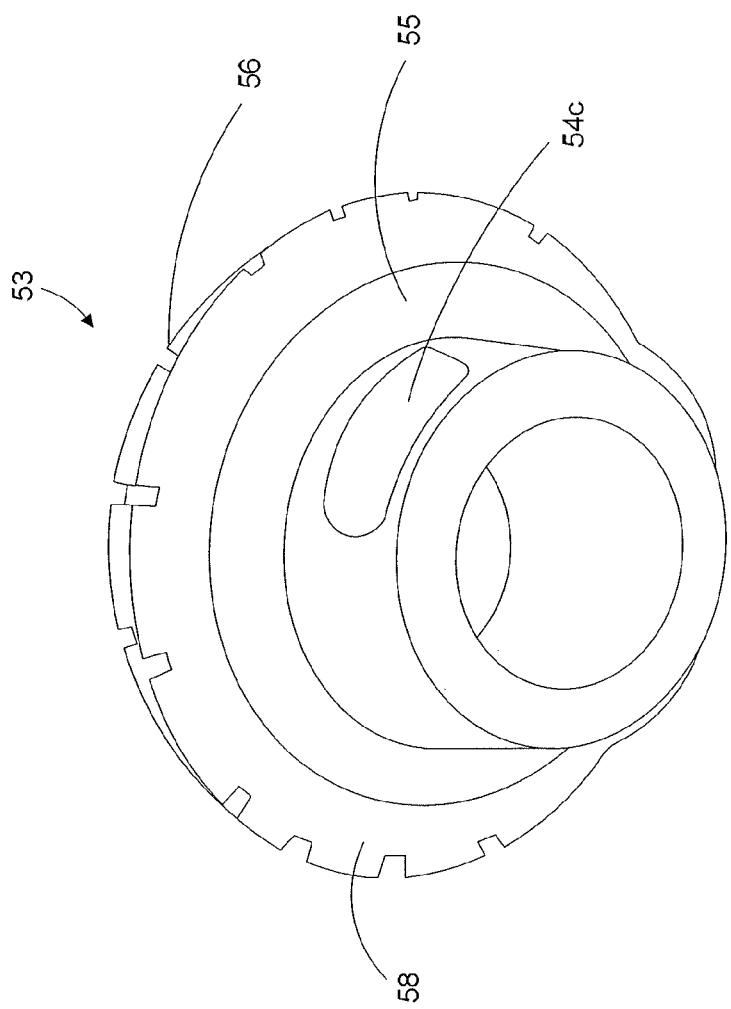

FIG. 15D provides a bottom-up view of another embodiment of the jack port bung of FIG. 15B. The port sealing bung 53 includes a top member 58 with grip features 56. The port sealing bung 53 includes a gasket region with gasket 55 and a bayonet cam feature this time with an expanded region 54c. It is to be noted that when this expanded cam feature is included in the port sealing bung 53, a corresponding indented cam receiving feature is substituted for the threaded region 54a of the port jack 50. See FIG. 15E.

Figure 15E:
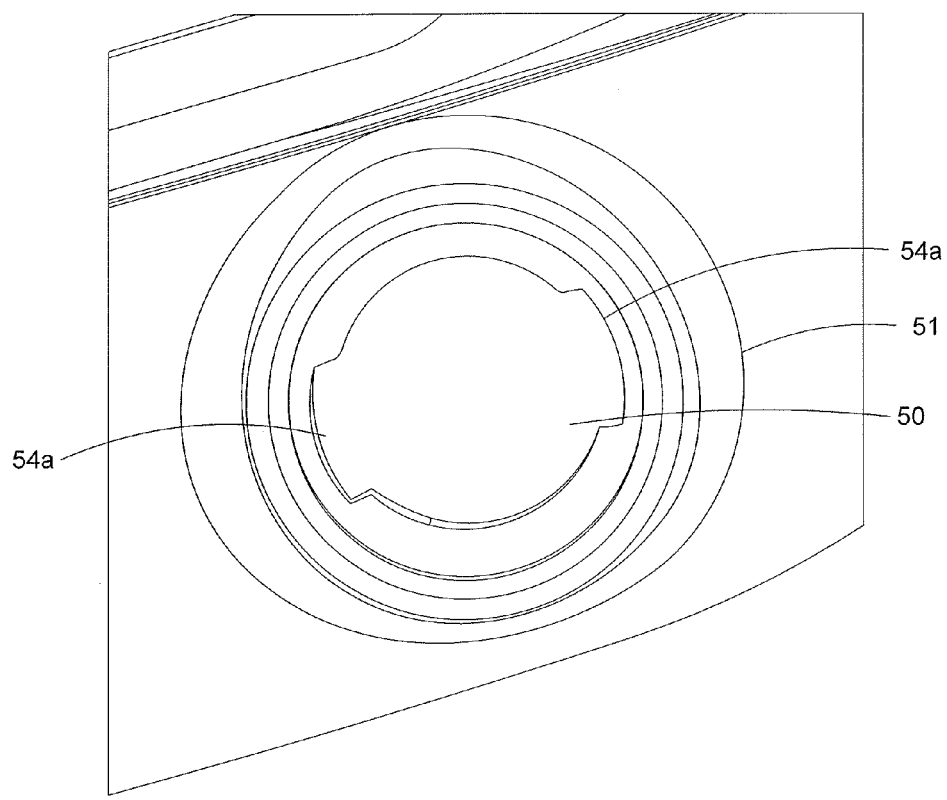

FIG. 15E provides a jack port 50 of a housing 1, wherein the jack port 50 has a bayonet thread receiving feature 54a that is configured for being coupled with a corresponding bayonet thread protruding feature 54c of a closure device 53 or cam protruding feature 58 of a waterproof jack 57. In this instance, the corresponding locking features are configured as a bayonet cam features, but they could alternatively be configured as corresponding threaded regions. The bayonet cam feature 54c or 58 is configured to act as an entry gate between the bung 53 or jack 57 and the jack port 50. The jack port 50 also includes a gasket sealing surface that is configured for interacting with a gasket feature 55 of the bung 53 or gasket feature 59 on jack 57 for assisting in providing a liquid-tight seal between the bung 53 or jack 57 and the jack port 50.

Figure 15F:
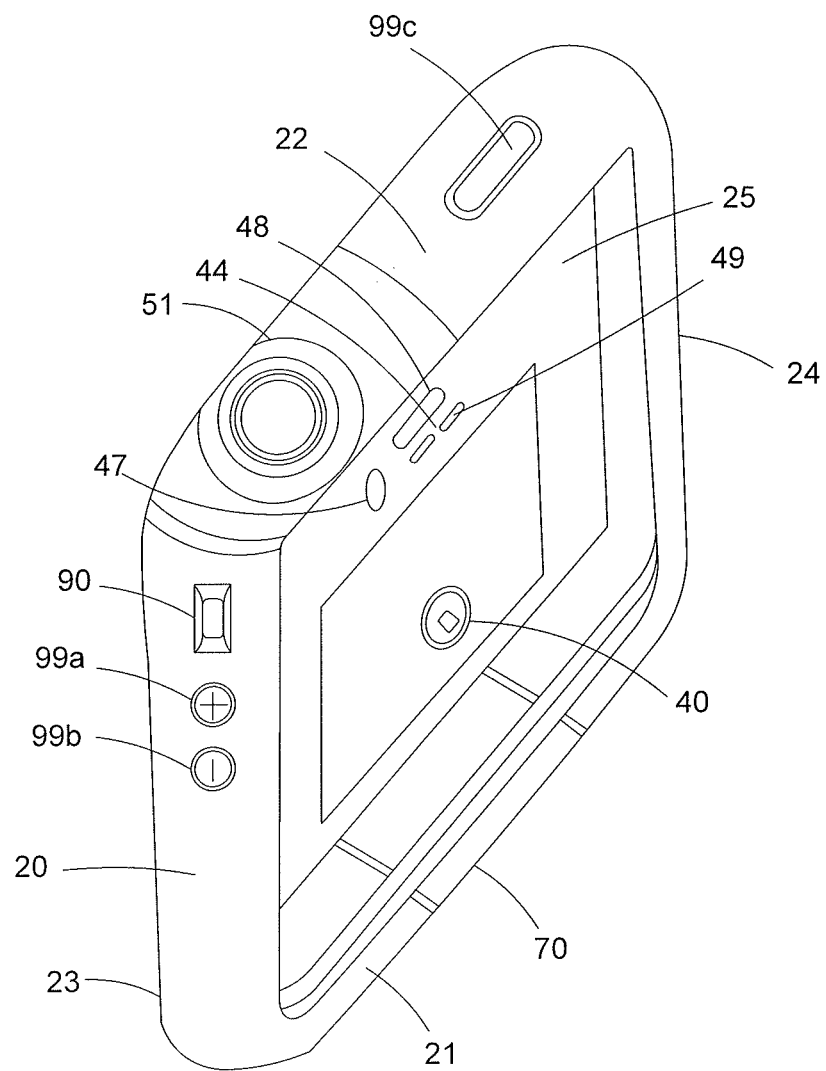

FIG. 15F provides a view of a housing 1 of the disclosure with an earphone port sealing bung 53 not installed therein.

Figure 15G:
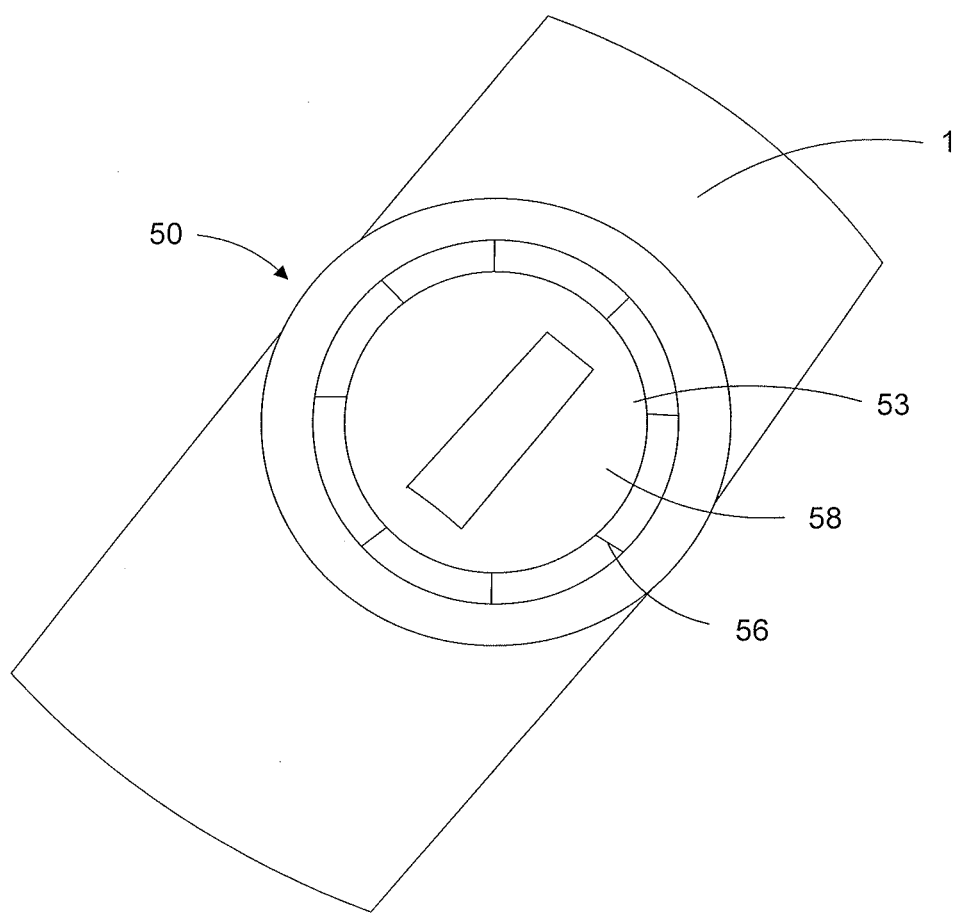

FIG. 15G provides a view of a housing 1 of the disclosure with an earphone port sealing bung 53 installed therein.

As indicated above, an element of the housing may be a port that is configured for acting as an interface between a headphone, speaker, or other jack containing accessory device and a jack port of an underlying electronic device.

Accordingly, in certain instances, a headphone, speaker, or other accessory device having a jack interface may be included and associated with the housing and/or an underlying device associated therewith in such a manner that a liquid-proof seal is formed by the coupling of the jack with the jack port of an underlying device through the housing's jack port interface. Hence, in certain embodiments, a device, such as a headphone, speaker, or other such accessory device having a jack interface is provided, wherein the jack interface of the device is configured so as to provide a liquid-proof seal between the jack and the jack port interface of the housing, which interface is adapted for receiving the headphone, speaker jack, etc., in such a manner so as to produce a liquid-proof seal thereby.

Figure 16A:
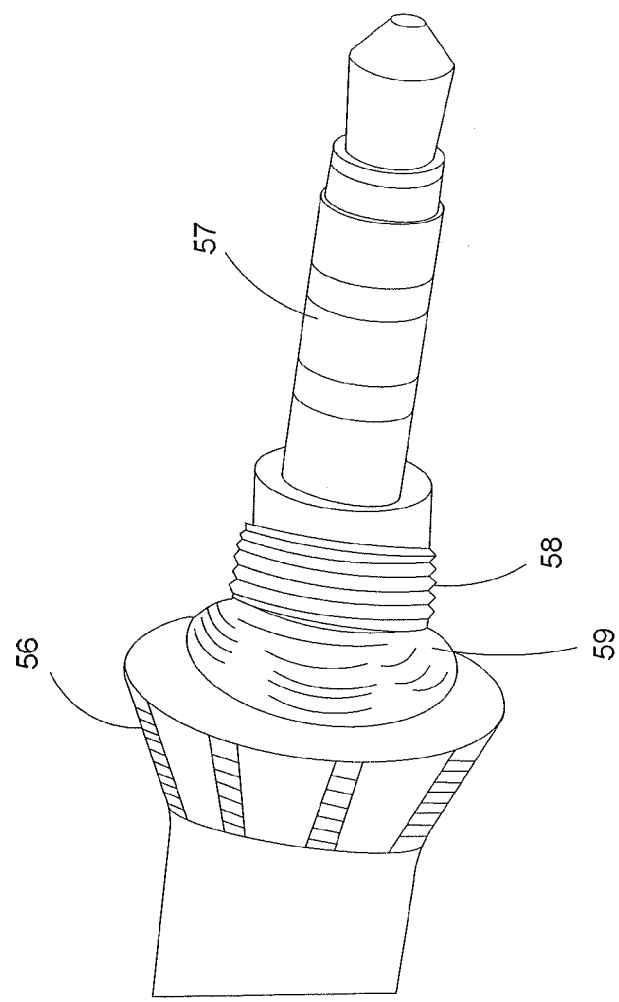

Accordingly, as illustrated in FIG. 16A, a device having a plug, e.g., a jack interface 57, is provided. The jack is configured for providing a liquid-tight seal between the jack interface 57 and a jack-port receiving feature 50 of the housing 1. The jack may include a gasket 59, such as an o-ring, and a threaded or cam feature 58. It is to be noted that where the jack interface 57 includes a threaded or cam feature 58, a corresponding threaded or cam feature 54a will be included in the jack port feature 50 of the housing 1. The jack plug comprises an electronic device interface.

The jack electronic device interface or bung 57 is configured for passing through the jack port 50 so as to associate with an encased electronic device, and also to associate with the jack port feature 50 of the housing 1 in such a manner as to establish a liquid-tight seal therewith. In this instance, the jack 57 includes a thread feature 58 configured as a thread feature locking mechanism 58, however, in other embodiments, the thread feature is configured as a bayonet cam locking mechanism.

With respect to FIG. 16A, provided is a perspective view of an electronix interface of an accessory having a jack interface 57, e.g., a plug. The jack interface 57 is configured for providing a liquid-tight seal between the jack 57 and a jack-port 50 receiving feature of a housing 1. The jack 57 includes a gasket seat for a gasket 59 and a threaded feature 58. The jack 57 further includes an electronic device interface. The jack 57 is configured for passing the electronic device interface through the jack port 50 so as to associate with an encased electronic device and also to associate with a jack port feature 50 of the housing 1 in such a manner as to establish a liquid-tight seal therewith. In this instance, the jack 57 includes a threaded feature locking mechanism 58, which is configured for interfacing with a corresponding threaded region 54a of the jack port 50.

Figure 16B:
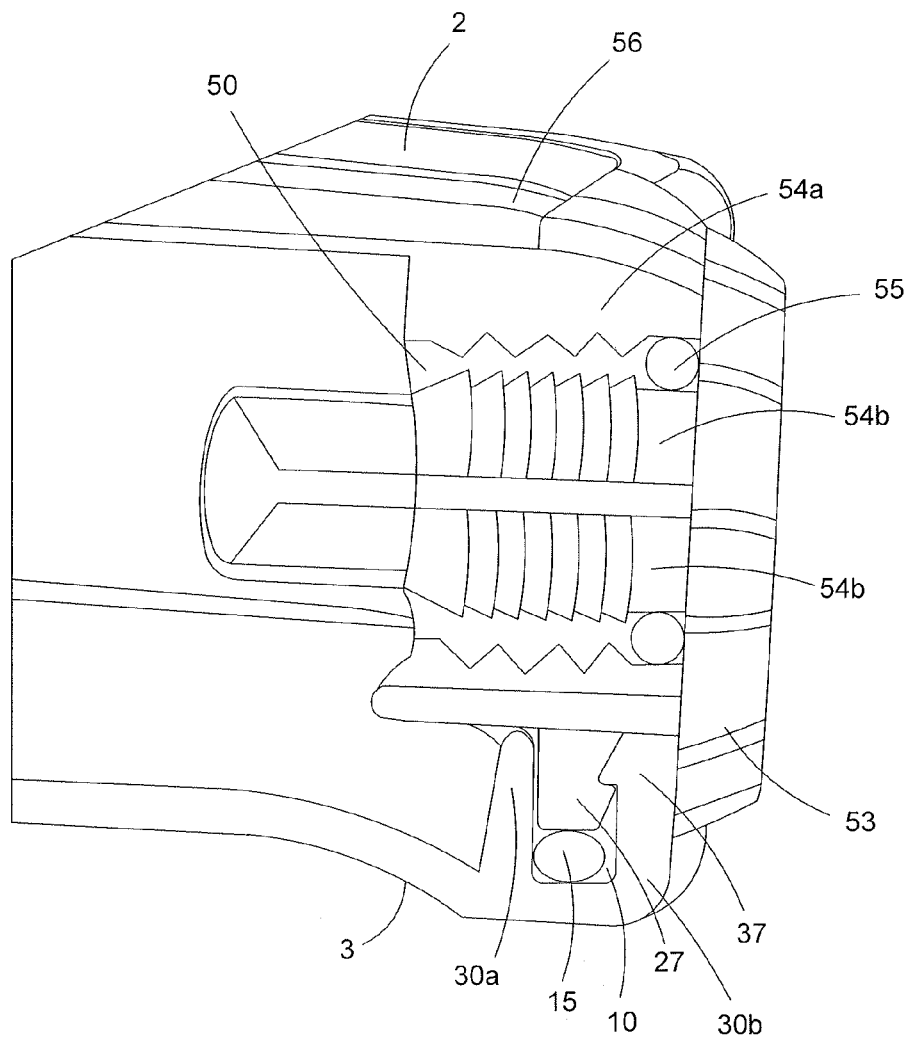

FIG. 16B provides a view of a threaded jack port. 16 into which a threaded bung 53 or threaded jack interface 57 could be associated, In this instance a port sealing bung 53, as described above, is installed therein. In this embodiment, the jack port 50 and the bung 53 have corresponding thread feature locking mechanisms 54a and b, respectively. The port sealing bung 53 additionally includes a gasket 55 which enhances the liquid-tight seal. It is noted, that in order for the jack electronic device interface 57 of the jack of FIG. 16A to be inserted into the jack port 50 of the housing 1 of FIG. 16B, the port sealing bung 53 must be unscrewed from the jack port 50 and the jack 57 must be screwed therein.

Figure 16C:
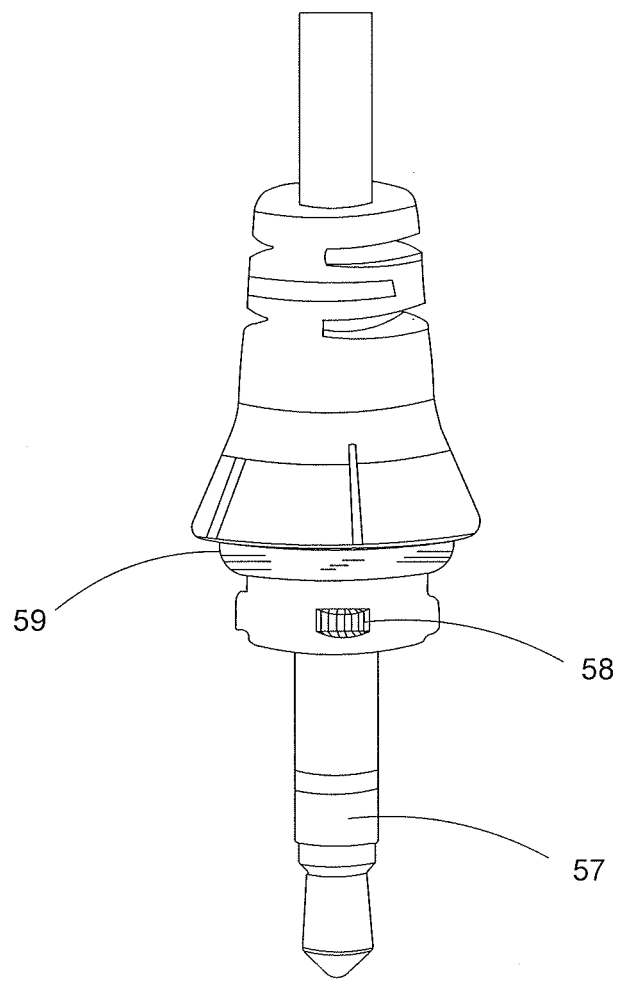

FIG. 16C a bayonet jack electronic device having a jack interface 57 is provided. The jack includes a gasket 59, e.g., an o-ring, and a cam feature 58. It is to be noted that where the jack interface 57 includes a cam feature 58, a corresponding cam feature 54a will be included in the jack port feature 50 of the housing 1. Accordingly, as illustrated in FIG. 16C, the jack interface 57 is configured for passing through the jack port 50 so as to associate with an encased electronic device, and also includes a cam feature 58 that is adapted for associating with a corresponding cam feature 54a of the jack port feature 50 of the housing 1 so as to establish a liquid-tight seal there with. See FIG. 16D.

Figure 16D:
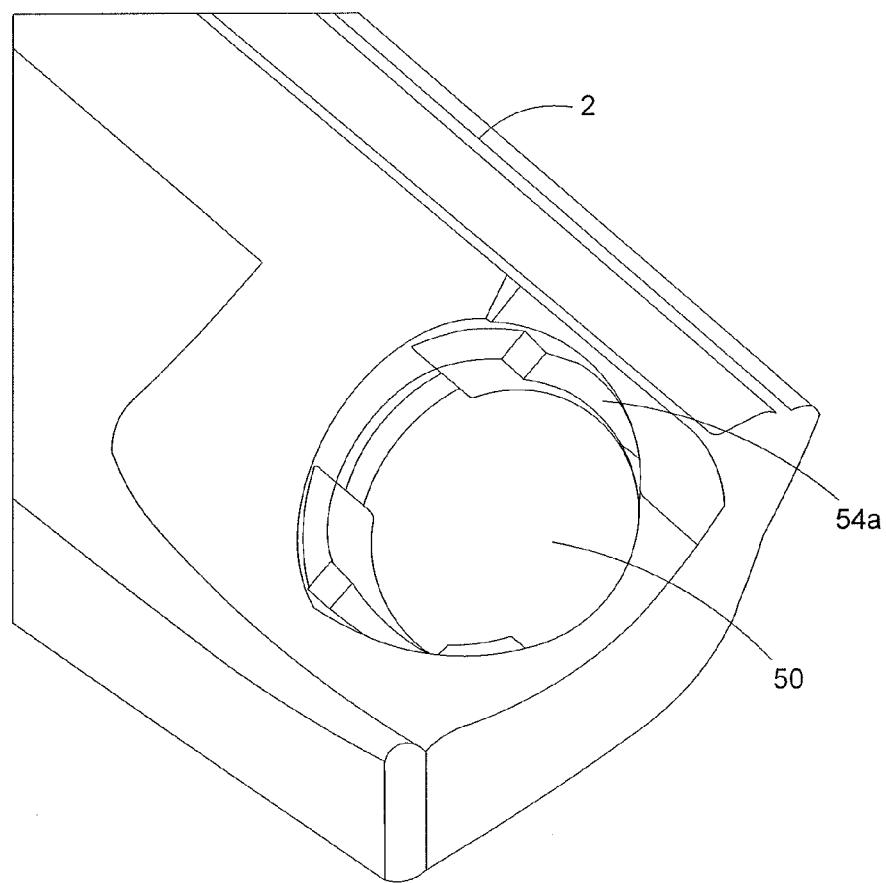

FIG. 16D provides a close-up view of a cammed jack-port 50 of a housing 1. The jack-port 50 includes a cammed feature 54a. The jack-port 50 is adapted to receive either a port bung 53 or a jack interface with corresponding threaded feature 54b or 58. When the port bung 53 or jack interface 57 is received within the jack-port 50, a liquid tight seal is provided thereby. This liquid tight seal is enhanced by including a gasket (e.g., 55 or 59) along with the bung 53 or jack interface 57

Figure 16E:
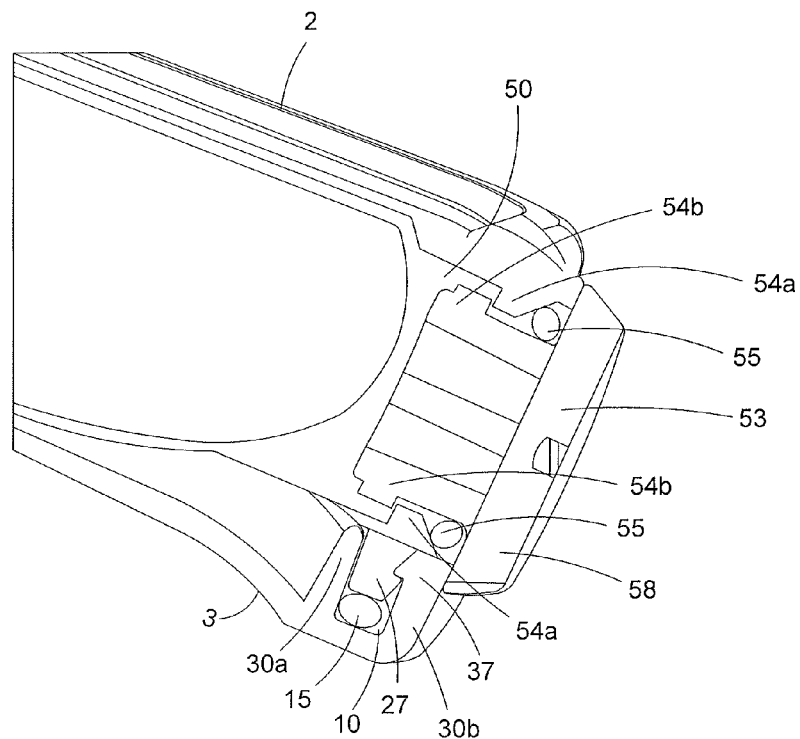

FIG. 16E provides an interior view of the bayonet cam jack port 50 of FIG. 16B with the port sealing bung 53 installed.

FIG. 16F provides a cross section interior view of the bayonet cam jack port 50 of FIG. 16E the port sealing bung 53 installed.

Figure 17A:
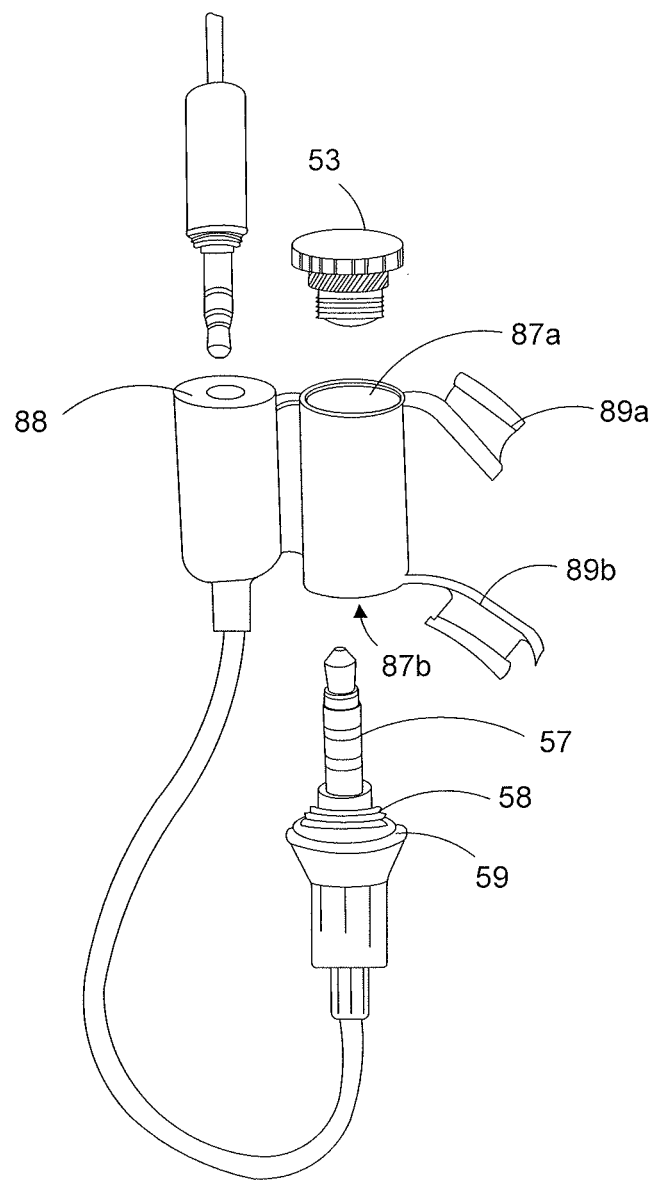

FIG. 17A provides a view of a liquid-proof adapter and cable for use in conjunction with a housing of the invention. The adapter includes a receiving or female member 88 that is configured for receiving a typical electronic device jack interface, e.g., plug, such as a headphone, speaker jack, other accessory, and/or the like to be inserted therein. The adapter further includes a liquid-proof jack 57 or male portion, e.g., plug, for being coupled to a liquid-proof jack port 50 of a housing 1 of the disclosure, so as to provide a liquid-proof sealing between the jack 57 and the port 50.

In this manner, a typical electronic device jack may be associated with the liquid proof adapter and employed with a housing 1 of the disclosure in a liquid-tight sealing. The liquid proof jack 57 portion of the adapter and cable includes a jack gasket 59 and a threaded jack interface 58.

The adapter may further include a storage port 87 which may be adapted for receiving one or both of the liquid proof jack 57 and/or a port sealing bung 53. The storage port 87 may also include a plurality of covers 89 a and b. It is to be noted that although the above description has been set forth with respect to the adapter being liquid-proof, in various embodiments the adapter need not be liquid-proof. For instance, the gasket, e.g., O-ring, 59 and/or locking mechanism, e.g., threads, 58 need not be present. In such an instance, the adapter may be a non-waterproof adapter.

Figure 17B:
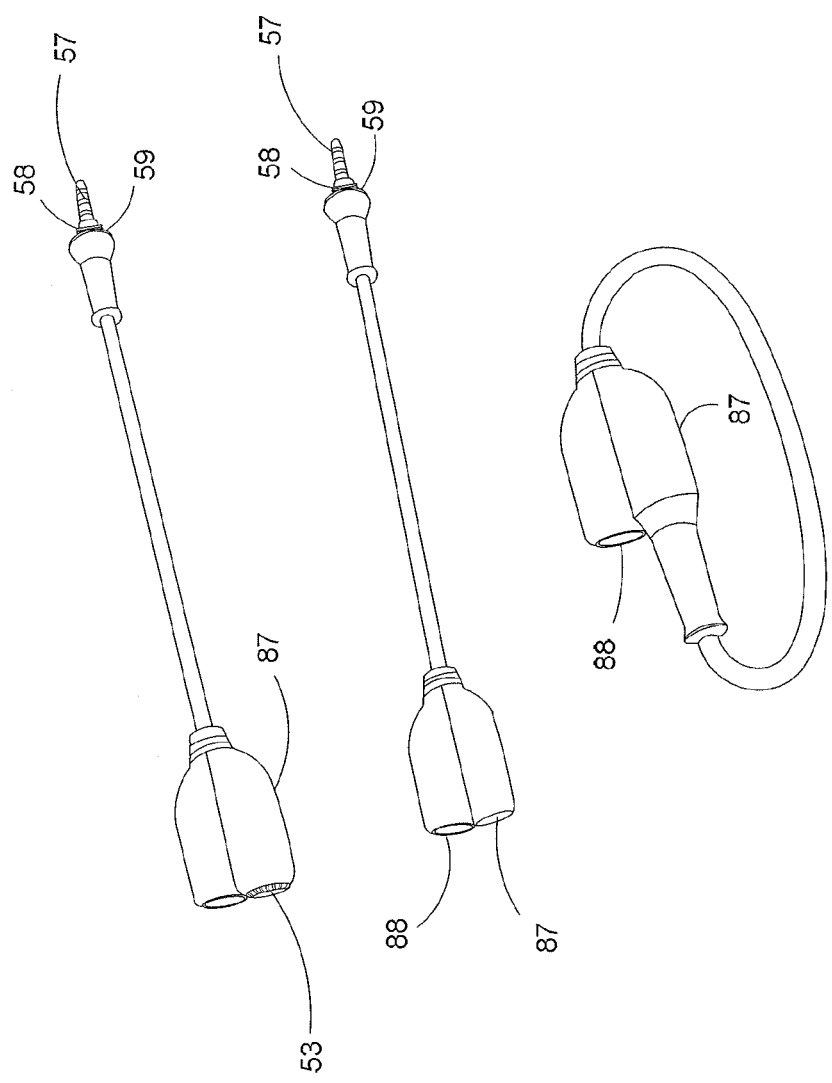

FIG. 17B provides other instances of the liquid-proof adapter of FIG. 17A. The adapter includes an earphone jack receiving member 88, which is configured for receiving a standard electronic device jack plug interface. The adapter also includes a liquid proof jack 57. The adapter further includes a storage port 87 that may be configured for receiving one or both of a portion of the liquid proof jack 57 and/or a port sealing bung 53, such as in a port bung storage receiving element 87. As can be seen with respect to FIG. 17B, in a first instance, the storage element 88 is closed, having a bung 53 stored therein. In a second instance, the storage element 88 is open, the bung 53 having been removed therefrom. In a third instance, the storage element is closed, having receiving therein the jack plug 57. Accordingly, the adapter is adapted for being bent about itself, so that the waterproof jack 57 may be inserted into the storage element 87 (for better storage capabilities); and/or the adapter is adapted for being coupled to a liquid-proof port 50 of the housing 1 via the liquid proof jack 57.

Consequently, the liquid proof jack 57 includes an earphone jack gasket, e.g., O-ring, 59 as well as a locking mechanism, such as threads 58. In a manner such as this an accessory may be inserted into the female portion 88 of the adapter and the male end 57 of the adapter inserted into the case, associated with a jack inlet port of a housed device, and locked into place via locking element 58. Hence, an accessory plug that would otherwise not be able to be inserted into the housing, such as in a waterproof manner, can via the adapter be electronically connected with an underlying device. This in turn allows for a jack-port interface having the smallest possible profile.

FIG. 17C provides a view of various different locking members for locking a jack 57 in combination with a housing 1 of the disclosure. For instance, one or more locking tethers 69 *a* and/or *b* may be associated with a jack 57. The one or more locking tethers 69 *a* and/or *b* may be configured for being coupled with one or more corresponding locking elements 69 *c* and/or *d* on the housing, such as by snapping, see FIG. 17C 1, 2, 3, 4 or 5; or by inserting and twisting. See FIG. 17C 5, 6, and/or 7. For example, the locking tether may be a part of the jack 57, see numbers 1 and 2, which slides onto a corresponding receiving member on the housing, or it may be a locking tether on the housing that slides into a corresponding groove on the jack 57, see #3 and 4. In certain instances, one or more of the locking tethers may include a locking screw thread and/or gasket, etc. See #5. In other instances, the jack 57 may include one or more wings 69*a* and *b*, which wings are configured for being coupled with one or more wing receiving members 69*c* and *d*, such as by inserting the jack wings 69 *a* and *b* into the wing receiving members 69 *c* and *d* and twisting so as to lock in place. See, for instance, FIG. 17C, reference numbers 6, 7, and 8.

Figure 17D:
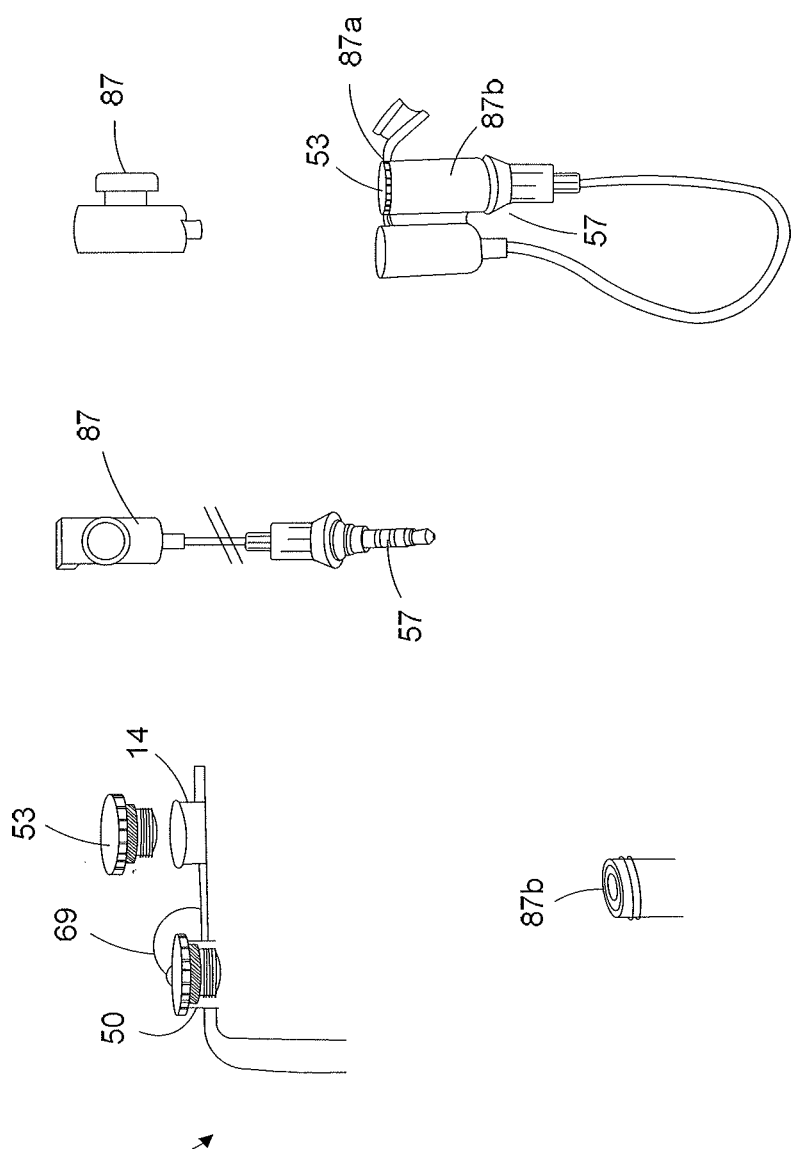

FIG. 17D provides various methods for securing a port sealing bung 53 when it is not secured within the housing 1. For instance, the port sealing bung 53 may be tethered to the housing 1 by a leash 69. The port sealing bung 53 may also be placed into a bung holding receptacle 14 that is built into the housing 1. Alternatively, the port sealing bung 53 may be stored into a bung holding receptacle 87*a* that is part of an adapter.

As depicted, in one embodiment the bung holding receptacle 87*a* may also include a plug receiving receptacle 87*b* as well, into which a plug, e.g. 57 may be inserted, e.g., for storage. For instance, in certain embodiments, the liquid-proof adapter member includes an earphone jack adapter receiving member 88, which is configured for receiving a standard electronic device jack interface 57. For example, on one end, the adapter includes a liquid proof jack 57, which is configured for being coupled to a liquid-proof port 50 of the housing 1, such as in a liquid-proof seal. The other end of the adapter member includes a storage receptacle that includes both a port 87*a* that is configured for receiving a liquid proof port sealing bung 53, and a port 87*b* that is configured for receiving the jack port interface, e.g., of the adapter. As depicted, the port sealing bung 53 is coupled to the port bung receiving member 87*a* and the jack interface 57 is coupled to the jack port receiving member 87*b*.

Figure 17E:
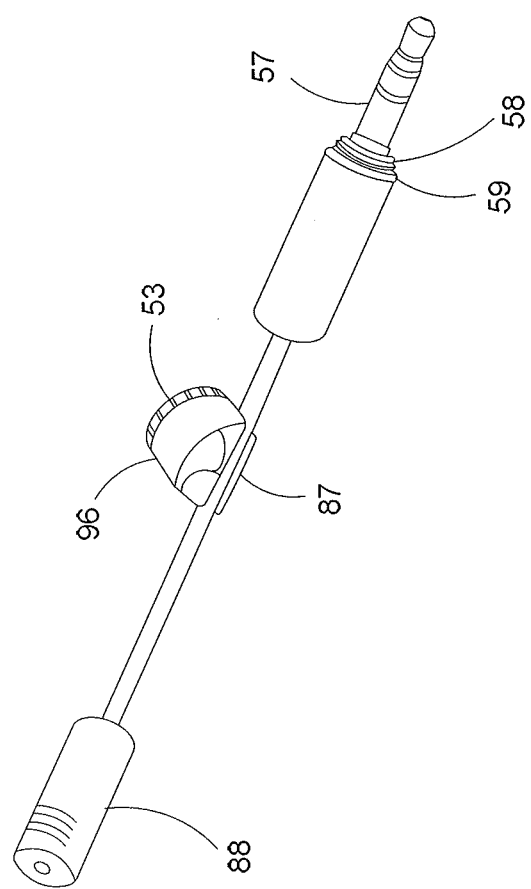

FIG. 17E provides a perspective view of another embodiment of a liquid-proof adapter member having a port bung storage element 96 associated therewith. The adapter includes a jack receiving member 88, such as a female plug receiving member, a storage device 96 having a port bung storage element, adapted for receiving and storing a port sealing bung 53 when not in use, and a liquid-tight jack 57. The jack 57 is an earphone jack that is configured so as to form a water tight seal between the earphone jack 57 and the earphone jack port 50. Accordingly, the water-tight jack 57 includes a jack gasket 59, such as an O-ring, which is positioned on a gasket stand of the jack 57. Also included is a threaded region, such as a jack threaded region 58 that is configured for being coupled to a corresponding threaded region 52 of the jack port 50 of the housing 1. It is to be noted that as depicted the jack port 50 is configured so as to have a gasket 59 and a threaded region 58 positioned thereon, in certain instances, the jack port 50 may be configured for housing the gasket, e.g., 55, and instead of a threaded region the jack and jack port may be configured with corresponding cam features.

Figure 17F:
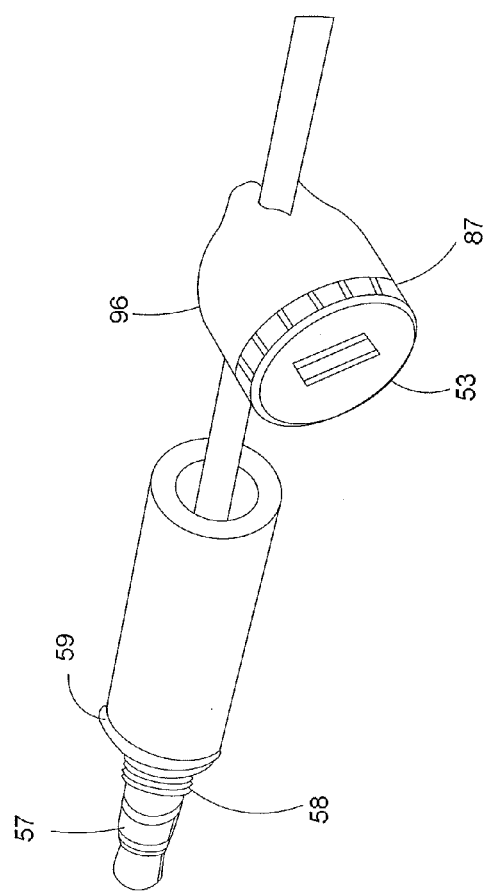

FIG. 17F provides a close up perspective view of the waterproof adapter member with port bung storage element 96 of FIG. 17E. The adapter includes an earphone a port bung storage element 96, having a port bung receiving member 87, and a liquid-tight earphone jack 57. The liquid-tight jack 57 includes a jack gasket 59, which is positioned on a gasket stand of the jack. The water-tight jack 57 also includes a jack threaded region 58 that is configured for being coupled to a corresponding threaded region 54*a* of the jack port 50.

Figure 17G:
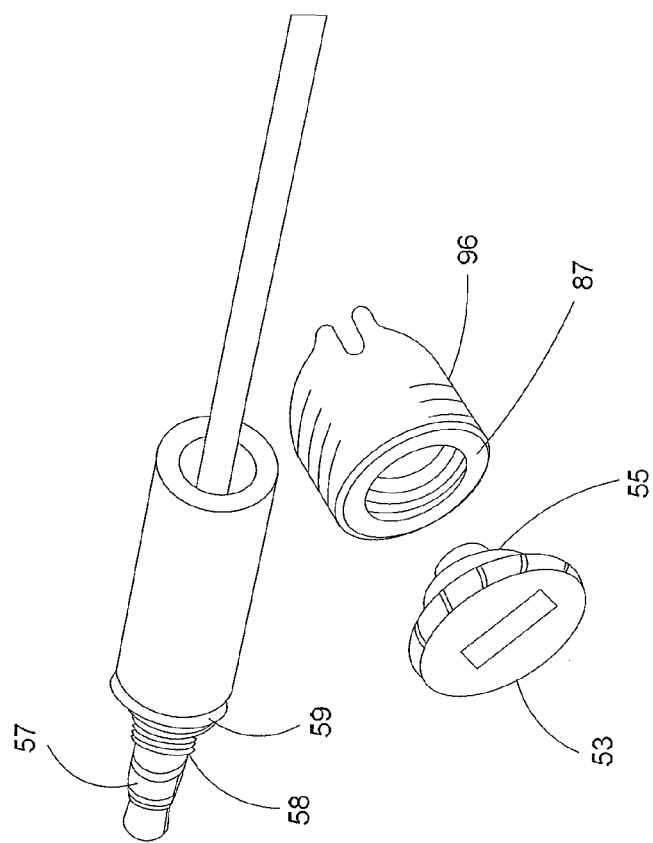

FIG. 17G provides a close up perspective view of the water-proof adapter member with port bung storage element 96 of FIG. 17E, wherein the bung storage element 96 is uncoupled from its association with the adapter member. The adapter includes an earphone jack adapter 88 (not shown), a port bung storage element 96 having a receiving portion 87 for receiving and storing a port sealing bung 53, and a liquid-tight earphone jack 57. The port bung storage element 96 includes a receiving member 87 that is configured for receiving a port sealing bung 53. The storage device 96 is further configured for being associated with the adapter, e.g., through a coupling interface, such as via a clasping member. As depicted the port bung storage element 96 is uncoupled from the adapter and the port sealing bung 53 is dissociated from the bung holder 87 of storage element 96. The water-tight jack 57 includes a jack gasket 59, which is positioned on a gasket stand of the jack 57. The water-tight jack 57 also includes a jack threaded region 58 that is configured for being coupled to a corresponding threaded region 44*a* of the jack port 50.

Figure 17H:
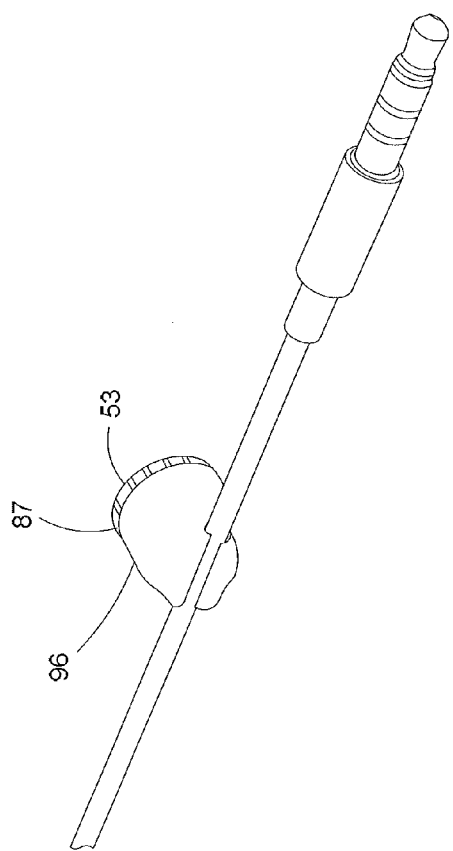

FIG. 17H provides a perspective view of the bung storage element 96 as it is attached to a non waterproof adapter. The bung storage element 96 includes a bung receiving member 87, which includes a clasping member that is configured for being coupled to a cable of an auxiliary device, such as a headphone or speaker device, and further includes a storage element 96 for storing a port sealing bung 53. The earphone jack interface in this embodiment is not a waterproof interface.

Figure 17I:
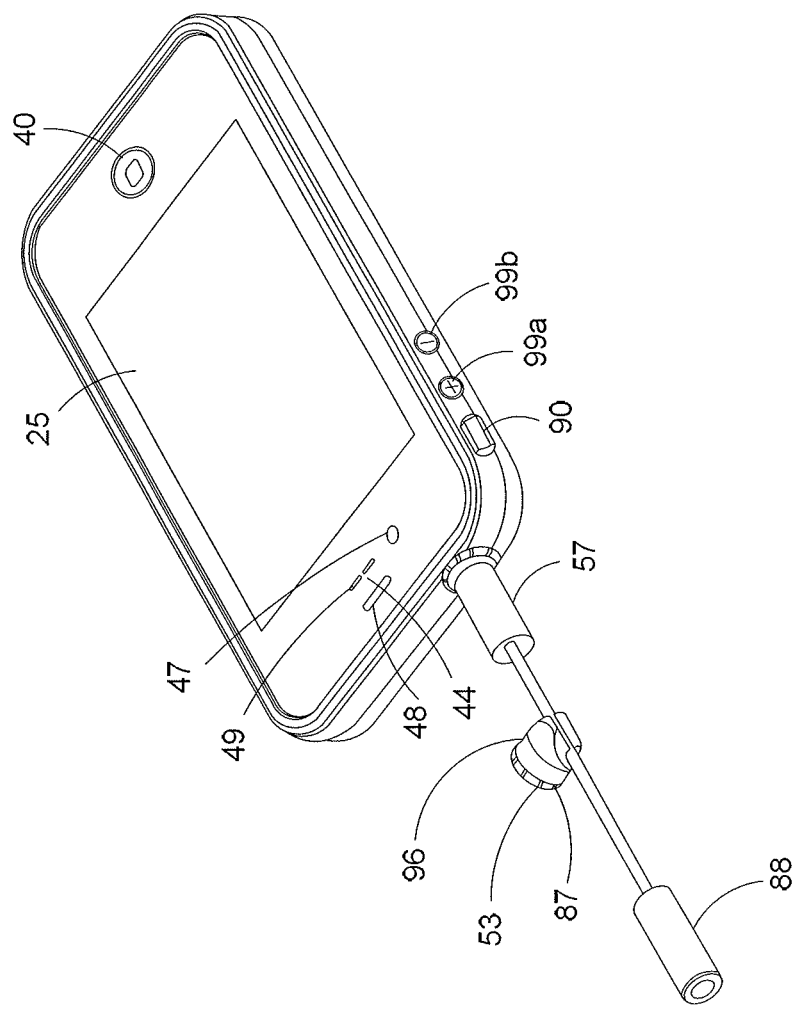

FIG. 17I depicts a waterproof jack port adapter of the disclosure as it would be when the jack port interface member 57 is coupled to a corresponding jack port 50 of the housing 1. In this embodiment, the adapter is a liquid proof adapter that includes a liquid proof jack 57, which jack is coupled to a liquid-proof port 50 of the housing 1 in a liquid-proof seal. As described above, the jack 57 includes both a locking element 58 as well as a gasket 59 (not shown), both of which enhance the waterproof seal between the jack 57 and the port 50. The adapter cable further includes a storage device 96 that includes a port 87 that is configured for receiving a liquid proof port sealing bung 53, wherein the port sealing bung 53 is coupled to the port bung receiving member 87. Also depicted is the plug receiving member 88 of the adapter. In this embodiment, an accessory, such as a pair of waterproof headphones, could be coupled to the external adapter member so as to be electrically connected with a housed device in a waterproof connection. The adapter could also be used for accessories having plug members that would not otherwise be able to fit through the bounds of the port 50 or where an extension is desirable.

Figure 18A:
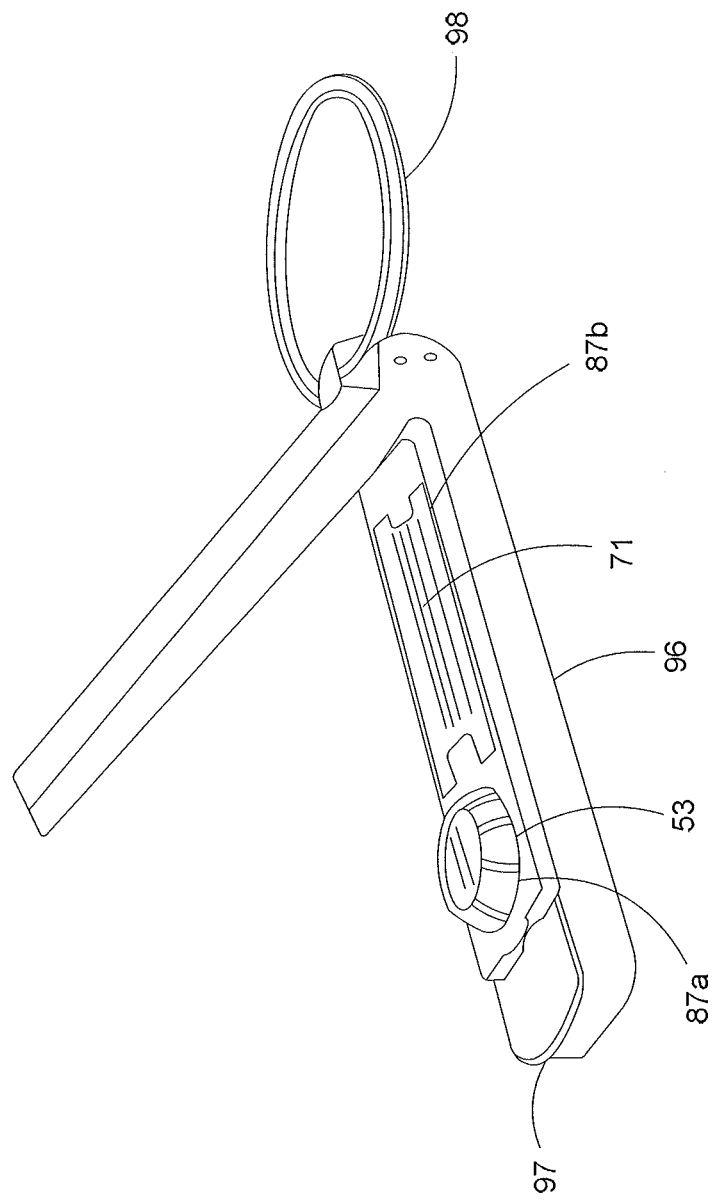
FIGS. 18A-18D provide various views of a closure element retaining device.

In certain instances, such as that provided in FIG. 18A, a storage element 96 is provided wherein the storage element is configured as a key chain. The storage element 96 includes a key chain interface 98 that is configured for being coupled at least to a key chain and further includes a plurality of storage elements, for instance, one storage element 87*a* for storing a port sealing bung 53, and another storage element 87*b* for storing a latch cover 71, such as where the latch cover is designed to be removable. In certain embodiments, the key chain storage device 96 may further include a tool 97 for separating the corresponding members of the housing one from the other. For instance, a tool 97 may be provided wherein the tool is configured for being inserted between the members of the housing 2 and 3, such as at a slot region 18 positioned along a perimeter of the housing 1. Inserting the tool 97 into the slot feature 18 and twisting will effectuate the separating of the top member 2 from the bottom member 3.

Figure 18B:
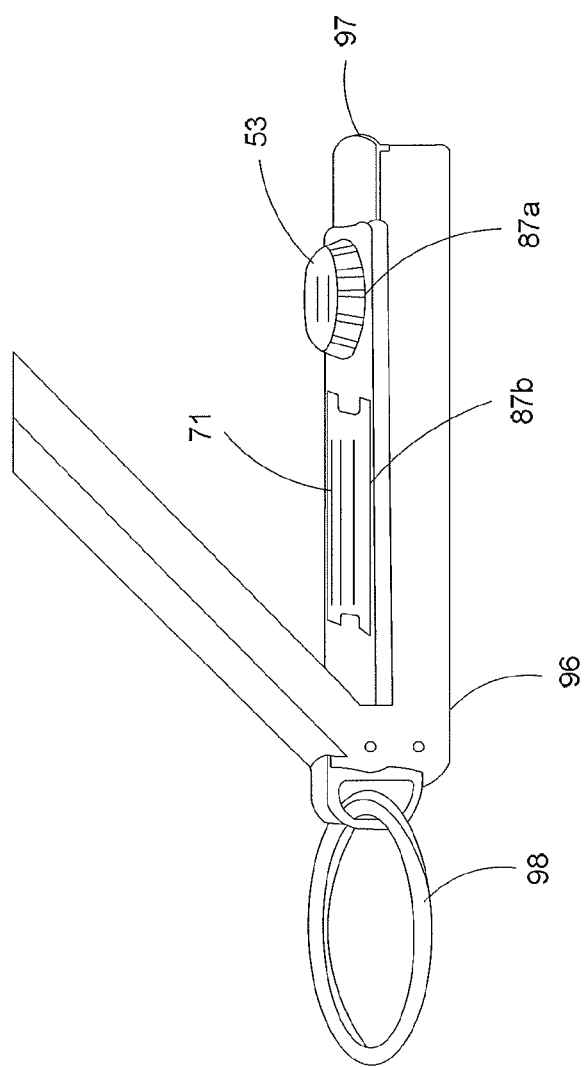

FIG. 18B provides a side-view of the key chain storage element 96 of FIG. 18A. The storage element 96 includes a key chain interface 98 and further includes a storage element 87*a* for storing a port sealing bung 53, and another storage element 87*b* for storing a latch cover 71. The key chain storage device 96 further includes a tool 97 for separating the corresponding members of the housing one from the other. As depicted, the key chain storage device is further configured for opening and closing, and in this embodiment, the key chain storage device is in the opened position.

Figure 18C:
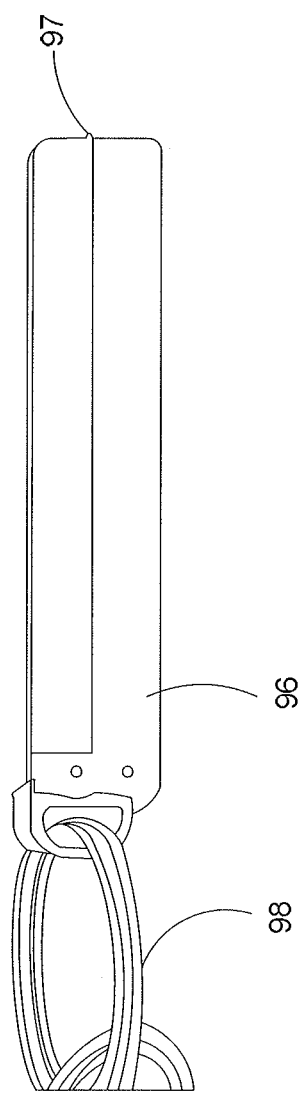

FIG. 18C illustrates the key chain storage device 96 of FIG. 18B, wherein the key chain storage device 96 is in the closed position. The key chain storage device 96 includes a key chain interface 98, a storage element 87*a* for storing a port sealing bung 53, another storage element 87*b* for storing a latch cover 71, and a tool 97 for separating the corresponding members of the housing one from the other.

Figure 18D:
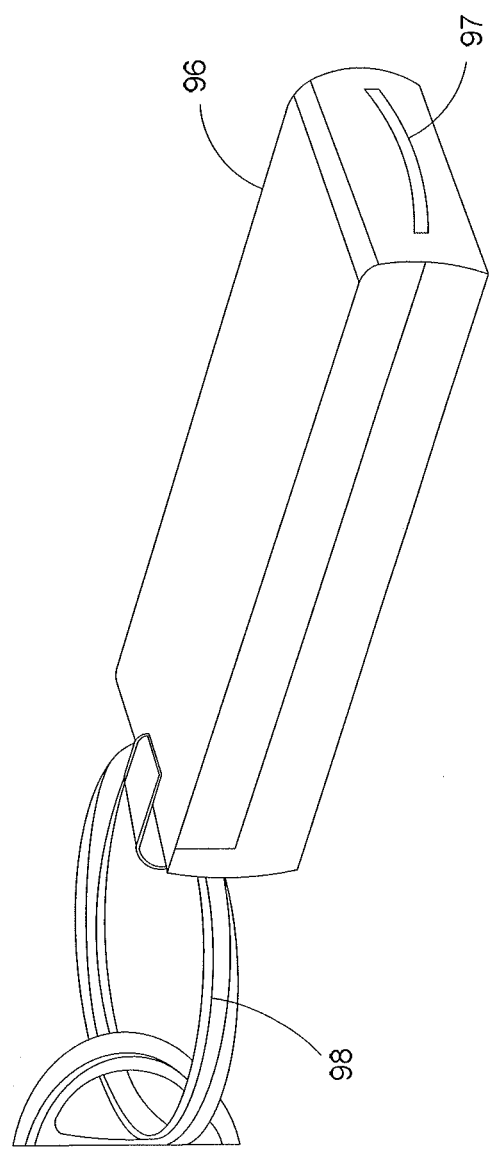

FIG. 18D is a further representation of the key chain storage device 96 of FIG. 18C.

Figure 19A:
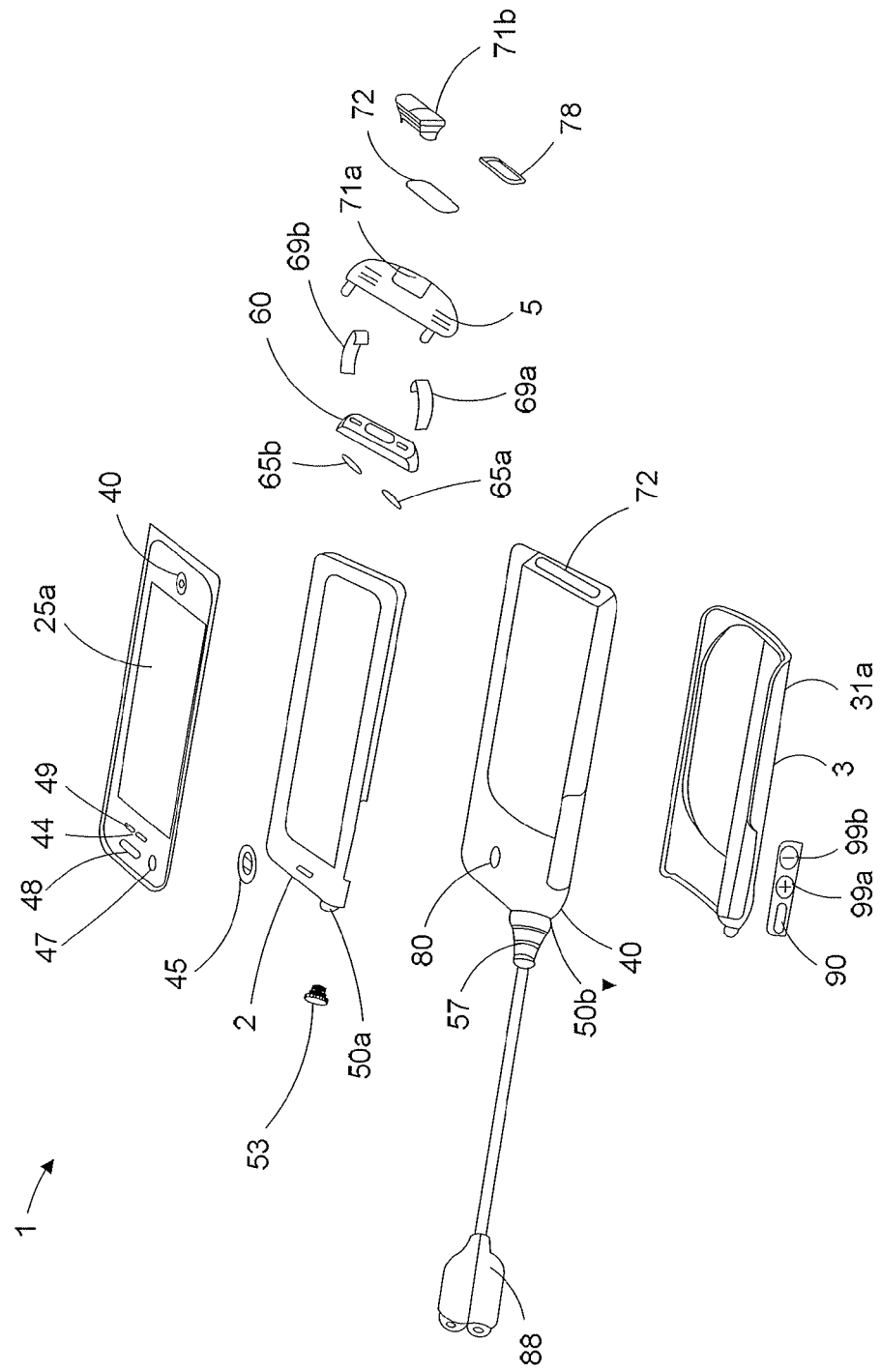
FIGS. 19A-19K provide various views of another embodiment of a housing of the disclosure.
Figure 19B:
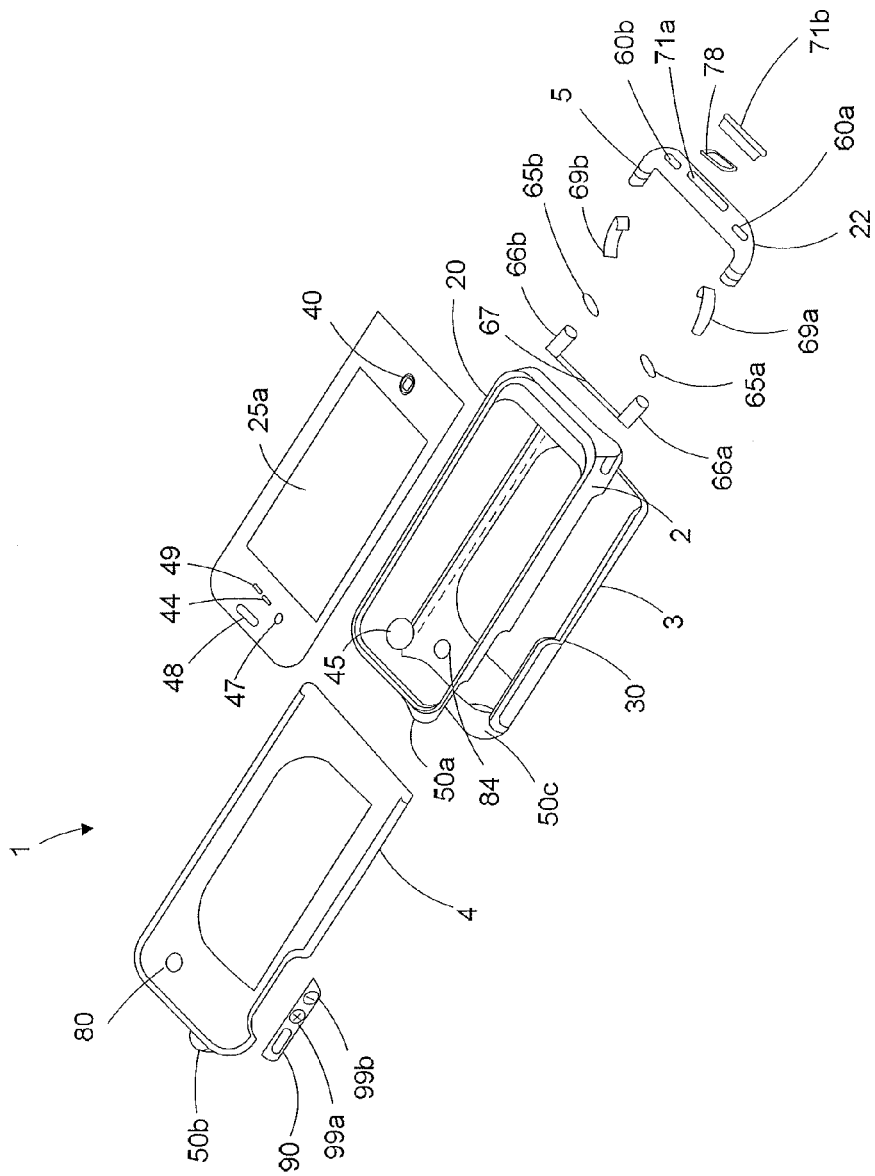
Figure 19C:
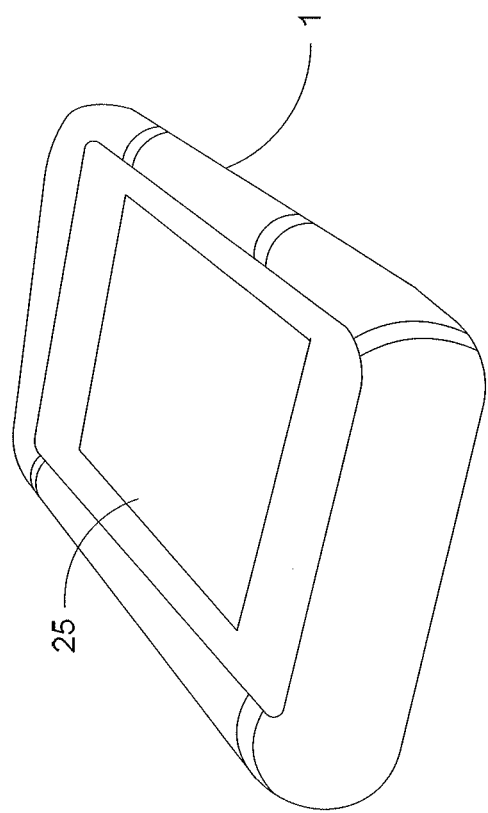

FIGS. 19A-K provide another embodiment of a device of the disclosure. Accordingly, FIGS. 19A-C provide a segmental illustration wherein various elements of a housing 1 are provided in a segmented fashion. In accordance with this embodiment, the housing 1 may include a top housing member 2 and a bottom member 3. Additionally, in this embodiment, the housing further includes an intermediate structural member 4. The top member 2 includes a top-surface 25*a*, which in this embodiment is configured as a membrane that is attachable to top member 2. The membrane 25*a* includes an acoustic membrane feature 44, video camera optically clear region 47, a proximity sensor 48, and a button feature 40. The top member 2 further includes an outer perimeter portion that includes a jack port 50*a*, several cutout regions configured for receiving various feature elements as described above, and an interface region so as to interface with the intermediate member 4.

The intermediate member 4 is configured for interfacing with both the top member 2 and the bottom member 3. The intermediate member 4 includes a jack port 50*b*, a slider switch receiving aperture, and a camera portion 80. A slider switch 90 is also provided and configured for being fit within the slider switch receiving aperture of the intermediate 4 and top member 2. The bottom member 3 is configured for interfacing with the intermediate member 4 and/or the top member 2. The bottom member 3 includes a slider switch interface region for interfacing with the slider switch 90.

The top member 2, intermediate member 4, and bottom member 3 are configured for being coupled to one another so as to form the housing 1. In this embodiment, each of the top 2, intermediate 4, and bottom 3 members are configured such that when they are coupled together an opening is formed at the proximal end of the housing 1. Any of the top, intermediate, and bottom members 2, 3 or 4 may be configured to be separable one from the other, or they may be fabricated such that once joined they are not further capable of being disjoined without destroying the housing or its ability to provide a liquid tight seal.

However, as the one or more components, e.g., 2, 3, and 4, come together to form the housing 1, the proximal end of the housing 1 includes an opening, such as an opening through which an electronic device, such as a mobile telephone or other like device, can be received. The proximal end of the housing 1, therefore, is further configured for being coupled to a removable proximal end portion 5, so as to seal the housing in a liquid and dirt tight seal.

It is to be noted that although the housing 1 is herein described as including three component parts, i.e., a top 2, intermediate 4, and a bottom 3 member, in various embodiments, one or more of these component parts may be excluded and/or their functions be performed by one or more of the other component parts. For instance, in certain embodiments, the housing 1 may simply include a top member 2 and a bottom member 3, e.g., in a configuration as that described above with the addition of a removable proximal end portion 5, as described herein below.

In other embodiments, the housing 1 includes a single member, i.e., the top and bottom members are not removable from one another, e.g., they may be fabricated from a single material, and further configured for being removably coupled to a removable proximal end portion 5, as described herein below. In any of these instances, the functional features as described herein above, button features, slider switch, port, coin slot, etc., can be included into any form of the housing, whether the housing is formed from a single or multiple members.

The proximal end portion 5 may have any suitable configuration so long as it is capable of removably coupling to the housing 1 and providing a liquid, dirt, and/or shockproof seal therewith. For instance, the proximal portion of the housing 1 and the proximal end portion 5 may have corresponding clasping mechanisms, as described above with respect to the perimeter portions of the housings 2 and 3. Accordingly, either of the proximal portion of the housing 1 and the proximal end portion 5 may have interior and exterior perimeter portions, bounding portions, channels, and corresponding clasping mechanism, as described above. Further, it is noted that although the configuration herein detailed is with respect to a proximal portion, this configuration can be changed such as to be a distal end portion or a side portion, with respective changes to the various components of the housing in adaptation for the change in configuration.

As depicted with respect to FIG. 19A, proximal end member 5 is configured for being coupled to several different elements. For instance, proximal end member 5 is configured for being coupled to a sound transmission portion 60 as well as latch door system 70. The sound transmission system 60 includes acoustic vents 65 *a* and b. These elements are capable of being coupled together via latches 69 that slide into corresponding grooves thereby joining the sound transmission portion 60 into the proximal end portion 5. The latch door assembly includes a rigid stiffener 72, gasket 78, as well as latch door 71*b*. These may be snapped into a corresponding latch door orifice 71*a* positioned in proximal end 5. In a manner such as this, once the housing assembly 1 is assembled and the proximal end portion 5 is assembled, an electronic device 100 may then be inserted into the housing 1, the end portion 5 coupled therewith, and the housing sealed in a liquid proof seal. See for instance, FIGS. 19C-F.

FIG. 19B provides another exploded, segmental illustration of the device of FIG. 19A. The housing 1 of the disclosure may include a top housing member 2, an intermediate member 4, and a bottom member 3. The top member 2 includes a top-surface membrane 25. The membrane 25 includes an acoustic membrane feature 44 and a button feature 40. The top member 2 further includes an outer perimeter portion 20 having both a jack port 50 and a slider switch aperture.

The intermediate member 4 is configured for interfacing with both the top member 2 and the bottom member 3. The intermediate member 4 includes a jack port 50b, a slider switch receiving aperture, and a camera portion 80. A slider switch 90 and volume toggles 99 are also provided and configured for being fit within the slider switch receiving aperture of the intermediate 4 and top member 2. The bottom member 3 is configured for interfacing with the intermediate member 4 and/or the top member 2 and further includes a camera feature 80 with lens 84, etc. The bottom member 3 includes a slider switch interface region for interfacing with the slider switch 90 as well as a port opening 50c.

The top member 2, intermediate member 4, and bottom member 3 are configured for being coupled to one another so as to form the housing 1. Each of the top 2, intermediate 4, and bottom 3 members are configured such that when they are coupled together an opening is formed at the proximal end of the housing 1. This opening is configured for being coupled to a proximal end member 5 in such a manner that a liquid, dirt, and/or shock-proof seal is formed thereby.

The housing 1 couples with the proximal end portion 5 in a liquid-tight seal. The end portion 5 may be configured so as to include one or more features, such as a sound transmission portion 60, including both a structural framework 67, having acoustic channels 66 a and b and acoustic vents 65, as well as a latch feature 70. The acoustic membrane feature includes a sturdy framework 67 having sound channels 66 a and b included therein. The sound channels form a microphone acoustic vent portion 66a having a microphone acoustic vent membrane 65a therein, and further includes a speaker acoustic vent portion 66b forming a speaker acoustic channel and having a speaker acoustic vent membrane 65b. The latch feature 70 includes a latch cover 71a, which latch cover 71a includes a gasket 73. Further, the end portion 5 may include a pair of latches for securing the acoustic membrane feature to the end portion 5. The housing 1 and/or end member 5 also includes a bottom sealing member, e.g., gasket 15, for interfacing with the top 2, intermediate 4, and/or bottom member 3.

Accordingly, with respect to FIGS. 19A and 19B, the housing members are adapted to be coupled together and therefore include a top member 2, bottom member 3, optionally an intermediate member 4 and/or a proximal end portion 5. As depicted the end portion 5 is configured for interfacing with a plurality of features, such as one or more sound transmission features, e.g., acoustic membrane features 65 a and b, and a latch feature 70. The sound transmission feature is configured as an acoustic membrane feature, which includes a plurality of acoustic membranes, such as a microphone acoustic membrane 65a and a speaker acoustic membrane 65b. The latch feature 70 includes a latch cover 71b, which latch cover 71b includes a gasket 73 and is further configured for interfacing with a rigid stiffener region 72 that may be positioned within the proximal end portion 5 or the proximal portion of the housing 1.

Further, as depicted, the acoustic channel feature 60 may include one or more, e.g., a pair of latches for securing the acoustic channel feature 60 to the end portion 5 and/or a gasket for enhancing the sealing thereof. The housing 1 is configured for receiving the proximal end portion 5 and therefore the housing 1 and the end portion 5 will have corresponding clasping mechanisms and may further include a gasket, e.g., an o-ring, to enhance the sealing of the housing 1 with the end portion 5. Also depicted is a liquid-proof adapter member, as described above, which adapter member is coupled to the housing 1 via the port 50. As the latch member 70b, in this instance, may be removable, a separate storage element (as described above) may also be included.

FIG. 19C provides an example of a method of assembling a housing of the disclosure. For instance, a housing 1 may be fabricated as a single framework portion or a multiplicity of framework portions that are assembled together so as to make a single composite framework portion, as described above. Added to this framework portion is attached a top surface membrane 25. Of course, the housing 1 can be configured as having two members, e.g., a top and bottom member, or more than two members, e.g., a top, intermediate, and bottom member, as described above. Further, the housing 1 is configured for being coupled to an end portion, e.g., a proximal or distal end portion 5. Of course, the housing 1 could be, in an alternative embodiment, configured for coupling to a side member in like manner. With respect to FIG. 19 C, the housing 1 is adapted to form a liquid tight seal by coupling to end portion 5.

Thus, the housing 1 and the end portion 5 may be fabricated so as to be independent pieces capable of being coupled together, as described above. For instance, the housing 1 and end portion 5 may have corresponding clasping mechanisms, as described above. A channel and/or gasket may also be included at this interface to ensure the coupling of the housing 1 and the end portion 5 form a liquid-tight seal upon coupling. For instance, the end portion could be configured as a plug portion, having a groove, or channel, or other form of gasket seat to which a gasket may be attached. As the end portion 5 is slid into the housing 1, the gasket is compressed thereby providing a liquid proof seal therewith. Accordingly, the clasping mechanisms, channel, and/or gasket may entirely or partially circumscribe the perimeter portions of the opening of the housing 1 and/or the end portion 5, e.g., at a housing interfacing portion of the end portion 5.

As stated above, the housing 1 may be fabricated to have two separate halves, e.g., a top member 2 and a bottom member 3, which halves are configured for being coupled together so as to form the housing 1 with an opening in one of its ends so as to be coupled with end member 5. Likewise a top member 25 may be fabricated from a suitable membrane member independently and then attached to the completed housing 1, or may be fabricated at the same time as the housing 1, such as in an overmould process.

Accordingly, the membrane 25 may be associated with the housing through any suitable method such as by bonding, such as by an adhesive and/or in an over-moulded fashion such as described above. The membrane 25 may further include one or more additional elements associated therewith, such as a touch membrane that may be bonded to the top membrane, such as during an in-mould process, via an adhesive, or by over-moulding. The bottom member 3 of the housing may further be associated with a film, such as a PET film upon which a graphic decal may be positioned. In certain instances, the film may be a scratch resistant film.

Figure 19D:
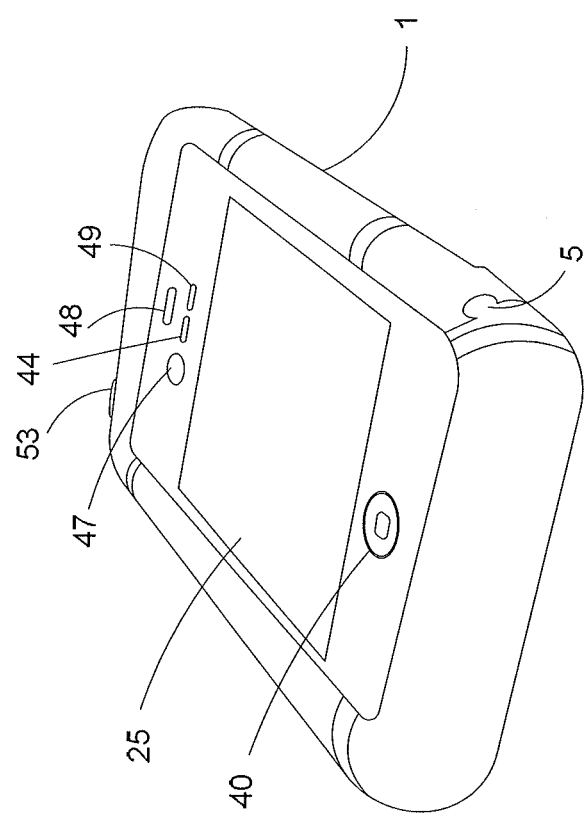

FIG. 19D provides a perspective view of a housing 1 of the disclosure with associated end portion 5 and membrane 25. All of the various functional feature elements described above may be added to the housing 1, end portion 5, and/or membrane 25 in the manner described above. In this embodiment, the housing 1 is assembled, end portion 5 is coupled to the housing 1 and is in the closed position.

Figure 19E:
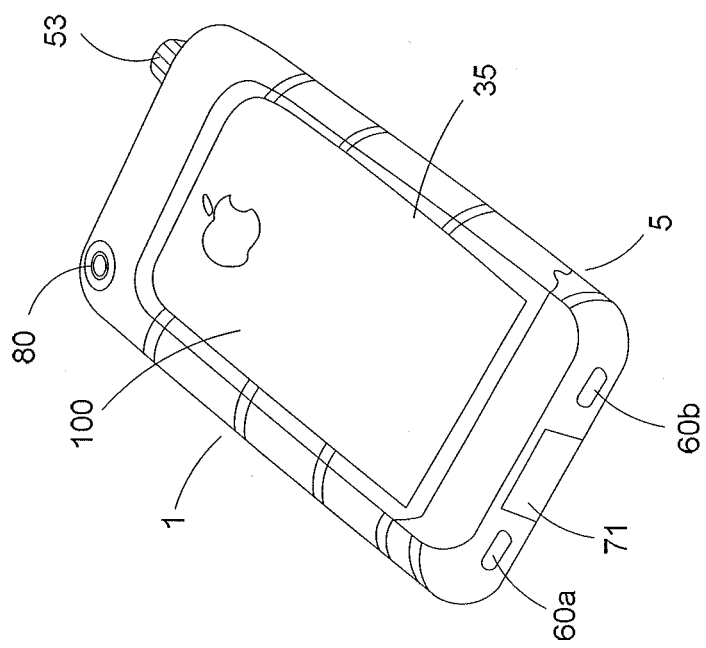

FIG. 19E provides a perspective view of a bottom of the housing 1 of FIG. 19D. The bottom surface of the housing 1 includes a transparent membrane 35. This membrane may be attached to the housing in the manner described above with respect to the top surface membrane 25. The housing 1 further includes an end portion 5 both of which have been coupled to an electronic device 100 that is housed within the housing 1. The end portion 5 is associated with the main body of the housing 1 and is therefore in the closed position so as to form a liquid, dirt, and shock-proof seal thereby. The housing 1 therefore houses the electronic device 100 and provides protection to the device against inclement weather, contact with liquids such as water, and/or damage due to shock, such as by dropping.

In this embodiment, the housing is not much wider, longer, or thicker than the underlying device to be housed therein. For instance, the housing may have a thickness of about 4.5 or about 3.5 mm or less, such as about 3 or about 2.5 mm, for instance, about 2 mm or about 1.5 mm, including about 1 mm or about 0.9 mm or less, for example about 0.75 mm to about 0.5 mm; dependent upon which materials the housing is made of. It is also to be noted that the when the device is housed within the housing the width dimension of the housing as compared to the device, as shown in FIG. 19E, may be about 0.5 mm or about 0.75 mm to about 3.5 mm or about 4 mm wider than the device, such as about 1 mm or about 1.5 mm to about 3 mm or about 2.5 mm wider, such as about 2 mm wider than the device.

Further, when the device is housed within the housing, the length dimension of the housing as compared to the device, as shown in FIG. 19E, may be about 1 mm or about 2 mm to about 20 mm or about 15 mm longer than the device, such as about 3 mm or about 4 mm to about 12 mm or about 10 mm longer, such as about 7.5 mm or about 5 mm longer than the housed device, dependent upon from what materials the housing is made and what perimeter features are to be include. For instance, where no perimeter features to be included, the housing could be less than about 1 mm, such as less than about 0.9 mm, including less than about 0.75 or 0.5 mm longer, wider, and thicker than the housed device.

Figure 19F:
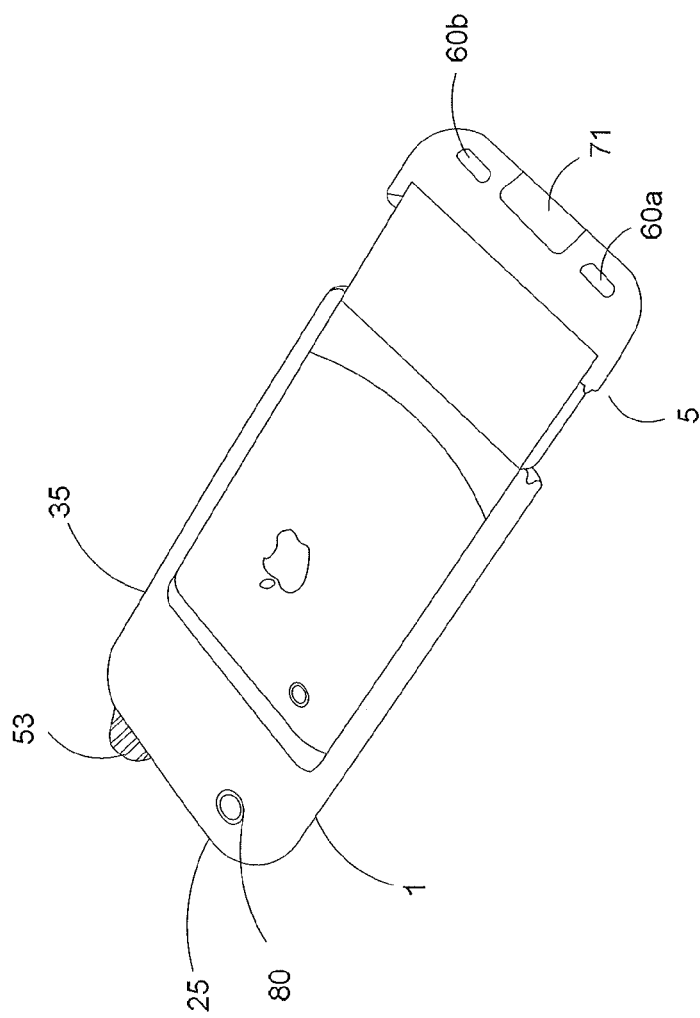

FIG. 19F provides a perspective view of a bottom of the housing 1 of FIG. 19E. The bottom surface of the housing 1 includes a transparent membrane 35. As can be seen, the front surface of the housing 25 also includes a transparent membrane 25. The housing 1 further includes an end portion 5 both of which are coupled to the electronic device. The housing 1 coupled to member 5 houses the device. As depicted the housing 1 and end portion 5 are uncoupled from one another and therefore are in the open position.

Figure 19G:
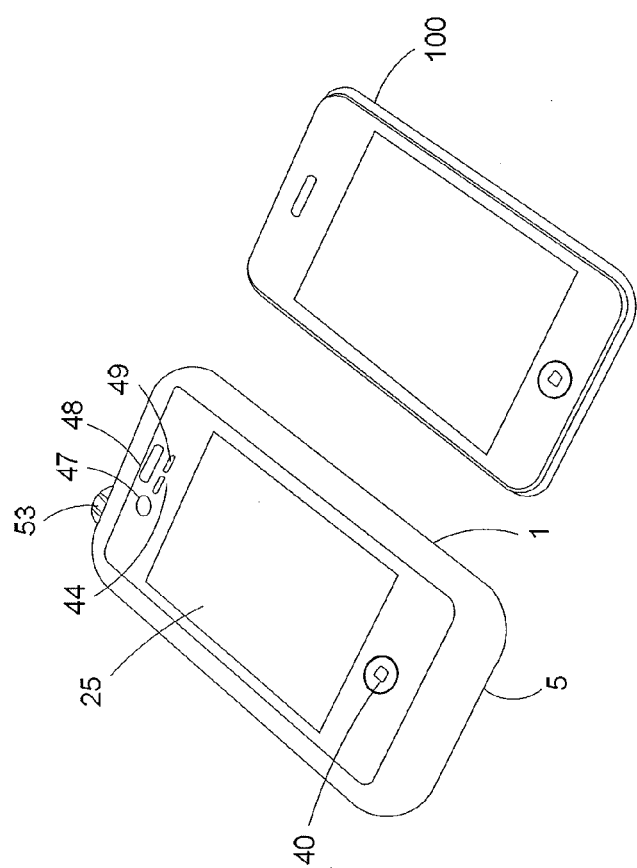

FIG. 19G provides a perspective view of a top of the housing 1 of FIG. 19E. The top surface of the housing 1 includes a membrane 25 having a button feature 40 associated therewith as well as the other features described herein above. As can be seen, the button feature 40 aligns with the button feature of the underlying device so as to allow the manipulation of the navigation button. The housing 1 is depicted as coupled to the end member 5 and therefore is in the closed position, housing an electronic device. The housing 1 is further positioned next to an exemplary electronic device so as to provide a perspective as to the length, width, and thickness of the housing 1 relative to the device 1.

Figure 19H:
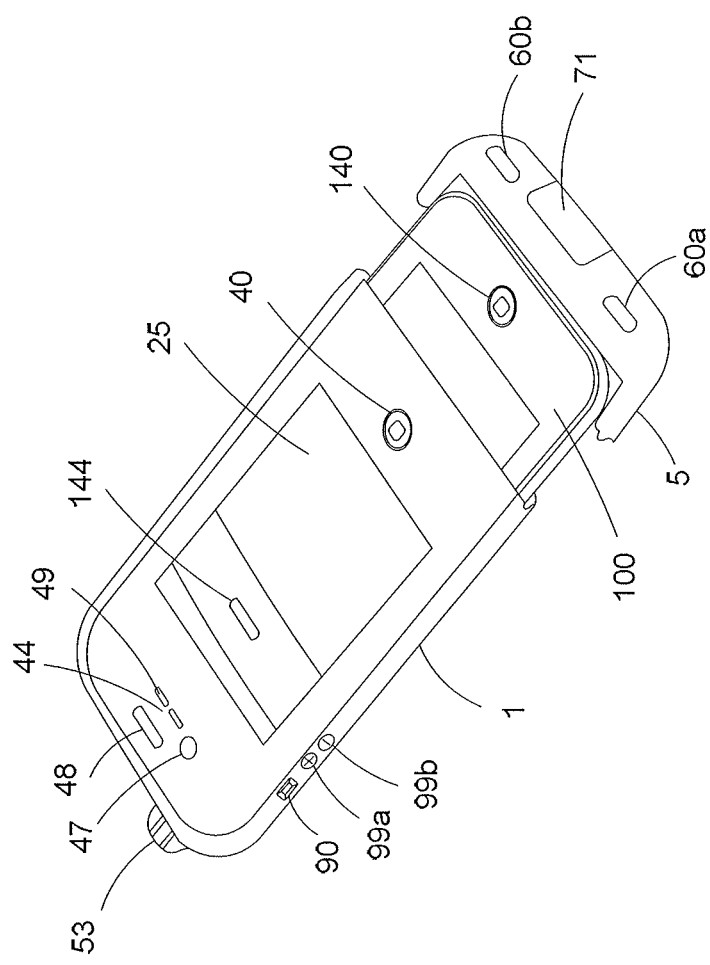

FIG. 19H provides a perspective view of a top of the housing 1 of FIG. 19G. The top surface of the housing 1 includes a transparent membrane 25 having a button feature 40 associated therewith as well as other membrane features described herein above. The housing 1 further includes an end portion 5 coupled to the electronic device. The housing 1 houses the device. As depicted the housing 1 and end portion 5 are uncoupled from one another and therefore are in the open position. It is to be noted, the end portion 5 has additional latching mechanisms positioned on opposing sides for further latching the end portion 5 with the housing 1 and ensuring a tight seal thereby. The housing 1 further include latch receiving members for receiving and securing the latching mechanisms of end portion 5. It is to be understood that this configuration could be reversed.

Figure 19I:
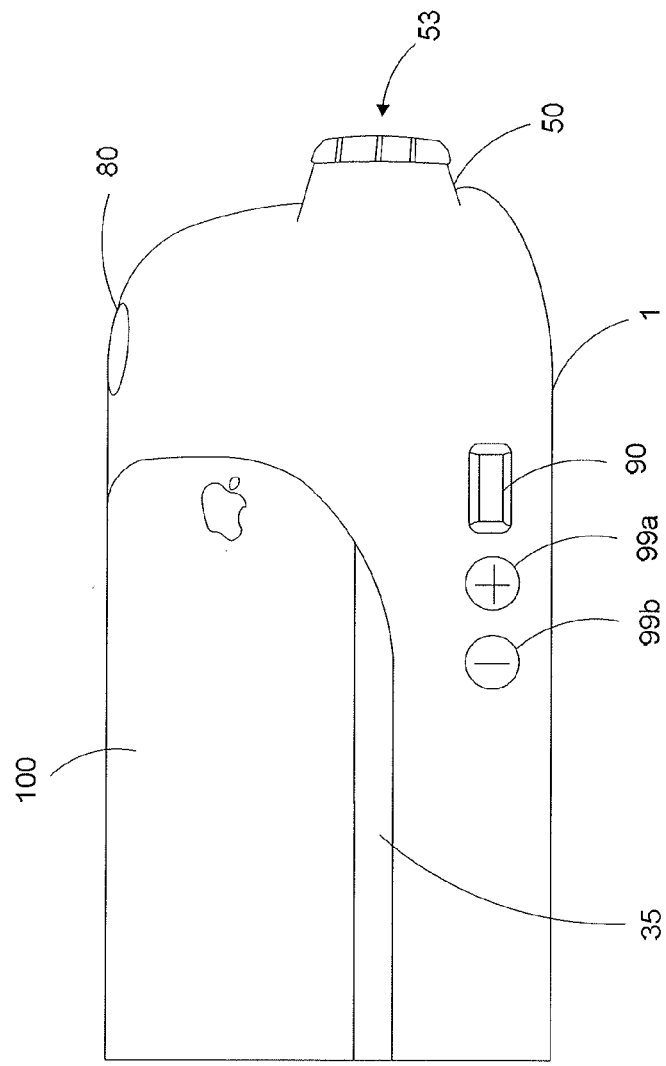

FIG. 19I provides a close up view of a top end portion of the housing 1 of FIG. 19H. As can be seen the housing 1 includes a transparent bottom membrane portion 35 as well as a camera aperture 80 and a port 50 with port bung 53 associated therewith.

Figure 19J:
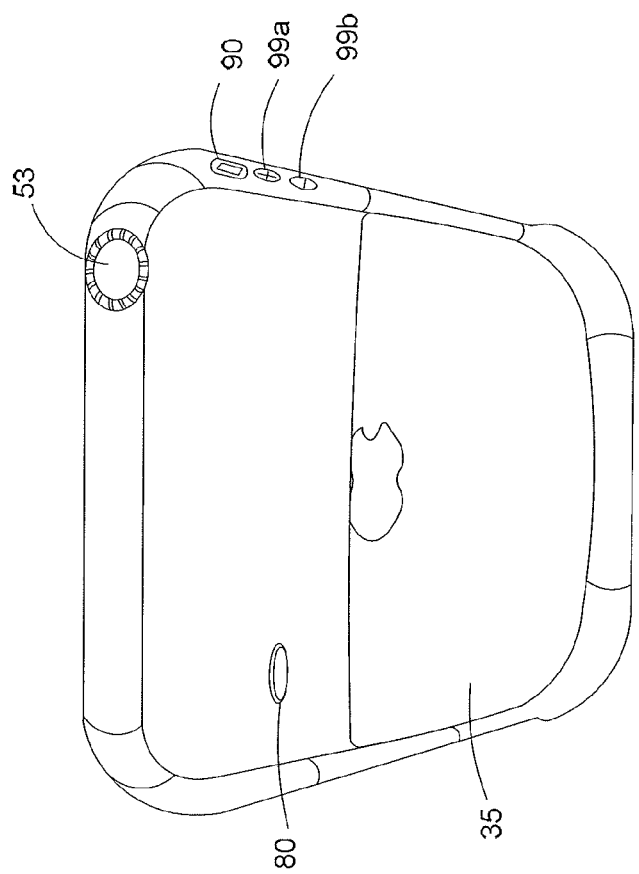

FIG. 19J provides a perspective view from a top end portion of the housing 1 of FIG. 19I. As can be seen the housing 1 includes a transparent bottom membrane portion 35 as well as a camera aperture 80 and a port 50 with port sealing bung 53 associated therewith.

Figure 19K:
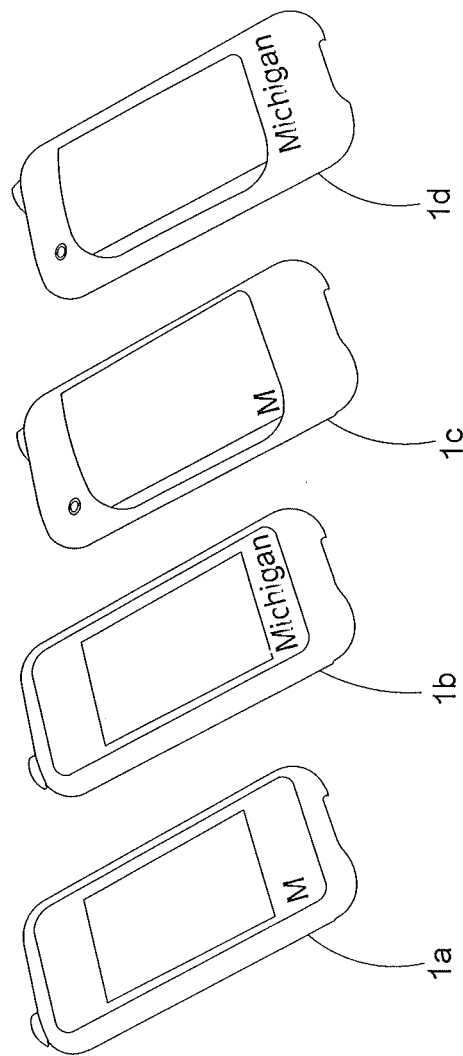

FIG. 19K provides a housing 1a-d with various decals positioned at various locations thereon. For instance, a top member 2 front membrane 25 may be adapted so as to include an optically masked region, which may be in the form or may additionally include a graphical feature, such as a decal. Hence, one or more decals may be added to the housing after fabrication, e.g., by an adhesive coating layer, or other attachment mechanism, or can be added during the fabrication process.

It is to be noted that in various instances the top member may include an adhesive layer such that the top member comprises a layer that may be applied directly to the perimeter of a top member of the housing as well as to the top surface of an electronic device and be wrapped there around and thereby provide a liquid-proof seal for the case.

Figure 20B:
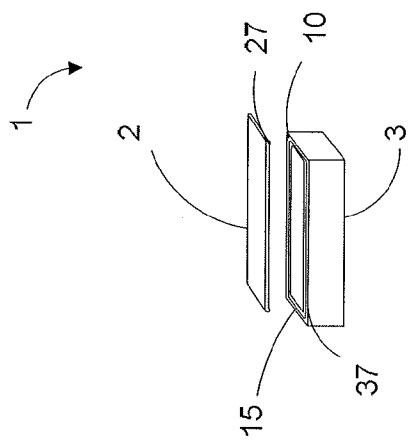
FIGS. 20A-20C provide a perspective view of other containing elements and locking elements.
Figure 20C:
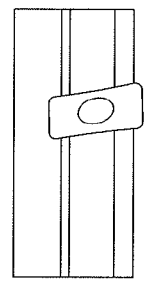
Figure 20A:
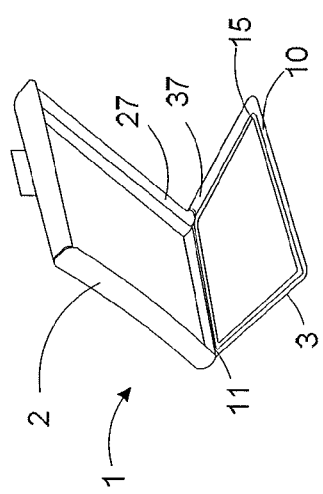

FIGS. 20A-C provide additional aspects of housings of the disclosure. As can be seen with respect to FIGS. 20A and 20B, a housing of the disclosure may be configured to house virtually anything capable of being housed and transported. FIG. 20A provides a housing 1 that is in the form of a case, such as a brief case, suitcase, messenger case, and the like. FIG. 20B provides a housing 1 that is in the form of a storage container, cooler, warmer, or the like. The storage container 20B can be configured to store anything in need of being protected from the environment, such as food, liquids, ice, paper, notebooks, books, household items, work items, office supplies, medical items, sports items, clothing, fragile items, precious items, and the like. The housings of FIGS. 20A and 20B each include a top member 2 and bottom member 3, which top and bottom members include respective clasping mechanisms 27 and 37, as described above. A channel 10 and gasket 15 are also provided, in this instance, in the bottom member, although they could as well be positioned in the top member 2. The top member 2 of FIG. 20A is connected to the bottom member 3 via a hinge element 11. In such an embodiment, the clasping mechanisms, channel, and/or gasket, may not need to entirely circumscribe the perimeters of the top and bottom members, however, in various embodiments, one or more of the clasping mechanisms, channel, and gasket do circumscribe the entire perimeter portions, e.g., of the respective top and/or bottom members 2, 3. As can be seen with respect to FIG. 20B the top member 2 is configured for being completely removed from the bottom member 3. In this instance, the clasping mechanisms 27 and 37 circumscribe the entire perimeter portions of the top and bottom members 2, 3, and the channel 10 and gasket 15 entirely circumscribes the perimeter portion of the bottom member 3.

As can be seen with respect to FIG. 20C an additional latching mechanism may be included to either of the housings of FIG. 20A or B for further securing of the sealing of the top and bottom members 2, 3. This latching mechanism may be in any configuration so long as it is capable of facilitating the coupling and/or securing of the top member 2 with the bottom member 3. For instance, the latching mechanism may be one commonly known in the art. In certain embodiments it may include a locking mechanism known in the art, such as a lock and key mechanism, a combination mechanism, a hoop mechanism through which an external lock is added, and the like.

In one aspect, a method of manufacturing a housing 1 as described herein is provided. The method includes individually producing a bottom member and a top member in such a manner that they are capable of being coupled together so as to produce a waterproof and dirtproof housing. As indicated above, the housing 1 includes several component parts. Primarily, in various embodiments, a housing 1 of the disclosure includes a top member 2 and a bottom member 3. However, to be more precise, the top member 2 is more particularly a perimeter portion 20 having a latching mechanism 27 configured thereon. The bottom member includes a front and back surface as well as a perimeter portion that includes, in various instances, a channel and a clasping mechanism 37 positioned therein. The clasping mechanisms are configured to be corresponding and function to lock the top and bottom members together.

The top 2 member perimeter portion 20 and the bottom member 3 may be produced in any suitable manner in accordance with the methods well know in the art. For instance, a suitable top member perimeter portion 20 and a bottom member 3 may be produced by moulding such as by injection moulding. Although it is recognized that other suitable moulding and/or fabrication techniques may also be employed, such as by casting and/or machining. As indicated above, a top member perimeter portion 20 may be composed of any suitable material, but is typically composed of a rigid or semi-rigid material such as a stiff plastic, such as polycarbonate. Likewise, the bottom member may be composed of any suitable material, such as from a rigid, semi-rigid, or flexible material, such as polypropylene.

As detailed herein, both top 2 and bottom 3 members have various additional features therein, which features may be produced thereon in various suitable ways, an exemplified version of which is herein described. For instance, in certain embodiments, such as provided in FIGS. 3L and 3M, the bottom member includes a channel 10 having internal teeth receptacles 13b and the top member includes teeth 13a on a perimeter thereof. The channel 10 includes an exterior perimeter portion 30b having a clasping mechanism, such as a circumferential groove provided therein, e.g., by tooling, and further includes an interior bonding member 20a.

The channel 10 may be produced during the injection moulding process wherein the polypropylene material is injected into a suitable mould, the channel formed, and one or more sliding elements, e.g., sliders, are positioned thereon so as to push through the interior bounding member 20a and partially enter the channel 10. For instance, the teeth receptacles 13b of the interior perimeter portion 20a of the channel 10 of the bottom member 3 may be produced by the use of a plurality of elements that are capable of producing undercut features, such as sliders, that once the bottom member has been injected into the mold and cooled to an insertion temperature, are positioned exterior to the interior bounding member 20a in a central portion of the bottom member 3. In one embodiment, five sliders are employed, but more or less sliders may be used dependent on the configuration. The sliders are positioned around an interior perimeter portion of the bottom member and as the moulded bottom member continues to cool the sliders are moved, e.g., sequentially, inward toward the center of the bottom member 3, forming the teeth receptacles 13b, and then the sliders are retraced upwards. The sliders therefore come down, move laterally in, move laterally out, and then are retracted.

The top member 2 perimeter portion 20 can also be produced by injecting polycarbonate into a suitable mould. Once moulded and suitably cooled cutout tools, as described above, may be employed to produce one or more apertures therein, such as various port, switch, or button openings may be produced therein. Suitable water impermeable vent materials may be placed to cover various sound inlet/outlet apertures as described above such as by a suitable adhesive and/or by overmoulding.

Once cooled a top surface membrane 25 may be attached thereto, e.g., via an adhesive, such as a pressure or thermal activated adhesive. The membrane 25 may be attached to a top surface portion of the polycarbonate frame or to an underneath top surface portion. In certain embodiments, an outer perimeter portion 20b of the top member 2 is to be added to the polycarbonate frame, such as via an overmould process, as described above. In this manner the top member 2 having the features described herein above may be produced.

Additionally, as indicated above, atop surface membrane 25 may include several features. These features may be formed, punched, and/or cut into the membrane 25. For instance, the button feature 40 may be cut into the membrane 25 and its components assembled therein or it can be thermal formed as an indented region of the membrane 25. The lens feature 47 may be punched and/or the sound transmission portion 44 may be cut into the membrane and the associated elements attached thereto, such as via suitable adhesives.

Once these features have been formed, suitable associated elements, such as impermeable vent materials, scrims, screens, and gaskets can then be added by hand or machine to ensure every aperture is sealed, plugged, or otherwise covered. It is to be noted, with respect to the sound transmission channel 60, e.g., microphone or speaker channel, the vent material 65 may be overmouled with one or both of an overmould material 67 and/or a grille material 68. The vent material, may therefore be added prior to the overmould process described above. It is to be noted that the various assembling of screens and attachment thereof my include one or more of the addition of a suitable adhesive, such as a glue, a pressure or thermal sensitive or other suitable adhesive, and/or an over moulding process. Also, it is understood that where the housing does not include a front membrane 25, one or more of the described vent materials, screens, or plugs may be applied directly to a device to be housed, such as by use of an adhesive (e.g., stickers configured for acting as water impermeable vents) or by using compressible pug elements, and the like.

Once these features have been formed, a suitable formed charge port door feature 70 and earphone port cover 53 may be assembled, gaskets added, and then they may be coupled to their respective top and bottom members and the housing 1 formed by the coupling of the top member with the bottom member.

Figure 21:
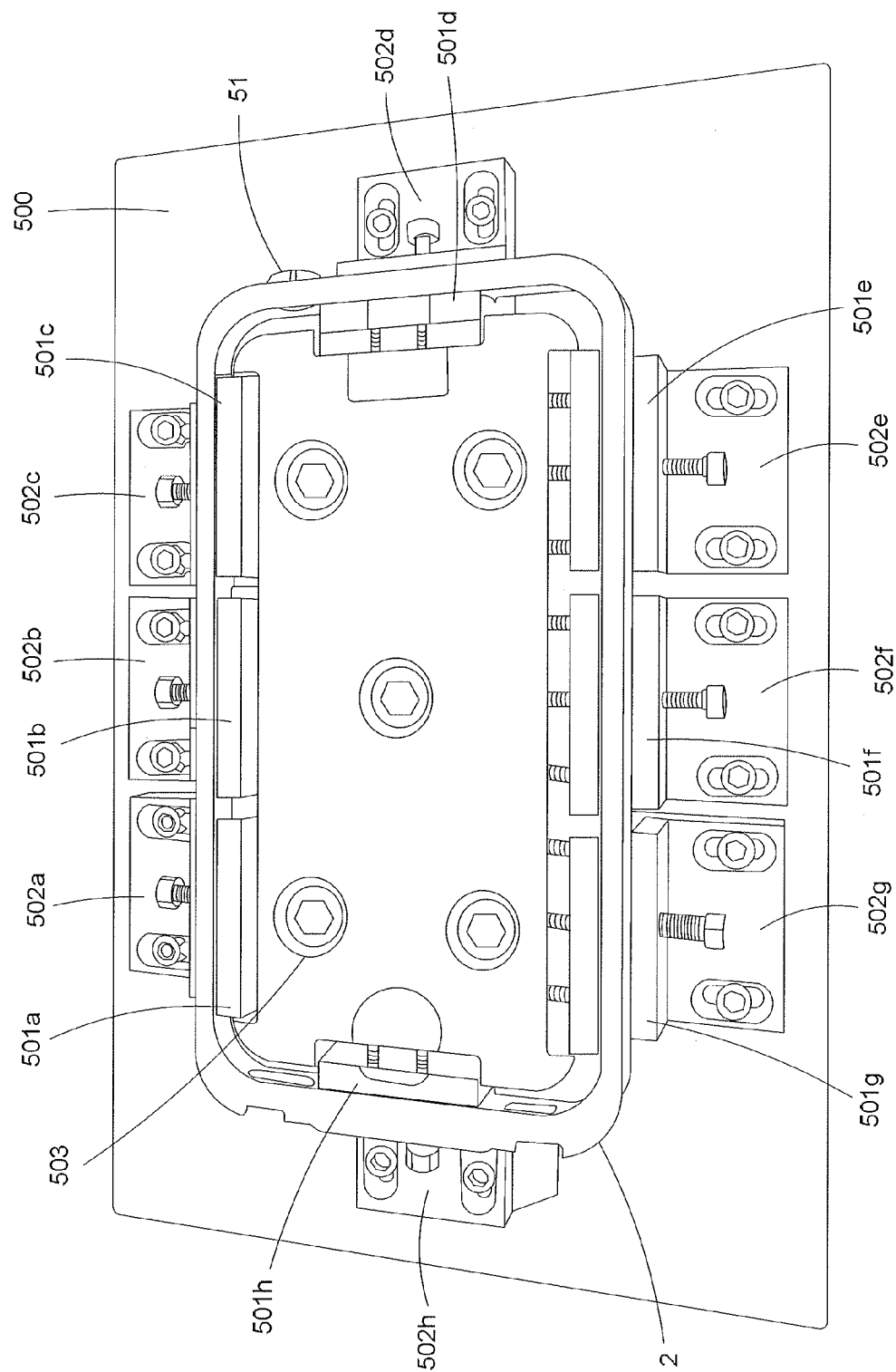
FIG. 21 provides a perspective view of a jig for use in producing a housing of the disclosure.

FIG. 21 provides a jig device 500 that may be employed in a method of attaching a front membrane 25 to a perimeter portion 20 of a top member 2 of the housing 1 of the disclosure. The jig 500 includes moving housing engagement members 501 that are capable of moving laterally inwards and outwards. The engagement members 501 are configured so as to fit a perimeter portion 20 of the housing therein. The jig 500 further includes tensioning elements 502 which can be employed in moving the engagement elements 501 inwards and outwards, thereby compressing or expanding the perimeter portion 20. The jig also includes securing bolts 503 that function to secure the jig in place.

In use, in certain embodiments, a formed perimeter portion 20 is inserted into the moveable engagement members 501. The engagement members 501 are contacted to the perimeter portion 20 and the tensioning elements 502 are engaged so as to compress the interior dimension of the perimeter portion 20, e.g., to compress its sides inwards. A suitably formed membrane material 25 is then attached to the perimeter portion 20, e.g., via a suitable adhesive, such as a pressure or thermal sensitive adhesive. In this instance, the membrane 25 is configured for attaching to the perimeter portion 20 in its compressed configuration. Once attached, the tensioning element 502 may be adjusted to relax the tension and the perimeter portion 20 may then be removed from the jig 500. Once the tension is released the perimeter portion 20 will return to its pre-compressed dimension thereby causing the membrane 25 to be stretched. In a manner such as this a top member 2 having a perimeter portion 20 and a top surface membrane 25 may be produced, wherein the top surface membrane 25 is taught and flat across its surface. Further, once attached, the perimeter portion 20a and membrane 25 may then be over-moulded to form a suitable exterior perimeter portion, such as with a more flexible rubber or TPE material. Accordingly, this process results in a top member 2, as described herein, with a front membrane 25 interface region that is flat, smooth, and responsive to touch, which in turn makes the user interface with a hosed device more efficient, easier to use, and more enjoyable.

The above figures may depict exemplary configurations for an apparatus of the disclosure, which is done to aid in understanding the features and functionality that can be included in the housings described herein. The apparatus is not restricted to the illustrated architectures or configurations, but can be implemented using a variety of alternative architectures and configurations. Additionally, although the apparatus is described above in terms of various exemplary embodiments and implementations, it should be understood that the various features and functionality described in one or more of the individual embodiments with which they are described, but instead can be applied, alone or in some combination, to one or more of the other embodiments of the disclosure, whether or not such embodiments are described and whether or not such features are presented as being a part of a described embodiment. Thus the breadth and scope of the present disclosure, especially in any following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read to mean "including, without limitation" or the like; the term "example" is used to provide exemplary instances of the item in discussion, not an exhaustive or limiting list thereof; and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. Additionally, where a range is set forth, the upper and lower limitations of the range are inclusive of all of the intermediary units therein.

The foregoing description is intended to illustrate but not to limit the scope of the disclosure, which is defined by the scope of the appended claims. Other embodiments are within the scope of the following claims.

What is claimed:

1. An apparatus for housing an electronic device comprising:
    a top member having a perimeter portion forming a proximal end portion, a distal end portion, and opposing side portions, the top member having a front surface and a back surface spanning from the proximal end portion to the distal end portion and across the opposing side portions of the top member, the perimeter portion further having a first clasping mechanism;
    a bottom member having a front surface, a back surface, and a side wall that extends around at least a portion of a perimeter of the bottom member, the side wall having an inner surface, and an outer surface, and a top ridge that extends around at least the portion of the perimeter of the bottom member, the bottom member, which when coupled with the top member, forms a housing to enclose the electronic device and to position the perimeter portion of the top member over the inner surface of the top ridge of the side wall of the bottom member, the bottom member further having a second clasping mechanism on the side wall of the bottom member, the second clasping mechanism to interface with the first clasping mechanism of the top member to maintain the top member and the bottom member coupled together; and
    a bottom frame member configured to couple with the back surface of the bottom member and the outer surface of the side wall of the bottom frame member having a flexible portion.

2. The apparatus in accordance with claim 1, wherein the bottom frame member further includes a port and a latch port cover that closes the port, the latch port cover having a gasket seat and a port gasket on the gasket seat, the port gasket sealing the port when the latch port cover closes the port.

3. The apparatus in accordance with claim 1, wherein the top member further comprises a membrane spanning between the proximal end portion to the distal end portion and across the opposing side portions.

4. The apparatus in accordance with claim 1, further comprising a lens defined in the bottom member and extending through the front surface and back surface of the bottom member.

5. The apparatus in accordance with claim 1, wherein the first clasping mechanism includes one or more apertures, and wherein the second clasping mechanism includes one or more protrusions, each protrusion to fit into a corresponding aperture.

6. The apparatus in accordance with claim 1, wherein the electronic device includes a control feature, and wherein the top member further comprises one or more button features for operating a corresponding button on the electronic device, each of the one or more button features having a molded overlay that seals the control feature.

7. The apparatus in accordance with claim 1, wherein the bottom member further comprises one or more of:
- a camera lens within the front surface and back surface of the bottom member;
- a flash lens within the front surface and back surface of the bottom member; and
- a light gasket on the front surface of the bottom member and that surrounds both the camera lens and flash lens.

8. A housing for an electronic device comprising:
- a top member having a perimeter portion forming a proximal end portion, a distal end portion, and opposing side portions, the top member further having a front surface and a back surface to allow touch-sensitive user inputs to the electronic device via the front and back surface, the front and back surface spanning from the proximal end portion to the distal end portion and across the opposing side portions of the top member;
- a gasket positioned at least partially in the perimeter portion of the top member;
- a frame member configured to couple with the perimeter portion of the top member, the rigid frame having a flexible portion and having a first clasping mechanism; and
- a bottom member having a front surface, a back surface, and a side wall that extends around at least a portion of a perimeter of the bottom member, the side wall having an inner surface and an outer surface, the bottom member, which when coupled to the frame member, forms a housing to enclose the electronic device and to compress the gasket of the perimeter portion of the top member with the inner surface of the side wall of the bottom member, the bottom member further having a second clasping mechanism on the outer surface of the side wall of the bottom member, the second clasping mechanism to interface with the first clasping mechanism of the rigid frame to maintain the bottom member and the rigid frame coupled together.

9. The housing in accordance with claim 8, wherein the top member further comprises a first coupling mechanism, and wherein the bottom member further comprises a second coupling mechanism to receive the first coupling mechanism of the top member to couple the top member with the bottom member.

10. The housing in accordance with claim 9, wherein the bottom member further comprises:
- a camera lens within the front surface and back surface of the bottom member;
- a flash lens within the front surface and back surface of the bottom member; and
- a gasket on the front surface of the bottom member and that surrounds both the camera lens and flash lens.

11. The housing in accordance with claim 8, further comprising a camera lens defined in the bottom member and extending through the front surface and back surface of the bottom member.

12. The housing in accordance with claim 8, wherein the first clasping mechanism includes one or more apertures, and wherein the second clasping mechanism includes one or more protrusions, each protrusion to fit into a corresponding aperture.

13. The housing in accordance with claim 8, wherein the top member further comprises one or more button features for operating a corresponding button on the electronic device, each of the one or more button features having a molded overlay that seals the control feature.

14. The housing in accordance with claim 8, wherein the membrane includes a first optically transmissive region for being positioned over a camera of the electronic device.

15. A housing for an electronic device comprising:
- a top member having a perimeter portion forming a proximal end portion, a distal end portion, and opposing side portions, the top member further having a membrane defining a front surface and a back surface of the top member, the membrane spanning from the proximal end portion to the distal end portion and across the opposing side portions of the top member;
- a gasket positioned at least partially in the perimeter portion of the top member;
- a bottom member having a front surface, a back surface, and a side wall that extends around at least a portion of a perimeter of the bottom member, the side wall having an inner surface and an outer surface, the bottom member, which when coupled to the top member, forms a housing to enclose the electronic device to allow touch-sensitive user inputs to the electronic device via the membrane, and to compress the inner surface of the side wall of the bottom member with the gasket of the perimeter portion of the top member, the bottom member further having a first clasping mechanism on the outer surface of the side wall of the bottom member; and
- a rigid frame configured to couple with the perimeter portion of the top member, the rigid frame having a flexible overmold and having a second clasping mechanism to interface with the first clasping mechanism of the bottom member to maintain the top member and the bottom member coupled together.

16. The housing in accordance with claim 15, wherein the top member further comprises a first coupling mechanism, and wherein the bottom member further comprises a second coupling mechanism to receive the first coupling mechanism of the top member to couple the top member with the bottom member.

17. The housing in accordance with claim 15, wherein the membrane further comprises:
- a sound port aperture; and
- a sound-passing, water-impermeable material covering the sound port aperture.

18. The housing in accordance with claim 15, further comprising a camera lens defined in the bottom member and extending through the front surface and back surface of the bottom member.

19. The housing in accordance with claim 15, wherein the first clasping mechanism includes one or more apertures, and wherein the second clasping mechanism includes one or more protrusions, each protrusion to fit into a corresponding aperture.

20. The housing in accordance with claim 15, wherein the electronic device includes a control feature, and wherein the top member further comprises one or more button features for operating a corresponding button on the electronic device, each of the one or more button features having a molded overlay that seals the control feature.

21. The housing in accordance with claim 15, wherein the membrane includes a first optically transmissive region for being positioned over a camera of the electronic device.

22. The housing in accordance with claim 15, wherein the bottom member further comprises one or more of:
- a camera lens within the front surface and back surface of the bottom member;
- a flash lens within the front surface and back surface of the bottom member; and
- a gasket on the front surface of the bottom member and that surrounds both the camera lens and flash lens.

23. An apparatus for housing an electronic device comprising:
- a top member having a perimeter portion forming a proximal end portion, a distal end portion, and opposing side portions, the top member further having a membrane defining a front surface and a back surface of the top member, the membrane spanning from the proximal end portion to the distal end portion and across the opposing side portions of the top member, the perimeter portion further defining a channel having a gasket positioned at least partially therein;
- a rigid frame configured to couple with the perimeter portion of the top member, the rigid frame having a flexible overmold and having a first clasping mechanism; and
- a bottom member having a front surface, a back surface, and a side wall that extends around at least a portion of a perimeter of the bottom member, the side wall having an inner surface and an outer surface, the bottom member, which when coupled to the top member, forms a housing to enclose the electronic device to allow touch-sensitive user inputs to the electronic device via the membrane, and to compress the inner surface of the side wall of the bottom member with the gasket of the perimeter portion of the top member, the bottom member further having a second clasping mechanism on the side wall of the bottom member, the second clasping mechanism to interface with the first clasping mechanism of the rigid frame to maintain the top member and the bottom member coupled together.

24. The apparatus in accordance with claim 23, wherein the top member further comprises a first coupling mechanism, and wherein the bottom member further comprises a second coupling mechanism to receive the first coupling mechanism of the top member to couple the top member with the bottom member.

25. The apparatus in accordance with claim 23, wherein the membrane further comprises:
- a sound port aperture; and
- a sound-passing, water-impermeable material covering the sound port aperture.

26. The apparatus in accordance with claim 23, further comprising a camera lens defined in the bottom member and extending through the front surface and back surface of the bottom member.

27. The apparatus in accordance with claim 23, wherein the first clasping mechanism includes one or more apertures, and wherein the second clasping mechanism includes one or more protrusions, each protrusion to fit into a corresponding aperture.

28. The apparatus in accordance with claim 23, wherein the bottom member further comprises one or more of:
- a camera lens within the front surface and back surface of the bottom member;
- a flash lens within the front surface and back surface of the bottom member; and
- a gasket on the front surface of the bottom member and that surrounds both the camera lens and flash lens.

29. The apparatus in accordance with claim 23, wherein the bottom member further includes a sealed switch having at least one fork on an inside surface of the side wall, the at least one fork to control a switch of the electronic device.

30. The apparatus in accordance with claim 23, wherein the bottom member further includes a sealed switch having at least one rocker coupled on an inside surface of the side wall, the at least one rocker to control a switch of the electronic device.

* * * * *